US009842949B2

(12) United States Patent
Moslehi et al.

(10) Patent No.: US 9,842,949 B2
(45) Date of Patent: Dec. 12, 2017

(54) HIGH-EFFICIENCY SOLAR PHOTOVOLTAIC CELLS AND MODULES USING THIN CRYSTALLINE SEMICONDUCTOR ABSORBERS

(75) Inventors: Mehrdad M. Moslehi, Los Altos, CA (US); Pawan Kapur, Burlingame, CA (US); K.-Josef Kramer, San Jose, CA (US); Virendra V. Rana, Los Gatos, CA (US); Sean Seutter, San Jose, CA (US); Anand Deshpande, Cupertino, CA (US); Anthony Calcaterra, Milpitas, CA (US); Gerry Olsen, San Jose, CA (US); Kamran Manteghi, San Jose, CA (US); Thom Stalcup, Longmont, CO (US); George D. Kamian, Scotts Valley, CA (US); David Xuan-Qi Wang, Fremont, CA (US); Yen-Sheng Su, San Jose, CA (US); Michael Wingert, Los Gatos, CA (US)

(73) Assignee: OB REALTY, LLC, Irvine, CA (US)

( * ) Notice: Subject to any disclaimer, the term of this patent is extended or adjusted under 35 U.S.C. 154(b) by 362 days.

(21) Appl. No.: 13/807,631

(22) PCT Filed: Aug. 9, 2012

(86) PCT No.: PCT/US2012/000348
§ 371 (c)(1),
(2), (4) Date: Sep. 11, 2014

(87) PCT Pub. No.: WO2013/022479
PCT Pub. Date: Feb. 14, 2013

(65) Prior Publication Data

US 2015/0020877 A1 Jan. 22, 2015

Related U.S. Application Data

(60) Provisional application No. 61/521,754, filed on Aug. 9, 2011, provisional application No. 61/521,743, filed on Aug. 9, 2011.

(51) Int. Cl.
*H01L 31/0224* (2006.01)
*H01L 31/0392* (2006.01)
(Continued)

(52) U.S. Cl.
CPC .. *H01L 31/022441* (2013.01); *H01L 31/0201* (2013.01); *H01L 31/02167* (2013.01);
(Continued)

(58) Field of Classification Search
CPC ........... H01L 31/02241; H01L 31/0392; H01L 31/0682; H01L 31/02327; H01L 31/03765;
(Continued)

(56) References Cited

U.S. PATENT DOCUMENTS

| | | | | |
|---|---|---|---|---|
| 6,998,288 | B1 * | 2/2006 | Smith | H01L 31/1804 136/243 |
| 2009/0223562 | A1 * | 9/2009 | Niira | H01L 31/1804 136/256 |
| 2010/0032012 | A1 * | 2/2010 | Isaka | C23C 16/345 136/256 |

* cited by examiner

*Primary Examiner* — James Lin
*Assistant Examiner* — Dujuan Horton
(74) *Attorney, Agent, or Firm* — Howard IP Law Group, PC

(57) ABSTRACT

Fabrication methods and structures relating to backplanes for back contact solar cells that provide for solar cell substrate reinforcement and electrical interconnects as well as Fabrication methods and structures for forming thin film back contact solar cells are described.

25 Claims, 119 Drawing Sheets

(51) Int. Cl.
*H01L 31/068* (2012.01)
*H01L 31/18* (2006.01)
*H01L 31/02* (2006.01)
*H01L 31/0216* (2014.01)
*H01L 31/0232* (2014.01)
*H01L 31/0376* (2006.01)
*H01L 31/075* (2012.01)
*H01L 31/05* (2014.01)
*H01L 31/049* (2014.01)

(52) U.S. Cl.
CPC .... *H01L 31/02327* (2013.01); *H01L 31/0392* (2013.01); *H01L 31/03765* (2013.01); *H01L 31/049* (2014.12); *H01L 31/0516* (2013.01); *H01L 31/0682* (2013.01); *H01L 31/075* (2013.01); *H01L 31/1812* (2013.01); *H01L 31/1896* (2013.01); *Y02E 10/547* (2013.01)

(58) Field of Classification Search
CPC ............... H01L 31/075; H01L 31/0516; H01L 31/1896; H01L 31/1812; H01L 31/18124; Y02E 10/545–10/548
USPC .......................................................... 136/256
See application file for complete search history.

HIGH-EFFICIENCY SOLAR PHOTOVOLTAIC CELLS AND MODULES USING THIN CRYSTALLINE SEMICONDUCTOR ABSORBERS

CROSS-REFERENCE TO RELATED APPLICATIONS

This application claims priority to U.S. Provisional Patent Application Ser. No. 61/521,754 and 61/521,743 both filed Aug. 9, 2011, which are hereby incorporated by reference in its entirety.

FIELD

The present disclosure relates in general to the fields of photovoltaics and semiconductor microelectronics. More particularly, the present disclosure relates to the methods, architectures, and apparatus related to high-efficiency back-contact crystalline silicon photovoltaic solar cells.

BACKGROUND

Currently, crystalline silicon (both multi-crystalline and mono-crystalline silicon) has the largest market share in the photovoltaics (PV) industry, currently accounting for about 85% of the overall global PV market share. Although moving to thinner crystalline silicon solar cells is long understood to be one of the most potent and effective methods for PV cost reduction (because of the relatively high material cost of crystalline silicon wafers used in solar cells as a fraction of the total PV module cost), utilizing thinner crystalline wafers is hampered by the problem of thin wafers being extremely fragile, mechanical breakage during wafer handling and cell processing, and the resulting production yield losses caused by thin and fragile silicon wafers. Other problems include inadequate light trapping in the thin cell structure because silicon is an indirect bandgap semiconductor material and absorption of longer wavelength red and infrared photons (particularly those in the wavelength range of about 900 nm to 1150 nm) requires relatively long optical path lengths—often much larger than the wafer thickness itself. Further, using known designs and manufacturing technologies it is often difficult to balance the requirement of high mechanical yield and reduced wafer breakage rate with high manufacturing yields in PV factories in a cost effective manner.

Relating to substrate (semiconductor absorber) thickness, for current crystalline silicon wafer solar cells, moving even slightly thinner than the current thickness range of 140 μm to 200 μm starts to severely compromise mechanical yield during cell and module manufacturing. This is particularly a big challenge for larger cell sizes such as 156 mm×156 mm and 210 mm×210 mm cells (compared to the smaller 125 mm×125 mm cells). Thus, manufacturable solutions directed to process very thin solar cell structures, such as with cell semiconductor absorbers thinner than about 100 μm down to micron-size-scale and submicron thickness, often must utilize a cell process during which the cell is fully supported by a either a temporary and/or a permanent host carrier throughout the process flow, or a cell process which utilizes a novel self-supporting, stand-alone, substrate with an accompanying structural innovation. This structural innovation must allow the cell substrate to be extremely robust against breakage in high throughput solar cell and module factories. Examples of the latter are the novel 3-Dimensional honeycomb and pyramidal structures formed with crystalline silicon thin films.

On the cell architecture side, back-junction/back contacted monocrystalline semiconductor (such as monocrystalline silicon) solar cells are conducive to very high efficiency. This is primarily because there is no metal shading associated losses on the front side as well as no emitter on the front which helps result in a high blue response. Moreover, the use of n-type base enables much higher mirrority carrier lifetime compared to p-type base, as well as no Light-Induced Degradation (LID). In addition, the back-contact/back-junction cell with n-type base may use well-established silicon nitride frontside passivation and anti-reflection coating layer with positive fixed charges in the passivation layer (or layer stack) comprising silicon nitride providing for improved frontside surface passivation with reduced Frontside Surface Recombination Velocity (FSRV) enabled by field-assisted passivation. Further, backside metal may be made thicker and with a higher area coverage (e.g., well over 90%) to ensure very low series resistance (or very high metal interconnect electrical conductivity) without worrying about the trade-off with shading that is often a consideration for front contacted cells. Back contacted/back junctions cells are, in particular, highly conducive to being combined with very thin (e.g., solar cell substrates for at least two distinct reasons. Firstly, high-efficiency back contacted/back junction cells have a stringent requirement of having mirrority carrier diffusion length (known as $L_{eff}$) at least 5× (by a factor of at least approximately 5) the thickness of the substrate (or the active crystalline semiconductor absorber). A very thin (e.g., with crystalline semiconductor layer thickness less than about 80 microns and more preferably less than about 50 microns) solar cell substrate enables this requirement without demanding a very high bulk substrate lifetime or a very high quality material, thus, can be done in practice on a cheaper starting material having eliminated the most stringent substrate quality requirements. This indirectly gives a further cost advantage: the quality of the material can be relaxed in addition to it being thinner. A second reason is related to the process flow which enables fabrication of the back contact/back junction cells (will be discussed further in the following sections). Because back contacted cell architecture and related process flow may be catered to have all high temperature process steps (i.e., any cell process steps with process temperatures in the range of approximately 400° C. to ~1150° C.) on one side of the cell, the requirement for a carrier of the thin substrate when it is going through processing on the other sides are considerably eased. Thus, using a very thin substrate (e.g., with crystalline semiconductor layer thickness less than about 80 microns and more preferably less than about 50 microns) in conjunction with a back-contacted/back-junction architecture may represent an ideal solar cell combination.

In the past, there have been attempts in solar PV R&D to use carriers such as glass for thin substrates; however, these carriers have suffered from serious limitations including relatively low maximum processing temperatures in the case of soda lime glass (or most other non-silicon foreign materials), with the processing temperatures being limited to well below approximately 400° C.—which potentially may compromise the solar cell efficiency. There have also been attempts to make small area (for example, cell areas well below 10 $cm^2$) thin cells which do not have serious breakage concerns (while they still suffer from the thermal processing limitations, including limitation of process temperatures to well below approximately 400° C.); however, large cell areas (areas well above 100 $cm^2$) are often required for commercial viability through cost-effective manufacturing.

BRIEF SUMMARY

Therefore, a need has arisen for fabrication methods and designs relating to a back contact solar cells. In accordance with the disclosed subject matter, methods, structures, and apparatus for fabricating back-contact solar cells are herein disclosed. These innovations substantially reduce or eliminate disadvantages and problems associated with previously developed back contact solar cells.

According to one aspect of the disclosed subject matter, fabrication methods and structures relating to backplanes for back contact solar cells that provide for solar cell substrate reinforcement and electrical interconnects are described. In one embodiment, the back contact back junction solar cell comprises a substrate having a light capturing frontside surface, a doped base region, and a doped backside emitter region with a polarity opposite the doped base region. A metallization pattern is positioned on the backside of the solar cell and a permanent reinforcement provides support to the cell.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description be within the scope of the claims.

BRIEF DESCRIPTION OF THE DRAWINGS

The features, nature, and advantages of the disclosed subject matter may become more apparent from the detailed description set forth below when taken in conjunction with the drawings in which like reference numerals indicate like features and wherein.

DETAILED DESCRIPTION

Figure 1:
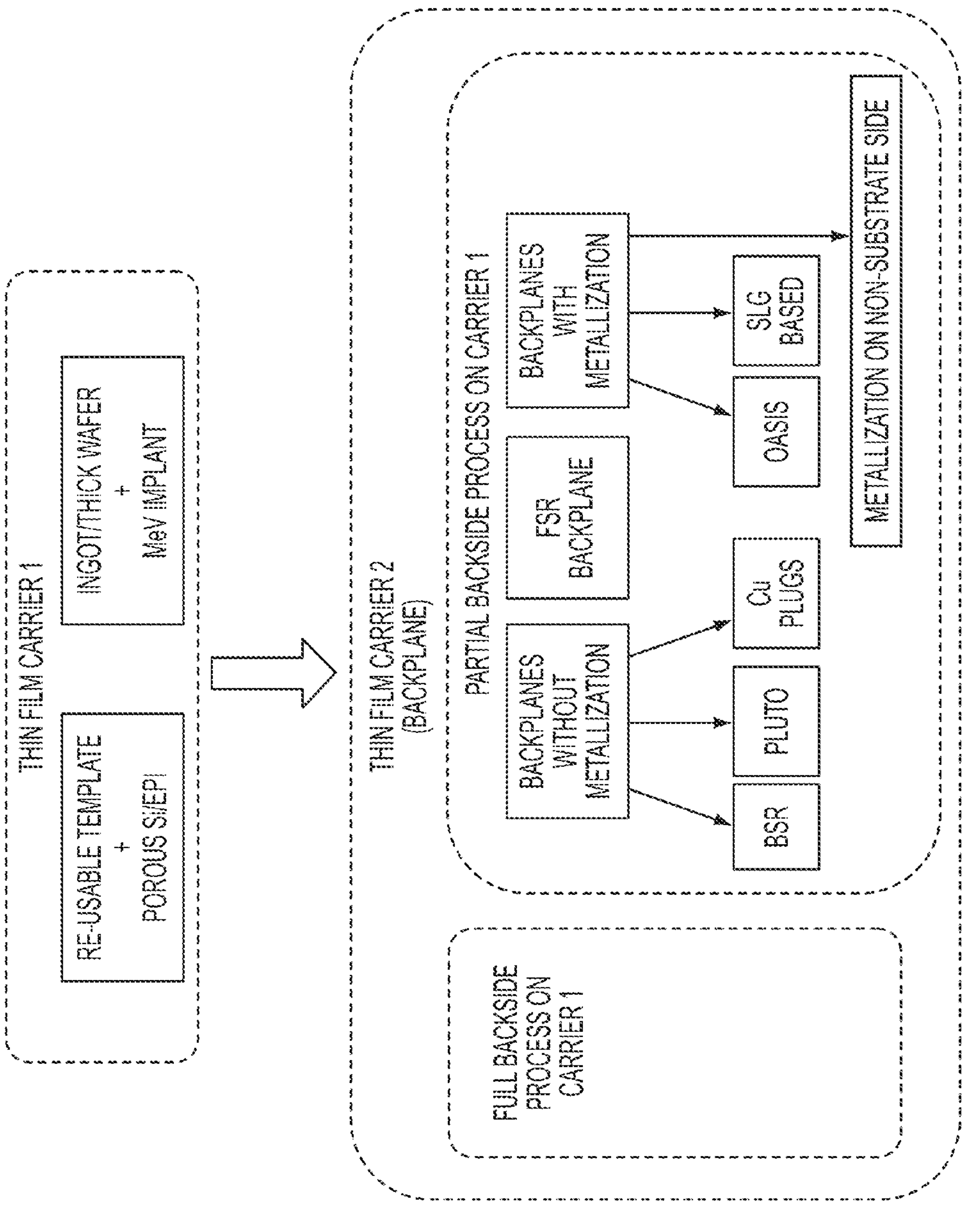
FIG. 1 is a diagram illustrating solar cell processing carrier combinations.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

And although the present disclosure is described with reference to specific embodiments, such as crystalline silicon and other fabrication materials, one skilled in the art could apply the principles discussed herein to other materials, technical areas, and/or embodiments without undue experimentation.

The disclosed subject matter provides various structures and manufacturing methods for high-efficiency back-junction/back contacted solar cells specifically using thin crystalline semiconductor absorbers such as monocrystalline silicon with the cell absorber layer (or substrate), preferably ranging in thickness from about less than one micron (1 μm) up to about one hundred microns (100 μm), and even more particularly ranging in thickness from about one micron (1 μm) to about fifty microns (50 μm). The cell structures and manufacturing methods provided also apply to thicker crystalline semiconductor substrates or absorbers, ranging in thickness from about 100 μm to about 200 μm (which also includes the thickness range for more conventional CZ or FZ wafer thicknesses). The crystalline solar cell substrates may be formed either using chemical-vapor-deposition (CVD) methods including epitaxial growth (such as atmospheric-pressure epitaxy) or other crystalline silicon material formation techniques (including but not limited to the so-called kerfless slicing or exfoliation methods utilization proton implantation, metal-stress-induced exfoliation, or laser). Various embodiments of manufacturing methods as it pertains to all aspects of processing very thin crystalline semiconductor solar cell substrates may be extended to other types of materials and to wafer based approaches, including kerfless cleavage methods such as the implantation-assisted wafer cleavage methods. Key attributes of various cell embodiments provided include substantially reduced semiconductor (e.g, silicon) material consumption, very low manufacturing cost, high cell efficiency, and relatively high energy yield, thus, improved solar photovoltaic module performance. Specifically, this stems from the combinations of the unique cell design architectures and manufacturing methods of this invention, which entail manufacturing back junction/back contacted solar cells using thin crystalline semiconductor layers, yielding very high conversion efficiency on thin crystalline semiconductor substrates, yielding very low cost. While the variety of disclosed embodiments may be applied to various crystalline semiconductor materials (such as silicon, gallium arsenide, germanium, etc.), preferred embodiments for monocrystalline silicon are provided (which also apply to the other monocrystalline semiconductors including gallium arsenide, germanium, gallium nitride, etc.).

The disclosed subject matter provides innovations particularly pertaining to very thin crystalline solar cells (from about 1 micron up to 150 microns, and more preferably cell absorbers in the thickness range of about 1 micron to about 50 microns) with the back junction/back contact architecture. First, novel very thin (thickness range of 1 micron to 150 microns) back contacted/back junction crystalline silicon cell structures are provided. Secondly, methods for manufacturing back contacted/back junction crystalline silicon cell structures are provided. Thirdly, methods for supporting thin substrates fusing Carriers) while they have being processed through the line and while they are deployed in the field are provided. Various combinations of these three categories create a myriad set of structures, process flows, and thin cell support carriers. FIG. 1 is a graphical flowchart showing the various thin film carrier combinations, comprising temporary Thin-Film Carrier 1 and permanent Thin-Film Carrier 2, disclosed herein. FIG. 1 shows the two classes of carriers whose varied combination constitute the novel structures and methods for manufacturing very thin back contacted/back junction crystalline semiconductor solar cells and specific embodiments which are disclosed herein. The two classes of carriers comprise first carrier and second carrier. Options for different cell fabrication process flows once the carriers 1 and 2 are established are also provided herein, including in FIG. 3. Note that, it is possible to have any of the process flows paired with most carrier 1 and carrier 2 combinations The final structures obtained using these unique combinations are back-contact solar cells. Importantly, although this disclosure provides many unique sets of set of structures, process flows, and thin cell support carriers, it is understood that not all sets of possible process flows based are explicitly covered by this document, and the ones which are not covered are implied based on the cell design and process flow architectures disclosed herein. Several process flows and alternative embodiments are provided with detail herein allowing one with skill in art to combine various disclosed aspects.

This disclosure provides various host carrier methods and structures used for supporting the thin semiconductor (such as thin monocrystalline silicon) cell. We start by first addressing the category pertaining to handling and supporting thin film silicon substrate (henceforth, TFSS) through its manufacturing and permanently reinforcing it—this is shown as Thin Carrier 1 and Thin Film carrier 2 in FIG. 1.

High manufacturing yield is a pre-requisite for commercially viable thin silicon solar technology. Very thin solar cells (from about 1 micron up to 150 microns, and more preferably cell absorbers in the thickness range of about 5 microns to about 60 microns) discussed in this document are fully and continually supported throughout the cell handling and processing to maintain high manufacturing yield and for commercial viability. This means that thin cells are never processed or handled without either temporary or permanent support attachments (also called substrate carriers). These thin semiconductor cells are also permanently supported (and reinforced) once assembled in the photovoltaic modules for installation and operation in the field to maintain mechanical resilience, reliability, and high yield during module lamination/packaging, field installation, and field operation. Because both sides of the solar cell need to be accessed and processed (to complete the cell backside and sunnyside), in general, two carriers are required for TFSS (in order to always support the thin semiconductor substrate throughout handling, processing, and final module packaging): one for processing each face of the solar cell. The carriers must satisfy several important criteria: firstly, they should be cost-effective (i.e., very low cost per cell or very low cost per peak watt). Their combined amortized cost should be less than the cost of the silicon in the thin cell that they save (compared to the traditional wafer-based solar cells). Secondly, at least one of the carriers should be able to withstand relatively high temperature processing (particularly at temperatures in the range of approximately 300° C. up to as much as 1150° C.) required in manufacturing of high-efficiency solar cells, without any complications due to mismatch in coefficient of thermal expansion (CTE) and/or due to undesirable impurities being introduced into the cell. In addition, if only one of the carriers is able to support high temperature cell processing (i.e., high-temperature processing to form the cell substrate itself using CVD epitaxy as well as to complete the cell backside device structure as required), the process flow should be such that all the necessary high temperature processing steps are on this high-temperature-capable carrier (which will serve as temporary reusable carrier). As mentioned before these particular criteria are highly favorable to back contacted/back junction cell, hence, truly enabling high efficiency back-contact, back-junction thin cells. Thirdly, at least one of the carriers should preferably be able to withstand wet processing and final cell metallization required for manufacturing solar cells. An example of a key wet processing step includes silicon front surface random pyramid texturing etch in diluted and heated alkaline (comprising KOH and/or NaOH and/or TMAH) solutions. Fourthly, once the first side (preferably the cell backside for the back-contact/back-junction cell processing) is partially or fully processed, the carrier (which serves as temporary reusable carrier) should be such that the thin cell (Thin Film Semiconductor Substrate: TFSS) may be easily detached or lifted off from the carrier on demand with high yield and with the TFSS layer transferred to the other carrier in conjunction with the lift-off detachment process (attached on the side which was processed first, preferably the cell backside for back-contact cell) for processing of the second side. Subsequently, in the case, where the first side (preferably the cell backside) was only partially processed, the remaining process steps (for instance, such as completion of the final cell metallization) can be completed using, for example, various embodiments detailed below. Preferably within the embodiments of this invention, the high-temperature-capable temporary carrier and the high-temperature processing steps precede the permanent carrier as well as the wet processing and final cell metallization steps. Moreover, starting with the formation of the thin-silicon substrate using CVD epitaxy till the pre-lift-off attachment of the permanent carrier to the TFSS layer, all the process steps performed on the TFSS while on the temporary carrier are preferably dry processing steps (no wet processing on the temporary carrier other than a wet porous silicon process step prior to the formation of the TFSS layer by CVD epitaxy). Furthermore, the cell contact metallization is preferably performed after formation of the cell contacts and prior to the attachment of the permanent carrier and prior to the lift-off separation of the TFSS layer from the temporary reusable carrier or template.

Supporting Carrier #1 (i.e., Reusable Template) for TFSS.

For the combination of TFSS with back contact/back junction architecture two choices for the first carrier are disclosed, henceforth carrier 1. These options are shown in FIG. 1 under carrier 1. In the remaining document Sunny-side of the Back contact/back junction cell will be interchangeably referred to as the cell "frontside", while the non-sunny side will be interchangeably called the cell "backside".

1. The first disclosed option for carrier 1 is a relatively thick (preferably in the thickness range of about 0.2 mm to 2 mm) semiconductor (e.g., preferably mono-crystalline silicon for high-efficiency mono-crystalline silicon solar cells) wafer (with wafer area in the range of 150 $cm^2$ up to over 2,000 $cm^2$), which may also serve as a reusable template (hence amortizing cost over many template reuse cycles). Large area thin solar cell substrates, with desirable cell areas, for instance, square-shaped cell dimensions of 156 mm×156 mm (this size may be scaled up to at least 210 mm×210 mm or even larger sizes up to 300 mm×300 mm and 450 mm×450 mm), are first manufactured using epitaxial semiconductor (epitaxial silicon) growth on top of a reusable crystalline semiconductor template, and are subsequently dislodged. The reusable template can be substantially planar or in a different embodiment have pre-structured 3-dimensional pre-pattern. This document focuses on the substantially planar template, although various embodiments can be applied to the pre-structured templates with random structure or patterned regular structure 3D features. It may be reused several times (preferably at least 10's of times) for epi (epitaxial silicon) growth, which amortizes its cost over the reuse cycles. After its useful reuse life, the reusable template can be ultimately recycled to make new templates through CZ crystal growth and wafer slicing. The TFSS is released from the reusable template using a sacrificial release layer which in one preferred embodiment may be a porous silicon layer, preferably with at least with two different porosities (a higher porosity buried release layer and a lower porosity seed layer) or a graded porosity. The reusable template, since it is preferably a relatively thick (preferably in the range of about 0.2 mm to 2 mm) silicon wafer, is capable of withstanding relatively high processing temperatures (e.g., up to about 1150° C. or even higher) without any CTE mismatch issues with the subsequent TFSS and without any contamination concerns, satisfying one of the key criteria for carrier 1, outlined above. The template can be in various sizes such as 156 mm, 165 mm, 200 mm, 300 mm or 450 mm (or any diametric or side dimensions in the range of about 100 mm to several hundred mm, at least up to 450 mm), shapes, such as round or square or polygon, and thicknesses capable of going through full or partial solar cell process without cracks or breakage, with template thickness of about at least 200 μm (and as thick as about 2 mm or even thicker). The second criterion for carrier 1, related to cost effectiveness is accomplished by reusing and amortizing the template cost over a plurality of TFSS fabrication cycles (as well as by using unpolished templates if necessary or desired). Finally, this carrier also satisfies the aforementioned carrier criteria of being conducive to the high-yield detachment of the TFSS with high repeatability and consistency. This is accomplished by preceding the epitaxial growth of TFSS with formation of a porous silicon layer (serving as an epitaxial seed layer and subsequent release layer) between the template and the TFSS, preferably using a wet electrochemical etch process in a liquid comprising HF and IPA (or HF and acetic acid, or HF mixed with another suitable material). The porosity of the porous silicon layer is catered and spatially adjusted in depth (by using a lower porosity top layer and a higher porosity buried bottom layer) to accomplish the dual purpose of i) transferring the crystallinity of template with high fidelity during the epitaxial process, and ii) yet be able to provide very high yield detachment and release on demand from the template. The cell release may be accomplished using processes such as mechanical release (MR) or sonicated mechanical release in a liquid (SMR), or another suitable method, resulting in lift-off detachment of the TFSS layer after its attachment or lamination to the permanent carrier 2.
2. The second disclosed option for carrier 1 can be a reusable thick wafer or an ingot. The detachment of the TFSS may be accomplished using a high-implantation-energy such as an MeV (mega-electron volt) proton (hydrogen ion) implant and separating thin slices from the host wafer or ingot.

When the porous silicon/epi technique on the host carrier is compared with the thick wafer/ingot and implant induced separation technique several trade-offs can be identified. The wafer/ingot with implant has the advantage of not needing porous silicon and epitaxial growth and the accompanying reactors (however, it has dependency on polysilicon feedstock and ingot growth). On the other hand it needs rather expensive MeV proton implantation capital equipment and high energy consumption to operate the implanters. The quality of silicon can be high depending on the cost of the ingot and it can potentially also allow wet processing. A downside is that because the ingot may have <111> orientation in order to eliminate the need for excessively high proton implantation doses, the wafer may rely on more-expensive and damage-producing dry texturing as opposed to the standard wet texturing. The porous silicon/epi combination has the advantage that it is compatible with standard alkaline wet texturing and the substrate doping can be modulated/graded to whatever is conducive for high efficiency requirements. Also, very thin silicon cell substrates (down to about one micron) are possible using a porous silicon/epi manufacturing method and the doping profile can be engineered and adjusted during the epitaxial growth process (not possible for the thin silicon layers produced by proton implantation).

Supporting Carrier #2 for TFSS: Backplane.

The second carrier, in the specific context of back contacted/back junction cells should preferably satisfy several criteria. An obvious one is that it must support the TFSS through the remaining process steps. Secondly, it should protect the prior processing on the side where it is attached (backside for our specific architecture), while the other side (frontside) is being processed. This requires that the second carrier preferably be relatively immune or resistant to the wet chemistry that is used during processing of the frontside (particularly and primarily the wet chemistry used to clean and texture the TFSS sunnyside). Thirdly, it may or may not have high-conductivity metallization layer (preferably comprising aluminum and/or copper) as its integral part. For the case where it does have metallization, in addition to being a carrier (preferably a very low cost permanently attached carrier), it provides metallization which seamlessly attaches to the metal on the cell with low resistance. Finally, though not as high a priority, it should have thermal processing capability sufficient for achieving excellent frontside passivation (therefore, preferably at least up to a temperature of about 180° C. and more preferably at least up to a temperature of about 250° C. or even 300° C.) without producing cracks in TFSS due to any CTE mismatch with silicon and without degradation of the carrier material. This second carrier attached to the solar cell backside henceforth, will be identified as the solar cell "Backplane."

Several backplanes embodiments are disclosed herein and outlined in FIG. 1 under the Thin Film Carrier 2 heading. It is important to note that any of the several options outlined for carrier 2 in FIG. 1 may be used in conjunction with either of the two carrier 1 options, which are discussed above, that is, any carrier 2 embodiment be used with either the Reusable template/epi/porous silicon option or with the Ingot (or thick wafer)/Implant option.

Carrier 2 (the backplane) may be divided into two broad classes (FIG. 1): The first category, "Full Backside Process on Carrier 1" is where carrier 2 is attached only after all the required processing on the side where it attaches (backside) is completed on carrier 1. In a back contact/back junction cell this might entail finishing all non-sunny side (backside) processing steps including patterned dopant diffusions, contact opens, and full backside contact metallization. No further processing is required on this side, except in some cases, where electrical access to the final cell metallization is required. The second category, "Partial Backside Process on Carrier 2" is where carrier 2 is attached after only partial processing on the backside is finished. Although, this document focuses on the latter category with partial processing and discusses several sub-groups that are possible within this paradigm, it is understood that a variation entailing full processing per the first category is implicit and within the scope of this invention.

One of the driving forces behind the partial processing paradigm on the non-sunny side (i.e., cell backside) is to ensure that if potentially deleterious materials (including lifetime degrading materials), such as copper, are part of the backside processing, they do not contaminate carrier 1, which can be reused for carrying other TFSS (hence, preventing the risk of metallic cross contamination in the production line). This prevents cross contamination in the manufacturing line and the resulting efficiency degradation (hence enabling high-yield template reuse without the risk of cross contamination to the cells). Thus, an idea behind partial processing on the non-sunny side is to introduce the potentially lifetime-degrading materials and processes (such as high-conductivity copper plating metallization) after the TFSS is detached and released from carrier 1, hence, eliminating the risk of cross contamination.

Three sub-categories of backplanes within the partial processing paradigm are shown in FIG. 1. In the first case, referred to as front surface reinforcement, "FSR", the TFSS is released from the template using a temporary carrier attached on the partially processed backside. Subsequently, the frontside cell processes such as texture and passivation are carried out with the temporary backside carrier supporting the TFSS. The temporary carrier is choose by the ease of release of the TFSS and may utilize known methods, such as electricity (ex. Mobile electrostatic chuck, MESC), mobile vacuum chuck, MOVAC, or a temporary adhesive which is released upon heating or upon UV exposure. The remaining backside steps (for example, copper metallization) are performed by transferring the TFSS from the temporary backside support to the optically transparent permanent front side reinforcement (for example, a low-cost EVA encapsulant/glass combination), thus freeing up the backside for remaining processing (for example remaining metallization steps). A specific requirement of the front side reinforcement being that it does not degrade light transmission and coupling beyond the degradation usually incurred due to module level packaging. Thus, EVA/glass based reinforcement or the like is preferred, although, other material sets are also possible (such as EVA with a clear front fluoropolymer sheet made of ETFE).

The second and third subcategories, "Backplanes without Metallization" and "Backplanes with Metallization," of backplanes with partial backside processing are characterized by backplanes which are permanent (in contrast with aforementioned FSR). A difference between these two categories is that the "Backplanes without Metallization" do not have thick metallization integrated or embedded in their structure; rather, this metallization is put on toward the back-end after the frontside (sunny-side) is processed. Whereas, "Backplanes with Metallization" have a thick second level of metallization (for instance, a patterned metal foil) integrated into the backplane. The thick metallization layer on the backplane connects to the thin metallization layer on the TFSS, forming the second layer of interconnects, and may also contain busbars. This thick high-electrical-conductivity metallization layer (preferably made of aluminum and/or copper) decreases resistance for back-contacted cells.

This disclosure details three particular embodiments within the "Backplanes without Metallization" subcategory of backplanes. Importantly, this should not be construed as limitation of this paradigm to these three embodiments. The first case is called Back Surface Reinforcement or "BSR." In this process flow, the TFSS is released from the template (the first carrier) using a permanent backside reinforcement. The permanent backside reinforcement only partially covers the backside, thus allowing processing on the backside through the open areas, after front side processes are completed also with the BSR support. A structural example of this is a backplane made in a grid pattern with a substantially large open area between the grids providing access to the backside for last several processing steps on the non-sunny backside.

The second embodiment of a permanent "Backplanes without Metallization" is a design known as acronym "PLUTO." In this process flow, a simple and cheap backplane material (e.g., a relatively low-CTE Pre-preg material comprising a mixture of resin and fibers) is attached to the TFSS, while it is attached to the first carrier. The backplane attachment may be a direct bonding/lamination (if material has adhesive in it) or use an intermediate adhesive layer, for example a dielectric adhesive (DA) which may be printed using means such as screen printing (or applied using a spray coater or a roller coater). The pre-preg assembly/material choices should be such that they meet the following criteria:

a. The released TFSS/Pre-preg assembly should be relatively stress and crack-free with very little bow.
b. The backplane should maintain crack-free properties and should not induce stress cracks in the TFSS, while going through subsequent processing steps such as frontside texturing (e.g., using hot KOH) and PECVD passivation processes.
c. The backplane should be relatively resistant to the chemicals used during frontside processing such as texturing and post-texture surface cleaning (and any possible pre-texture silicon etch).

After all frontside processing is completed using the PLUTO backplane, access holes (100's to 1000's of holes) are drilled, preferably using a high-productivity laser drilling tool, through the backplane (such as a pre-preg material) and remaining cell metallization is finished, preferably either by plating or using a combination of screen printing of a patterned electrically conductive seed paste and attachment of a pre-patterned metal foil layer (comprising aluminum and/or copper). These holes provide access to the underlying on-cell patterned metal which was formed while the TFSS was on the template (specific examples will be illustrated during the subsequent discussion on process flows). The drilling of holes may be accomplished using a myriad of laser and mechanical methods, in a specific example this can be accomplished using a fast throughput CO2 laser. Requirements for the drilling technique include fast throughput, no damage to the TFSS or the underlying metal on the TFSS, a reliable way to clean the laser opened contacts (if necessary) to have low resistance electrical access to the underlying metal on the TFSS, and proper alignment of the holes to the underlying metal. Subsequent to the laser drilling the rest of the metallization (comprising a second level of metal) may be finished using several method including plating (both electroless and/or electroplating), direct thick metal write techniques such as flame spray, attaching a cheap bread-board with metallization to the backplane, attaching metal foil fingers after screen printing of a patterned conductive seed paste, or having the metallization as part of the module assembly in approaches such as monolithic module assembly (MMA). A slight modification process includes an embodiment in which the pre-preg has pre-drilled holes prior to its attachment/lamination to the TFSS (to eliminate the risk of laser-drilling-induced damage to the TFSS) and is protected by another easily removable cheap thin material layer or sheet (such as a thin Mylar sheet or another suitable material). In this embodiment, the removable protective sheet will be preferably removed after completion of the sunnyside cell processing (including at the wet texture and PECVD passivation processes), and prior to completion of the final cell metallization (or prior to module assembly in the case of MMA).

The third embodiment, "Cu Plugs," of a permanent "Backplanes without Metallization" of FIG. 1 is a design with a slight modification of the aforementioned so-called PLUTO embodiment. And although, specifically identified with a metal as a naming convention, this approach should not be construed to be limited to copper as the electrically conductive material. In this case, the backplane has an additional layer backing compared to PLUTO. For example, the backplane may consists of glass or other harder solid backsheet materials (e.g., anodized Al) with a pliant attachment material such as an encapsulant PV-FS Z68 (from DNP Solar), also called Z68 in short, or Ethylene Vinyl Acetate (EVA). The backsheet may have pre-drilled holes, but the underlying attachment material serves as a sealant to protect the TFSS metal from being chemically attacked during frontside processing (such as during frontside wet alkaline texturing). After texture and passivation processes, the sealant material is opened up through the pre-drilled holes in the backsheet (for example soda lime glass, SLG). This may be performed using a myriad of methods such as laser drilling or mechanical punching. Once these holes are opened, a continuous seed metal layer is deposited either using a direct write scheme such as metal ink/paste printing (using s stencil printer, screen printer, inkjet printer, or aerosol jet printer), or PVD (e.g., plasma sputtering), or electroless plating. The metal is then thickened by plating and isolated between p and n type diffusion contact metals on top of the backsheet. Various known plating and isolation processes may be used including, for example a screen print resist, then blanket plating of metal, then etch back the resist and use the plated metal as the mask to etch the underlying thin seed metal layer. Alternatively and preferably in our embodiments, a patterned electrically conductive paste is formed by direct write on the backplane, such as with screen printing of a suitable paste (e.g., paste containing copper or nickel or another suitable conductor). Then, the final metallization is completed using direct plating (e.g., such as copper plating) on the patterned plating seed (hence, eliminating the need for sacrificial resist and resist strip and seed etch-back processes).

Another embodiment uses a single sided or a dry frontside texturing process so that the need to protect the partially processed backside is obviated and all access points can be pre-opened (using laser drilling or mechanical drilling or punching) either before attachment of the backplane or before processing the frontside.

The "Backplanes with Metallization" subcategory of backplanes, as shown in FIG. 1 with partial backside processing, are characterized by backplanes which are permanent and have integrated metallization. Three embodiments of the "Backplanes with Metallization" are disclosed in detail in FIG. 1: Shown with acronyms OASIS, SLG-based (soda lime glass), and "Metallization on non substrate side" (backplanes with metallization facing away from the TFSS). In two embodiments, OASIS and SLG-based, the backplane-integrated metal faces the TFSS during its lamination/bonding to the TFSS, while in the third embodiment, "Metallization on non substrate side," the metallization of the backplane faces away from the TFSS.

The OASIS backplane embodiment has several components. First, it consists of a metallic backplate which may or may not also serve as the metallization layer. This metallization layer, which in a particular embodiment is patterned into inter-digitated fingers with busbars, may be made, for example, from Al foils or solderable aluminum foils. The Al foils may be pre-coated or pre-plated with nickel and Sn (or a Sn solder alloy) to provide better adhesion of the conductive vias which connect the second level of interconnects to the first level of interconnects on the TFSS. The backplate may be protected from chemical attack on the top by a suitable protective layer such as Z68, EVA or prepreg or another suitable polymeric/plastic cover sheet. These layers are ultimately opened up to provide access for the testing and module connections from the top. During lamination of the patterned metal to the EVA or Z68 like material, substantial planarity must be accomplished by exploiting the flow of the attachment material such that the final assembly should be substantially planar from both top and bottom. At the planar bottom of this assembly, the connection of the Al foil metal to the underlying TFSS metal is made using selective conductive posts or vias in the dielectric layer which has gaps to accommodate the electrically conductive vias. The conductive vias (henceforth conductive epoxy or CE) and the dielectric material (henceforth dielectric epoxy or DE) in the preferred embodiment are screen printed on either the TFSS or on the backplane. CE material requirements include cost effectiveness, highly conductive, it may be screen printable in a preferred embodiment, and that it attaches with low contact resistance to both the overlying backplane metal and the underlying TFSS metal. DE material requirements include cost effectiveness, that it is a non-electrically-conductive dielectric, it may be screen printable in a preferred embodiment, and it adheres well to both the overlying backplane material (both metal and the EVA or Z68 dielectric encapsulant) and the underlying TFSS materials consisting of both TFSS metal and dielectric. For example, the OASIS backplane may have a myriad of variations based on choices in the following categories:

a. Backplate material in the backplane: examples include aluminum foils, Al foils coated with Sn, or glass (different kinds of glasses including the soda lime glass), or other polymeric materials. The requirement is that the backplate material should give the strength and rigidity to the backplane to carry the TFSS. It should also be such that during subsequent thermal processes, it does not induce cracks in the TFSS because of thermal expansion coefficient mismatch.
b. Patterned Metallization material: examples include Al foils which may be coated with other metals to make them conducive for low contact resistance attachment to the electrically conductive vias. In another example, these may be pre-coated Al foils. In one embodiment the metallization material may be the same as the backplate material or it could be attached to the backplate material using adhesive. The thickness of the metallization is dictated by strength requirement if it is the same as the backplate and the resistance requirements.
c. Pattern Design of the metallization: Options primarily consist of the number and hence the width of interdigitated fingers that are used. The widest width and the least number of fingers that is used may be determined by the largest tolerable resistance (without degrading Fill Factor) on the TFSS metal line between conductive via posts. A second consideration which falls under pattern design is whether the metal foils have additional functionality. For example, they can be designed to give a partial spring-like action, which may be accomplished, for example, either by having them physically separated within each finger or by partially cutting them in a snake-like pattern; however, various designs are possible. The spring-like functionality is geared toward providing the metal foils to expand and contract freely such that they do not rupture the CE or the TFSS due to thermal expansion coefficient mismatch.
d. The choice of the dielectric and the conductive connection material: criteria for selection of these materials are already discussed above.
e. Method of depositing the CE and the DE materials: in one preferred embodiment these are screen printed. This print can be either on the TFSS or on the backplane.
f. Orthogonal vs. Parallel Design: Whether the backplane metallization (second level metal or M2) is parallel or orthogonal to the on-cell TFSS metallization (first level metal or M1) is dictated by several considerations. The orthogonal backplane (M2 fingers orthogonal or crosscut or perpendicular to M1) has an advantage that the width of the lines on the backplane (or the width of M2 fingers) can be independent, in general, and specifically, much wider than the M1 fingers. This helps in making this metallization much coarser and with less stringent alignment requirements than M1. However, precaution needs to be taken to ensure that orthogonal lines do not short. Thus, the dielectric material has to have good coverage. Parallel design restricts the pitch and dimensions of the backplane metal (M2) to be the same as the on-cell TFSS metal (M1) design. This design on the cell is in general fairly tight and, in turn, is dictated by several device considerations including reduced base resistance, reduced electrical shading, etc.
g. Access scheme of the foil busbars for the module connections: For example, this may be through through-holes through the protective layer or may be a wrap around where the Al foils are wrapped around to the top of the backplane, and protected for example by a laminated polymer during processing of the frontside and contact access to the foils is enabled at the end of the process.

Figure 2:
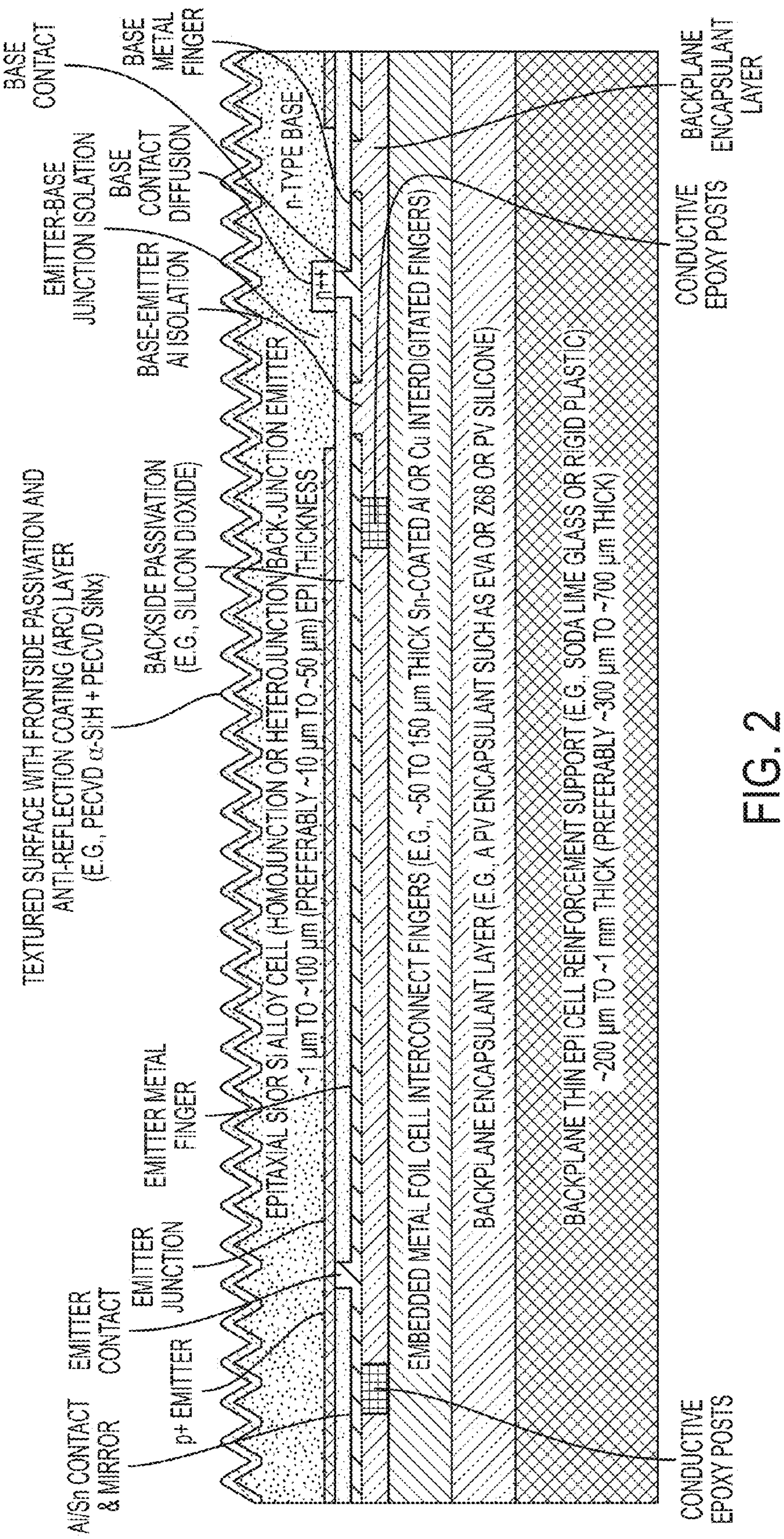
FIG. 2 is a cross-sectional diagram of a back contact solar cell embodiment.

FIG. 2 is a diagram of a cross section of an SLG-based back contact solar cell embodiment. The soda-lime glass or SLG based embodiment as disclosed herein is a subcategory of the so-called OASIS backplane, where the backplate material is a soda lime glass sheet—as shown in FIG. 2. This is attached to the Sn-coated (or solder alloy coated) Al foil metallization using Z68 (or another suitable encapsulant) material. The Al foils wrapped around the glass to have the busbars on top of the glass backplane, and thus are sealed with the protective z68 on the sides as well. The "Metallization on non substrate side" back contact solar cell embodiment has the integrated metallization of the backplane on the side facing away from the TFSS.

Specific examples in which these backplanes may be fit into process flows for forming back contact solar cells are outlined in the manufacturing methods below.

General Structures and Methods for TFSS-Based Back Junction/Back Contacted Solar Cells The above discussion pertained to the choices and combinations pertaining to first and second (backplane) carriers for ensuring high processing/manufacturable yield for TFSS back junction/back contacted solar cells. The following section deals with manufacturing methods and process flows for an entire TFSS based solar cell with these carriers. While depicting process flows, in several cases, the backplane is abstracted. This abstraction may be replaced by any of the several backplane options that were discussed in the above sections. In addition, the combination of the backplane with specific flows may either be used with the template/Porous Silicon (PS) based carrier 1 or the Ingot (or Thick Wafer)/implant based carrier 1. Specific flows pertaining to these two cases will be shown. FIG. 1 shows process flow options and their relations to carrier 1 and carrier 2; however again it should be noted that the process flows in FIG. 1 or the following process flows are descriptive examples and should not be used in a restricted sense. Further, these exemplary process flow embodiments should be interpreted as being able to be used with the myriad backplane options as well as any of the two carrier 1 options. A noted exception to this is that in-situ emitter based process flows may not be used with Ingot (or Thick Wafer)/implant carrier 1 option.

Ex-situ vs. In-situ Emitter.

The process flows shown FIG. 1 may be further categorized into two broad categories of process flows: Ex-situ emitter where the emitter is not formed as an integral part of the epitaxial growth process and is produced after the TFSS is manufactured using techniques such as atmospheric pressure chemical vapor deposition (APCVD) epitaxial growth. And in-situ emitter which is appropriate for the carrier 1 template/porous silicon option and is grown as part of the silicon epitaxial growth of the TFSS (hence, eliminating the need for subsequent formation of emitter). This disclosure focuses on the embodiments with ex-situ emitter formation; however, in-situ emitter based flows may also be applicable in some instances by one skilled in the art. With respect to the aforementioned options of ex-situ and in-situ emitter, the following considerations should be noted.

1. The ex-situ boron doped p+ emitter is formed after the in-situ phosphorous based n-type epitaxial substrate is grown using epitaxy. The patterned ex-situ emitter is formed preferably using the combination of APCVD BSG (glass doped heavily with boron), laser ablation of BSG, followed by drive-in of the emitter.
2. The ex-situ emitter eliminates the risk of epitaxial auto-doping during high-volume manufacturing of solar cells, which is present in the case of in-situ emitter.
3. The ex-situ emitter eliminates the need for pulsed picoseconds laser ablation of silicon to isolate base with the emitter (or to form the patterned emitter and base regions).

General Structural and Manufacturing Method Attributes Shared by the Process Flows.

Specific examples of a class of final back junction/back contacted solar cell structure and methods for manufacturing are detailed below. Note, that the structures and methods are not limited to these specific examples. A wider range of examples may be derived using the aforementioned general carrier methods by those skilled in the related art. For those specific structure and methods detailed herein, identified common attributes include:

1. Common Structural attributes in the disclosed process embodiments:
   a. About 25 μm (microns) to 50 μm epi thickness. More generally, this range can be 5 μm to conventional thicknesses of around 200 μm.
   b. Phosphorous based n-type base doping. In general, this can be other n-type dopant material (for instance, arsenic or antimony or indium) as well as a p-type base such as, but not limited to that formed by boron or gallium doping.

2. Common Manufacturing Method attributes in the disclosed process embodiments:
   a. The processes on carrier 1 (either template of thick wafer/ingot) include:
      i. APCVD-based processes are preferably used in conjunction with furnace anneal to form the ex-situ emitter. APCVD, in general, has both boron silicate glass (BSG) and phosphorous silicate glass (PSG). However, other substitutes for APCVD PSG are also possible and discussed.
      ii. As mentioned above, in another embodiment relevant to the template/porous silicon (PS) first carrier, the ex-situ APCVD emitter may be replaced by epitaxial-based in-situ emitter followed by laser based silicon ablation to isolate the base from the emitter area.
      iii. Pulsed pico-second based laser ablation pattern for emitter-base isolation, emitter and base contacts, and busbarless Al fingers on the cells. In a generic case, the pattern may be defined by other lasers such as nanosecond (ns) laser. In addition, the Al (or aluminum alloy such as Al—Si) fingers on the cell may be of arbitrary design conducive for better cell performance. This includes, but is not limited to, several mini-cells (on a single substrate) with their own busbars connected at a level above the on-cell metallization levels, such as at the backplane.
      iv. An anneal step with optional oxidation, which takes care of both driving and activation of the BSG dopant (and PSG, if present), as well as creating the thermal oxide based back surface passivation. In a preferred embodiment this is done in the same step, however, if need be, in general may be broken down into separate steps. In addition, this may be done either in a tube based or an in-line thermal processing furnace.
      v. A metal 1 deposition step, which may be a vacuum based deposition such as physical vapor deposition (PVD) such as plasma sputtering or evaporation or ion beam deposition, which is then followed by a laser ablation, such as a pulsed picosecond laser ablation step, for patterning said metal 1 layer. Alternatively, the metal 1 (M1) deposition step may entail the direct-write printing, using for instance ink jet, screen printing, stencil printing, or aerosol jet printing to deposit directly a patterned metal ink or paste on the processed TFSS backside.
      vi. If the carrier 1 is a template/Porous Silicon (PS), a preferred process method embodiment is to not use wet processing on it after (between epitaxial growth till completion of the lift-off separation of TFSS attached to carrier 2) because of the risk of TFSS lifting or bubbling prematurely. However, this should not be interpreted in the limiting sense. The disclosed subject matter includes the general case where it is possible to do wet processing or semi-wet processing, for instance, through the use of etching vapors such as HF vapors to remove dielectric films such as the silicate glasses.
      vii. On carrier-1 lamination of backplane and the release of the TFSS from carrier-1 while attached to carrier-2.
   b. The processes on carrier 2 (Backplane)
      i. Post-release wet etch for removing quasi monocrystalline silicon (QMS) layer arising from the processed porous silicon layer. This also includes using wet processing to texture the front surface. In a preferred embodiment, these wet steps are performed in a single step using KOH-based (or NAOH-based) etch chemistry. However, if needed, in general they can be broken down in two separate steps with both steps using KOH based chemistry or the QMS removal step using TMAH-based or a separate KOH-based (or NAOH-based) chemistry. There is also the possibility of just doing QMS removal without texture with either KOH or TMAH (KOH may be advantageous for lower cost reasons). And instead of wet texture either use dry texture based on laser or plasma processing, or no texture and use other means to effectively couple-in broadband sunlight—these "other" means may rely on dispersed nanoparticles such as dielectric particles, or silver or gold particles.

ii. If texturing is involved, a post texture surface cleaning process is a critical step for back junction/back contacted cell. This cleaning step enables formation of a high quality front-surface passivation layer following the cleaning process. A specific cleaning chemistry for this purpose may be based on HF/HCl chemistry and/or ozonated HF chemistry, although more expensive alternates such as the so-called RCA clean can also be used. Performing a diluted HF dip post texture clean and just before passivation is also critical to get lower front surface recombination velocities (hence, higher quality passivation). For the case of an organic backplane material such as prepreg or prepreg with an underlying additional adhesive layer and with a marginal integrity of the backplane during the texture and post texture clean processes, an additional process step prior to the deposition of the passivation layer or layers such as a-Si or a-SiOx (amorphous silicon oxide) plus Silicon nitride is disclosed which is to use a reduced pressure or atmospheric pressure plasma or a stream of radicals (such as hydrogen radicals and/or ions) to remove both organic residue redeposited from the backplane material as well as native oxide. Such processes may be preferably integrated in the initial stage of the passivation tool (such as the PECVD passivation) or alternatively be performed off-line.

c. Low temperature front surface passivation and ARC layer that meets the required device specifications. In general, this includes a passivation layer which is deposited at a temperature which can accommodate processing with the chosen backplane is adequate. The allowable maximum temperature of passivation is dependent on the ability of backplane to withstand this without cracking TFSS, without degradation of the backplane material, and/or compromising the solar cell fill factor and other reliability related parameters. A good passivation is expected at temperatures in the range at or above about 150° C. for PECVD SiN. One example is to use PECVD of thin amorphous silicon (deposited using PECVD at a substrate temperature in the range of about 150° C. to 200° C.) followed by a low temperature SiN deposition (preferably at the same temperature as amorphous silicon or amorphous silicon oxide). More generally, a good passivation must have a very low interface trap density with silicon and the polarity of charge which repels the mirrority carriers away from the front surface. For the n-type material, this embedded charge needs to be a stable positive charge. A subsequent thermal anneal either in a forming gas, a neutral, or vacuum or other suitable ambient at a suitable time after the passivation may be beneficial for improving the passivation quality. Such thermal anneal may be performed at a temperature equal to or higher than the PECVD passivation temperature (up to about 300° C. depending on the thermal stability and CTE-match of the backplane material).

d. Access to backplane metal and its busbars. The specifics of this depends on the type of the backplane. If the backplane is the kind (discussed above) which has integrated or embedded metal foil metallization then the choices are either a pre-made through hole (which would be covered during wet processing) or a wrap around bus bar opening (which would be covered during wet processing). For the backplanes where the backplane metallization is a final processing step, access is not an issue.

Figure 3:
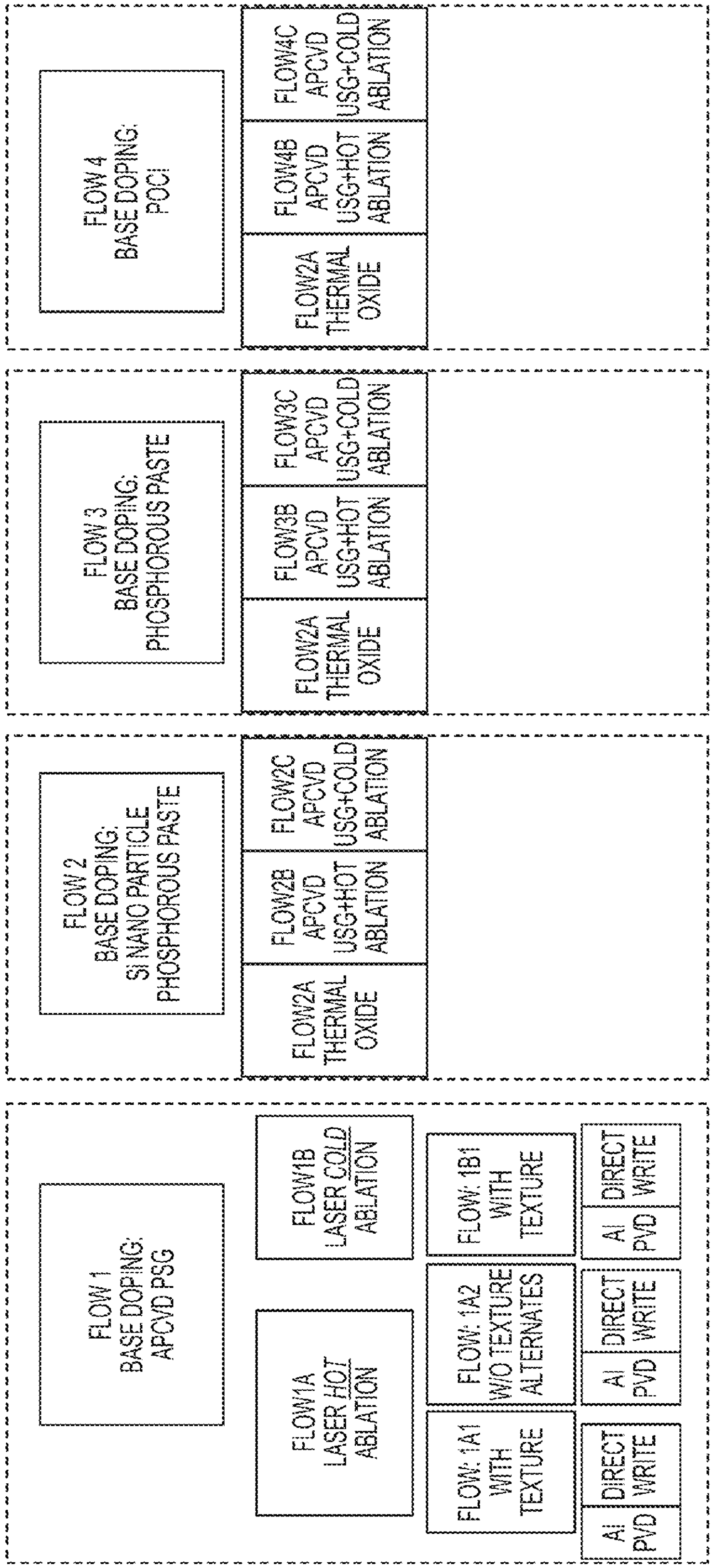
FIG. 3 is a diagram illustrating ex-situ emitter process flow embodiments.

FIG. 3 is a diagram showing for ex-situ emitter process flow embodiments in accordance with the disclosed subject matter. The process flows are divided into four categories Flow 1 through 4 which are distinguished by the differences in the way the base contact is made. All the flows shown in FIG. 3 may be used with either the template/porous silicon carrier 1 or with the bulk wafer Ingot/implant Carrier 1, and with any backplane option outlined in this disclosure.

Flow Option 1:

This process flow uses APCVD PSG to make the base doping. PSG layer is deposited and phosphorus is driven in either using a batch furnace anneal or using pulsed nanosecond laser hot ablation of the PSG layer (in the latter case, to dope the underlying TFSS and to ablate the PSG layer for base contact opening).

Flow Option 2:

This process uses screen printed (or stencil printed) silicon nanoparticle phosphorous or silicon nanoparticle phosphorous ink applied by inkjet (or aerosol jet) printing. This will be followed by a thermal anneal.

Flow Option 3:

This option uses screen printing of the phosphorous paste or phosphorous ink applied by inkjet printing. This is followed by thermal anneal in a batch furnace equipment to drive in the dopant.

Flow Option 4:

This process uses Phosphorous Oxychloride POCl3 as the starting phosphorous dopant material (process is preferably performed in a POCl3 tube furnace). It requires post diffusion phosphorus glass wet etch or HF vapor etch.

Sub-categories of the four flow option categories of FIG. 3 are detailed below.

Flow Option 1: APCVD PSG Based Base Doping.

Figure 4:
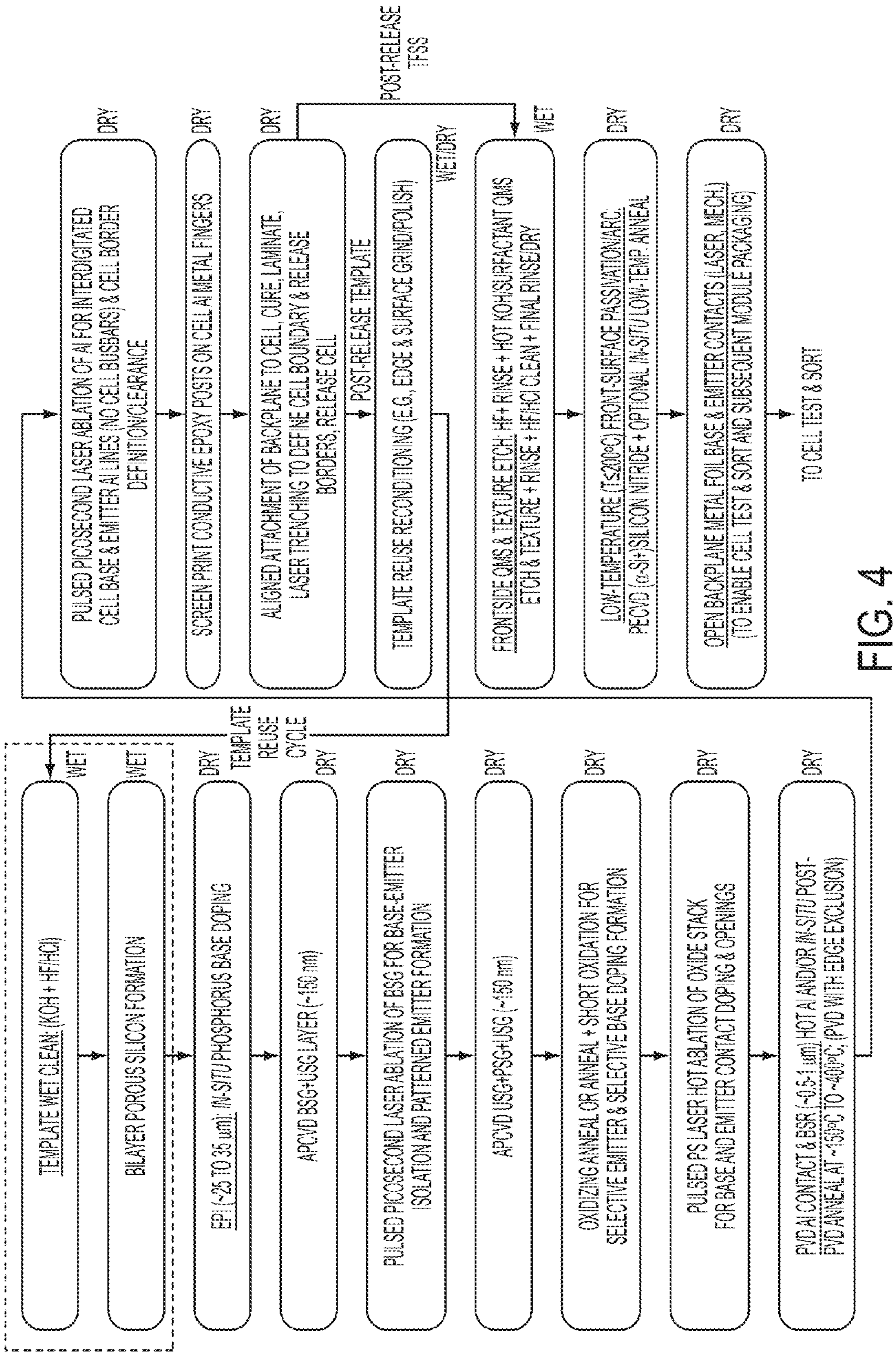
FIG. 4 through 8 are back contact solar cell manufacturing process flows using an epitaxial substrate.

There are two sub-categories in this class: a) Hot ablation using pulsed ns laser processing to drive base and emitter contact using laser (and to concurrently open the base and emitter contact holes), b) Cold ablation (preferably using pulsed ps laser processing) where furnace anneal makes the base contact diffusion regions. FIG. 4 is a process flow using hot laser ablation (preferably using pulsed ns laser processing) with selective emitters for manufacturing thin back junction/back contacted solar cells with two carriers (corresponding to flow option 1A1 in FIG. 3). The process starts with cleaning of a mother template crystalline silicon wafer. In one example this could be a 200 mm diameter, 200 μm to 1.2 mm thick semiconductor standard wafer. In another example, this can be a 165 mm side full square, 200 μm to 1.2 mm thick crystalline silicon wafer. The template is cleaned using, for example, chemistries such as KOH, and acids such as HF, HCl or combinations thereof (HF/HCl), and/or a chemistry comprising ozonated HF. The cleaning can also be performed using any other chemical cleans known for cleaning metallic and organic impurities. Another example is RCA clean; however, RCA clean is more expensive for solar cell manufacturing purposes. The cleaning is followed by bilayer or multi-layer (at least two different porosities) porous silicon formation using electrochemical etching (preferably in HF/IPA). The first layer (or the top layer) formed is a low porosity layer (for example, this can be a layer with a porosity in the range of, but not limited to, 15-40%). This is followed by the second layer (buried layer) with a higher porosity (for example, this can be a layer with a porosity in the range of, but not limited to, 45-70% porosity) which is formed underneath so that it is closer to the template and separates the lower porosity layer from the template. Other configurations such as monolayer or trilayer or graded-porosity porous silicon are also possible, in general, as long as the layers facilitate several key requirements including: an excellent top epitaxial seed layer to enable formation of a good quality epitaxial silicon layer on top of the low porosity porous silicon layer, a reliable and high release yield due to on-demand breaking of the high porosity layer for TFSS lift-off separation from the template, and no premature release or bubbling of the TFSS from the template carrier during the on-template processing steps (preferably but not limited to the all-dry on-template processing steps after formation of TFSS till lift-off separation). The porous silicon formation process is followed by a drying step and then hydrogen pre-bake and epitaxial silicon growth, preferably in the thickness range of about 5 μm to about 50 μm. Both the hydrogen prebake and epitaxial growth process are preferably performed in the same An integral part of the growth process is the selection of the pre-bake condition. During the hydrogen pre-bake process step (preferably in-situ prebake in the epitaxial growth reactor), not only the pre-bake removes the native oxide and other potential surface contaminants, is also causes a reflow and solid phase diffusion of silicon such that the surface pores of the porous silicon seal at the surface of the low porosity layer (due to the driving force caused by reduction of the surface energy of low-porosity porous silicon), hence, producing an excellent epitaxial seed layer for subsequent epitaxial growth of a high quality TFSS layer. This, in turn, facilitates better epitaxial growth and formation of high-quality in-situ-doped TFSS layer with high mirrority carrier lifetimes. The epitaxial growth process is then followed by BSG deposition, preferably using an in-line atmospheric-pressure CVD (AP-CVD) reactor. The BSG layer ultimately serves as the boron source for forming the emitter regions by thermal diffusion of boron from BSG into the underlying TFSS using thermal anneal. Although, 150 nm thickness is shown in FIG. 4, this may be adjusted per requirements of the back mirror and emitter doping. In practice, the BSG thickness may be in the range of about 50 nm up to 250 nm and the BSG layer may be capped with an undoped layer of oxide (with an undoped glass thickness in the range of about 10 nm to 100 nm). The BSG layer deposition is followed by picoseconds (ps) pulsed laser ablation of the BSG layer, this laser ablation stops at silicon, thus does not damage the underlying silicon (negligible heat-affected zone compared to pulsed ns laser ablation). The ablated area ultimately becomes the base part of the device—where the emitter will not be diffused and the doped base contact regions will be exposed. Depending on the device design, this area fraction (fraction of base openings) can range from about 3% up to about 20% (corresponding to emitter area ratio in the approximate range of 80% to 97%). Larger emitter area fractions are preferred for higher cell efficiencies and this is enables through the use of pulsed ps laser processing. A very large opening, thus a large fraction of base results in mirrority carrier having to travel larger distances to get to the emitter. This results in more recombination dragging down the cell conversion efficiency (also known as electrical shading). The narrower size of the width of the opening is limited by being able to align and put base diffusion and contact areas inside this area. The laser ablation of the BSG is optionally followed by APCVD of undoped silicate glass (USG), followed by PSG/USG, thus forming a trilayer. The underlying USG layer, depending on its thickness, controls the extent of phosphorous diffusion during anneal. A thicker USG layer will prevent phosphorous diffusion, and will result in a true separated junction (where emitter and base diffusion regions do not touch) with no back surface field (henceforth, BSF). A BSF layer can help increase the open circuit voltage of the device (Voc). If the underlying USG layer is thin (or not deposited at all), some phosphorous diffuses into the TFSS surface region during the thermal annealing step. This, in turn, results in both a BSF formation as well as a so-called abutted junction cell structure. The phosphorous and Boron concentrations, respectively in the PSG and BSG layers, are controlled to yield the appropriate doping concentrations the in emitter and the base regions. Depending on the cell design requirements, these dopant concentrations in the BSG and PSG layers may be in the range of about 2% up to 7%. After USG/PSG/USG is deposited (after the pulsed ps laser ablation direct patterning process), the device is then processed through a multi-functional furnace anneal step where there may be both an inert anneal in a nitrogen (or inert gas) ambient as well as an optional oxidizing anneal, optionally followed by a low-temperature in-situ gettering anneal (preferably performed in the temperature range of about 550° C. to 650° C. to getter metallic contaminants such as iron), optionally followed by a lower temperature in-situ forming gas anneal (in the temperature range of about 400° C. to 500° C.). The goal is to optimize the conditions of these in-situ anneal steps within the same multi-functional furnace anneal process recipe such that a good quality back surface oxide passivation, desirable phosphorus and boron dopant drive-ins and dopant activation, gettering of metallic impurities and further improvement of the backside passivation properties are accomplished in a single tool. It can also be advantageous to have a thin layer of aluminum oxide Al2O3 at the immediate back surface, as it tends to enable the incorporation of a negative charge, which in turn repels electrons, the emitter mirrority carriers, from that surface and is capable of providing very good surface passivations in that region. Such Al2O3 layer can be deposited in situ and as a first step in the same APCVD tool used for deposition of the BSG layer. Flows incorporating Al2O3 are disclosed later in this disclosure.

As shown in FIG. 4, the anneal step is followed by picosecond pulse laser ablation to open contacts (Other types of lasers such as pulsed ns lasers can also be used). However, a special laser ablation processes called hot laser ablation can be used which performs the dual role of not only opening the contacts to both emitter and base but at the same time rapidly driving in the respective dopants into TFSS silicon surface in the contact open area. Thus, base contacts are formed through the USG/PSG layer with phosphorous driven from PSG into silicon (where PSG is in contact with silicon), whereas, the emitter contacts are formed through USG/PSG/USG/BSG stack and Boron is driven in (from the BSG layer where it is in contact with silicon or separated from silicon only with an ultrathin layer of Al2O3). Hot ablation processing is able to create highly doped n+ and p+ contact areas under where the metal will eventually make contact with silicon (for base and emitter contact metallization). This is desirable for both decreasing contact resistance and for reducing recombination velocity at the metal contact. Thus, locally high dopant regions may be created, while maintaining lightly doped regions (dictated by the anneal) such as a more lightly doped emitter region (desirable for higher cell efficiency) under the passivation and away from the contact regions. This ensures an independent optimization of doping concentrations in regions close to the contact from regions away from contacts and enables effective formation of a selective emitter and base which in turn is beneficial for higher Voc, better infrared quantum efficiency, and higher overall cell efficiency Laser hot ablation is followed in one embodiment for metal 1 by physical vapor deposition (PVD) based deposition of a thin aluminum or Al—Si layer (such as with plasma sputtering or evaporation). This aluminum (Al) layer serves the function of both back surface reflector (BSR) in conjunction with the backside passivation dielectric stack as well as is instrumental in making a good electrical contact to the device base and emitter regions. The contact resistance of Al (or Al doped with Si) PVD to both the doped emitter and the base contact regions is critical. The PVD process may also be done either as a hot PVD (depositing the Al layer while the cell substrate is heated to a temperature in the approximate range of 150° C. to 450° C., or a post PVD anneal may be performed between 150° C. to 450° C. if needed. This is to ensure better contact resistance (hence, higher fill factor) as well as take advantage of a better passivation in presence of Aluminum (Al anneal) and H2 from the APCVD layers (effectively performing a forming gas anneal to improve the backside passivation and to improve the cell Voc). Subsequently, other PVD metal layers may be deposited depending on the needs of the adhesion, reflectivity requirements and laser metal isolation requirements. In one rendition, combination of NiV (or Ni) and Sn can also be sputtered as second and third layers on top of Al using PVD and in situ after sputter deposition of Al. The function of this metal stack with a top layer of Sn will be to ensure that the adhesion of the backplane metal or M2 is not compromised (hence, improving the cell fill factor and long-term reliability). In a variation of this stack, the Al/NiV/Sn stack can be annealed below the melting point of Sn to give a solder like anneal between Sn and NiV. Subsequently, pulsed picoseconds laser is used to isolate and pattern both base and emitter metal areas. A typical design is interdigitated finger design. In a preferred embodiment, no busbars and only interdigitated fingers are defined on the cell for M1. This minimizes electrical shading under the busbar and increases cell efficiency. However, other embodiments with busbars as well as with other designs such as mini-cells can be defined with the metal ablation laser process. In general, the specific dimensions including pitch of emitter/base lines is dictated by several device design considerations including, but not limited to, base and emitter diffusion resistance. PVD could entail vacuum sputtering, vacuum evaporation, ion-beam deposition (IBD), atmospheric arc spray and other thermal physical vapor coating methods. In a different and less preferred embodiment, screen printing of resist, followed by etch can also be used to isolate base and emitter patterns. However, there is a risk in this approach due to performing wet processing on template (for metal etching and resist stripping wet steps).

In another variation of the metallization process, instead of using PVD metal (which includes vacuum techniques such as sputtering, evaporation etc), prevalent metal screen printed approach can be used. This approach has the advantage of not using vacuum process which tends to be both expensive as well as present the danger of dislodging the epi substrate prematurely from the mother template due to the delamination pressure from the porous silicon interface while the cells are in vacuum. In the metal screen printed embodiment, in general, a base and an emitter metal is screen printed (this may be a single screen print process using a single aluminum paste material) and fired to make metallization contact to the emitter and base diffusion regions, where the base and emitter diffusions are created using several possible techniques, one of which is described above and several others will be detailed subsequently. The rest of the process flow remains similar. The screen printed metal or metals can be either co-fired or sequentially fired, and may be the same for base and emitter or be dissimilar. Further, the screen printed metals may be fritted, lightly fritted, or frit-less (such as a suitable fritless aluminum paste). Specific examples of this process may entail screen printing a frit-less Al metal paste on both emitter and base and co-firing using the same process step. The M1 metal pattern will depend on the underlying cell design; however, in general, it can include segmented metal lines to reduce wafer level stress and to reduce the risk of microcrack formation in TFSS. Another example of this process could entail screen printing and firing Ag for the phosphorous contact, while screen printing and firing Al for the base contact. These screen printed lines or fingers can be continuous or segmented. In this rendition, if it is segmented on the base, the PSG may be deposited selectively in the base area, thus, creating pockets of base contact doping. Subsequently, the Ag metal may be fired through the doping sources (PSG in this case) to create contacts within the base pockets. This approach can have efficiency advantage by ensuring much smaller base contact mirrority carrier recombination, hence improving both Voc and Jsc of the solar cell. It also obviates the need for opening base contact using laser process. This segmented metal design is possible only because of the versatility of the backplane. The backplane allows a vertical draw of current while summing it at the backplane layer. In case there is difficulty in providing backplane level connection at the same tight pitch as the Ag metal segmentations (which may be dictated by other device constraints), a continuous metal can be screen printed (for example Al) on top of Ag segments at the same time that the emitter metal is printed. Care has to be taken to ensure that this metal (Al) does not penetrate through the PSG oxide which may be avoided using the right choice of the metal paste.

Although, not explicitly mentioned in the following sections dealing with other variations of the process flow, it is understood that the direct write metal screen printed option can be utilized in lieu of the PVD metal option for the subsequently discussed process flows as well.

In the specific embodiment shown in FIG. 4, the next step is to screen print conductive material (as an example, an epoxy material) on to the patterned metal lines on a cell. If necessary, a dielectric adhesive layer may also be printed to protect the cell from shunting. This is understood to be an option, if necessary, for all the process flows discussed subsequently that involve a conductive adhesive (although, not explicitly shown in the process flow Figures). This is followed by alignment, attachment and lamination of the backplane to the metal lines. In a separate embodiment, the screen print of the conductive and/or dielectric material may be performed on the backplane metal. Subsequently, the backplane assembly with the conductive material may be aligned and attached to the metal lines on the template. The advantage of printing conductive epoxy on the backplane is that there is no screen print step on the template, which ensures a complete contact free processing on the template and increases mechanical yield. The challenge is that the alignment becomes more stringent.

And although several types of backplanes were discussed in the earlier section, the two embodiments are detailed as follows:

a. Face to Face Bond: A thick interconnect stack, made with patterned Al foil of thickness preferably between 50 μm to 300 μm, helps conduct the electrical current laterally without much resistive losses. The conductive foil is attached to the backplane which may be either glass or plastic using a PV qualified, compliant encapsulant material, for example, but not limited to Z68. The Al foil, Z68, and the backplane material (for example glass or plastics) is referred to as the backplane assembly. The assembly is attached to the template using the aforementioned conductive epoxy such that the interdigitated pre-patterned foil pattern attaches face down on to the template. In the following two configurations the dimension of the Al foil patterns may be different. In the first configuration the Al foil lines are parallel to the patterned lines on the template. In the second configuration the backplane Al lines are orthogonal to the metal lines on the template. In orthogonal case, to avoid shorting of the emitter and base lines only alternate template metal lines make contact to the overrunning backplane foil lines in a checkerboard cross-points pattern. The orthogonal configuration may be advantageous as it allows the backplane lines or fingers (M2 fingers) to be wider and less in number, making its manufacturing manageable and also reduce its cost. The parallel lines have to conform to the pitch/dimensions of the on-template metal lines, which, in turn, are restricted by device design. In a thin cell case, this pitch is further limited because of a high sheet resistance of the base for a thin cell. Several precautions are suggested to ensure that there is no shorting between the orthogonal lines at the crossing junctions where no contacts to M1 are desired. This may be ensured by flowing the Z68 or another suitable dielectric encapsulant material under the Al foil during lamination. The flow can be enhanced if the Al foil is perforated. Another way to avoid the risk of shunting with the orthogonal configuration is to dummy print dielectric (non-conductive) posts in the negative checkerboard pattern. This ensures that at the cross-points, where the contacts are not desired, the over-running Al foils are supported by the non-conductive posts, and consequently, it does not sag to touch the on-template metal line.

The current still needs to be drawn out to the top of the backplane from the face down side. Following are two general schemes for this: firstly, to wrap the Al foil around the edge of the backplane on to the other side (henceforth, Wrap-around Busbars). Risks with this scheme include difficulty in protecting the wrapped foil during some of the subsequent steps. In the second scheme, a few through holes are drilled and current is accessed at these locations from the underlying foil. Several ways to create these holes are disclosed herein.

b. A second configuration of the backplane does not have any Al foil. The backplane assembly consists of only the backplane material (most likely a polymeric or plastic material, or possibly glass) and Z68 or like material. A polymeric or plastic material sheet may be advantageous over rigid glass because it is easier/cheaper to drill more holes through it, and it also makes the resulting solar cells flexible or semi-flexible (hence, also enabling lower cost flexible module packaging of the cells). The challenge with polymeric or plastic backplane is that the subsequent steps with plastic may require capping the temperature to a lower values (for instance, no more than ~150° C. up to 300° C.) as it has a higher CTE mismatch with silicon compared to glass (unless made with embedded low-CTE fibers or particles). The holes are drilled only through the backplane, but not through Z68. During subsequent wet and dry processing, the Z68 cover protects the underlying device. Finally, Z68 is opened and the module assembly is used to directly draw current from the underlying cell. This renders the cell cost to be dramatically cheaper, while requiring a somewhat more complex assembly process in the module.

Although, the process flow remains similar with either of the backplane embodiments discussed above, the Al foil configuration is detailed in the remaining process flows. Backplane assembly is attached to the cell/template (FIG. 4) and is laminated and cured. This is followed by a laser trench to define cell boundary and release boundary. Subsequently, a mechanical release is performed using available techniques such as mechanical release (MR) or sonicated mechanical release (SMR).

After release, the template is cleaned and send back for reuse for porous silicon and epi for the next Reuse. The TFSS attached to the backplane assembly (which is the second and the permanent carrier) is now cleaned on the QMS (or porous silicon) side and textured. In one specific embodiment, this may be performed in one shot using hot KOH based chemistries such as KOH/SCD or KOH/IPA combination (wherein KOH may be replaced with NaOH). This is followed by post texture clean which in one case can be done using HF/HCl combination. Subsequently, the TFSS is taken for its final process step on the sunny-side which is deposition of the (hydrogenated) SiNx ARC and passivation layer. Because of the presence of backplane assembly, the maximum temperature of this process is limited to a low value which may be in the range of 150° C. to 300° C. depending on the choice of the backplane material. A method by which a satisfactory passivation may be achieved at low temperature for back contacted cells is discussed in an earlier passivation. It suffices to mention that this will involve excellent cleaning post texture and deposition of a thin (e.g., 3 nm to 10 nm) amorphous silicon (a-Si) or amorphous silicon oxide layer before SiN. The SiN preferably has to be rich in positive charges to repel the positively charged mirrority carrier holes away from the surface and reduce surface recombination The final step in the process flow of FIG. 4 is to open the access holes in the Z68 material through the already existing holes in the backplane. This is for vertically drawing out (or in) the emitter and base current from the Al foil. In one specific embodiment, the through-access holes in Z68 are created using hot solder material which burns through the Z68 material, making contact to the underlying Al foil. Subsequently, the solder can be used for module assembly. In another embodiment, the Z68 (or another suitable encapsulant) material can be exposed to a quick radiation (potentially IR), which pulls it back and opens the access point to Sn or solder alloy. In yet another configuration, the holes are drilled either only in Z68 or in both glass and Z68 at the end using laser. In yet another configuration, the holes are drilled through both Z68 and glass at the time of backplane assembly, but the underlying device is now protected through from the texture bath using the single sided texture tools or by a temporarily tagging Z68 on top of the holes.

Figure 5:
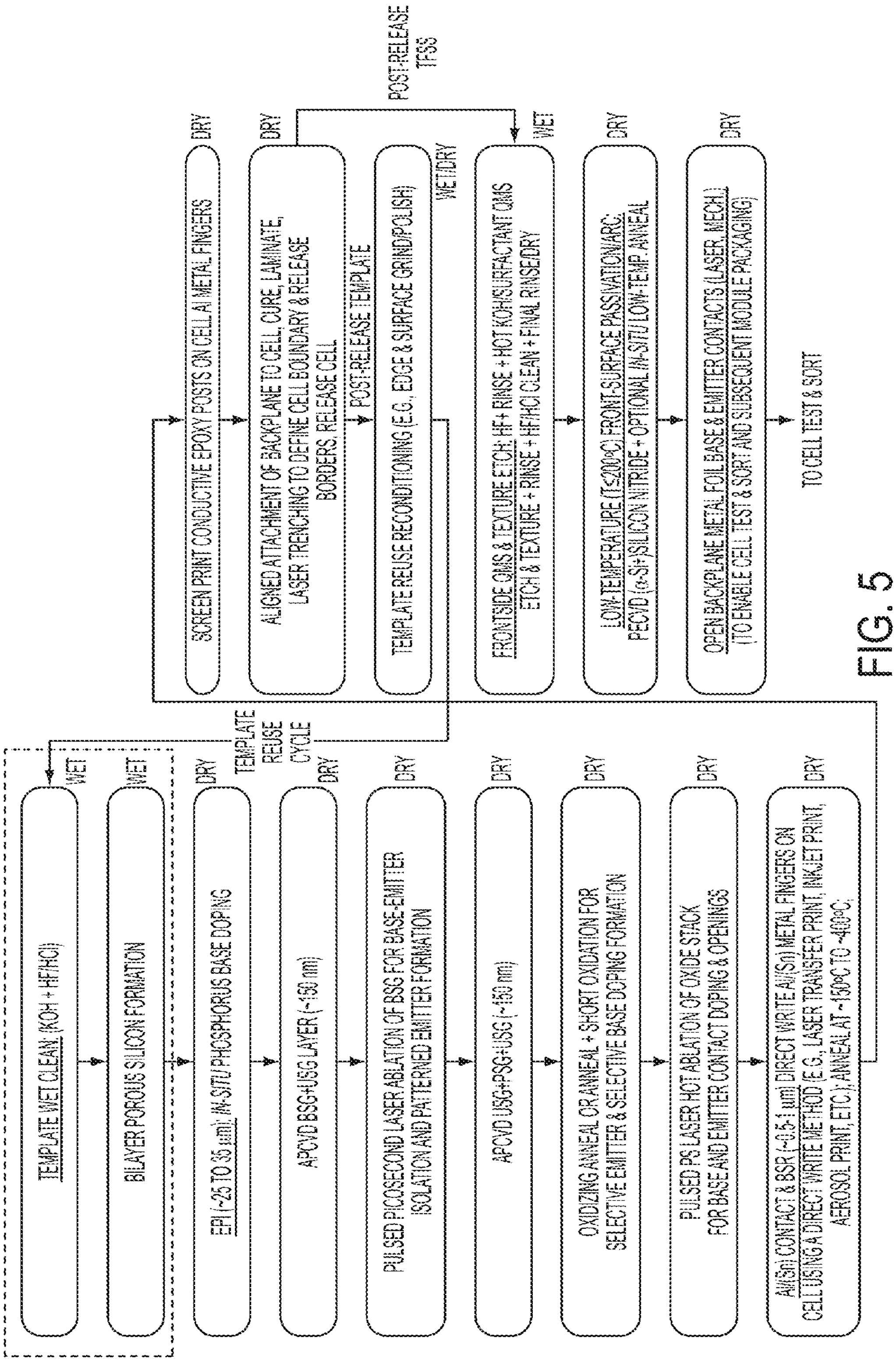

FIG. 5 is a representative selective emitter and hot ablation process flow of this invention similar to that depicted in FIG. 4 except using direct metal write techniques (corresponding to flow option 1A1 in FIG. 3). Direct write techniques can eliminate the need for the PVD metal deposition and the subsequent laser metal isolation steps. As a variation of the process flow shown in FIG. 4, the PVD metal deposition followed by laser metal isolation may be replaced by any of the numerous direct metal write techniques. These may include, but are not limited to screen printing of one or more metal pastes, inkjet/aerosol printing of one or more metal based inks and laser transfer printing. These direct metal write techniques may subsequently be followed by higher temperature anneals.

Figure 6:
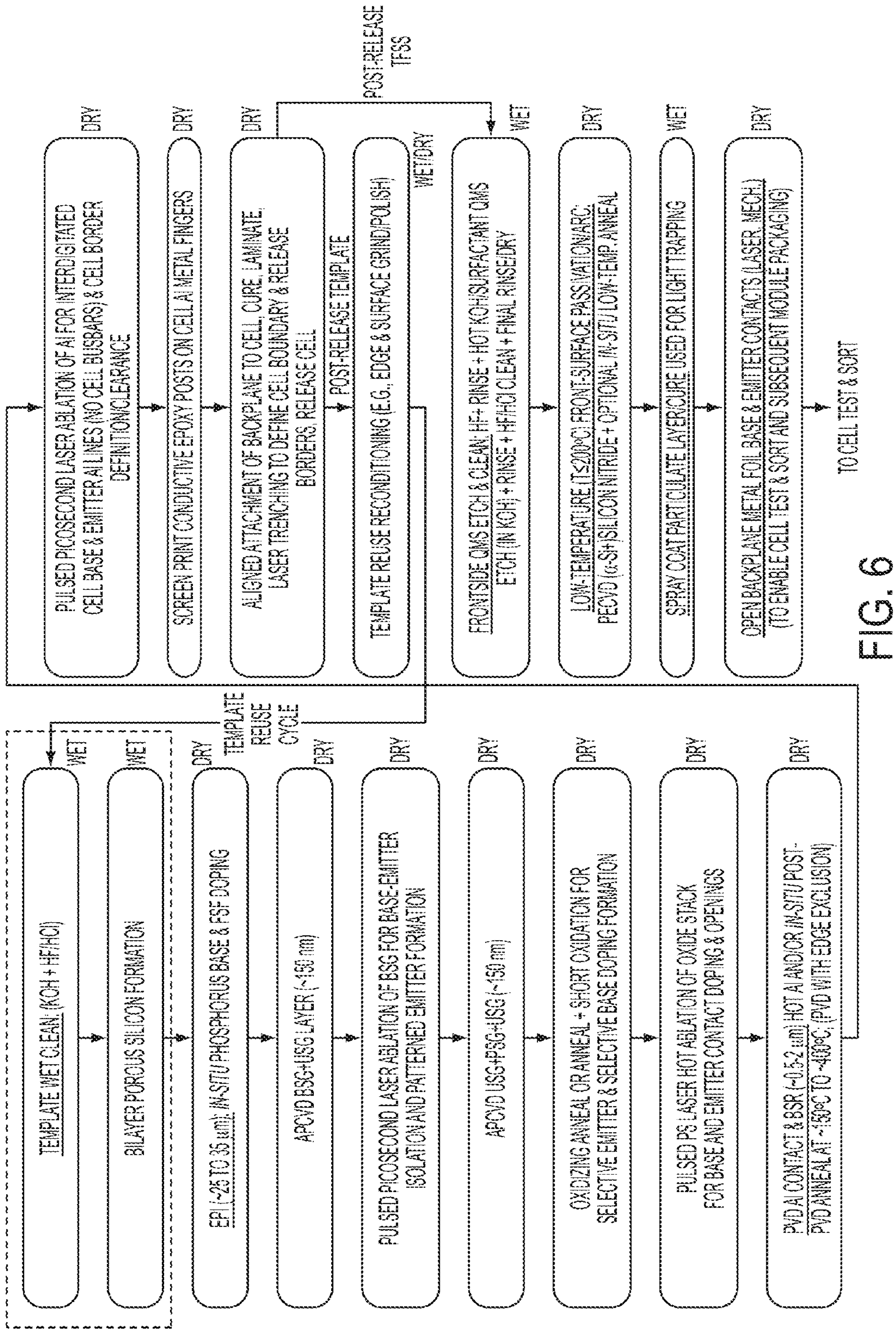
Figure 7:
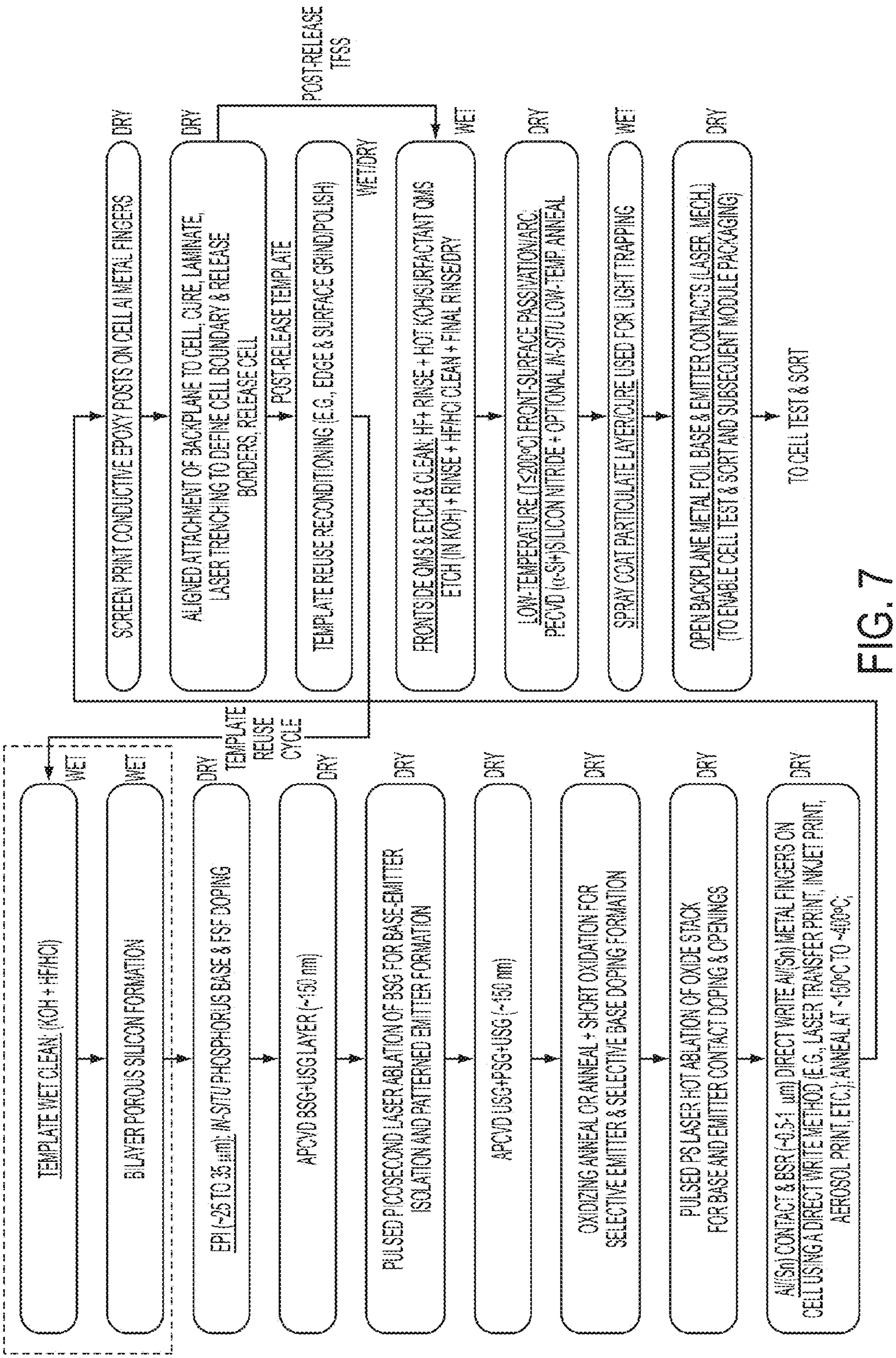

FIG. 6 and FIG. 7 are two selective emitter and hot ablation process flows paralleling FIG. 4 and FIG. 5, respectively, with a difference that the flows detailed in FIGS. 6 and 7 allows formation of an in-situ front surface field (FSF) during epitaxial silicon growth by eliminating texture on the front side. Thus, FIGS. 6 and 7 correspond to flow option 1A2 in FIG. 3. An advantage of the FSF is that it helps reduce base resistance, increase Voc by reducing the front surface recombination velocity (reduced FSRV). An idea behind this no texture flow is to protect the in-situ-doped front surface field. After doing QMS removal (small amount of silicon removal from the front), the flow moves directly to passivation without performing texture. The function of texture in terms or light trapping is accomplished by an additional subsequent step following the front passivation. These steps entail depositing, in one instance spray coating, a suitable dielectric or metallic particulate layer and curing.

FIG. 6 shows PVD metal stack deposition while FIG. 7 shows direct write metal techniques. FIG. 6 depicts the process flow with PVD metal deposition which has an in-situ front surface field achieved using a textureless process. Light trapping is achieved using particulate layer on the front side of the cell. FIG. 7 depicts direct metal write instead of the PVD metal plus laser isolation methods shown in FIG. 6.

Figure 8:
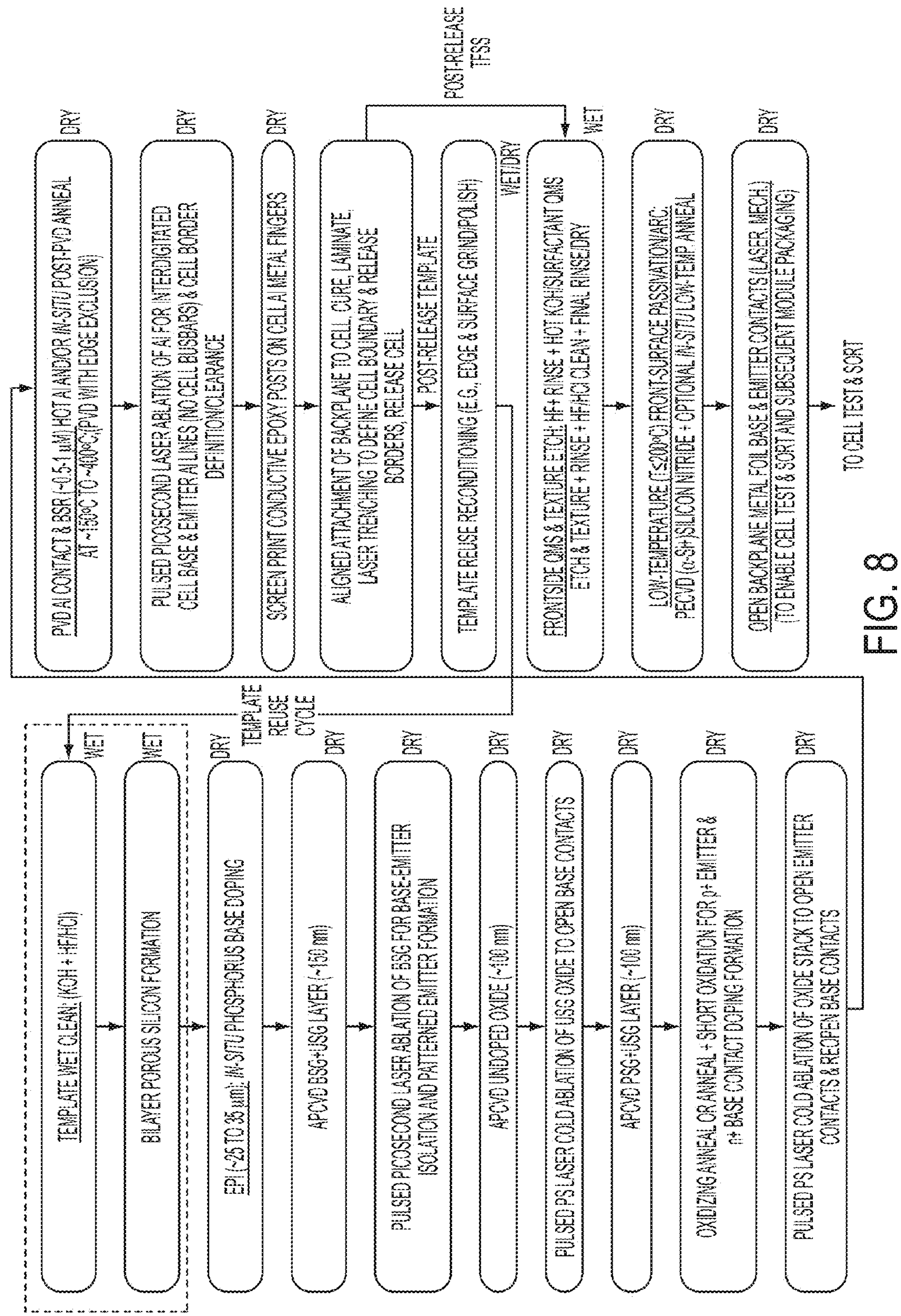

FIG. 8 is an embodiment of a process flow corresponding to flow option 1B in FIG. 3. This flow is similar to the flow outlined in FIG. 1 with variations discussed above, except for one difference—the flow in FIG. 8 uses cold ablation (preferably using pulsed ps laser) instead of hot ablation. The backend steps are similar to Flow Option 1A in FIG. 4 with a few modifications of the initial on-template steps. The process of cold ablation may modify a few steps on the template. As shown, the flow is identical up to laser ablation of the BSG layer to isolate emitter and base diffusion areas. This laser step is followed by deposition of APCVD USG layer only instead of a USG/PSG/(USG) stack (as may be used in the case of hot ablation process). Subsequently, USG layer is ablated using laser ablation process to create phosphorous doping opening. This is followed by the PSG/USG (with USG cap on top of PSG) stack deposition. Now, the thermal oxidizing anneal and drive is performed. This ensures the formation of the emitter junction, formation of the base doping in silicon, and back surface passivation with thermal oxide. The next step is to open emitter and base contacts using cold pulsed ps laser ablation. A difference from hot ablation is that in the case of cold pulsed ps laser ablation the laser does not have the concurrent burden of driving the dopant in (this has already been done for both base and emitter using high temperature anneal). The laser only opens contacts and stops at silicon with negligible damage to silicon. Although cold laser ablation may be considered an easier manufacturing process, hot ablation holds at least two advantages. First, it reduces the number of steps by two which can provide cost savings. Second, it requires only aligning the base contact to the emitter/base isolation area while the cold ablation requires aligning first the USG open area to the emitter/base isolation area and then aligning the base contact to the USG open area. For a given alignment capability and contact sizes, cold ablation will require starting with wider emitter/base isolation area. Subsequent process steps shown in the flow FIG. 8 are similar to the flows previously depicted.

Figure 9A:
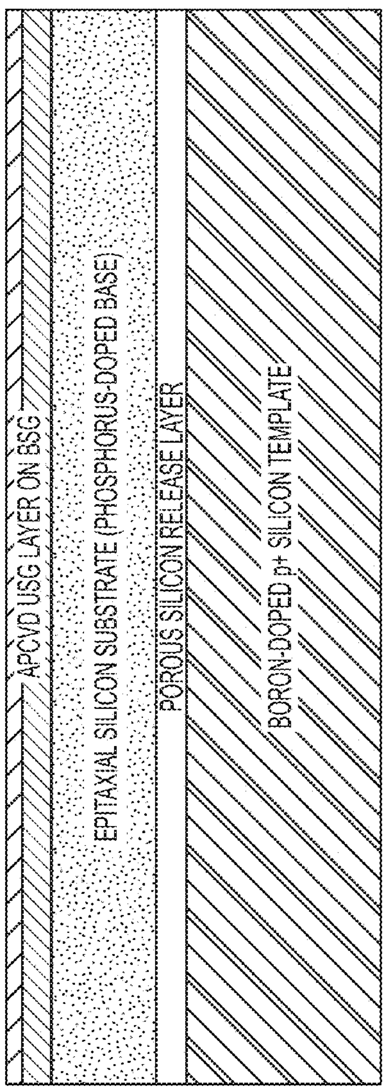
FIGS. 9A through L are cross-sectional diagrams after processing steps of a back contact solar cell.
Figure 9B:
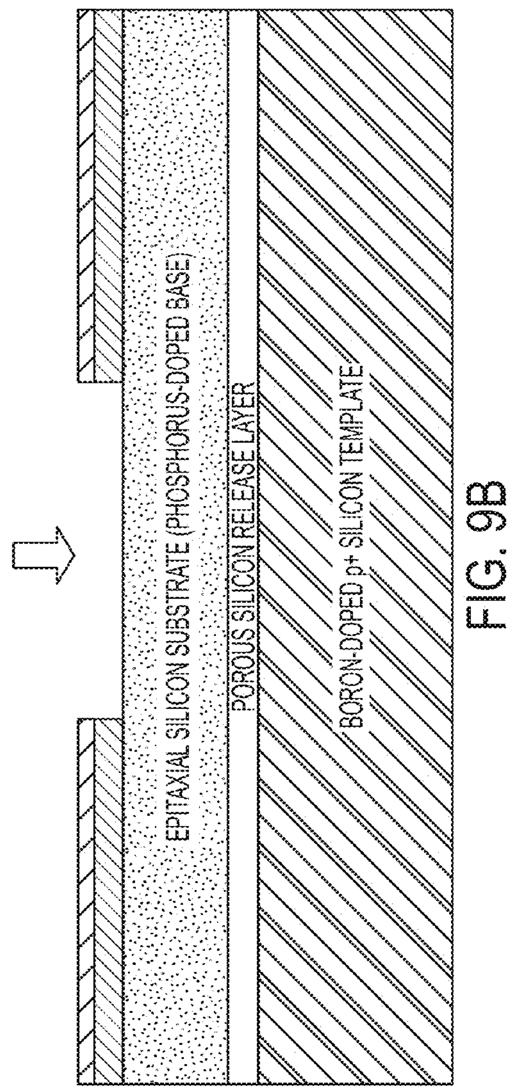
Figure 9C:
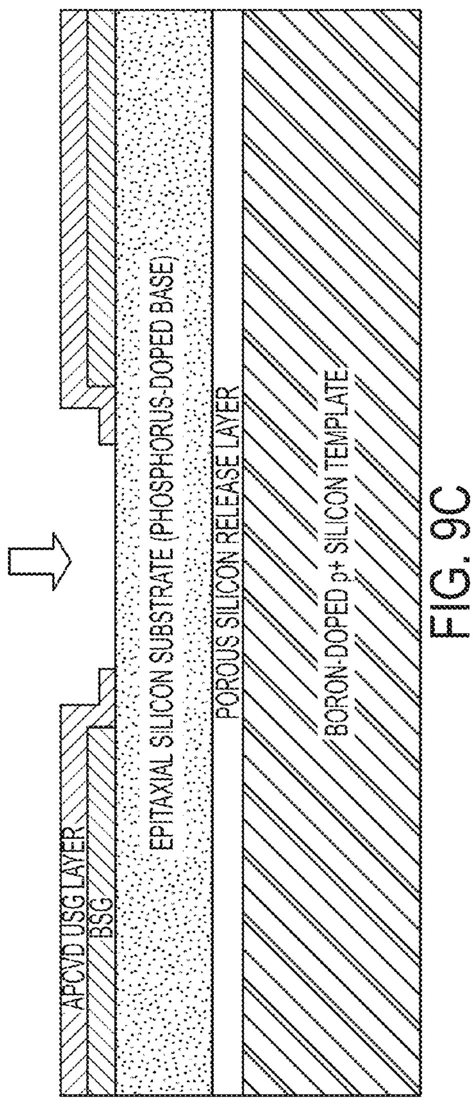
Figure 9D:
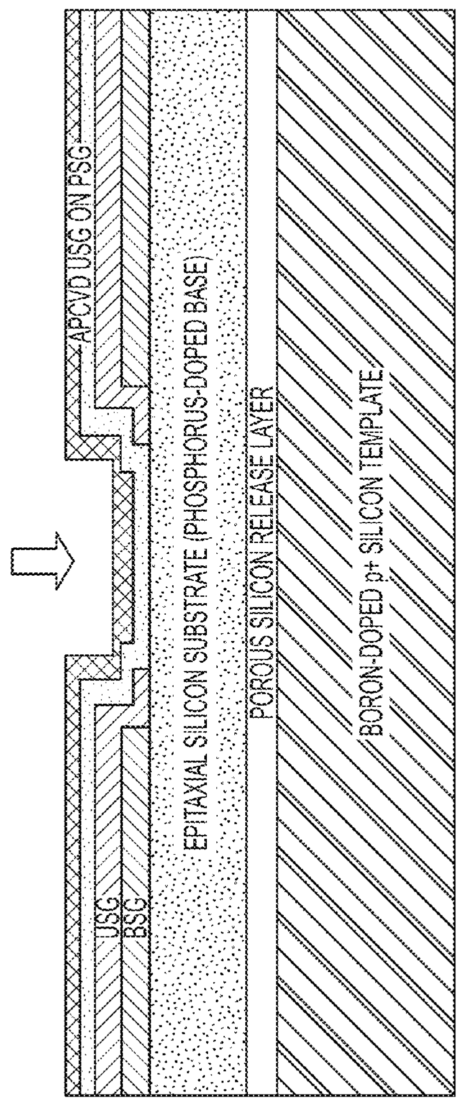
Figure 9E:
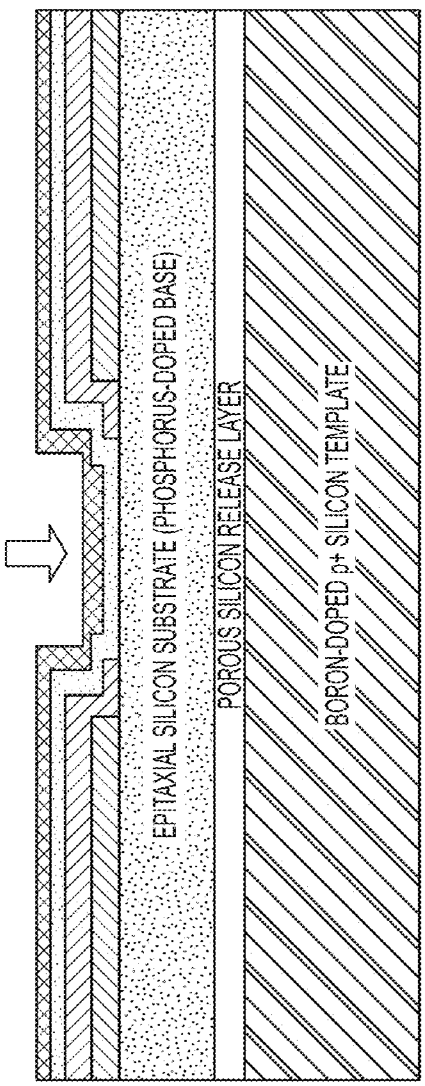
Figure 9F:
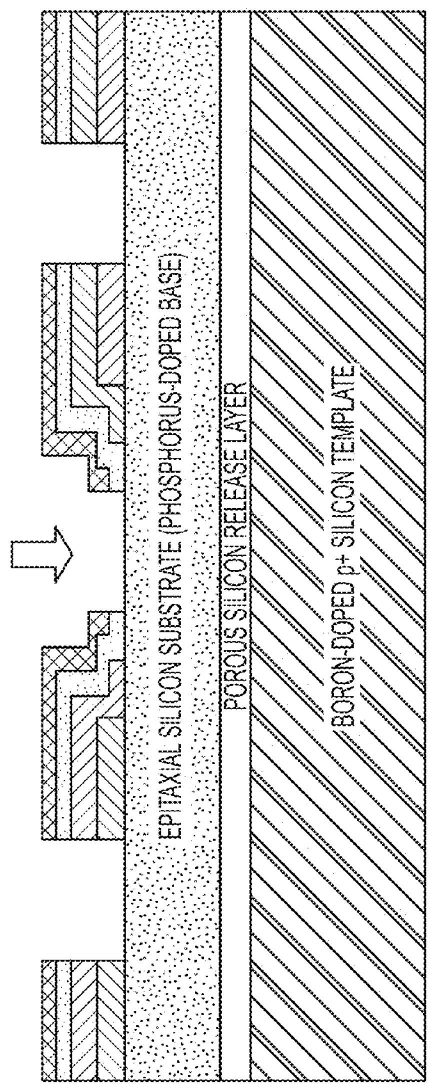
Figure 9G:
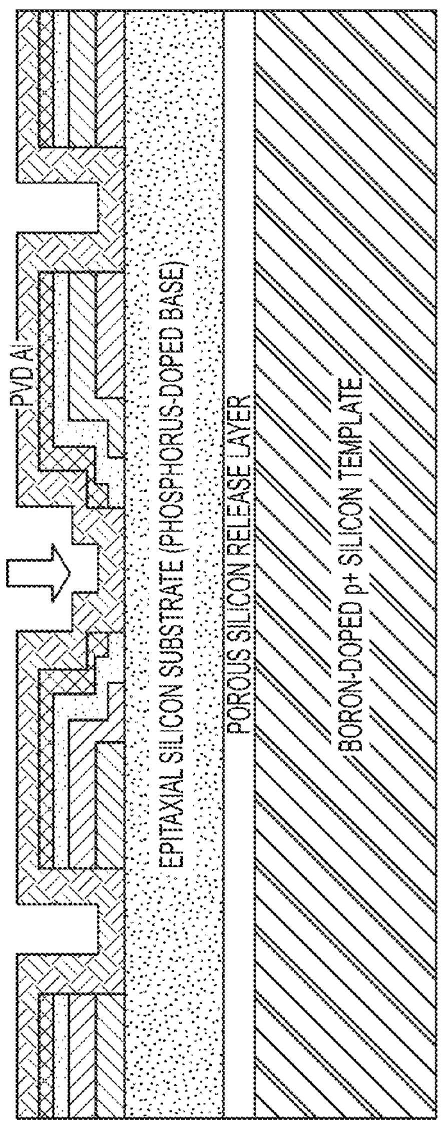
Figure 9H:
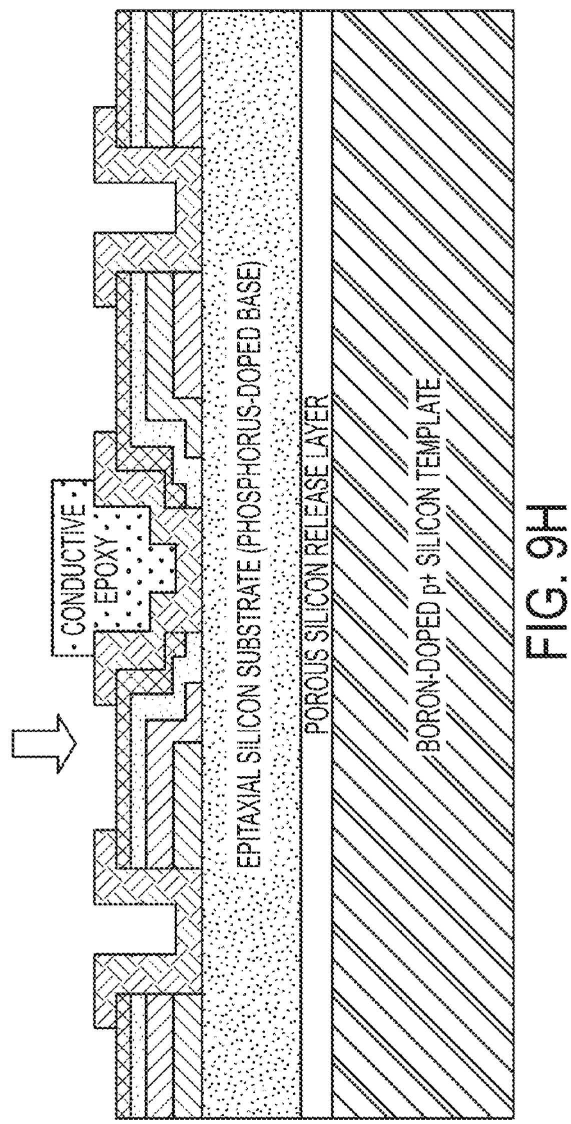
Figure 9I:
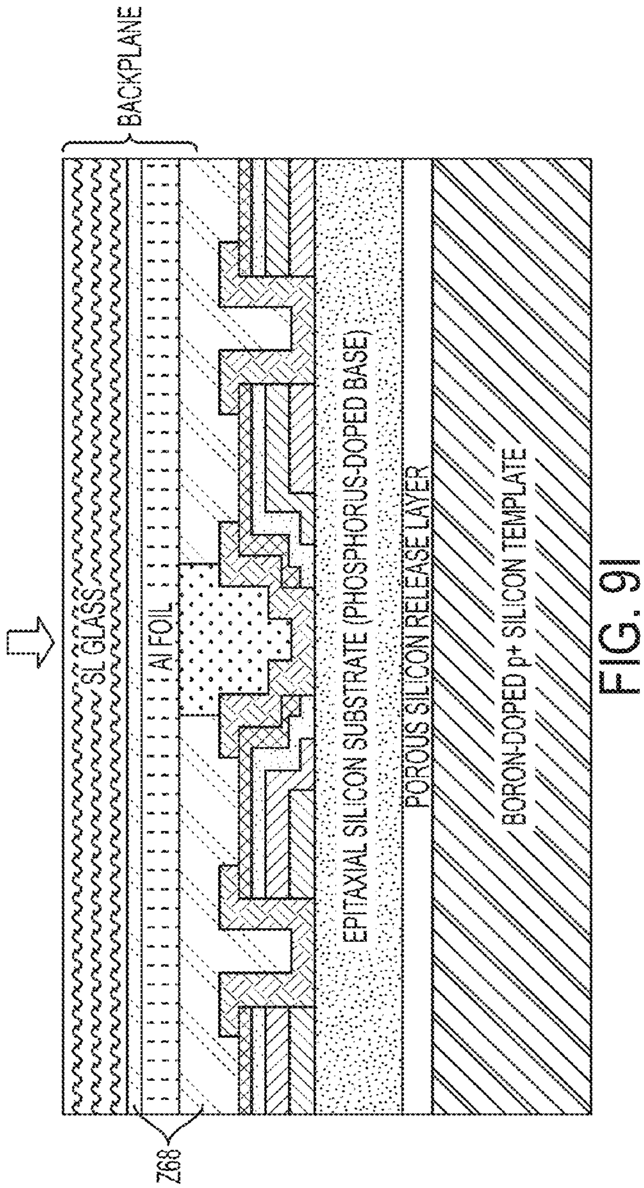
Figure 9J:
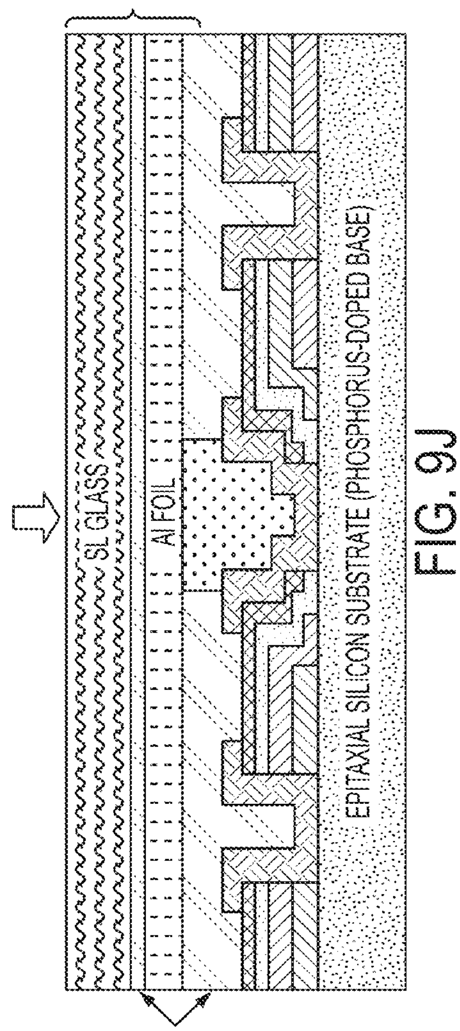
Figure 9K:
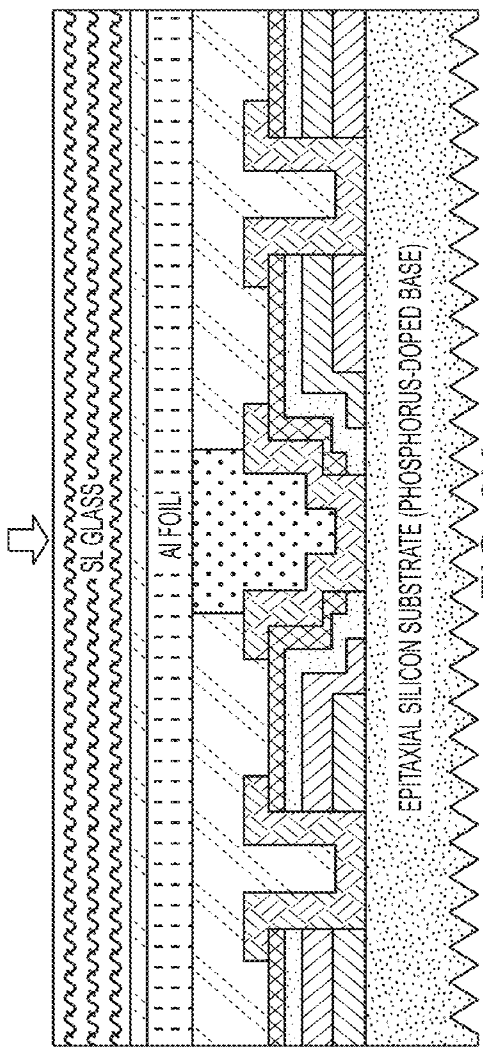
Figure 9L:
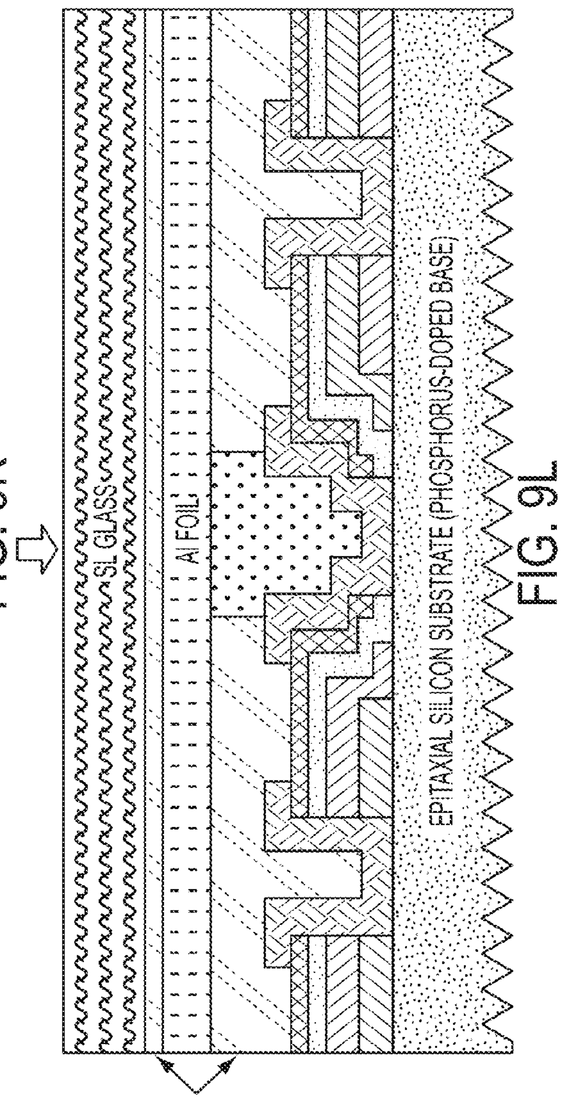

FIGS. 9A-L are cross-sectional diagrams depicting major fabrication steps of the cold ablation flow of FIG. 8. (corresponding to flow option 1B in FIG. 3). FIG. 9A shows the USG/BSG (with USG can on top of BSG) deposition steps, FIG. 9B shows the USG/BSG laser ablate steps, FIG. 9C shows the USG deposition steps, FIG. 9D shows the USG/PSG/(USG) deposition steps, FIG. 9E shows the oxidizing anneal/dopant drive-in deposition steps, FIG. 9F shows the laser cold ablate and contact open steps, FIG. 9G shows the PVD Al (or Al/NiV/Sn or another suitable stack comprising an underlayer of Al and an overlayer of a suitable solder alloy) deposition steps, FIG. 9H shows the laser metal ablate plus epoxy print steps, FIG. 9I shows the backplane attachment steps, FIG. 9J shows the cell/template release steps, FIG. 9K shows the QMS (remnant of porous silicon residues on the TFSS) removal and texturing steps, and FIG. 9L shows the low temperature front surface passivation steps.

FIG. 3 Flow Option 2: Silicon Nanoparticle Phosphorous Based Base Doping.

Figure 10:
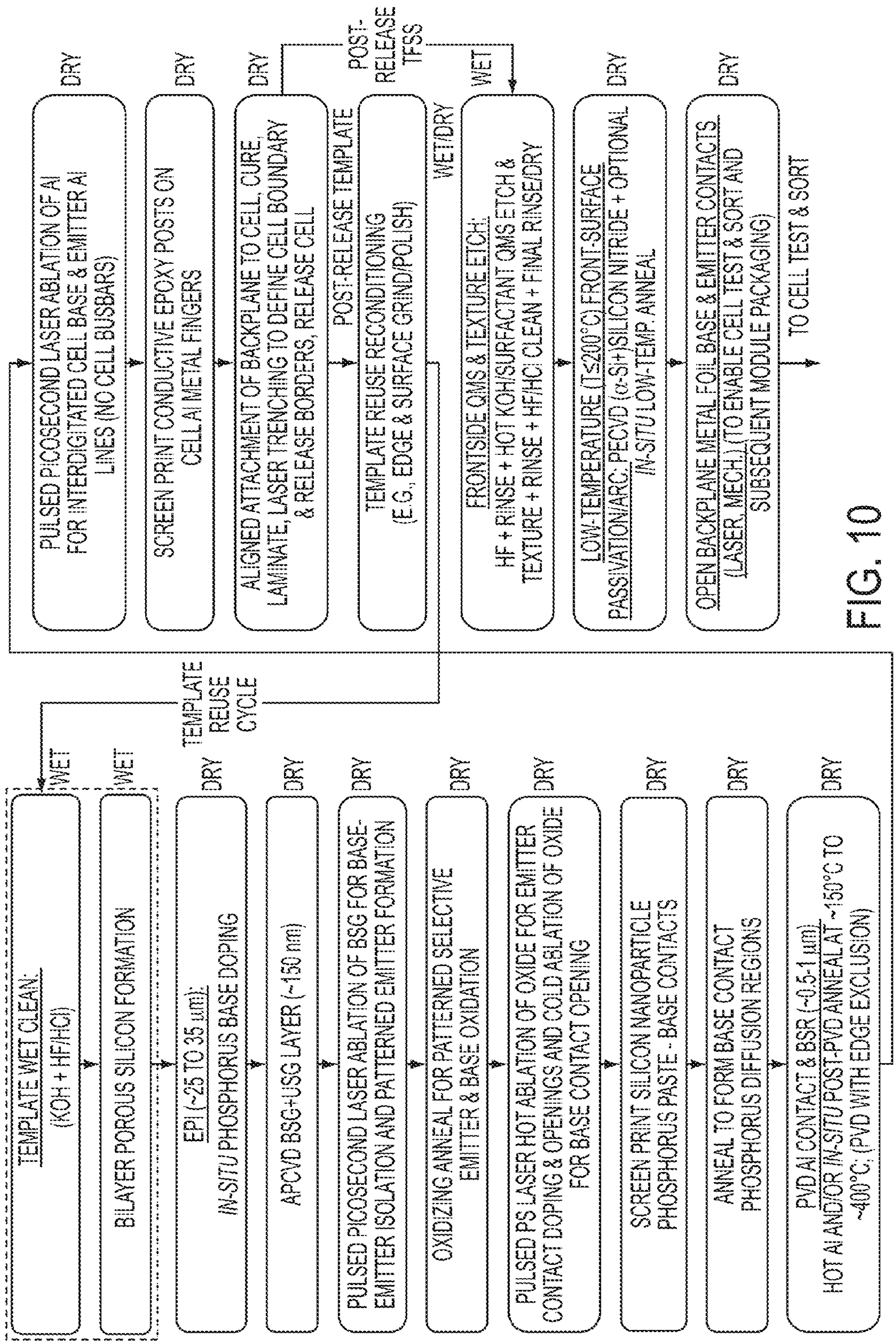
FIGS. 10 through 21 are back contact solar cell manufacturing process flows using epitaxial substrate.
Figure 11:
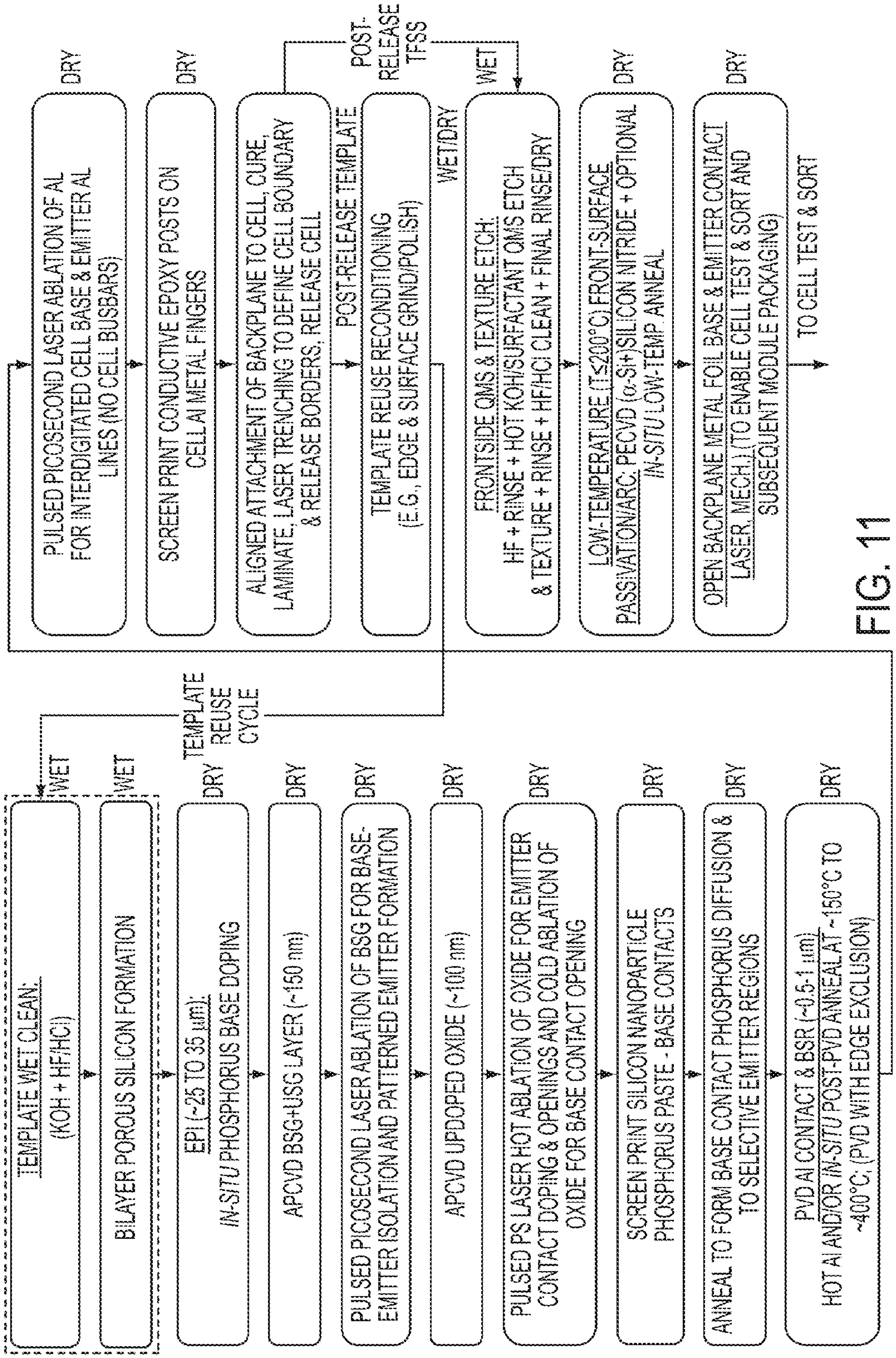
Figure 12:
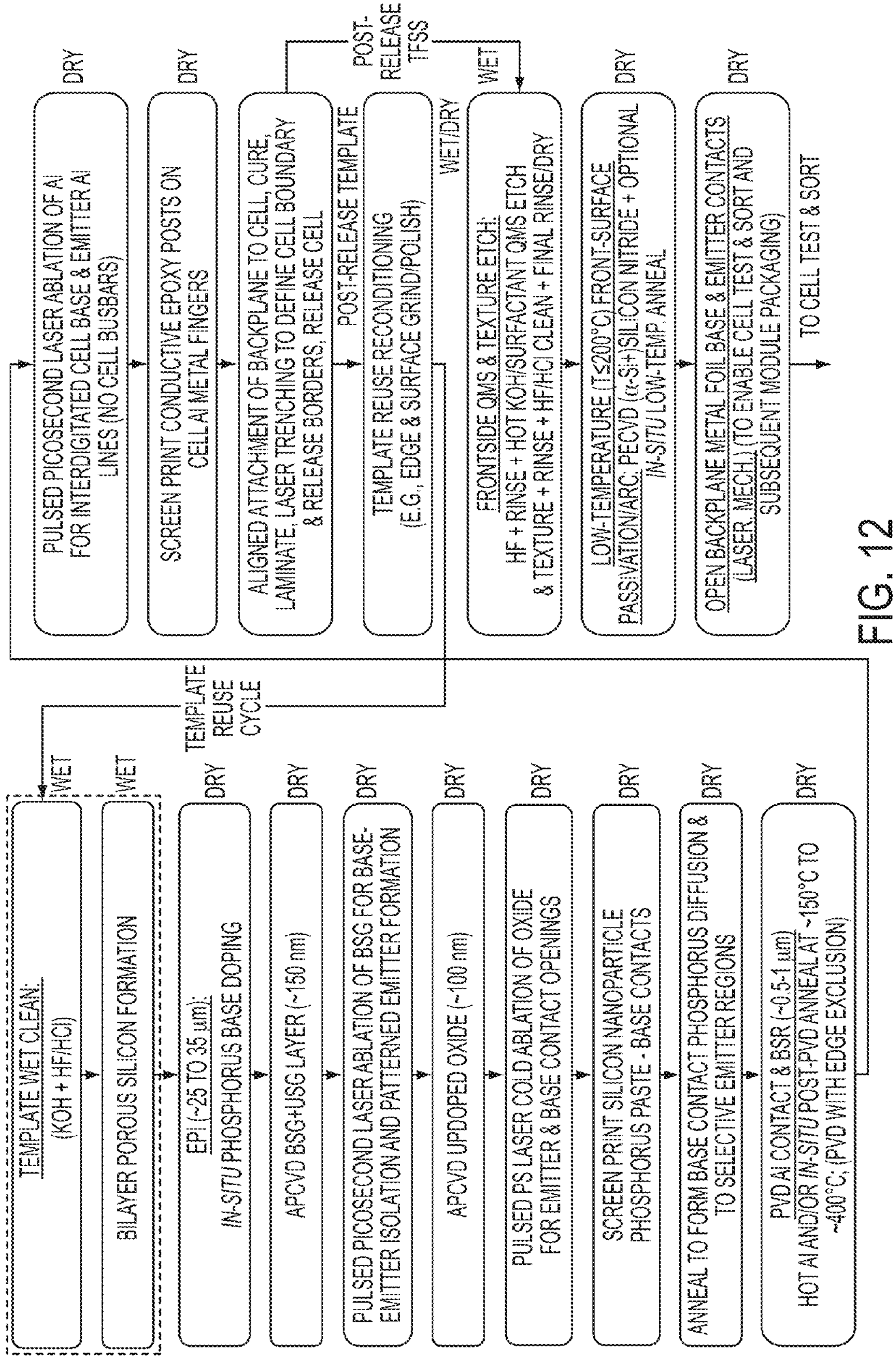

FIG. 10 outlines a process flow for silicon nanoparticle phosphorous based base doping (paste or ink). The backend of the process flow starting with Al PVD as well as the front end of the flow consisting of template clean/porous silicon/epi/APCVD BSG/USG depositions, and laser ablation of BSG stack are previously disclosed, see FIG. 4 and FIG. 8. Of the three described sub-variations of flow option 2 (options 2A, 2B, and 2C), option 2A and 2B use hot ablation and option 2C uses cold ablation. FIGS. 10, 11, and 12 depict the entire process flow for option 2A, 2B, and 2C of FIG. 3, respectively.

FIG. 10 representing option 2A shows that post BSG laser ablation, an oxidizing anneal is performed in a thermal furnace anneal tool. This is a multi-functional process and has at least a dual purpose of forming the emitter by driving boron from BSG into silicon as well as forming a thermal oxide layer in the area where BSG was ablated which serves as a passivation for what will ultimately become the base region. This is followed by hot laser ablation of the emitter area to form selective emitter similar to the process described in flow option 1A. At the same time cold ablation is used in the base area to open oxide for base doping contact. Subsequently, silicon nanoparticle based phosphorous paste is screen printed or is dispensed using other ways such as injecting, in the base contact open areas. Subsequently, the paste is annealed to drive the base doping. This is followed by identical process flow to option 1 (along with all its variations) starting at PVD Al.

FIG. 11 shows flow option 2B with hot ablation and silicon nanoparticle phosphorous paste or ink using two APCVD tools. In option 2B (FIG. 11), post BSG laser ablation, APCVD is used to deposit USG (instead of thermal oxide in option 2A). This is followed by hot ablation of the emitter and cold ablation of USG for base contact open. Subsequently, screen printing or inkjetting of phosphorous based silicon nanoparticles (paste or ink) is performed. This is followed by a thermal anneal to form base contact as well as the selective emitter. Subsequent processing may be identical with variations to flow option 1.

Option 2C (FIG. 12) is the cold ablation flow. FIG. 12 shows flow option 2C with cold ablation with silicon nanoparticle paste for phosphorous doping. Here, post BSG laser ablation, APCVD is used to deposit USG just as in option 2B. However, this is followed by base and emitter contact open using cold ablation. Subsequently, nanoparticle phosphorous paste is applied in the base area (again by either screen printing of a paste or inkjet printing of an ink) and is annealed. The annealing action drives the emitter and forms the base doping area. Subsequent processing may be similar to that previously disclosed.

Note that, in all the options with silicon nanoparticles (flow option 2 in FIG. 3), since the paste is silicon nanoparticle based there is no need to open the base contact again after the paste is applied. Hence, the metal may be put down directly on this cured paste. And if needed, the flow can be modified to accommodate opening the area before putting PVD Al.

Flow Option 3 of FIG. 3: Phosphorous Paste Based Base Doping.

Figure 13:
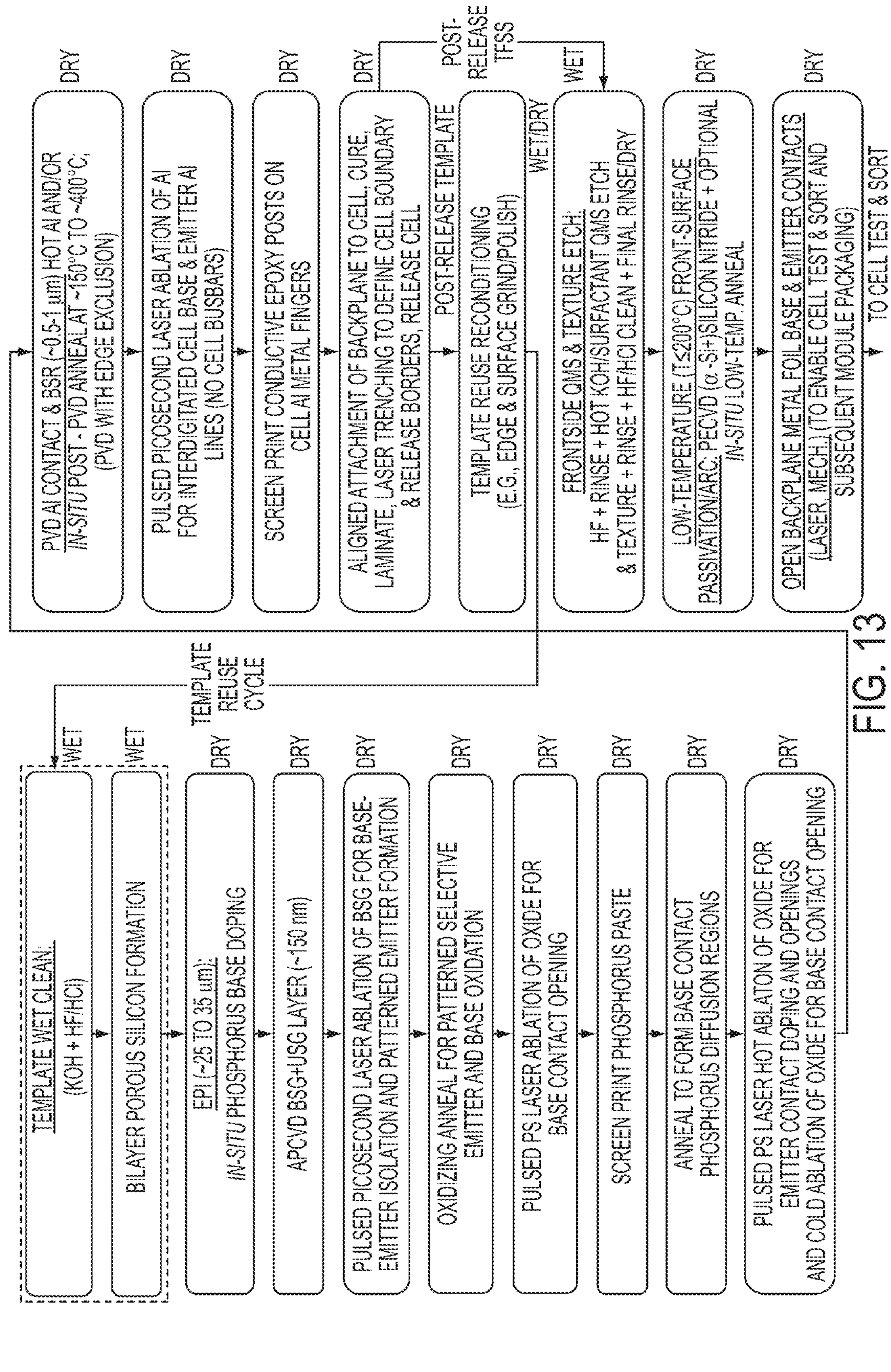
Figure 14:
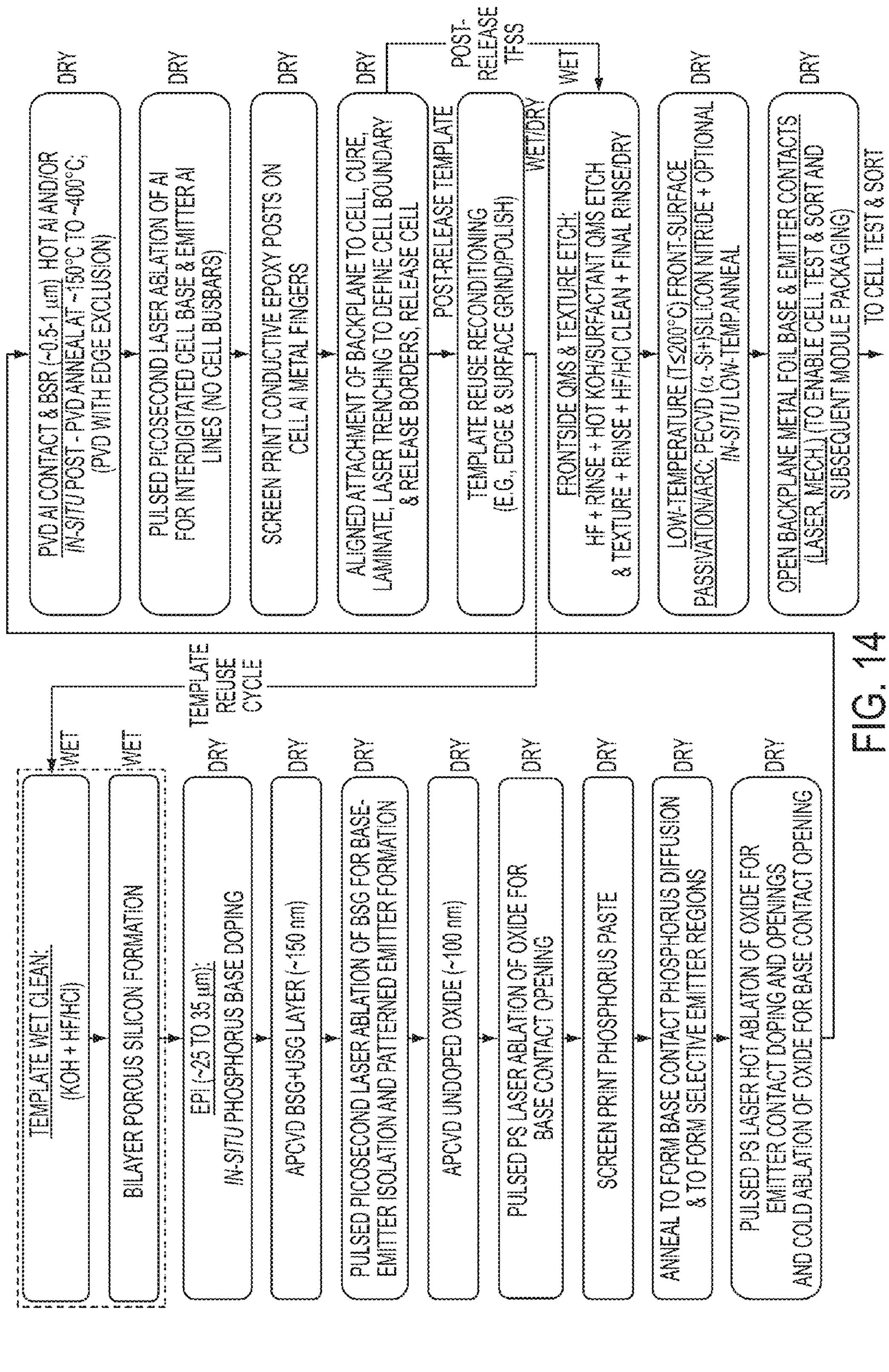
Figure 15:
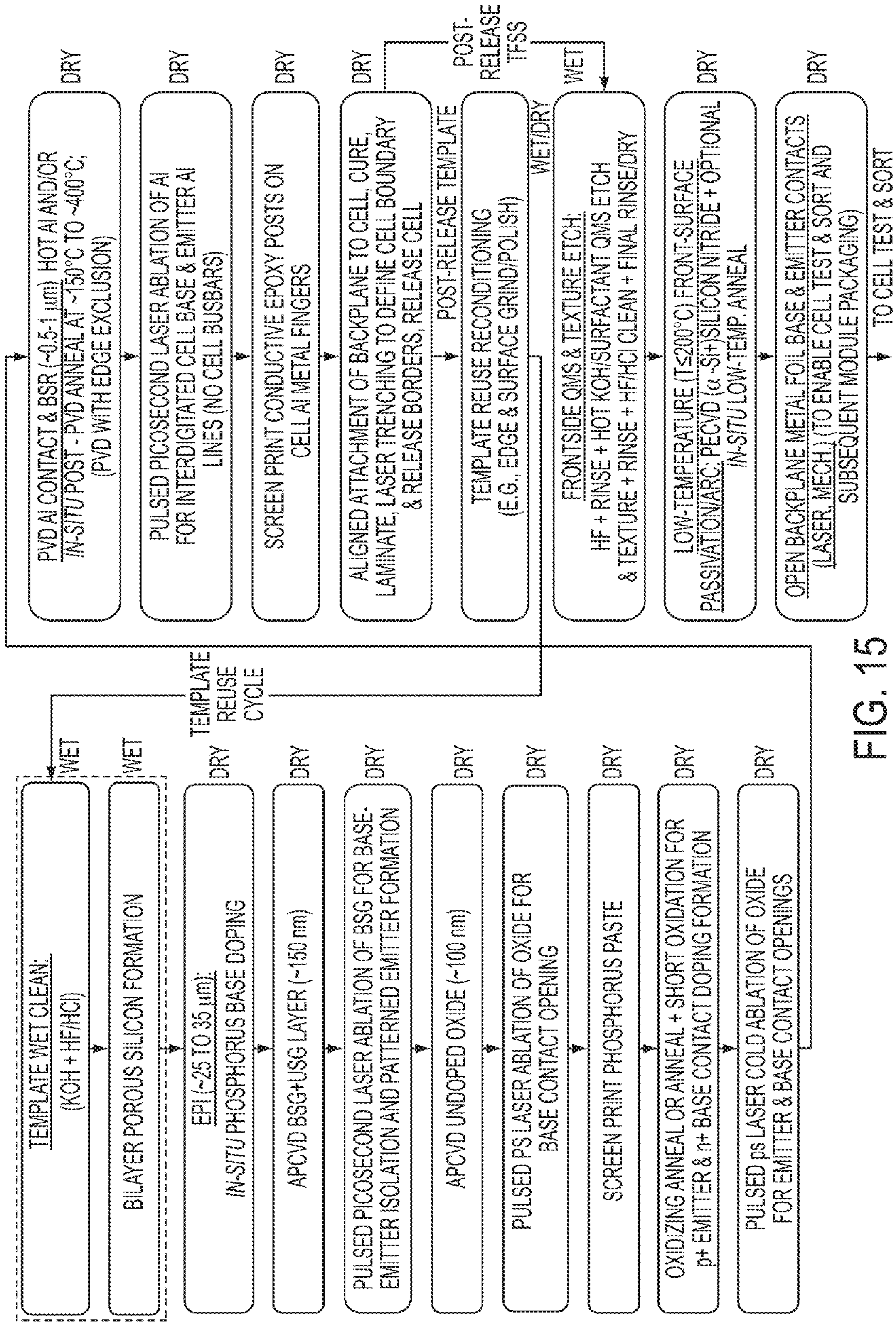

Here the difference compared to previous flows is that the base contact is formed using the commercially available phosphorous pastes. All process steps before up to laser ablation of BSG stack and after and including Al PVD may remain the same as option 1. There are three phosphorous paste based base doping variations shown, in FIGS. 13, 14, and 15 corresponding to flow options 3A, 3B, and 3C of FIG. 3 respectively. In many ways these three sub options mirror the three sub-options for the nanoparticle paste previously discussed with mirror differences. FIG. 13 (flow option 3A) and FIG. 14 (flow option 3B) use hot ablation while FIG. 15 (option 3C) is cold ablation process. Additionally, as shown FIG. 13 (flow option 3A) uses one APCVD, while FIG. 14 (flow option 3B) and FIG. 15 (option 3C) use two APCVD tools.

In option 3A (FIG. 13), post BSG ablation there is an oxidizing anneal for emitter formation as well as for base area passivation using thermal oxide—similar to flow option 2A. Subsequently, laser ablation is used to open only base contacts with cold ablation—different from flow option 2A. This step is followed by screen printing (or any other way of dispensing phosphorous paste for direct write, such as inkjet printing), followed by an annealing to drive the base contact phosphorous diffusion regions. Subsequently, hot ablation of the emitter and cold ablation of base area is performed to make selective emitter and base contacts. All steps following this starting from PVD Al are previously disclosed.

Option 3B (FIG. 14) has APCVD USG deposition after BSG ablation, followed by pulsed ps laser (or pulsed fs laser which can be used instead of pulsed ps laser whenever cold ablation is required in any of the process flows of this invention) cold laser ablation of USG to open base contacts. Just as in option 3A, this is followed by screen printing of phosphorous paste and drive and anneal of phosphorous base contact as well as emitter areas. This is followed by hot ablation of emitter and cold ablation of the base to reopen the contact in the base through the phosphorous paste. All steps starting Al PVD following this are previously disclosed.

Option 3C (FIG. 15) uses APCVD USG after BSG ablation. This is followed by ablation of USG for base opening, followed by screen printing of phosphorous paste, followed by an oxidizing anneal and/or anneal to form emitter, base doping, as well as a passivation. This is followed by cold ablation of emitter and base areas to open contacts. Subsequently, starting Al PVD all steps are previously disclosed.

Flow Option 4: POCl3 based Base doping.

Figure 16:
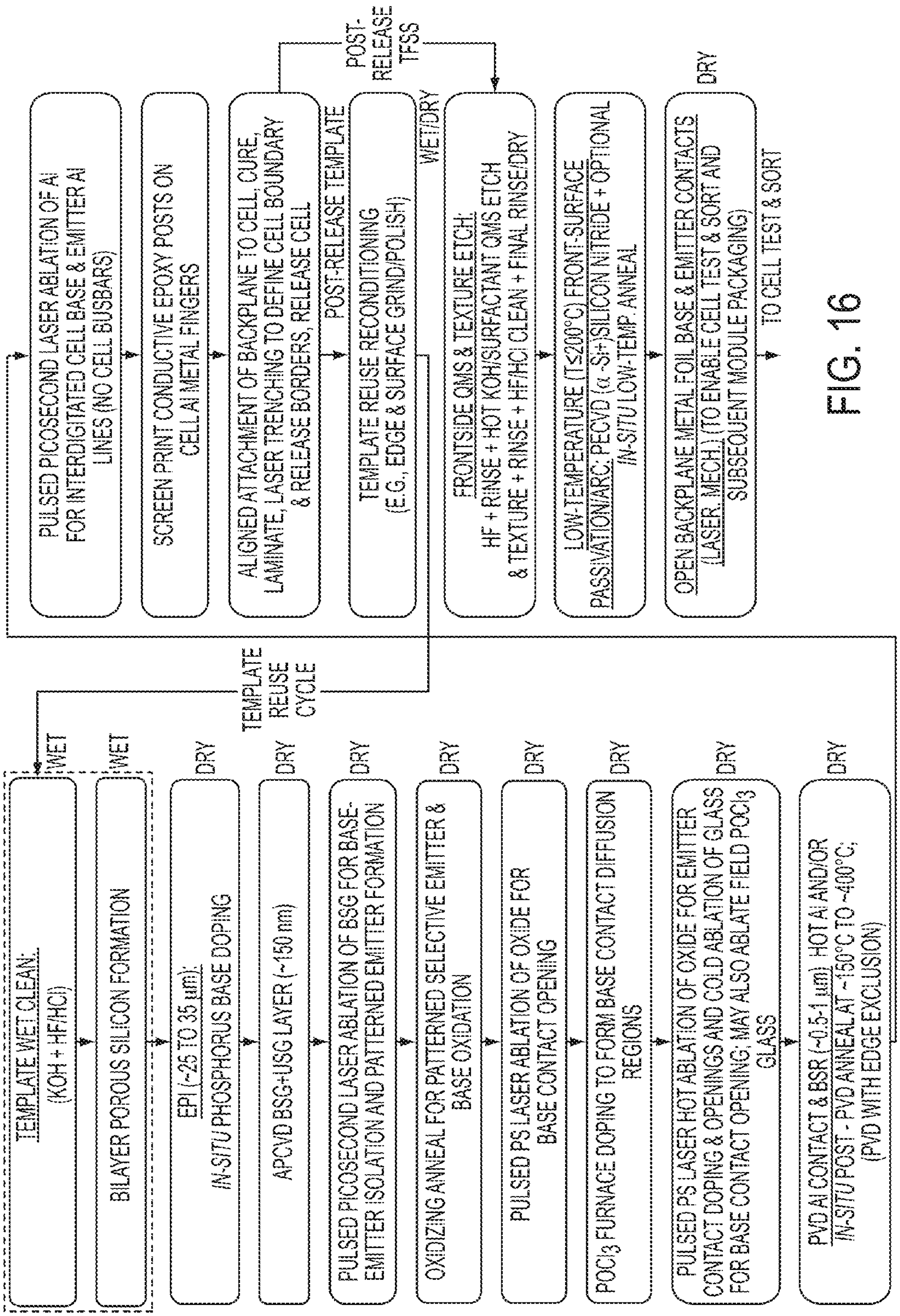
Figure 17:
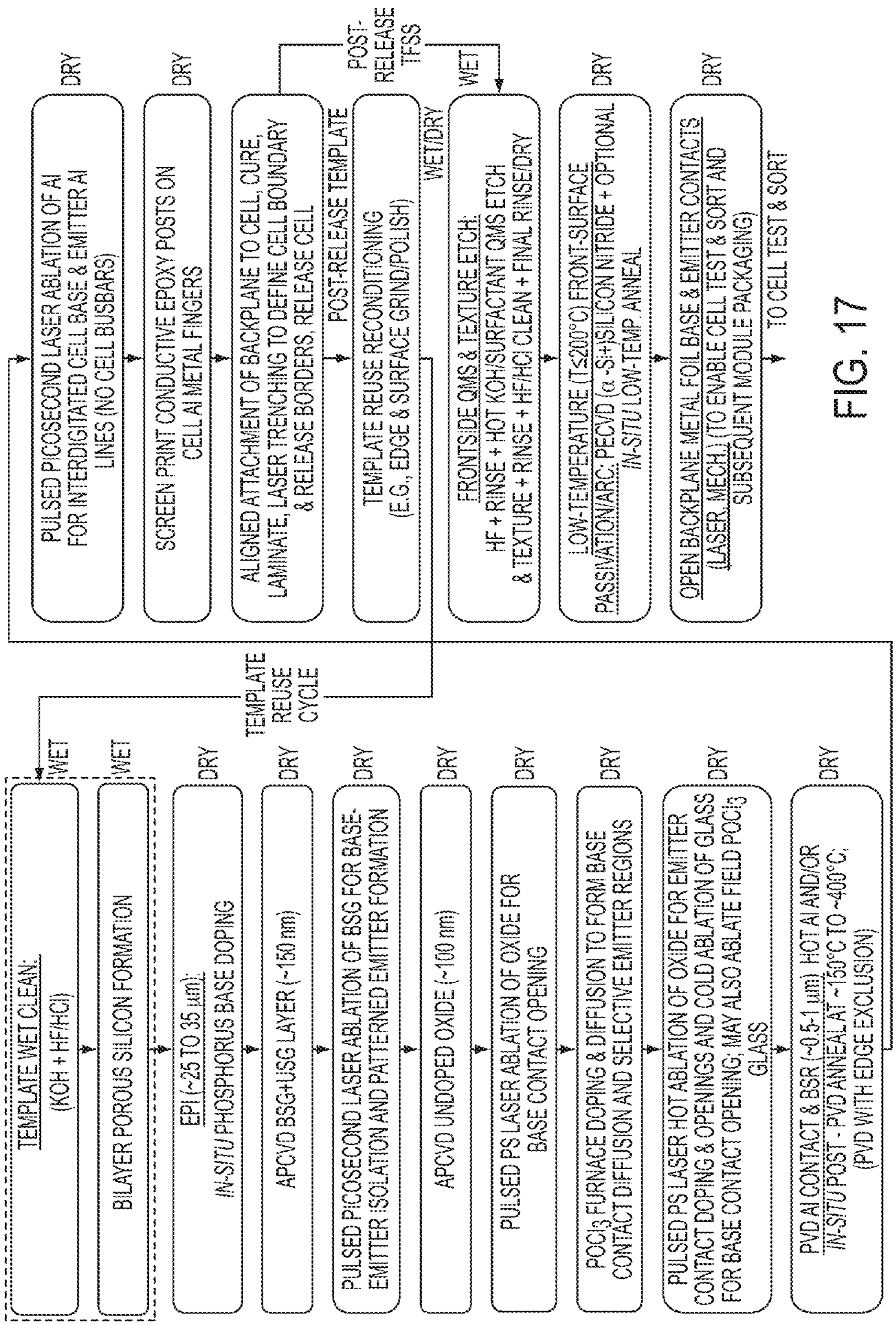
Figure 18:
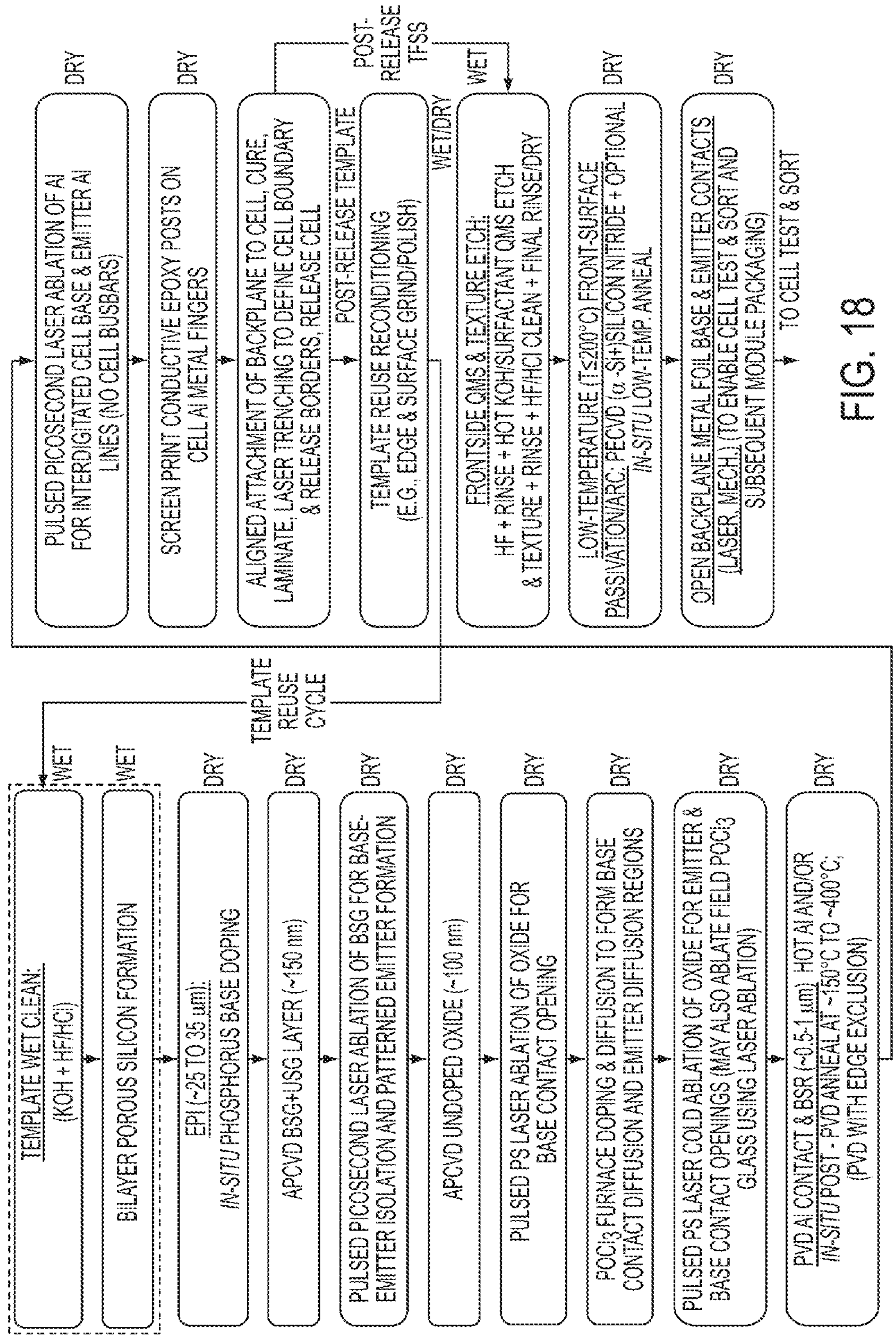

FIGS. 16, 17, and 18 are a set of flows using furnace POCl3 (phosphorus oxychloride) doping for base doping. As shown, all steps up to including BSG laser ablation as well as all steps post and including Al PVD may be the same as previously disclosed. There are three POCl3 based base doping variations shown, in FIGS. 16, 17, and 18 corresponding to flow options 4A, 4B, and 4C of FIG. 3 respectively. FIG. 16 (flow option 4A) and FIG. 17 (flow option 4B) use hot ablation while FIG. 18 (option 4C) is cold ablation process. Additionally, as shown FIG. 16 (flow option 3A) uses one APCVD, while FIG. 17 (flow option 3B) and FIG. 18 (option 3C) use two APCVD tools.

In option 4A (FIG. 16), laser ablation of BSG stack is followed by an oxidizing anneal in a batch furnace which drives the emitter at the same time and forms a passivating thermal oxide in the base region. This is followed by cold ablation of thermal oxide for base contact open which is followed by POCl3 furnace doping to form base contact diffusion regions. Subsequently, hot ablation is used for emitter contact open, and cold ablation to go through the POCl3-formed glass in the base area. It is also conceivable that the laser is used to ablate all POCl3-formed glass, which may be desirable from the back mirror perspective. This is followed by Al PVD as previously disclosed.

In option 4B (FIG. 17), APCVD oxide is deposited instead of thermal oxide anneal. This is followed by cold laser ablation of USG material to form base contacts. This is followed by POCl3 doping, which takes care of both forming base diffusions as well as driving the emitter regions into silicon. Subsequently, hot ablation is used for emitter contact opening and drive to form selective emitter, where cold ablation is used to go through the POCl3 glass material and open base contacts. This is followed by the standard process starting at PVD Al.

In option 4C (FIG. 18), instead of thermal oxide, APCVD of USG is used to create blocking of POCl3. This is followed by cold ablation of USG for base contact open and POCl3 process. The POCl3 process not only forms base contacts, but also simultaneously diffuses the emitter. This is followed by a cold ablation of both emitter and base contact opens. The remaining process flow remains as before.

Minimum cell process flow. This section describes a variation of the process flows described as option 1 above (using PSG for making base contact). In this variation, several steps are combined and the CE print step is eliminated to use a reduced number of tools for creating the high-efficiency, back contact thin cell. A defining attribute of these minimum steps flows is that the screen printing of conductive epoxy is eliminated by using a low-temperature solder alloy (e.g., 58% Bi-42% Sn with 138° C. solder melting point, or Bi-45% Sn-0.33% Ag with a melting point of 140-145° C.), formed both as an overlayer on top of the cell Al metal/mirror as well as on the backplane metal fingers with a pre-formed pin grid array on the metal fingers. Once the backplane is aligned and placed on the cell, the backplane pin grid array is solder attached to the cell during the thermal lamination process.

Figure 19:
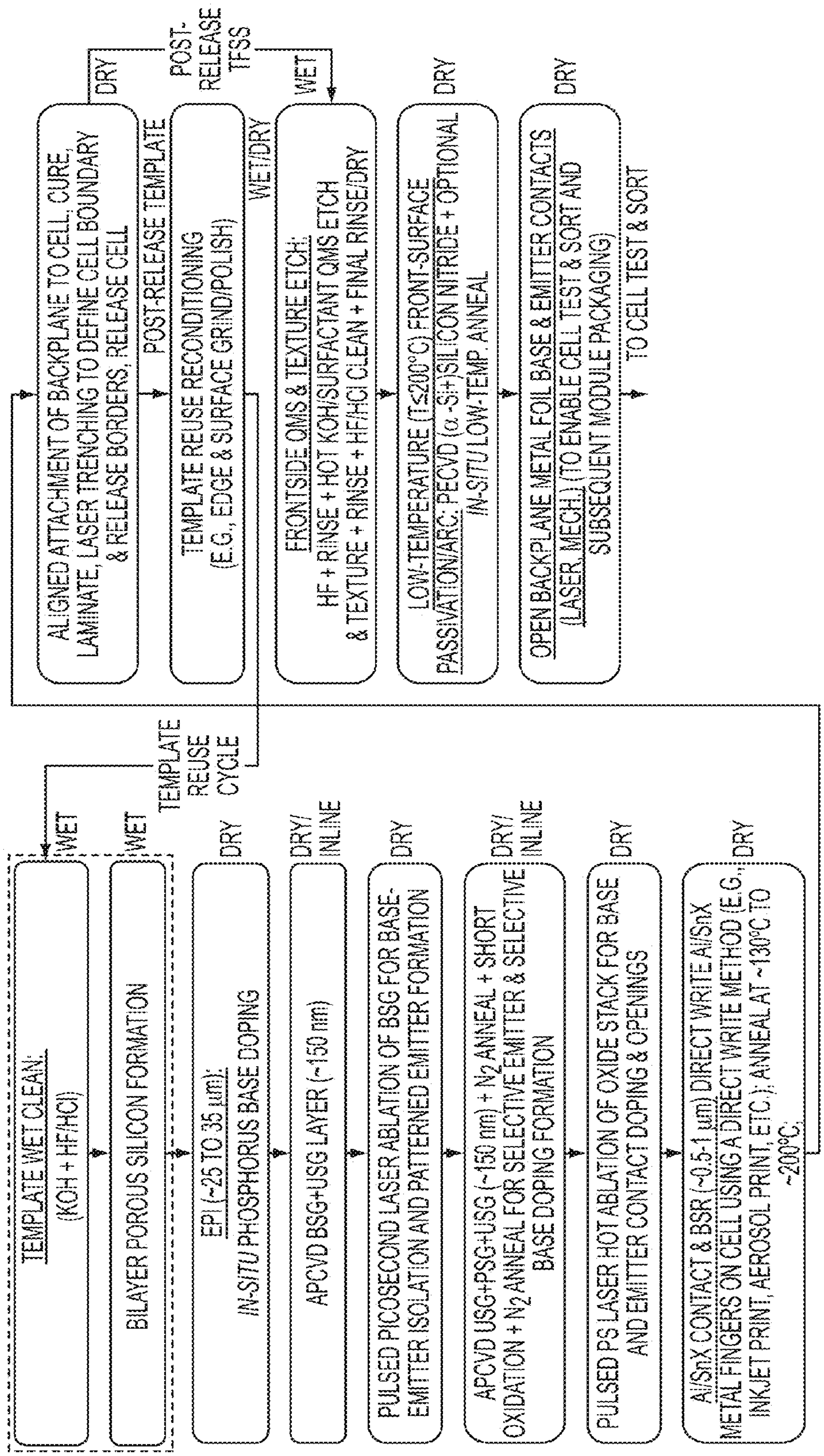

FIG. 19, a hot ablation direct writing process, depicts a first embodiment of a minimum steps process flow with the following noted attributes: two APCVD process steps used, has a texturing process, uses PSG and hot ablation to form base diffusion, selective emitter formed using laser, has a direct metal write process such as screen print, inkjet, aerosol print, laser transfer print, and direct solder bonding without CE screen print.

Figure 20:
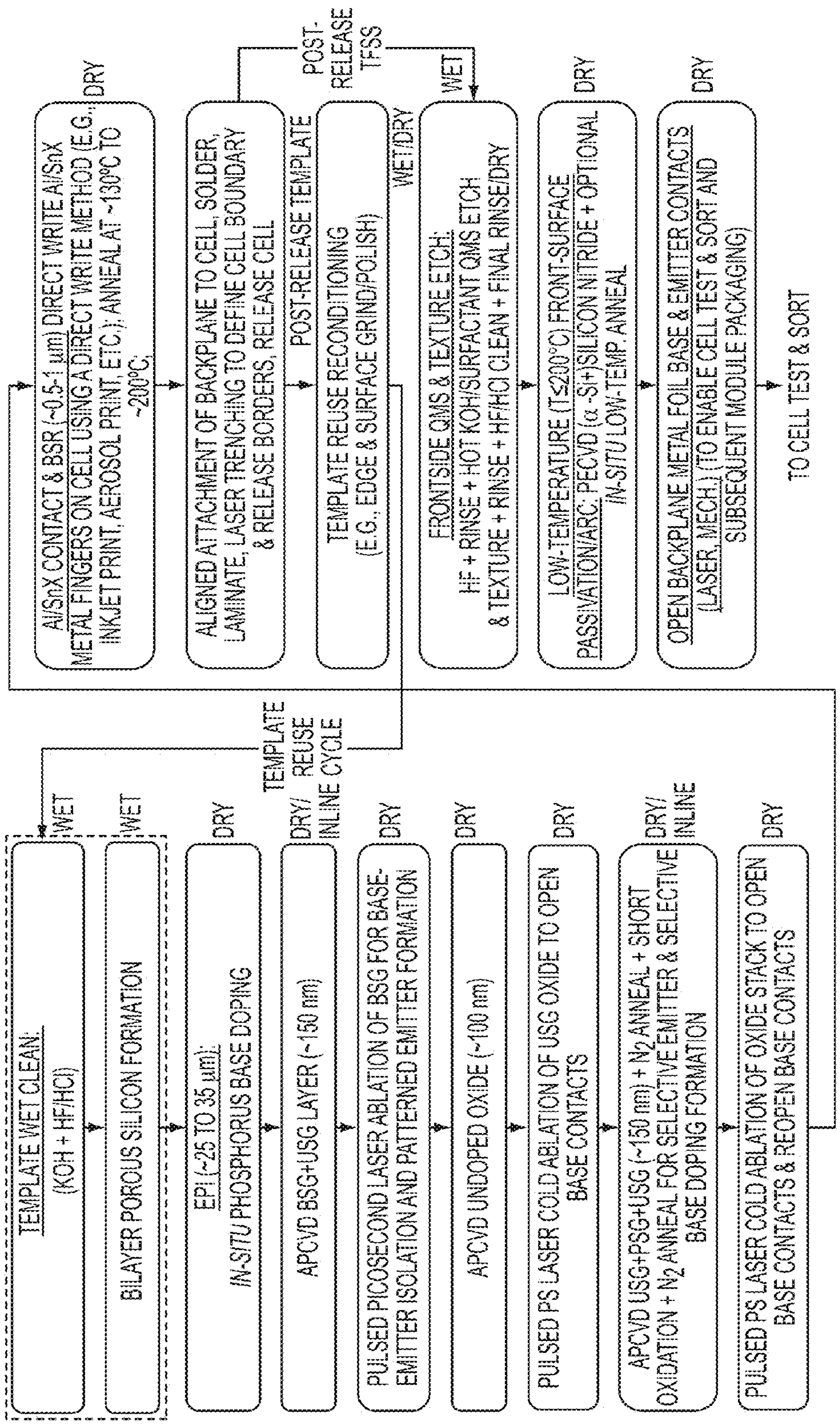

FIG. 20, a cold ablation direct writing process, depicts a second embodiment of the minimum process flow. It retains the common attributes of FIG. 19 of solder attachment as well as direct metal write to eliminate a few process steps. However, it differs from the FIG. 19 flow in that it does not rely on hot ablation and has three APCVD steps.

Non Epi Bulk Thin Substrate Process Flows.

Previously, two types of carrier 1 examples were disclosed. The first type of carrier 1 uses a template and the second type of carrier 1 is a thicker wafer or ingot from which thin CZ or FZ slices are cleaved or exfoliated using a myriad of available techniques, including hydrogen ion implantation. The following section describes the cell level process flows utilizing backplane innovation in conjunction with the wafer cleaving approach to obtain a thin silicon substrate. Proton implant based cleaving produces <111> textured substrates, which would preferably require dry texturing. The embodiments show proton implant cleavage/slicing of ultrathin substrates (e.g., about 1 μm to 80 μm thick substrates separated/cleaved from much thicker reusable wafers, e.g., wafers or bricks which are several mm or several cm thick).

Figure 21:
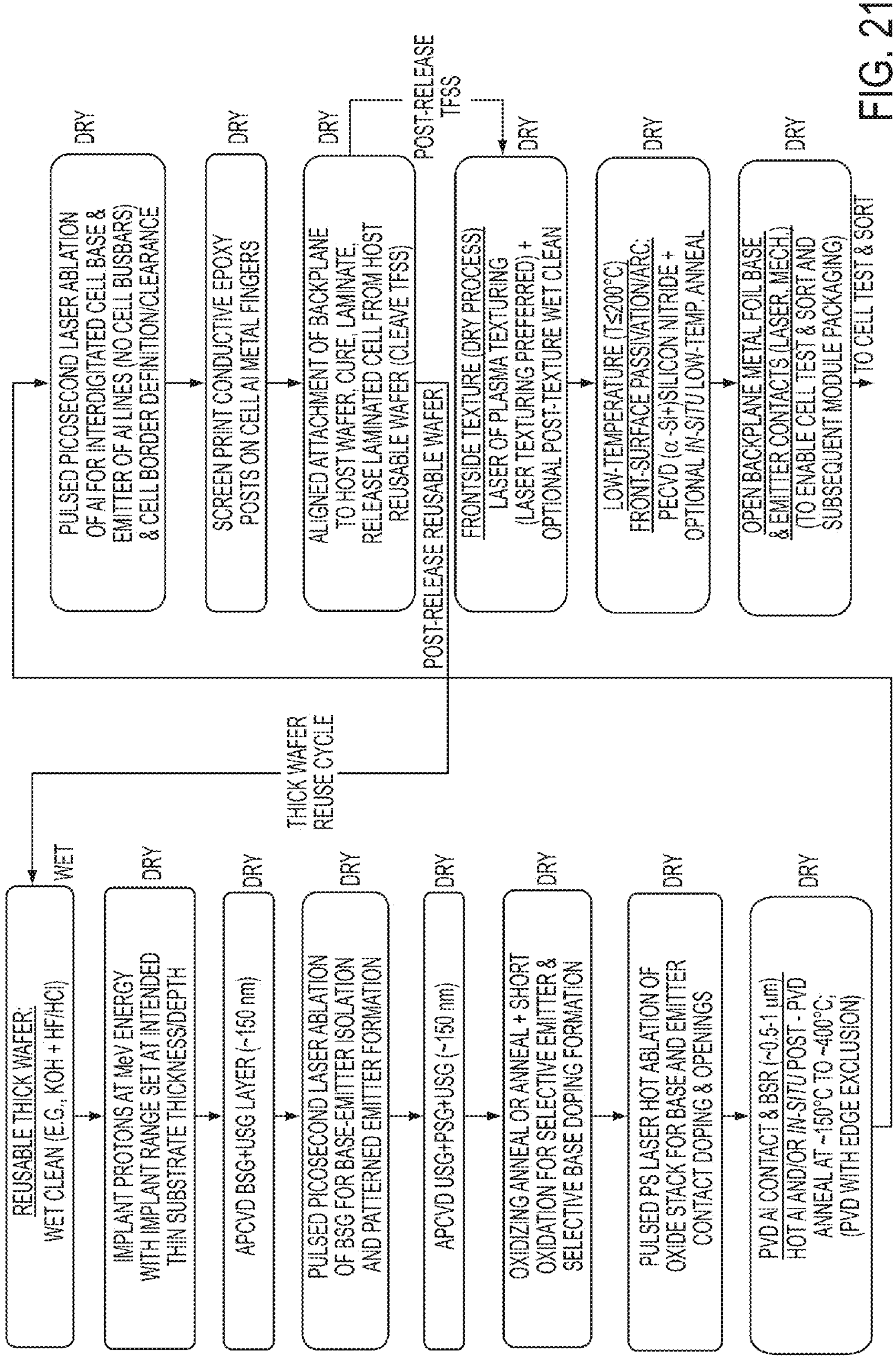

FIG. 21 shows the first process flow using a wafer cleaving approach to obtain a thin silicon substrate. The process flow parallels the flow 1A1 described in FIG. 4 (which uses a reusable template for carrier 1) except for the initial steps which are used to create the substrate. The specific attributes of this flow are: uses two APCVD processes (base contact diffusion formed using APCVD PSG and hot laser ablation), cell front-surface texturing which may be performed on planar or pre-textured templates with or without in-situ Front-Surface Field (FSF) phosphorus doping, metal deposition which may be performed using vacuum sputtering, vacuum evaporation, atmospheric arc/thermal spray coating, etc. The first step is to start with a reusable, thick wafer.

In FIG. 21, first the wafer is implanted with MeV proton implants, with the implant energy setting the substrate thickness. Following this step of substrate creation, the steps shown are similar to the flow shown in FIG. 4 until the backplane attachment step. After backplane attachment the wafer is released from the thick wafer from the cleave created by the implant. This is followed by a dry texturing process, which may be performed either using the laser or a dry plasma process, since it is a <111> surface. An optional post texture clean may subsequently be performed—previous embodiments using a reusable template did not necessarily require a dry texture process also. As shown in FIG. 21, after dry texturing passivation and backplane access steps are performed.

FIGS. 22 through 35 show several variations and examples of the process flow outlined in FIG. 21 for back contact thin crystalline solar cells using proton implanted and cleaved thin silicon cells. The variations mirror similar flows described using the Reusable PS/Epitaxial TFSS on template process flows. Four categories of process flows are similar to the flow options in FIG. 3—these four categories are distinguished from each other on the bases of the method used to create the base diffusion area. The first category, including the flow of FIG. 21, uses PSG layer to create the base diffusion areas; the second category uses silicon nano particles; the third category uses phosphorous paste; and the forth category uses POCl process to create base diffusion regions.

FIGS. 22 through 26 show flows belonging to the PSG based doping category. Each of these process flows may be characterized by the following attributes listed directly thereafter.

Figure 22:
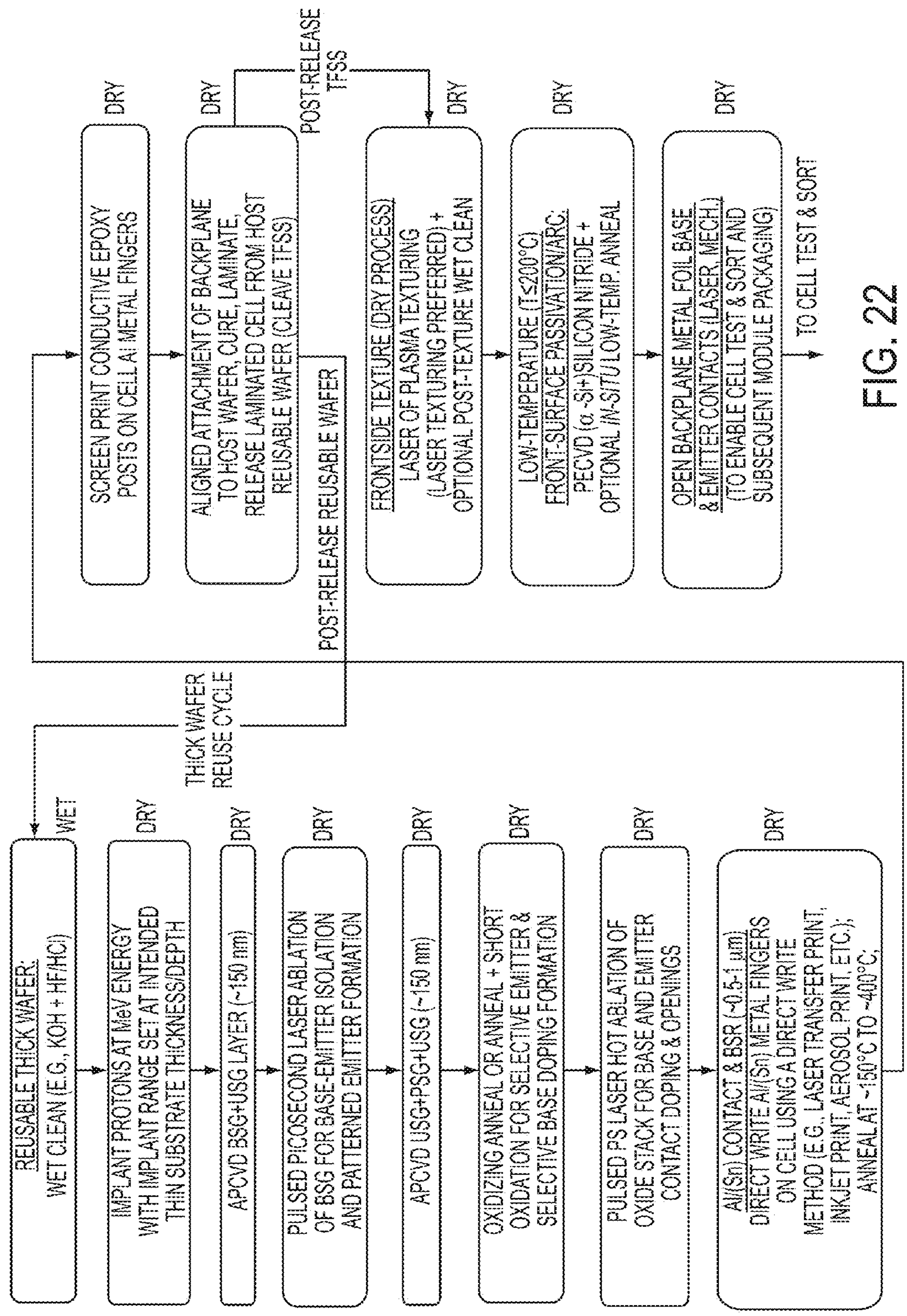
FIGS. 22 through 35 are back contact solar cell manufacturing process flows using a cleaved substrate.

FIG. 22 corresponds to flow option 1A1 of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates (to facilitate cleavage with reasonable proton implantation doses), requiring dry laser or plasma texturing
- Includes selective emitter without added process steps (using hot ablation process)
- Uses two APCVD processes
- Base contact diffusion formed using APCVD PSG & hot laser ablation
- Includes cell front-surface texturing
- May be performed on planar or pre-textured templates with or without in-situ Front-Surface Field (FSF) phosphorus doping
- Same as flow 1A1 but with direct write process for interdigitated cell metal (e.g., Al or Al/Sn or Al/NiV/Sn) fingers
- Metal deposition may be performed using a direct write process such as screen printing, laser transfer printing, inkjet printing, aerosol printing.

Figure 23:
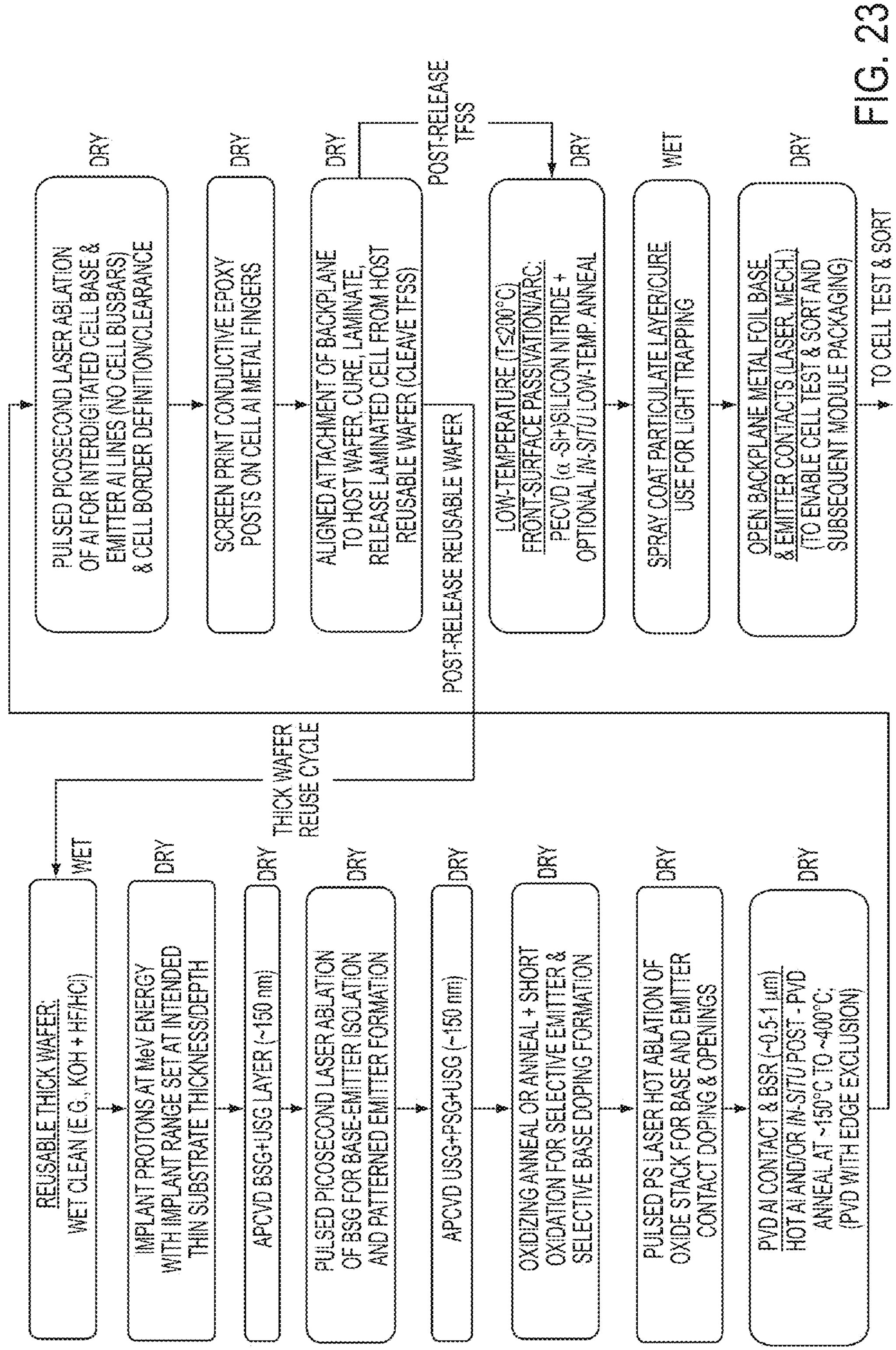

FIG. 23 corresponds to flow option 1A2 of FIG. 3, and may be characterized by the following attributes:

- Thin substrate formed by slicing/cleaving from reusable thick wafer or ingot piece (e.g., after MeV proton implant); the thin substrates are typically (111) oriented substrates, requiring dry laser or plasma texturing
- Includes selective emitter without added process steps (using hot ablation process)
- Uses two APCVD processes
- Base contact diffusion formed using APCVD PSG and hot laser ablation
- No cell front-surface texturing (textureless)—instead light trapping is assisted by coating a particulate light trapping layer (such as a dielectric or metallic particulate)
- Includes Front-Surface Field (FSF) phosphorus doping
- Metal deposition may be performed using plasma sputtering, vacuum evaporation, atmospheric arc/thermal spray coating, etc.

Figure 24:
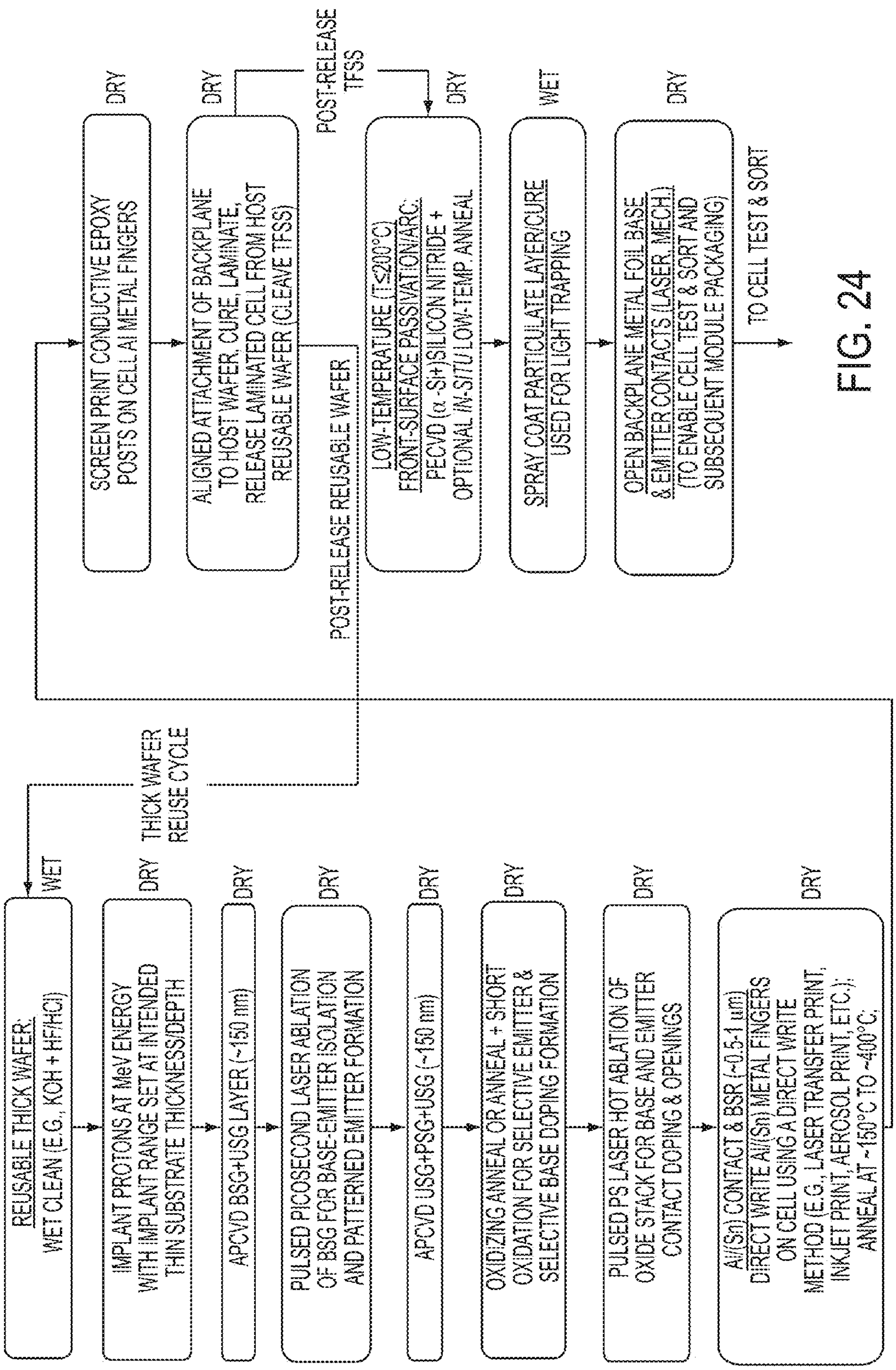

FIG. 24 corresponds to flow option 1A2 of FIG. 3, and may be characterized by the following attributes:

- Thin substrate formed by slicing/cleaving from reusable thick wafer or ingot piece (e.g., after MeV proton implant); the thin substrates are typically (111) oriented substrates, requiring dry laser or plasma texturing
- Includes selective emitter without added process steps (using hot ablation process)
- Uses two APCVD processes
- Base contact diffusion formed using APCVD PSG and hot laser ablation
- No cell front-surface texturing (textureless)—instead light trapping is assisted by coating a particulate light trapping layer
- Includes Front-Surface Field (FSF) phosphorus doping

- Metal deposition may be performed using a direct write process such as screen printing, laser transfer printing, inkjet printing, aerosol printing, etc.

Figure 25:
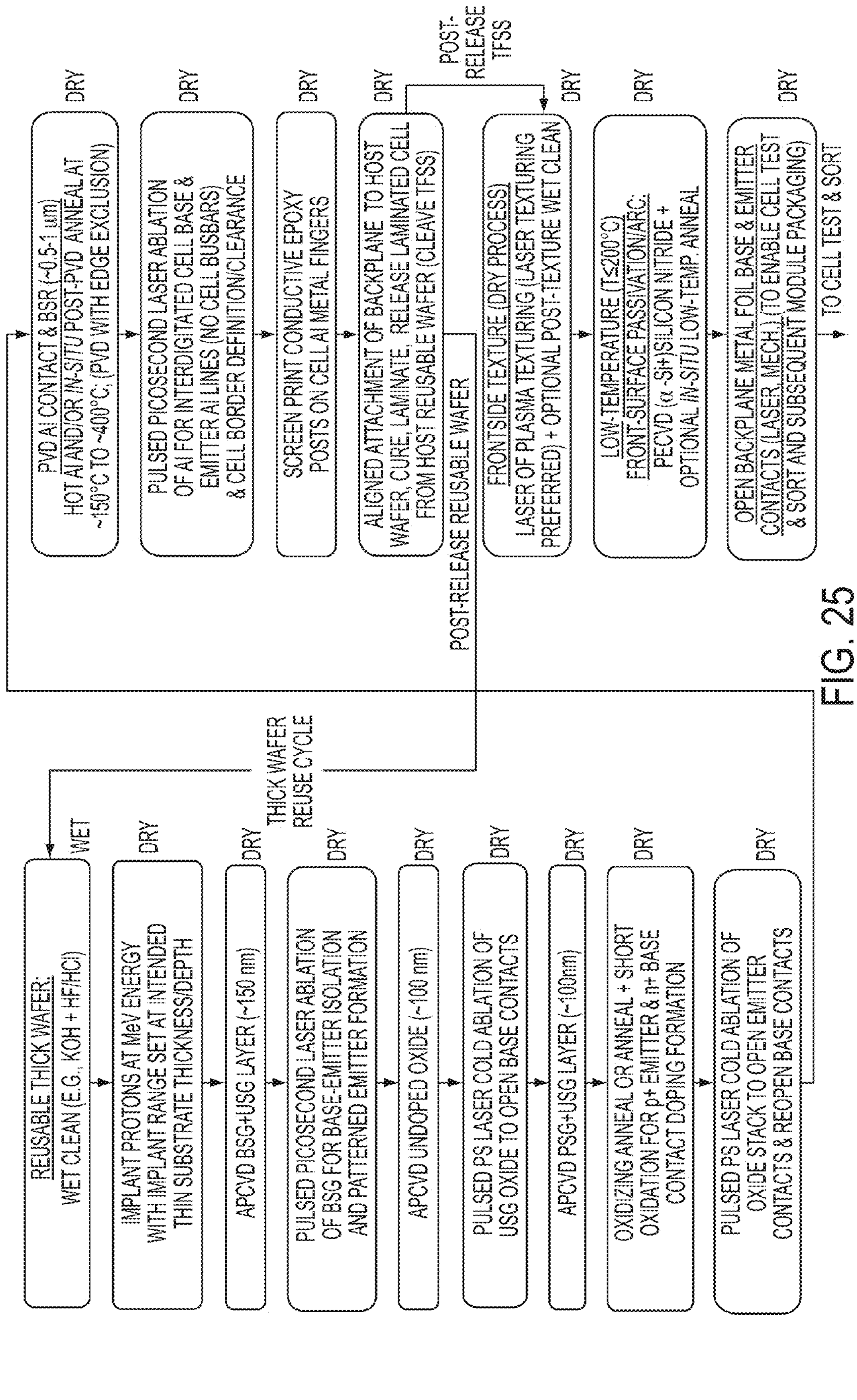
Figure 26:
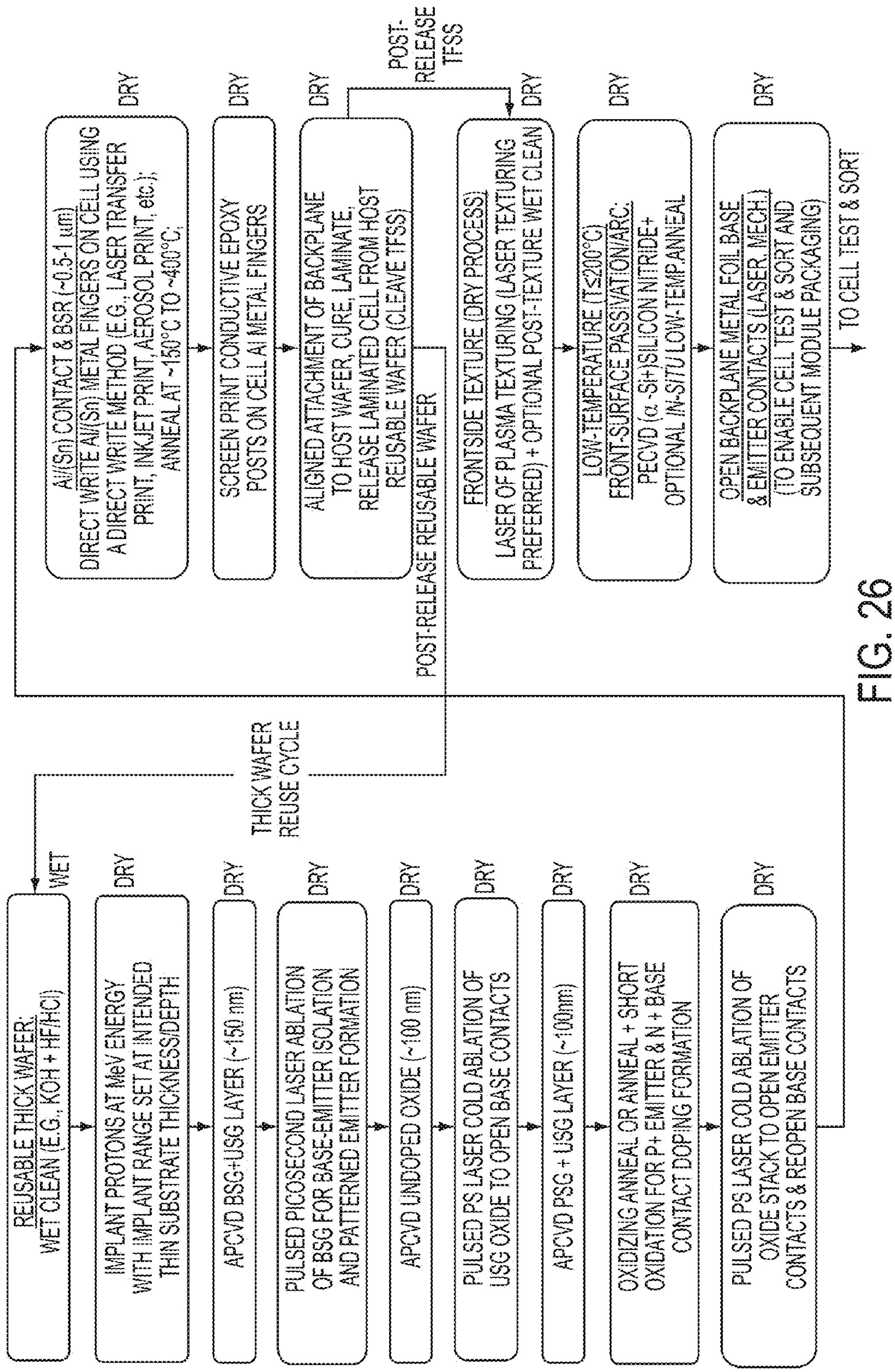

FIG. 25 corresponds to flow option 1B of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates, requiring dry laser or plasma texturing
- Includes selective emitter without added process steps (using hot ablation process)
- Uses three APCVD processes
- Base contact diffusion formed using APCVD PSG and furnace anneal
- Metal deposition may be performed using plasma sputtering, vacuum evaporation, atmospheric arc/thermal spray coating, etc FIG. 26 corresponds to flow option 1B of FIG. 3, and may be characterized by the following attributes:

- Thin substrate formed by slicing/cleaving from reusable thick wafer or brick or ingot piece (e.g., after MeV proton implant); the thin substrates are typically (111) substrates, requiring dry laser or plasma texturing
- Includes selective emitter without added process steps (using hot ablation process)
- Uses three APCVD processes
- Base contact diffusion formed using APCVD PSG and furnace anneal
- Metal deposition may be performed using a direct write process such as laser transfer printing, inkjet printing, aerosol printing, etc.

Figure 27:
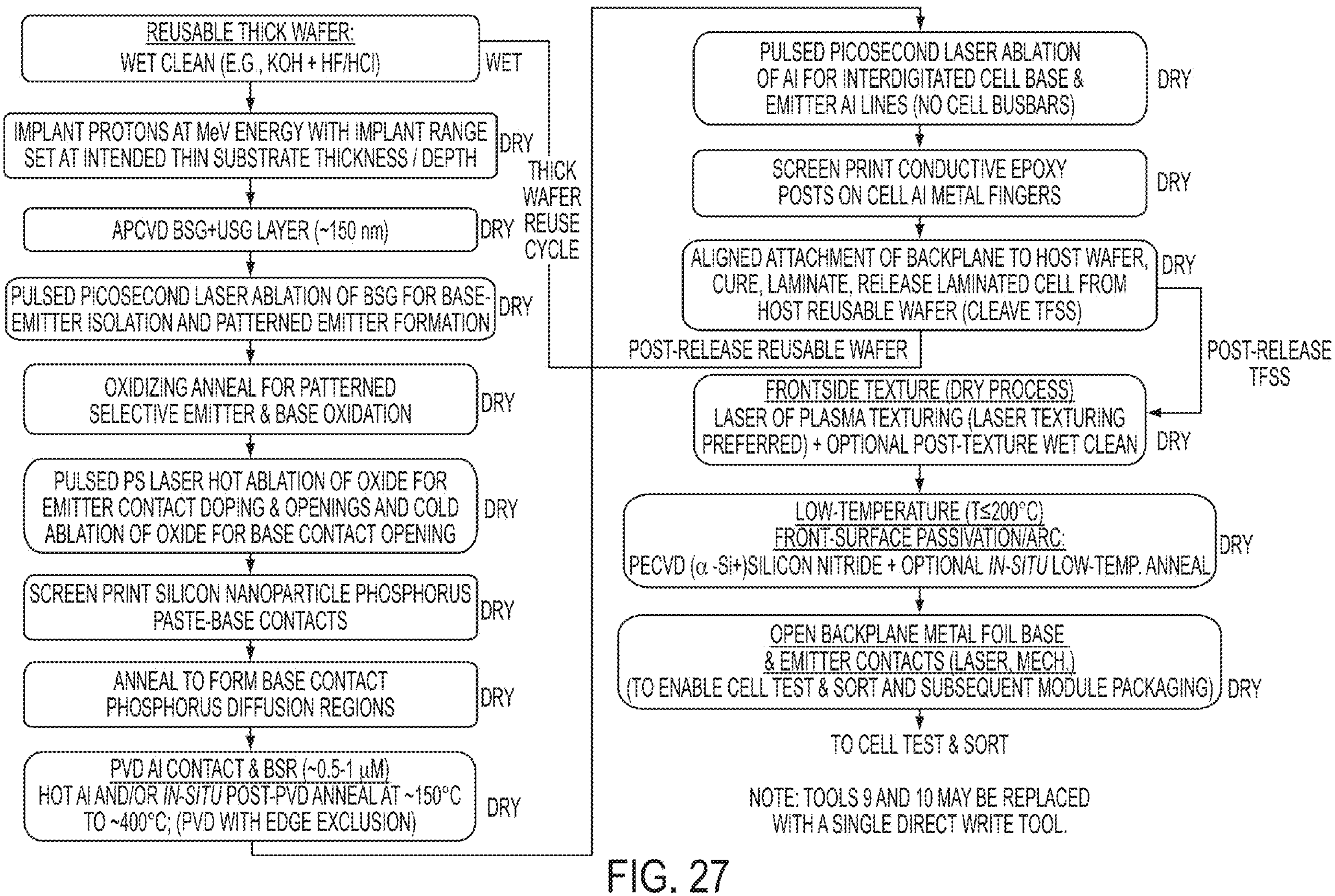
Figure 28:
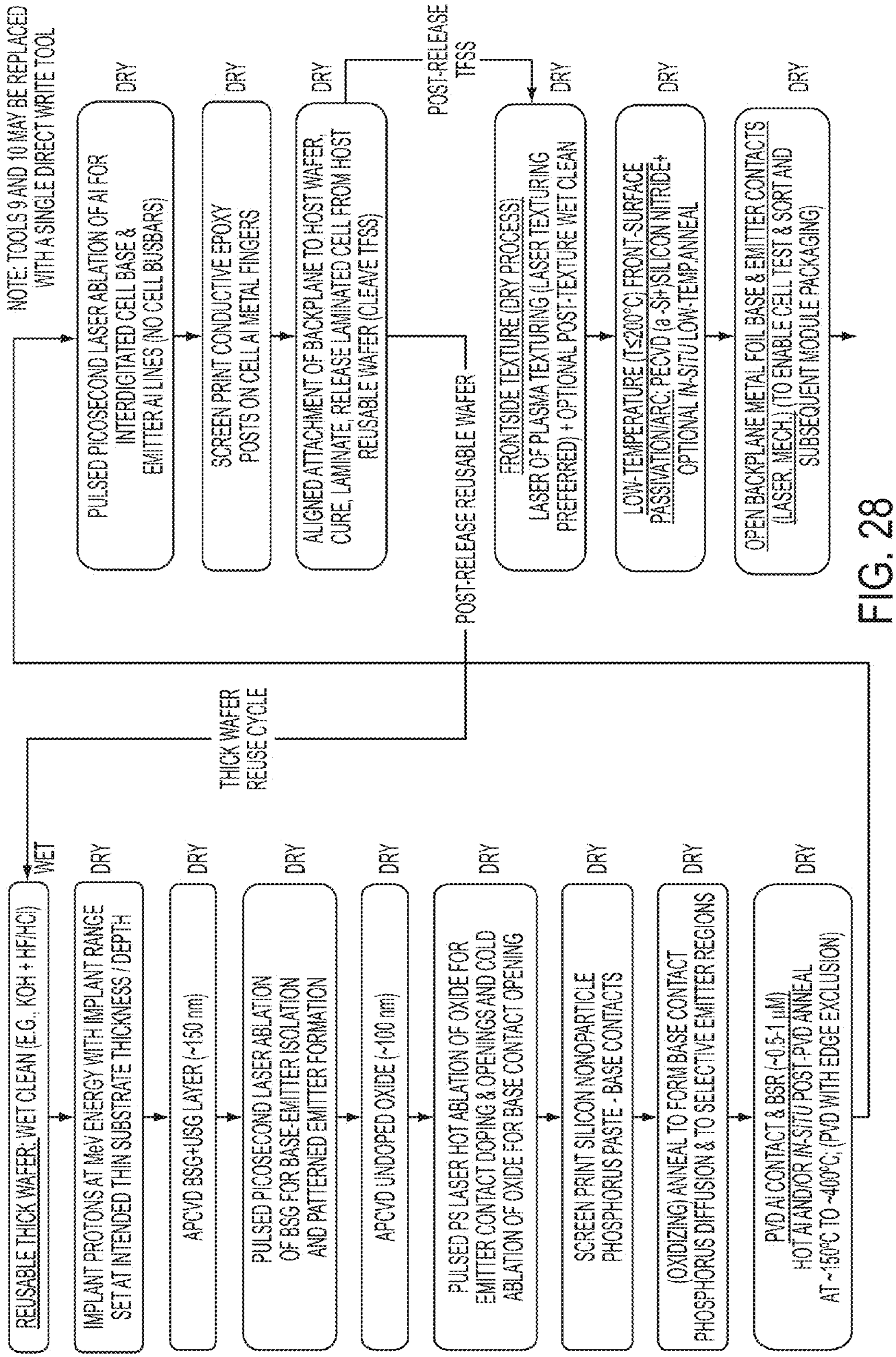
Figure 29:
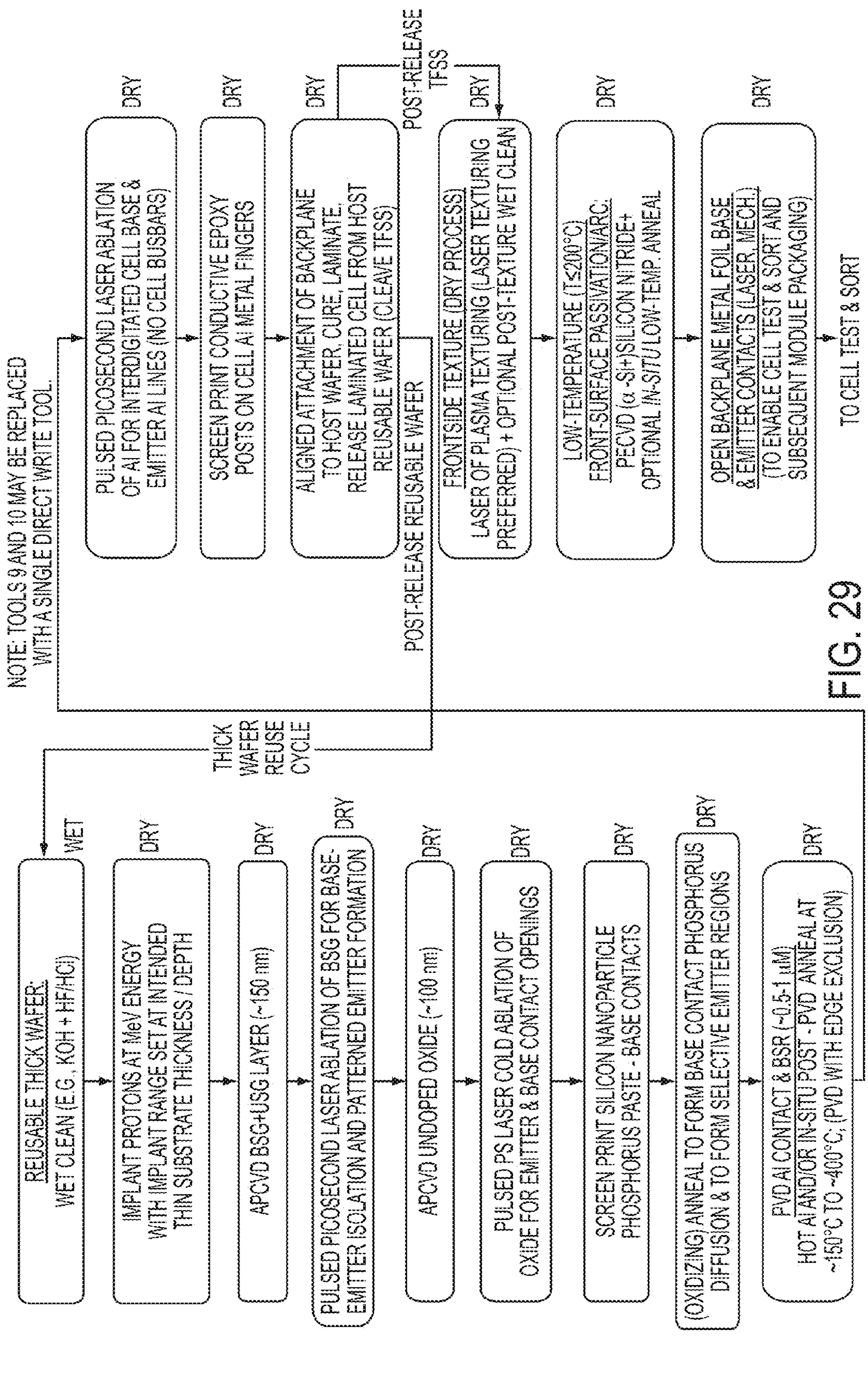
Figure 30:
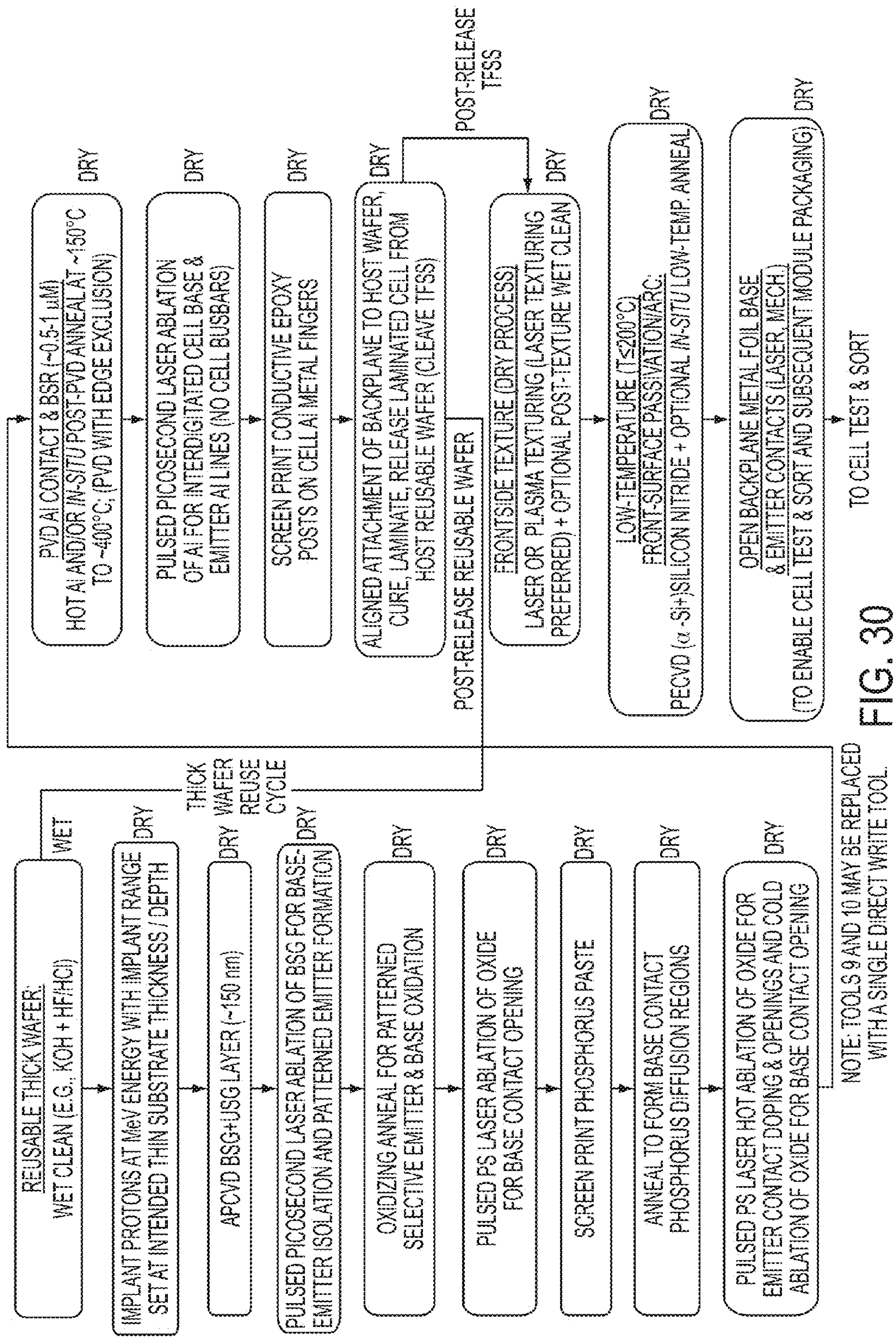

FIG. 27 corresponds to flow option 2A of FIG. 3, and may be characterized by the following attributes:

- Thin substrate formed by slicing/cleaving from reusable thick wafer or ingot piece (e.g., after MeV proton implant); the thin substrates are typically (111) substrates, requiring dry laser or plasma texturing
- Includes selective emitter without added process steps (using hot ablation process)
- Uses only one APCVD process step
- Base contact diffusion formed using screen printed or inkjet printed silicon nanoparticle phosphorus paste FIG. 28 corresponds to flow option 2B of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates, requiring dry laser or plasma texturing
- Includes selective emitter without added process steps (using hot ablation process)
- Uses two APCVD process steps
- Base contact diffusion formed using screen printed or inkjet printed silicon nanoparticle phosphorus paste FIG. 29 corresponds to flow option 2C of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates, requiring dry laser or plasma texturing
- No hot ablation process and no selective emitter
- Uses two APCVD process steps
- Base contact diffusion formed using screen printed or inkjet printed silicon nanoparticle phosphorus paste FIG. 30 corresponds to flow option 3A of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates, requiring dry laser or plasma texturing
- Includes selective emitter without added process steps (using hot ablation process)
- Uses only one APCVD process step
- Base contact diffusion formed using standard commercial phosphorus paste (e.g., applied by screen printing)

Figure 31:
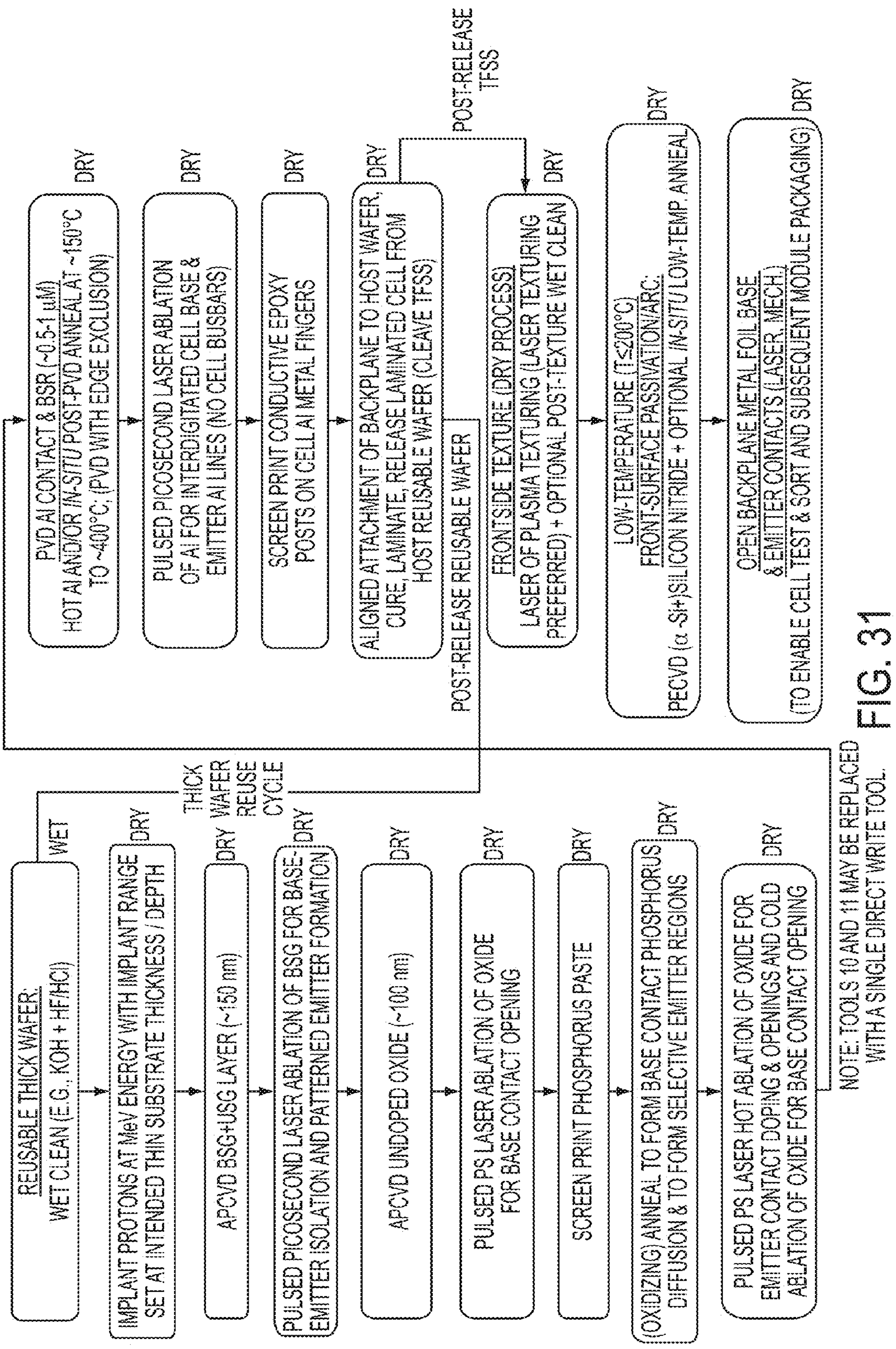

FIG. 31 corresponds to flow option 3B of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates, requiring dry laser or plasma texturing
- Includes selective emitter without added process steps (using hot ablation process)
- Uses two APCVD process steps
- Base contact diffusion formed using standard commercial phosphorus paste (e.g., applied using screen printing)

Figure 32:
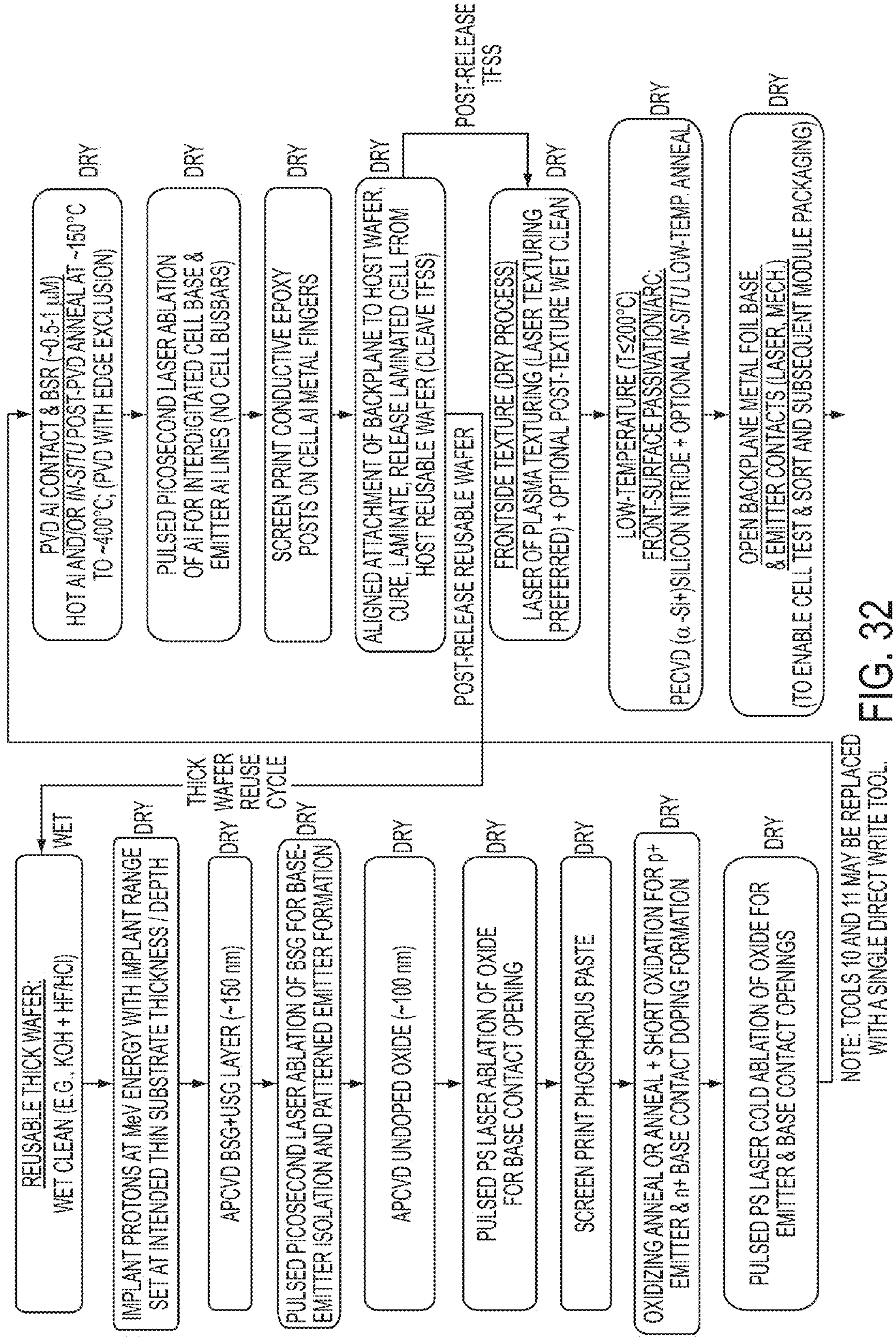

FIG. 32 corresponds to flow option 3C of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates, requiring dry laser or plasma texturing
- No hot ablation process and no selective emitter
- Uses two APCVD process steps
- Base contact diffusion formed using standard commercial phosphorus paste (e.g., applied using screen printing)

Figure 33:
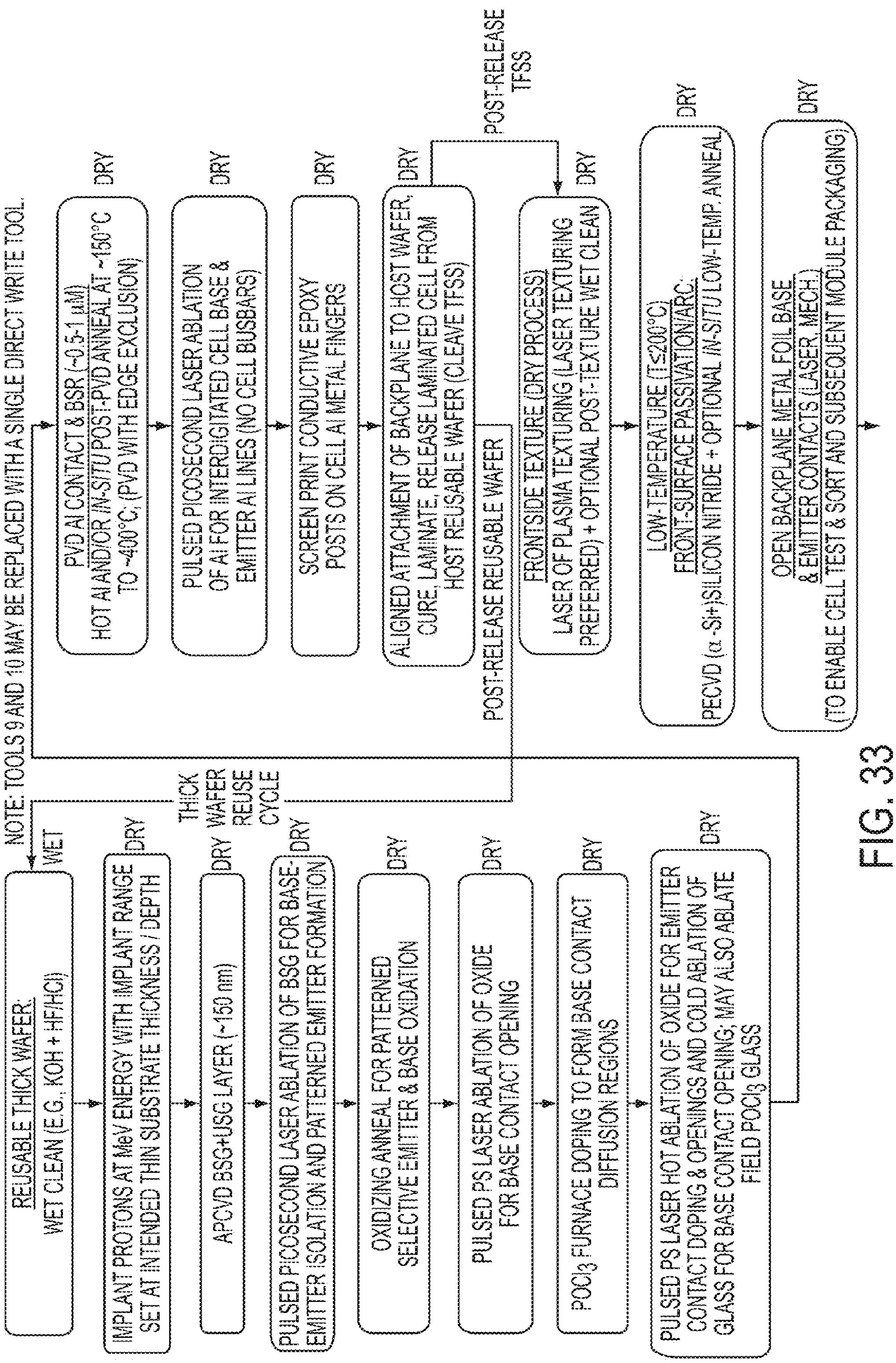
Figure 34:
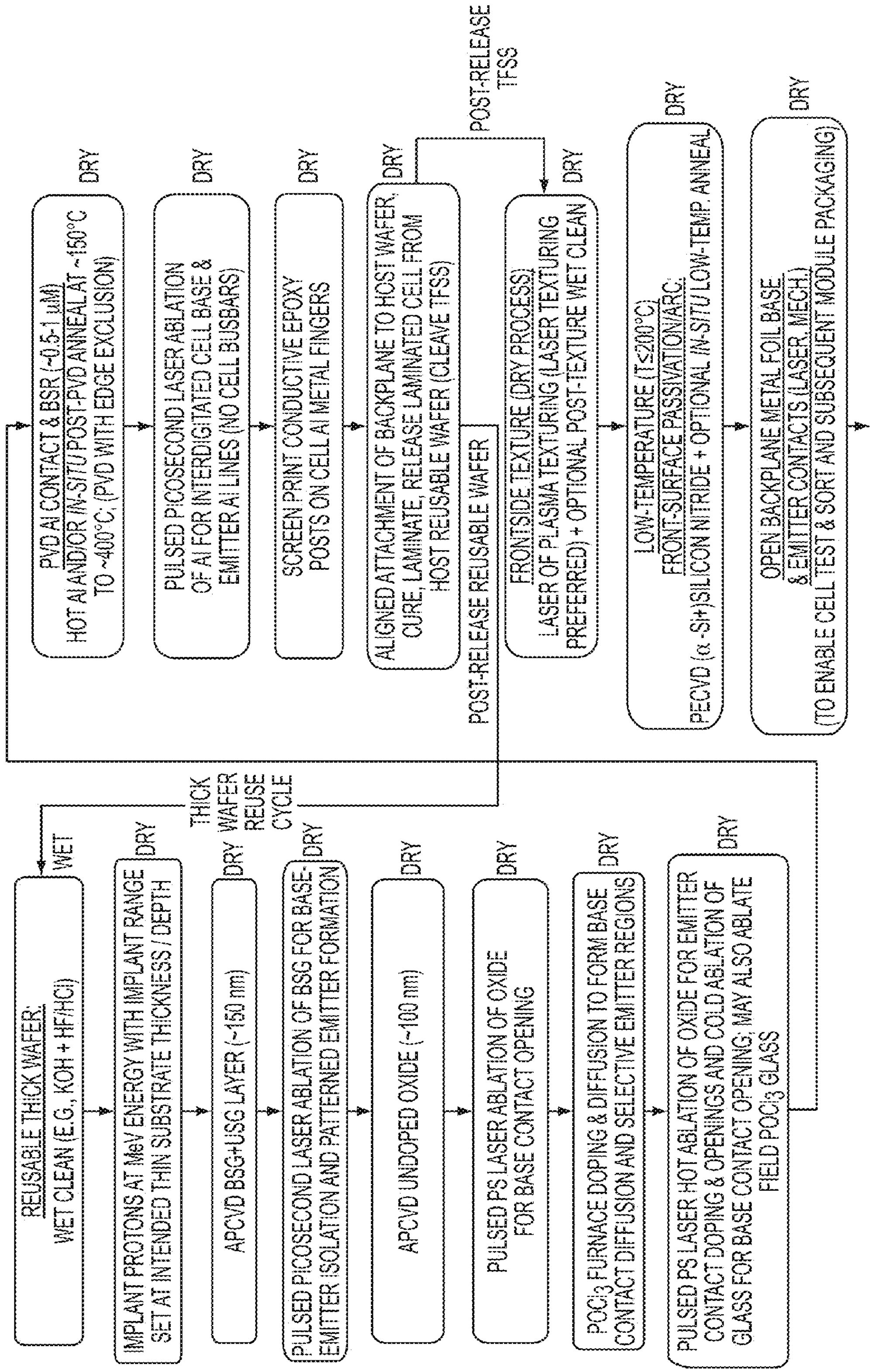
Figure 35:
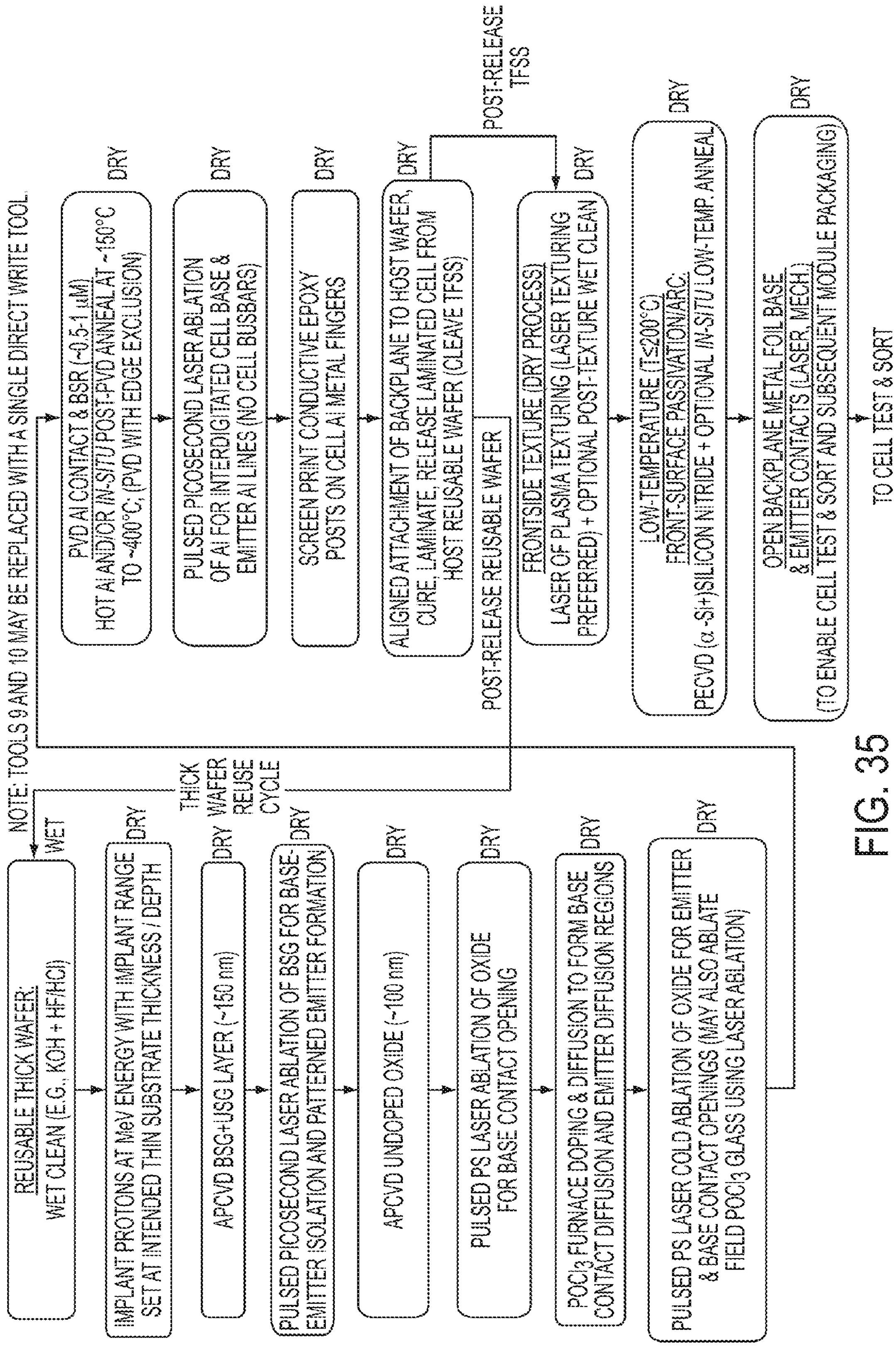

FIG. 33 corresponds to flow option 4A of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates, requiring dry laser or plasma texturing
- Includes selective emitter without added process steps (using hot ablation process)
- Uses only one APCVD process step
- Base contact diffusion formed using $POCl_3$ furnace doping FIG. 34 corresponds to flow option 4B of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates, requiring dry laser or plasma texturing
- Includes selective emitter without added process steps (using hot ablation process)
- Uses two APCVD process steps
- Base contact diffusion formed using $POCl_3$ furnace doping FIG. 35 corresponds to flow option 4C of FIG. 3, and may be characterized by the following attributes:

- Thin substrate formed by slicing/cleaving from reusable thick wafer or brick or ingot piece (e.g., after MeV proton implant); the thin substrates are typically (111) oriented substrates, requiring dry laser or plasma texturing
- No hot ablation process and no selective emitter

- Uses two APCVD process steps
- Base contact diffusion formed using $POCl_3$ furnace doping Specific Process Flows for Bulk CZ and FZ Wafers Using Backplane Technology.

In this category of flows representative back contacted/back junction process flows for bulk CZ (Czochralski) and FZ (Float Zone) wafers using backplane technology are detailed. Among distinguishing factors includes insertion of backplane and also the extensive use of pico-second laser processes for direct pattern definition. Although, not explicitly mentioned, if desired, the backplane technology may be used on the bulk FZ and CZ wafers to thin them down by etching to form much thinner cell absorbers, which may be useful when cheap bulk wafers are desired that may not render very high lifetimes. These cheaper, relatively lower lifetime wafers may also be of p-type bulk doping. Although, all the process flows depicted are examples of wafers with the preferred doping which is n-type base (bulk) doping.

Five categories of flows are detailed below—each category having two subcategories. Subcategories are distinguished by the method which is used to deposit and pattern metal on the cell. In the first sub-category, analogous to the previously described flows in this document, PVD along with laser based metal isolation processes are used to obtain patterned base and emitter metals. In the second sub-category, a direct patterned metal write technique is used in lieu of the PVD/laser isolation steps. Full process flows of the five main categories are detailed in the figures and descriptions; however, the categories may be defined according to the following characteristics:

CZ/FZ Option I: PSG based front surface field (FSF) which is formed before texture.

CZ/FZ Option II: POCl3 based FSF which is formed before texture. The process has no POCl3 glass deglaze step.

CZ/FZ Option III: POCl3 based FSF with the POCl3 glass deglaze.

CZ/FZ Option IV: PSG based FSF formed after texture.

CZ/FZ Option V: No FSF

Figure 36:
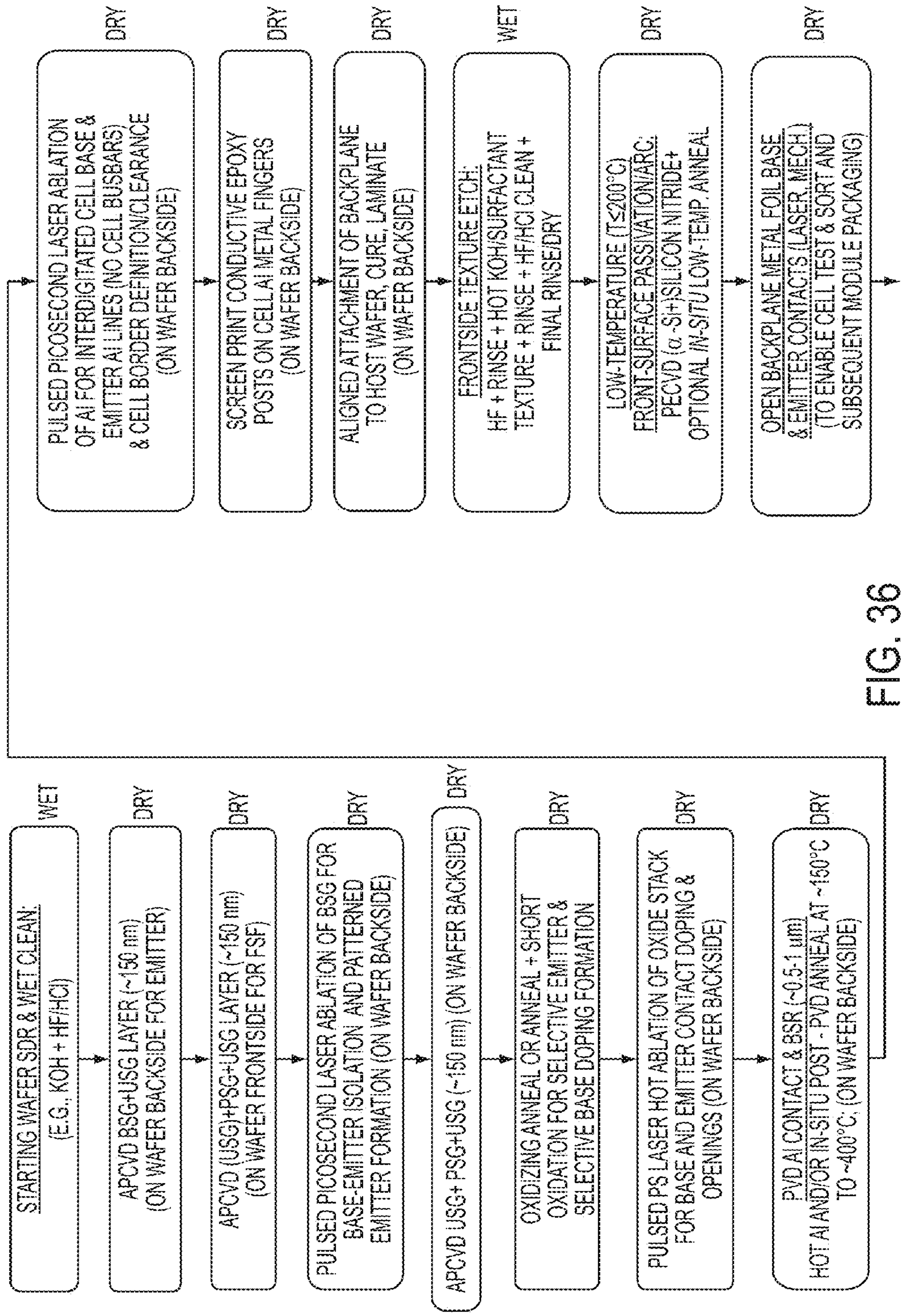
FIGS. 36 through 45 are back contact solar cell manufacturing process flows using a bulk wafer.

FIG. 36 corresponds to CZ/FZ Option I, and may be characterized by the following attributes:

- Includes selective emitter without added process steps (using hot ablation process)
- Separated Base-Emitter Junction
- Uses two APCVD processes
- Base contact diffusion formed using APCVD PSG and hot laser ablation
- APCVD PSG used for frontside FSF as well as backside base contact diffusion
- Pre-texture FSF formation
- In-Line backplane attachment
- Metal deposition may be performed using plasma sputtering, vacuum evaporation, atmospheric arc/thermal spray coating, etc.

Figure 37:
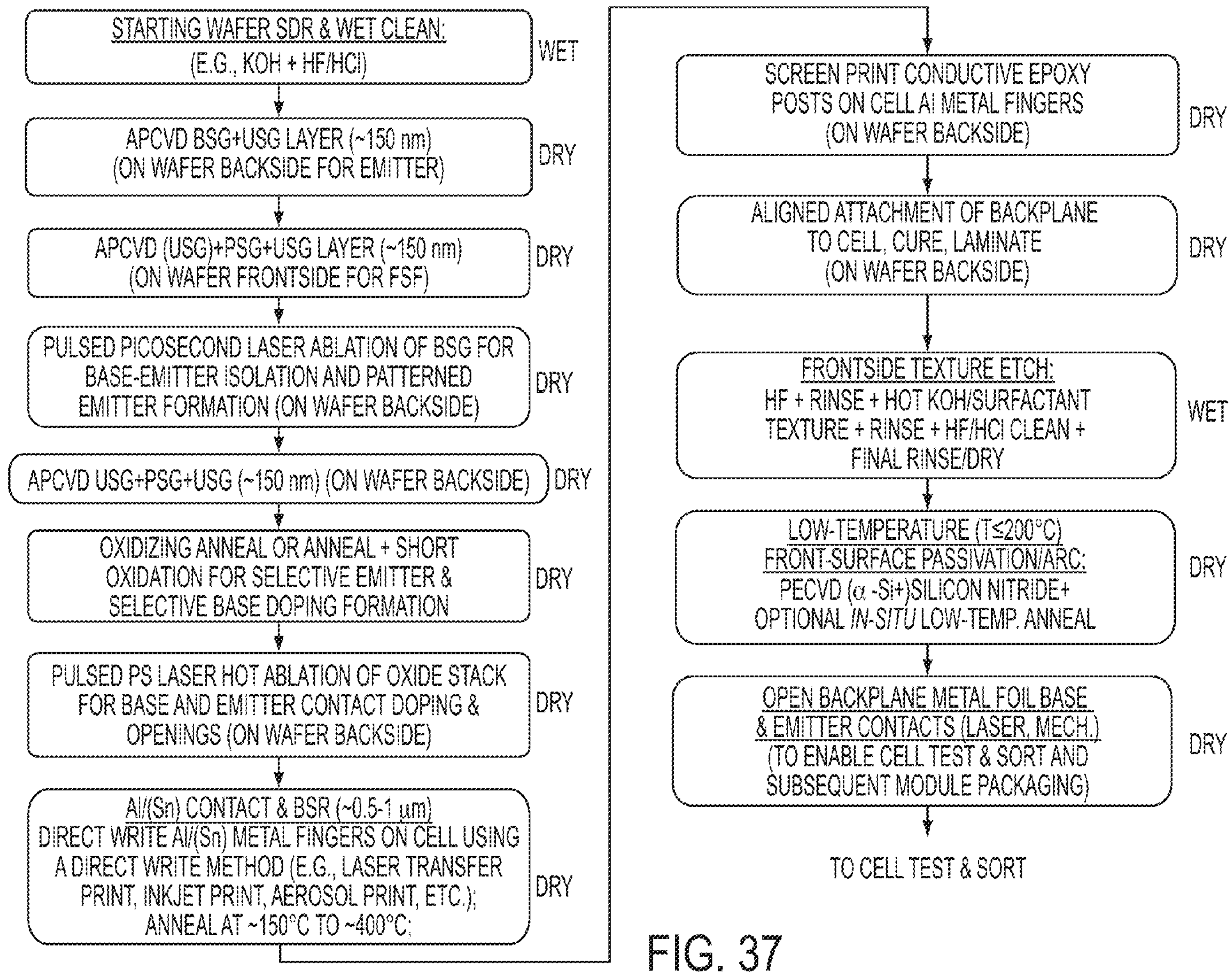

FIG. 37 corresponds to CZ/FZ Option I, and may be characterized by the following attributes:

- Includes selective emitter without added process steps (using hot ablation process)
- Separated Base-Emitter Junction
- Uses two APCVD processes
- Base contact diffusion formed using APCVD PSG and hot laser ablation
- APCVD PSG used for frontside FSF as well as backside base contact diffusion
- Pre-texture FSF formation
- In-Line backplane attachment
- Metal deposition may be performed using a direct write process such as laser transfer printing, inkjet printing, aerosol printing, etc.

Figure 38:
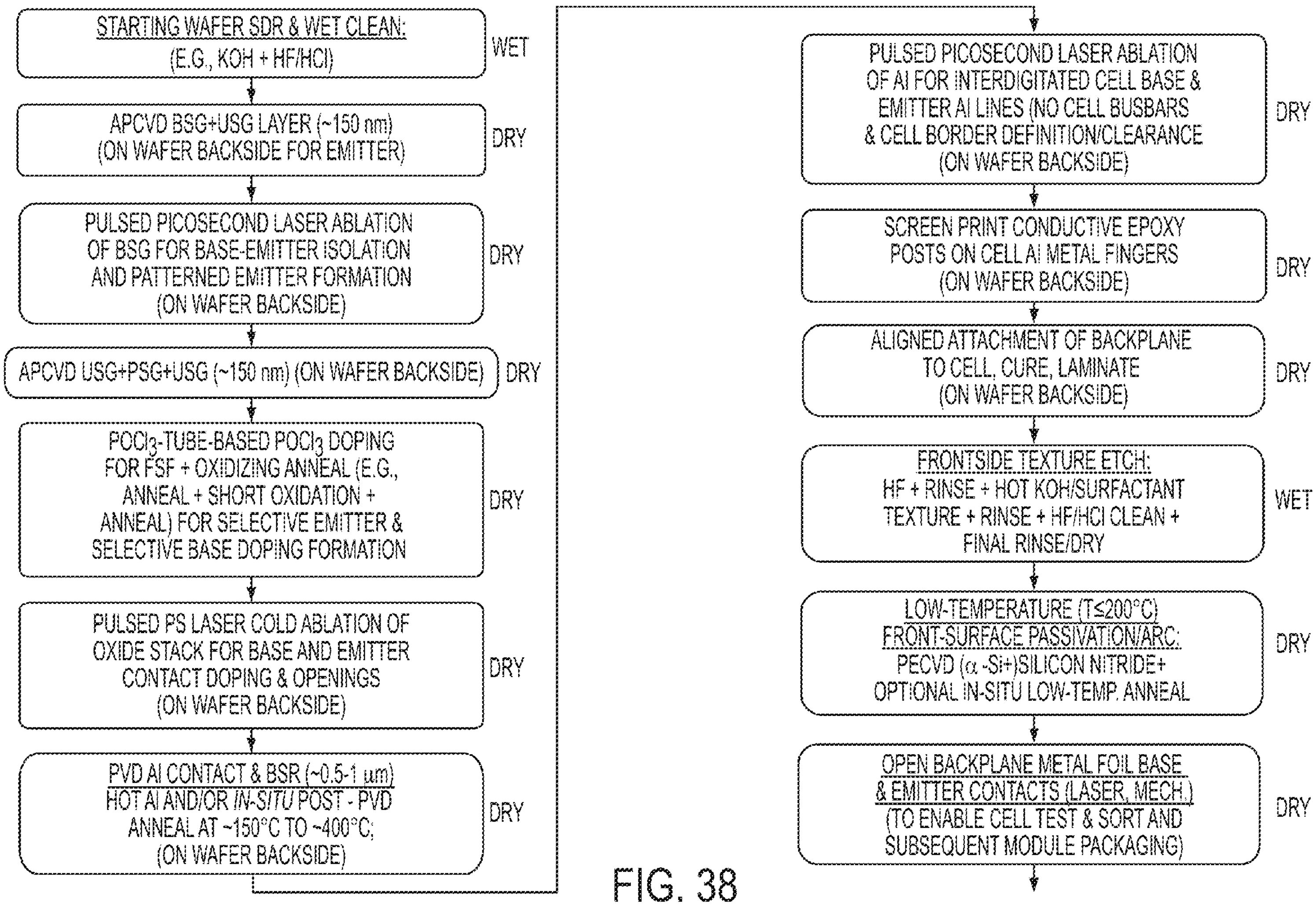

FIG. 38 corresponds to CZ/FZ Option II, and may be characterized by the following attributes:

- Includes selective emitter without added process steps (using hot ablation process)
- Separated Base-Emitter Junction
- Uses two APCVD processes
- Base contact diffusion formed using APCVD PSG and hot laser ablation
- APCVD PSG used only for backside base contact diffusion
- POCl3-tube-based anneal used to concurrently or sequentially anneal and oxidize
- No POCl3 glass deglaze
- Pre-texture FSF formation
- Metal deposition may be done using vacuum sputtering, vacuum evaporation, atmospheric arc/thermal spray coating, etc.

Figure 39:
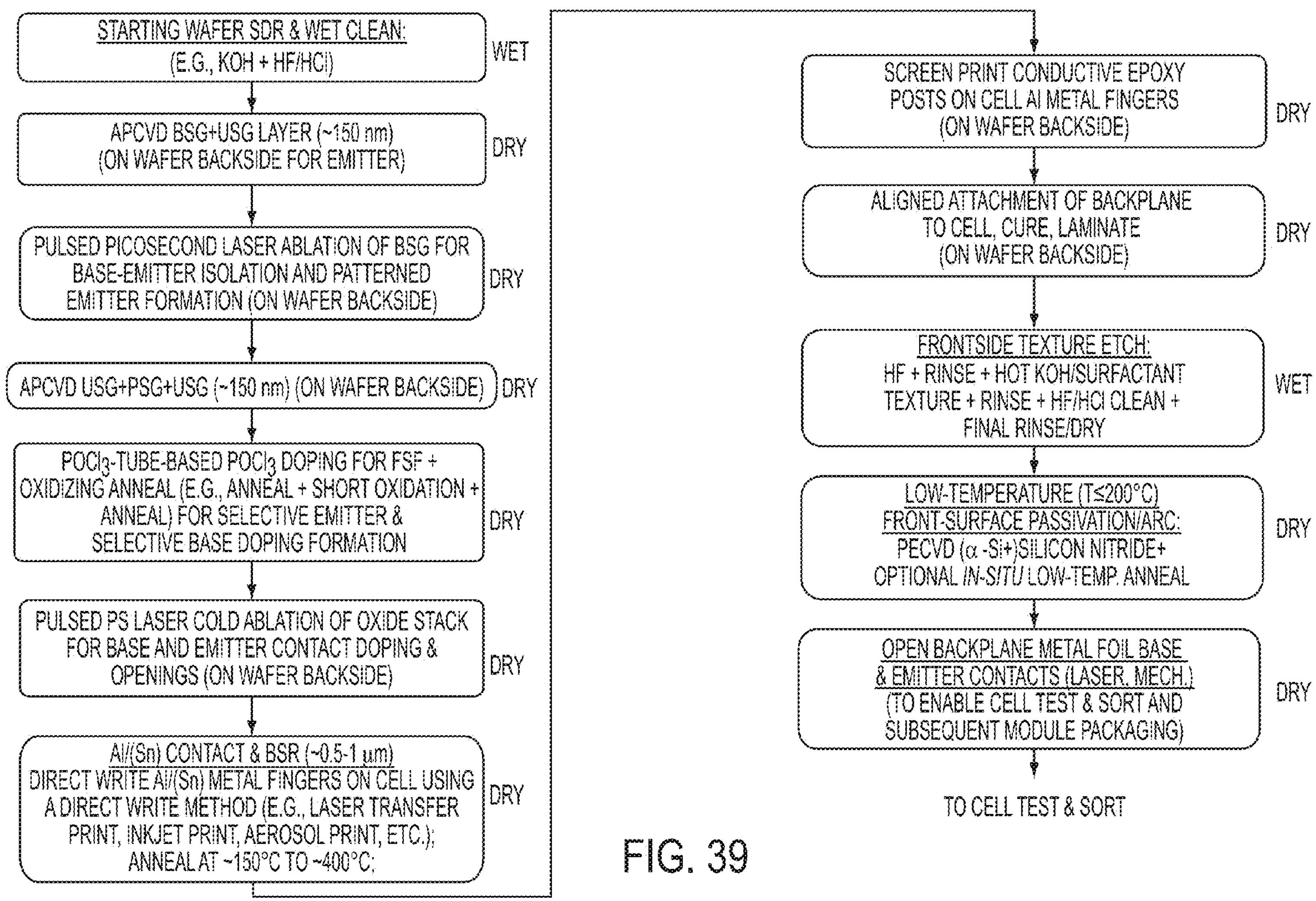

FIG. 39 corresponds to CZ/FZ Option II with main attributes similar to FIG. 38 except the direct write for metal, and may be characterized by the following attributes:

- Includes selective emitter without added process steps (using hot ablation process)
- Separated Base-Emitter Junction
- Uses two APCVD processes
- Base contact diffusion formed using APCVD PSG and hot laser ablation
- APCVD PSG used only for backside base contact diffusion
- POCl3-based furnace anneal used to concurrently or sequentially anneal and oxidize
- No POCl3 glass deglaze
- Pre-texture FSF formation
- Metal deposition may be performed using a direct write process such as screen printing, laser transfer printing, inkjet printing, aerosol printing, etc.

Figure 40:
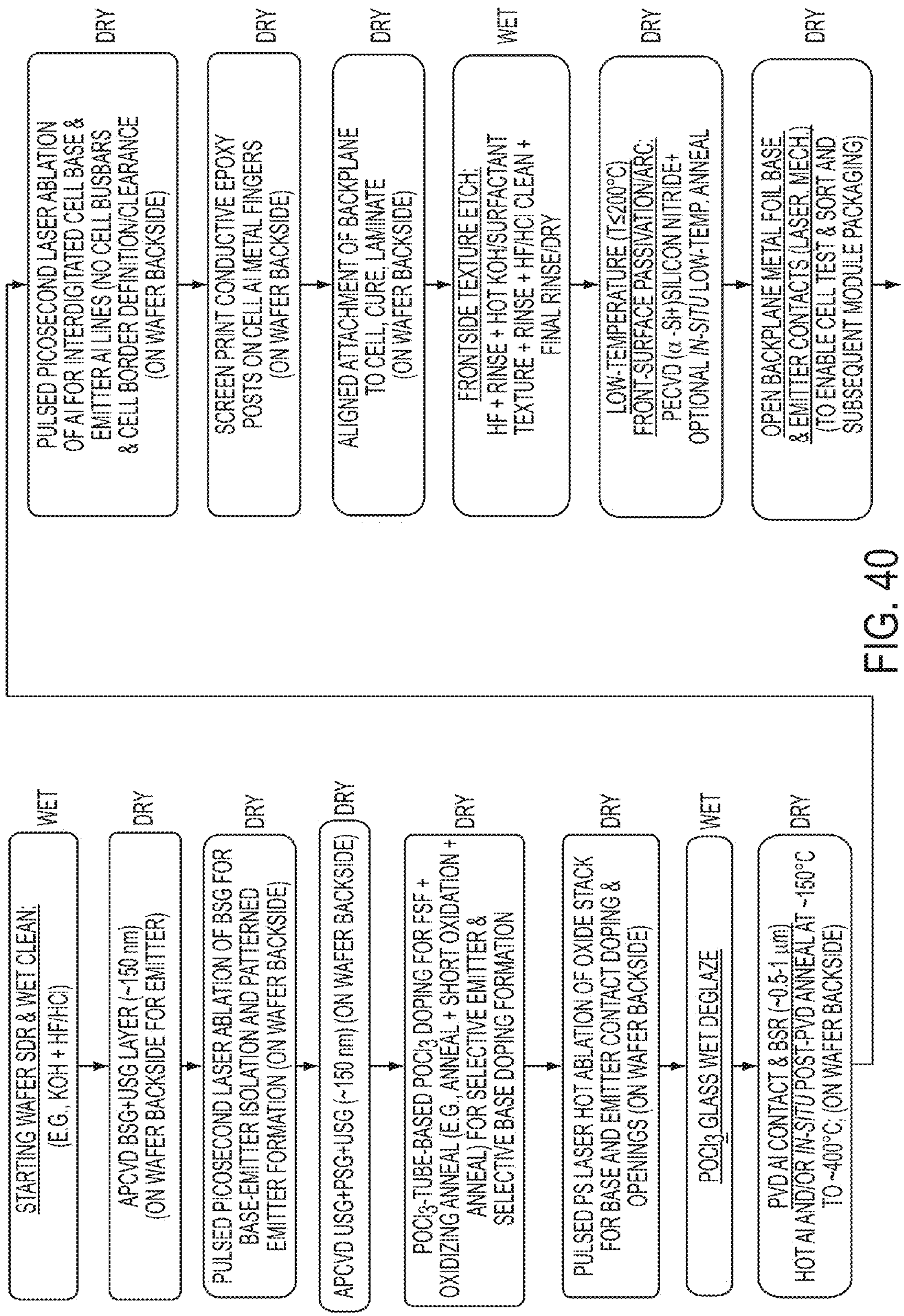

FIG. 40 corresponds to CZ/FZ Option III, and may be characterized by the following attributes:

- Includes selective emitter without added process steps (using hot ablation process)
- Separated Base-Emitter Junction
- Uses two APCVD processes
- Base contact diffusion formed using APCVD PSG and hot laser ablation
- APCVD PSG used only for backside base contact diffusion
- POCl3-based furnace anneal used to concurrently or sequentially anneal and oxidize
- With POCl3 glass deglaze
- Pre-texture FSF formation
- Metal deposition may be performed using plasma sputtering, vacuum evaporation, atmospheric arc/thermal spray coating, etc.

Figure 41:
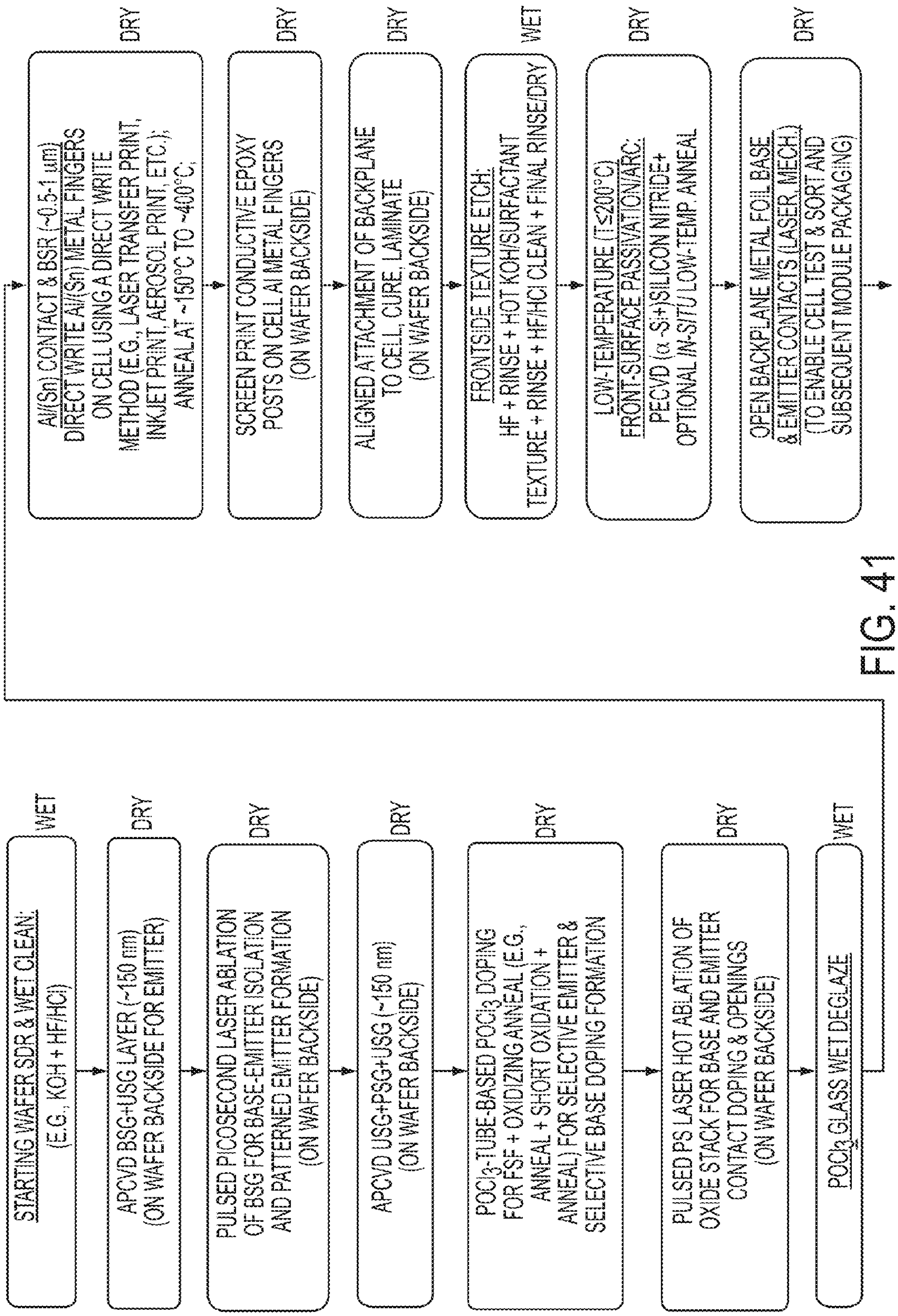

FIG. 41 corresponds to CZ/FZ Option III, and may be characterized by the following attributes:

- Includes selective emitter without added process steps (using hot ablation process)
- Separated Base-Emitter Junction
- Uses two APCVD processes
- Base contact diffusion formed using APCVD PSG and hot laser ablation
- APCVD PSG used only for backside base contact diffusion POCl3-based furnace anneal used to concurrently or sequentially anneal and oxidize
With POCl3 glass deglaze
Pre-texture FSF formation
Metal deposition may be performed using a direct write process such as screen printing, laser transfer printing, inkjet printing, aerosol printing, etc.

Figure 42:
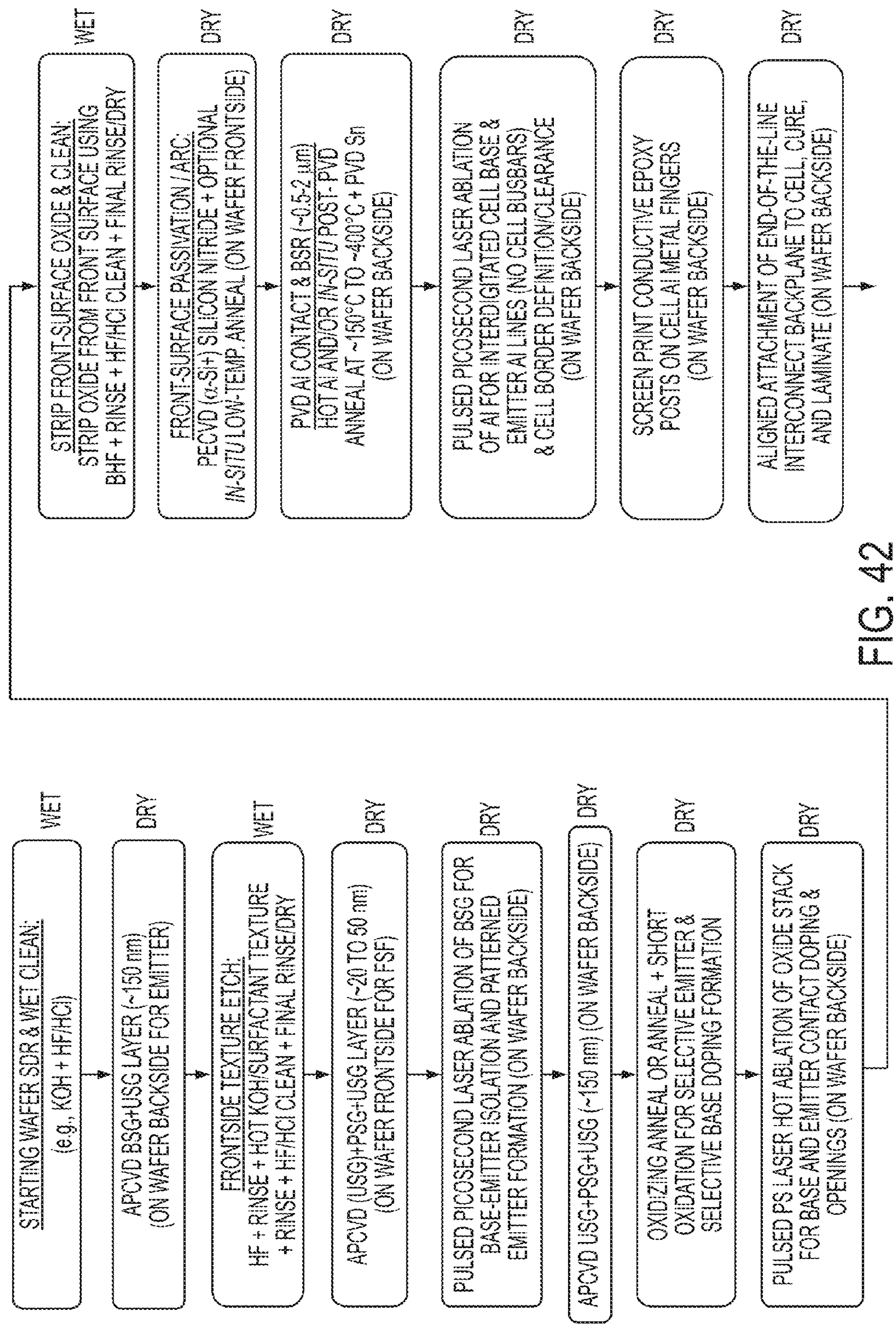

FIG. 42 corresponds to CZ/FZ Option IV, and may be characterized by the following attributes:

Includes selective emitter without added process steps (using hot ablation process)
Separated Base-Emitter Junction
Uses two APCVD processes
Base contact diffusion formed using APCVD PSG and hot laser ablation
APCVD PSG used for frontside FSF as well as backside base contact diffusion
Post-texture FSF formation
Metal deposition may be performed using plasma sputtering, vacuum evaporation, atmospheric arc/thermal spray coating, etc.

Figure 43:
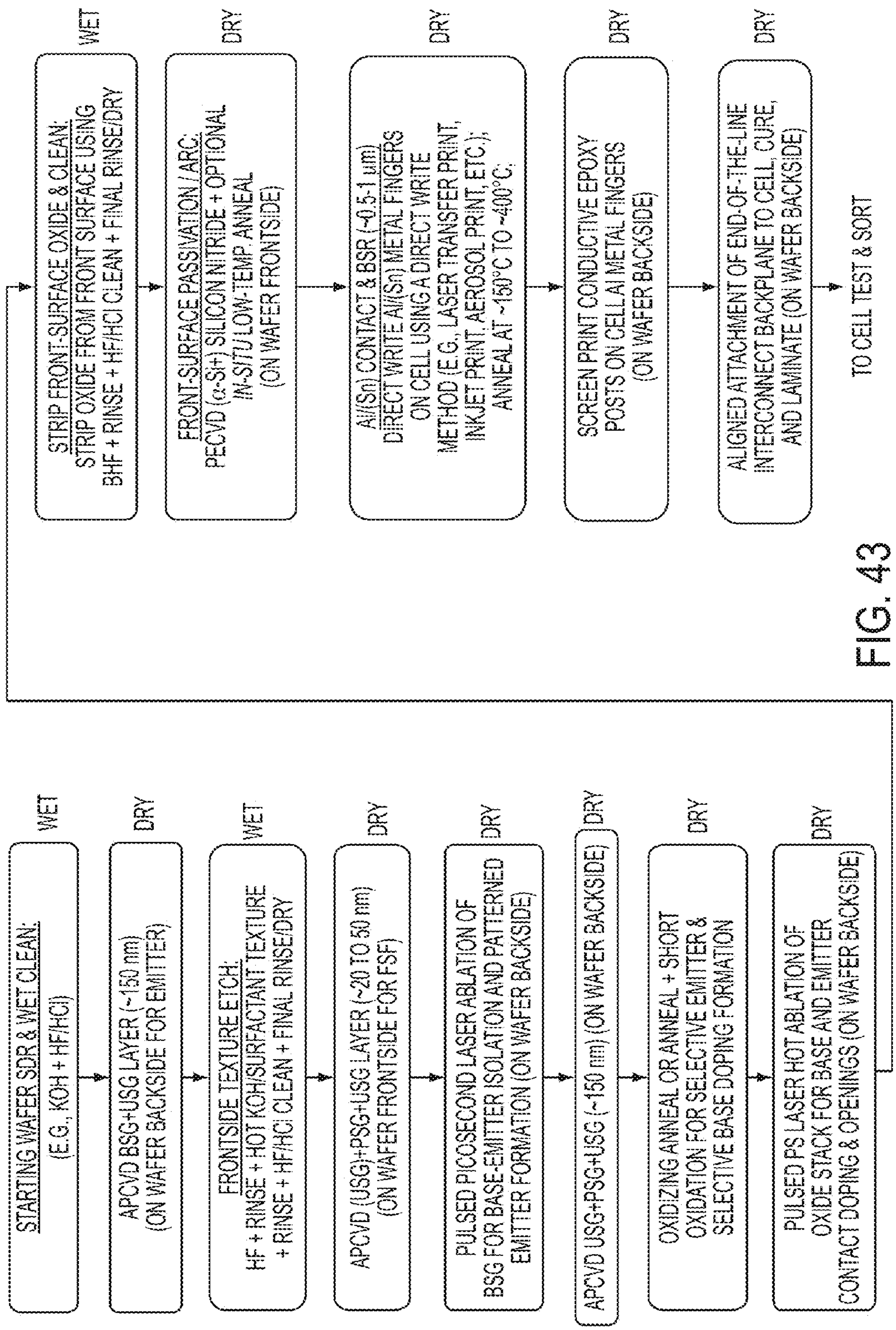

FIG. 43 corresponds to CZ/FZ Option IV, and may be characterized by the following attributes:

Includes selective emitter without added process steps (using hot ablation process)
Separated Base-Emitter Junction
Uses two APCVD processes
Base contact diffusion formed using APCVD PSG and hot laser ablation
APCVD PSG used for frontside FSF as well as backside base contact diffusion
Post-texture FSF formation
Metal deposition may be performed using a direct write process such as screen printing, laser transfer printing, inkjet printing, aerosol printing, etc.

Figure 44:
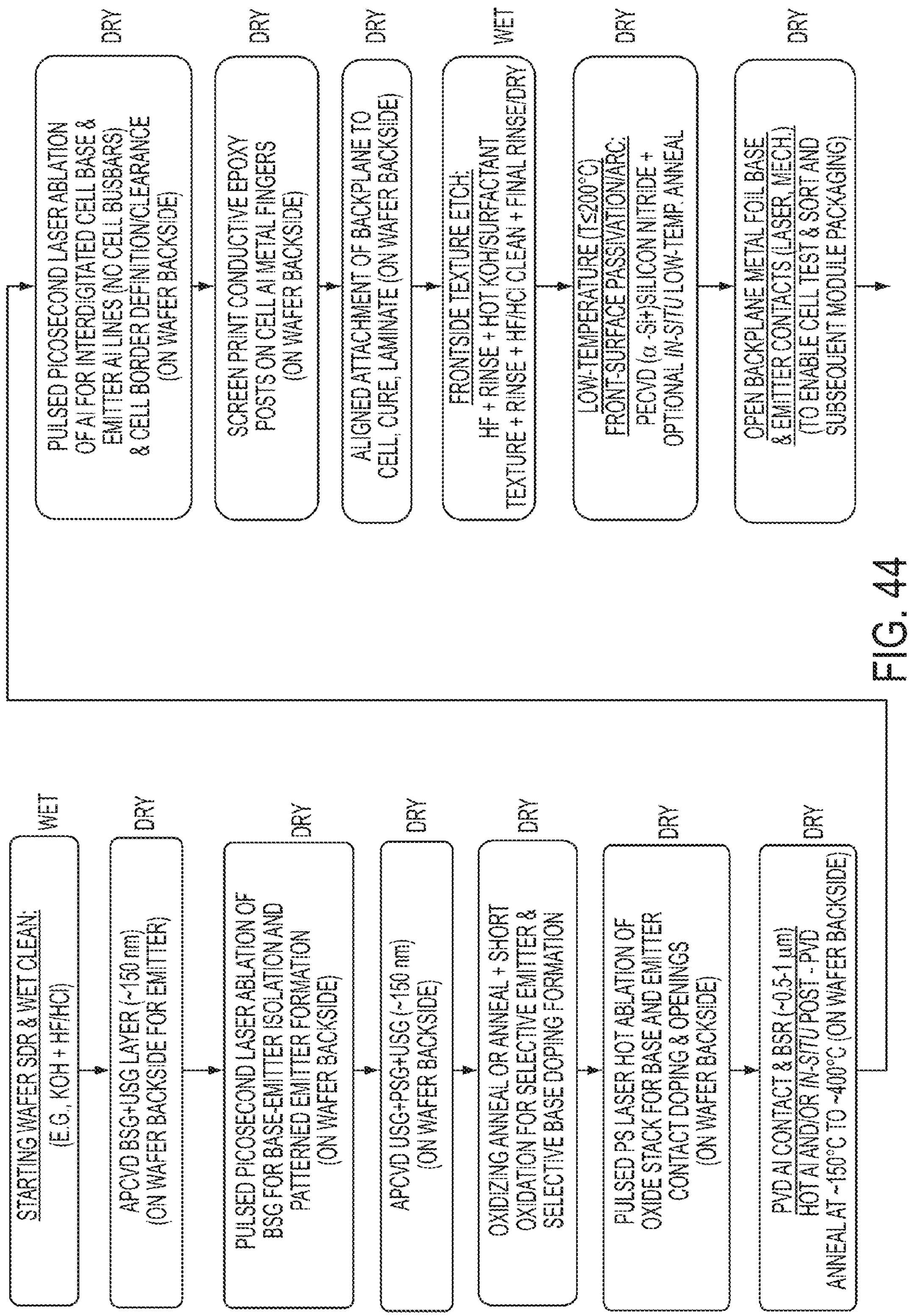

FIG. 44 corresponds to CZ/FZ Option V, and may be characterized by the following attributes:

Includes selective emitter without added process steps (using hot ablation process)
Separated Base-Emitter Junction
Uses two APCVD processes
Base contact diffusion formed using APCVD PSG and hot laser ablation
APCVD PSG used for backside base contact diffusion
No FSF
Metal deposition may be performed using plasma sputtering, vacuum evaporation, atmospheric arc/thermal spray coating, etc.

Figure 45:
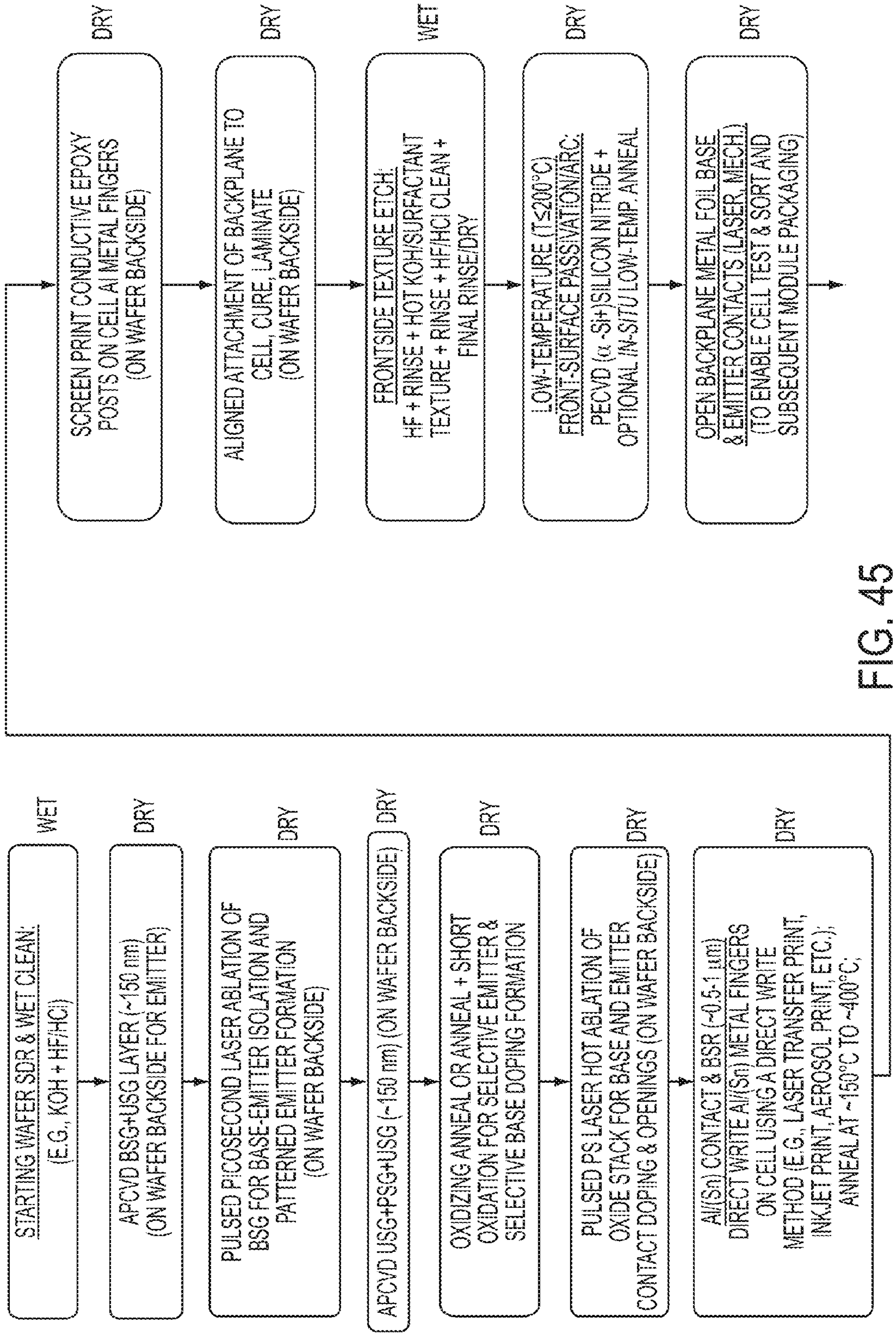

FIG. 45 corresponds to CZ/FZ Option V, and may be characterized by the following attributes:

Includes selective emitter without added process steps (using hot ablation process)
Separated Base-Emitter Junction
Uses two APCVD processes
Base contact diffusion formed using APCVD PSG and hot laser ablation
APCVD PSG used for backside base contact diffusion
No FSF
Metal deposition may be performed using a direct write process such as screen printing, laser transfer printing, inkjet printing, aerosol printing, etc.

Figure 46:
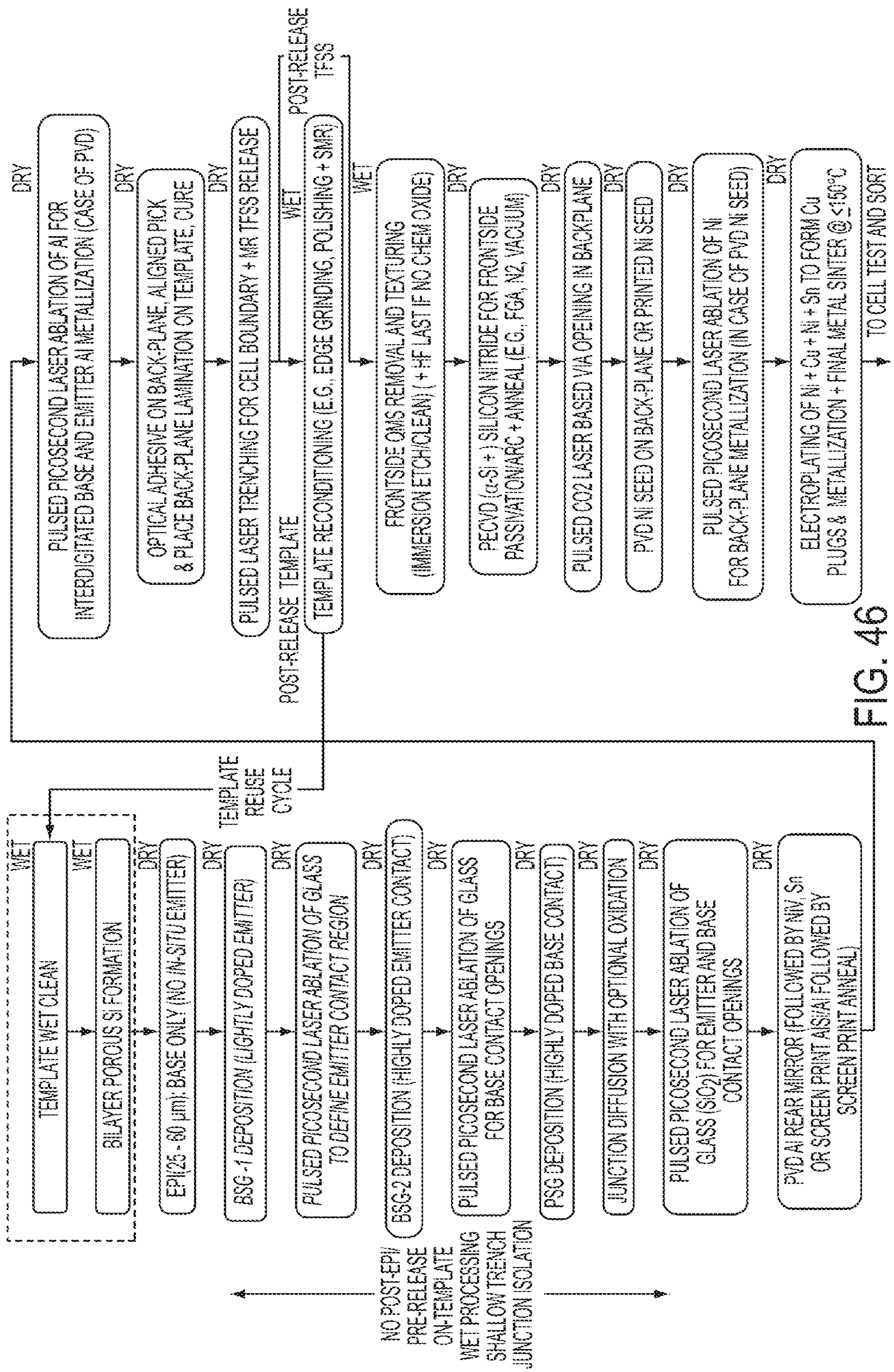
FIG. 46 is a back contact solar cell manufacturing process flow for a selective emitter.
Figure 47:
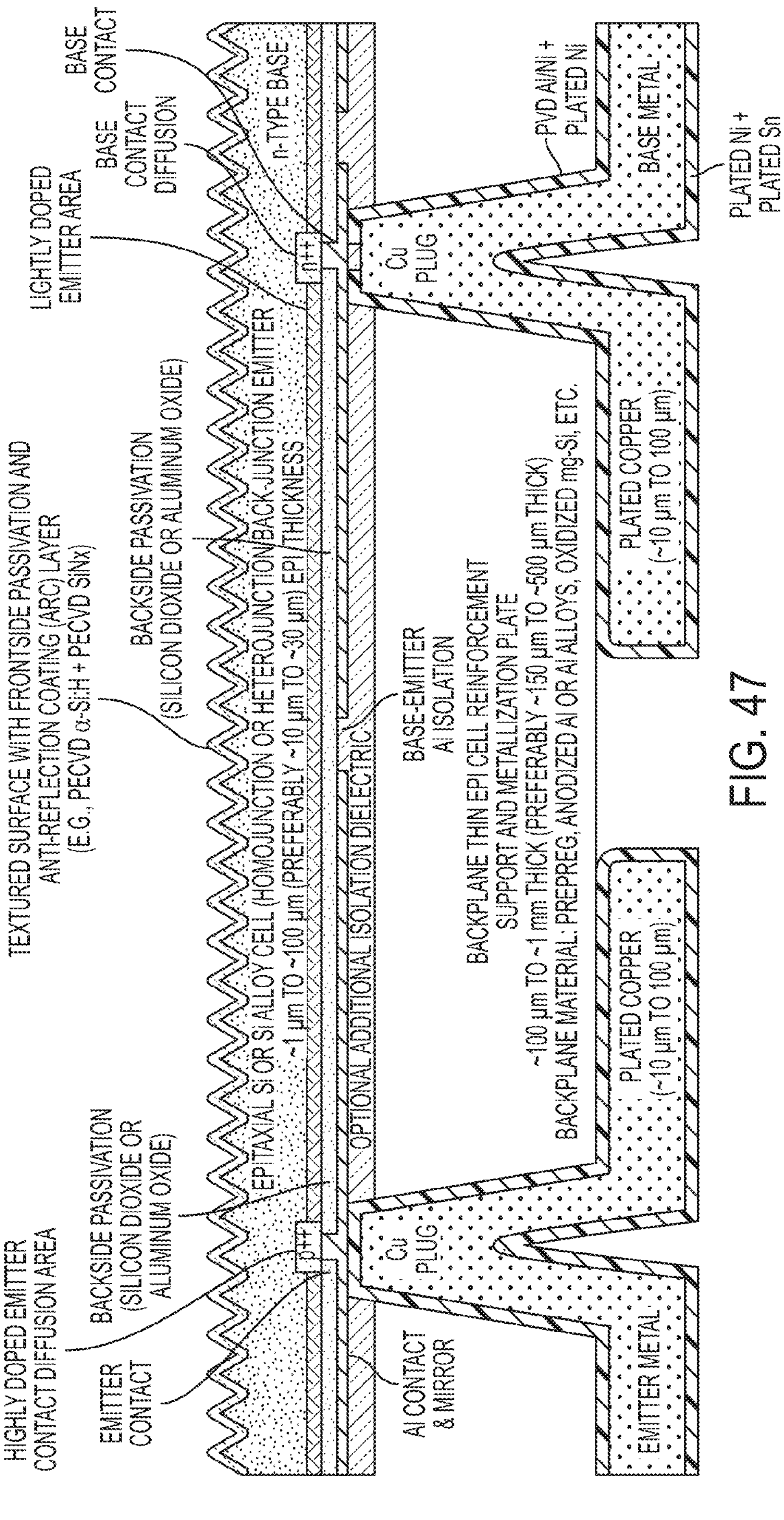
FIG. 47 is a cross-sectional diagram of a cell resulting from the flow of FIG. 46.

In addition to the flow family 1B outlined in FIG. 3, it is also possible and desirable to generate a selective emitter structure on the back side by the use of two separate BSG layer depositions, together with an additional cold pulsed ps (or fs) laser ablation step. This selective emitter structure using APCVD layers and laser ablation is applicable as a variation of all previously described structures and flows, be they on absorber layers generated from epitaxially deposited films, from CZ wafer or from otherwise processed absorber layers such as those cleaved using high energy such as MeV implantation and splitting. FIG. 46 shows a cell process flow to generate selective emitter structure (with lighter emitter junction doping and heavier emitter contact doping concentrations) using an additional BSG layer and picosecond laser ablation patterning. FIG. 47 is a diagram showing the cross section of the resulting cell structure from the flow of FIG. 46, the cell containing a selective emitter formed by two BSG depositions with different diffused sheet resistances.

As seen in FIG. 46, starting with a cleaned template the porous silicon bilayer or layer structure is formed. A lightly n-type doped epitaxial film (in-situ base doping typically in the range of about $5\times10^{14}$ $cm^{-3}$ to $1\times10^{18}$ $cm^{-3}$, thickness between about 5 μm and 100 μm) is deposited. The base phosphorus doping concentration may be varied based on a pre-specified profile during the epitaxial growth process (again, preferably in the range of about $5\times10^{14}$ $cm^{-3}$ to $1\times10^{18}$ $cm^{3}$). As outline previously, the doping is optionally done using more than one doping level to implement optimized doping, for instance, to achieve both high Voc (high mirrority carrier lifetime) and high fill factor (reduced parasitic base resistance). Such optimized doping may consist of a front surface field where a higher doping close to the sunny side surface of the device is implemented. However, it may also be advantageous to have a lower doping in that regime, which in turn can also lead to a better front surface recombination velocity but from a different effect. That effect is believed to be due to the band lineup at the surface with respect to the band position of interface states and which renders such interface states less severe.

After epitaxial silicon layer deposition, a first BSG layer is deposited with a rather low concentration of boron to later provide a lightly doped emitter in the bulk of the back surface region. This process is followed by laser ablation (preferably picosecond laser) of the area where the emitter contact is to be formed. This and the subsequent structuring processes can advantageously contain parallel lines across the structure. Areas of emitter contacts and base contacts are aligned in an alternating interdigitated pattern. In certain zones, namely in the zones where later in the process the busbars are located on the metal 2 layer (second metal deposition), it may be advantageous to deviate from the linear, parallel, interdigitated base and emitter contact pattern. This deviation is employed to drastically reduce the electrical shading that is otherwise experienced underneath each busbar. Next the second BSG layer is deposited with a comparatively higher concentration of boron, such as to provide the highly doped emitter contact region (e.g., with p++ doping). Subsequently, the area for the base contact is laser ablated, preferably using a picosecond laser. Next, a PSG layer is deposited, to serve as the precursor for the phosphorus doped base contact. Subsequently, the dopants are driven in during a multi-functional high temperature process step which optionally can contain a neutral ambient such as nitrogen, optionally followed by an oxidizing ambient such as oxygen or water steam (and furthermore, optionally comprising backend lower temperature gettering and finally forming gas anneal). The junctions are now driven in. Contact can subsequently be made by laser ablation in the contact area, preferably using picosecond laser. Next, the metal 1 (first metal deposited and metal positioned closest to cell) is deposited and structured, either using PVD of for instance a stack of Al, Ni or NiV and Sn, followed by patterning using for instance, picosecond laser ablation, or by screen printing, aerosol printing, ink jet or otherwise printing one or more layers of aluminum containing paste. The aluminum paste may be selected to contain in a first layer some silicon to reduce spiking into the junctions upon subsequent annealing, or other spike reducing agents. In a second layer, also attributed to the structure of metal 1, the paste or ink can be selected to contain a suitable grain structure to harmonize well with the later via access hole drilling which is employed to make contact between metal 1 and metal 2. Other selection criteria are the optimized conductivity to have a low line resistance within metal 1 (M1). Especially for the lower ink or paste it is also crucial to select the correct paste for a low contact resistance to both the base and the emitter. Where desired, different pastes or inks, even containing different metals, may be employed to make the contact to the baser contact diffusion versus to the emitter contact diffusion. For example, the initial metal 1 layer can be a thin layer of ink such as nickel ink which can be deposited very locally in the contact regions and then turned into a silicide by heating, preferably in a self limiting process. However, the subsequent layer of metal 1 be treated at low enough temperatures to provide the lowest resistivity phase of the respective silicide formed. It is to be noted that in order to facilitate a good process window for later via access hole laser drilling while at the same time keeping metal 1 consumption (thickness) and cost per cell in check, it may be advisable to locally print thicker aluminum metal paste pads underneath the designated via holes areas, while printing a much thinner aluminum paste elsewhere on the cell to form the continuous or segmented fingers. This design may be formed, for example, by printing additional metal paste material in the area of the via hole (hence, double screen printing of the metal paste) or also by increasing the line width in the area of the via hole for better alignment tolerance or by combinations of the former and the latter.

It is to be noted that all flows and structures described in this disclosure may, in alternative embodiments, use printing processes for metal 1 paste such as ink jet, aerosol or screen printing, although PVD followed by picosecond (or fs) laser ablation patterning is explicitly mentioned as the method for metal 1 deposition. Subsequent to paste or ink printing, the pastes or inks can be suitably baked and annealed. Next, the backplane can be attached, for instance, but not limited to lamination of a suitable low-CTE prepreg material, or by first screen printing and heat or radiation treatment, such as by UV radiation, of another adhesive filler, optionally between the metal 1 spaces in order to planarize the surface prior to the backplane lamination. If such an additional adhesive is used, the backplane material, such as prepreg, can be laminated to the relatively planarized surface structure afterwards.

The lamination material, such as prepreg, may be smaller in extent than the template side dimension for instance a few millimeters on each side. For instance, for a standardized 156 mm×156 mm final cell it may be advantageous to have a lamination material just larger, for instance about 158 mm×158 mm, and a template just larger than that, for instance about 165 mm×165 mm.

After the lamination, in the area just outside the lamination region an ablated trench of silicon can be cut partially or fully through the epitaxial film with a laser, preferably a nanosecond UV laser, or alternatively employing thermal laser separation, a process where locally an area is heated using a travelling laser beam and subsequently cooled, using a trailing jet of mist, water or other coolant such as helium, thereby creating a cleaving front which can be terminated in the region of the release layer, formed by the porous silicon and thereby at the interface between the epitaxial layer and the template.

Following such preparation, the laminated reinforced thin film solar substrate (TFSS) may be released from the template, preferably by a pulling process, a peeling process, a pull-peeling process or through the support of sonication, such by either immersing the TFSS and template stack in an ultrasonic bath or by adding ultrasonic energy to a dry release station with the capability of applying vacuum to both sides of the stack, or by vacuum oscillation or by a combination of the above. After release of the TFSS the remaining template undergoes a process in which the area outside of the active released area is stripped of remaining epitaxial material, by grinding it off, by the use of water or other liquid pressure, by chemical removal or by a combination of the above. Subsequently, the template is cleaned and inspected and then fed back into circulation, for another round of porous silicon formation, epitaxial film deposition and so on.

The released TFSS is then trimmed to size, preferably using one or a combination of several lasers, for instance a UV or green nanosecond laser. Such trimming to size can also contain a partial ablation trench just inside of the edge boundary, to make the structure less prone to propagation of microcracks from the outside of the device. After trimming the TFSS is then textured, for instance using an alkaline texture chemistry, such as KOH with a suitable additive, followed by a post texture clean, for instance using HF and HCl, and finishing with a hydrophobic surface (for instance, using an HF-last cleaning step). Next, the TFSS receives the front side passivation, for instance by deposition of a-Si or a-SiOx, followed by ARC layer deposition, such as Silicon nitride (SiN), all preferably performed using PECVD.

The silicon nitride also contributes to the front side passivation by providing hydrogen as well as a positive charge to repel the base mirrority carriers. Either during the deposition or at a later step such as end of the line, the passivation layer and interface may be annealed, for instance, using a forming gas or a neutral ambient or in vacuum, to improve passivation. Such anneal may be performed at a temperature in the range of about 200° C. up to the maximum temperature allowable by the backplane material, as well as ensuring no crystallization of amorphous silicon (or silicon oxide) and ensuring formation of no microcracks. The maximum allowable temperature may be as high as about 300° C. to 350° C.

Subsequently, the backside of the wafer receives via holes, preferably drilled using a CO2 laser and stopping on or just inside the metal 1 layer. Next, the metal 2 deposition is employed, which may be arranged orthogonally to metal 1. An exception is the bus bar area if it is desired to be part of metal 2. As stated before, underneath the bus bars, metal 1 fingers as well as emitter and base regions are preferably arranged differently in order to minimize overall electrical shading from the bus bar area.

Prior to metal 2 deposition, a surface clean of the contact may be employed, such as with a sub-atmospheric or atmospheric plasma etch or cleanup to remove native oxide. For the metal 2 application, various techniques, such as those described above, may be employed, including a PVD seed which is later patterned using resist print, plating of Cu and Sn, resist strip and local seed layer etch or a pattern or unpatterned printed seed layer, such as printed nickel ink or paste (or a copper ink or paste), followed by suitable baking and subsequent copper plating. Alternatively, the metal 2 layer may also be applied using thermal spraying such as flame spraying of Al, Al with Zn, or Cu or Cu followed by Sn. The thermal spraying may be performed in lines or through a patterned mask that is periodically cleaned.

Dimensions for the metal 2 layer may be relaxed as the region access is mainly achieved by the smaller dimension metal 1 layer and metal 2 layer being arranged orthogonally to metal 1. The laminated backplane serves among other functions (such as permanent support and reinforcement) also that of the isolating dielectric between metal 1 and metal 2 layers and to provide the matrix for the via holes which provide access between the two layers (M1 and M2). Exemplary thickness dimensions for the cell of FIG. 47 include: epitaxial Si ~10 to 50 μm, backside passivation oxide 50 to 250 nm, backplane (prepreg, anodized Al alloy or oxidized metallurgical grade silicon: mg-Si) ~150 to 500 μm, sputtered (PVD) Al or printed (AlSi, Al) contact/mirror ~50 to 250 nm, plated Ni (top and bottom) ~100 to 500 nm, plated top Sn ~0.5 to 5 μm, and plated copper metal ~25 to 50 μm.

If the bus bar is not part of the cell but rather part of the module, then the geometries in the cell may be simplified and it is possible to have both metal 1 and metal 2 both completely contain parallel interdigitated fingers only, arranged orthogonally between metal 1 and metal 2.

However, another advantage of having structures in metal 1 not being completely linear is that this design allows for a recess or exclusion of the area of metal 2 coverage within the TFSS area and thereby a sealing of the edges of the TFSS during the plating process. Such sealing prevents contamination of the active absorber area with potentially detrimental metal plating solutions containing for instance Cu.

It also may be advantageous to have the interdigitated metal lines of the metal 1 layer segmented, especially in cases such as a rather thick printed metal paste. Segmentation is to be arranged such that the contact to metal 2 is still made as well so that the series resistance throughout the line does not noticeably deteriorate. When these requirements are met, for example for line segments between about 0.5 and 5 centimeter in length, then the segmentation may prevent generation of microcracks as well as excess bow and stress initiated by the shrinkage of the metal 1 lines during a paste anneal or during process steps subsequent to the metal deposition or metal paste anneal.

Figure 48:
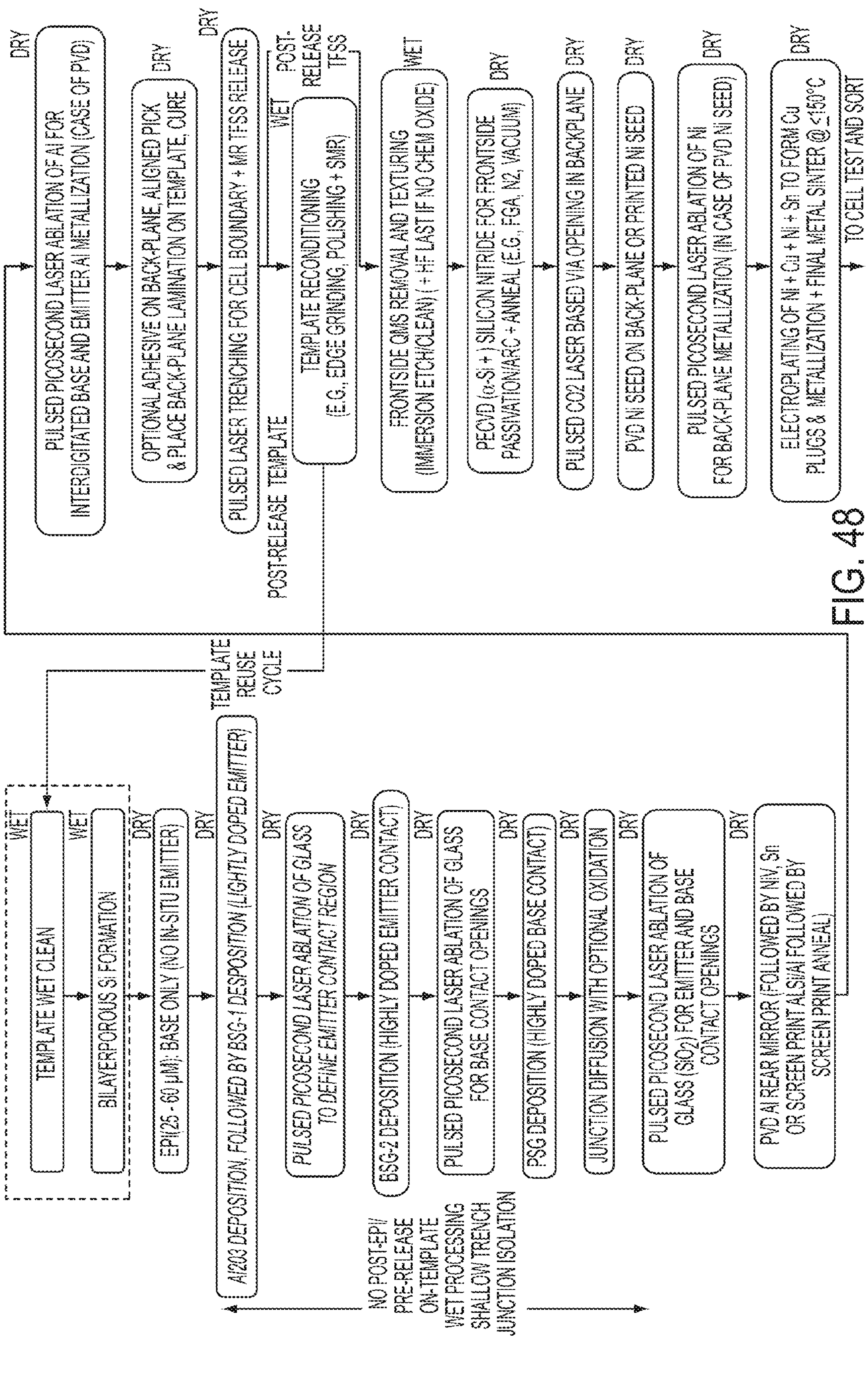
FIG. 48 is a back contact solar cell manufacturing process flow.
Figure 49:
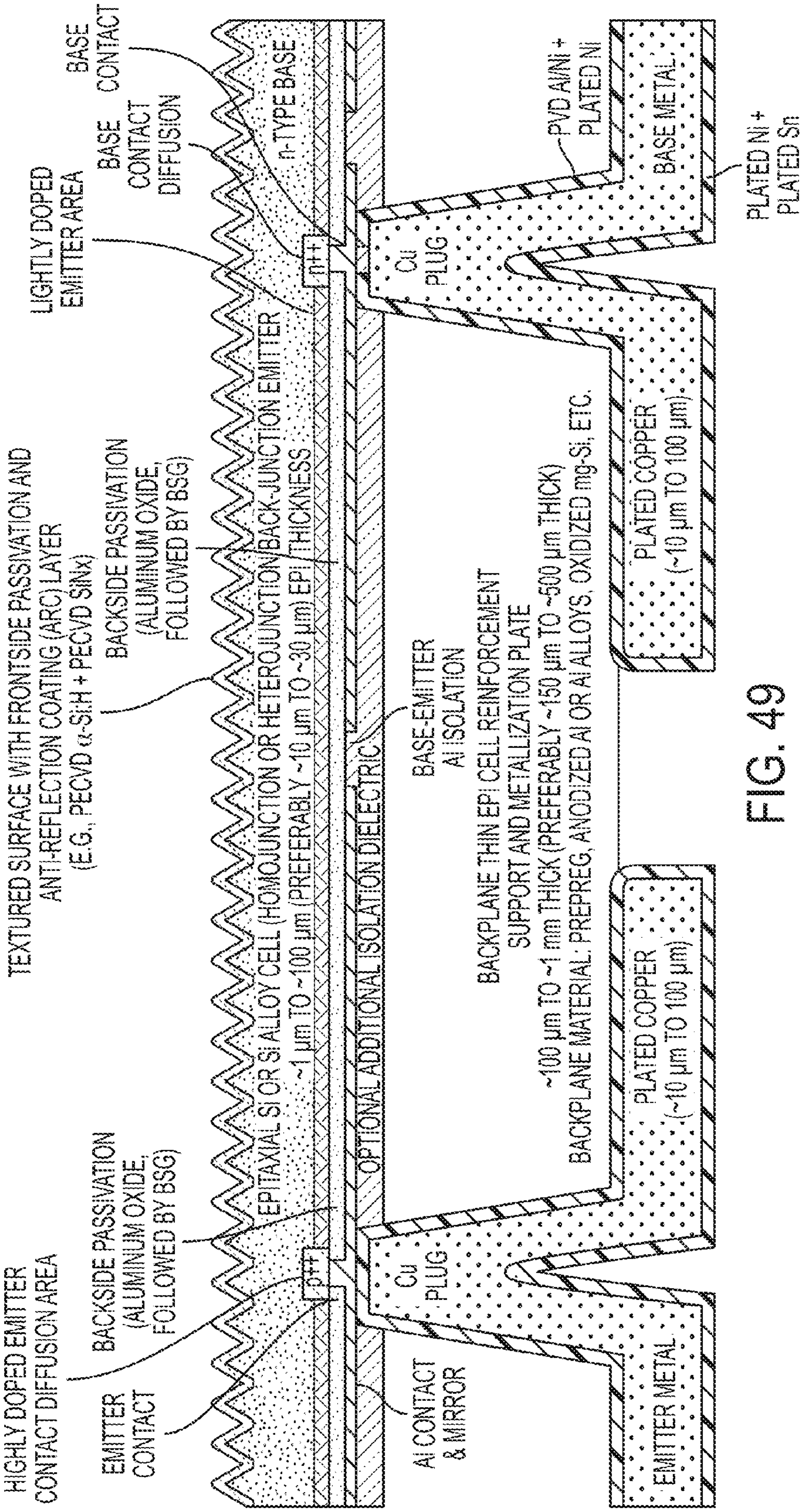
FIG. 49 is a cross-sectional diagram of a cell resulting from the flow of FIG. 48.

Importantly, alternative dielectrics may be formed and used on the backside of the cell. For a p-type emitter, such as a boron doped emitter, it may be advantageous to have a passivation dielectric in contact with the emitter region which provides a negative charge. Therefore, in a variation of all previously described structures and flows, be they on absorber layers generated from epitaxially deposited films, from CZ wafer or from otherwise processed absorber layers such as those cleaved using high energy such as MeV implantation and splitting, it is also possible to have material such as a thin (e.g., thickness in the range of about 5 nm to 50 nm) aluminum oxide (preferably formed by APCVD or ALD) as the first layer contacting the backside (and therefore the top of the epitaxial layer). FIG. 48 is an example process flow which incorporates the deposition of aluminum oxide as the back surface passivation of the active absorber layer and FIG. 49 is a cross-section of an example embodiment of a cell structure formed by the process shown in FIG. 48 and which incorporates deposited aluminum oxide as the back surface passivation of the active absorber layer. The cell of FIG. 49 shows aluminum oxide as the backside passivation dielectric. The aluminum oxide may preferably be deposited using an atmospheric process such as APCVD, or by atomic layer deposition (ALD). Such a layer may be deposited, preferably in the same tool, immediately prior to the deposition of the first BSG layer and emitter doping using BSG proceeds through this layer. Alternatively, the layer itself can contain boron or, less likely, enough aluminum to be activated to diffuse as a dopant and form the emitter region, especially for the selective emitter version the lightly doped emitter region. The aluminum oxide layer subsequently undergoes the same laser ablation processes that have been described above when using BSG, USG and PSG.

Exemplary thickness dimensions for the cell of FIG. 49 include: epitaxial Si ~10 to 50 μm, backside passivation oxide 50 to 200 nm, backplane (prepreg, anodized Al alloy or oxidized mg-Si) ~150 to 500 μm, sputtered (PVD) Al or printed (AlSi, Al) contact/mirror ~50 to 250 nm, plated Ni (top and bottom) ~100 to 500 nm, plated top Sn ~0.5 to 5 μm, and plated copper metal ~25 to 50 μm.

Figure 50:
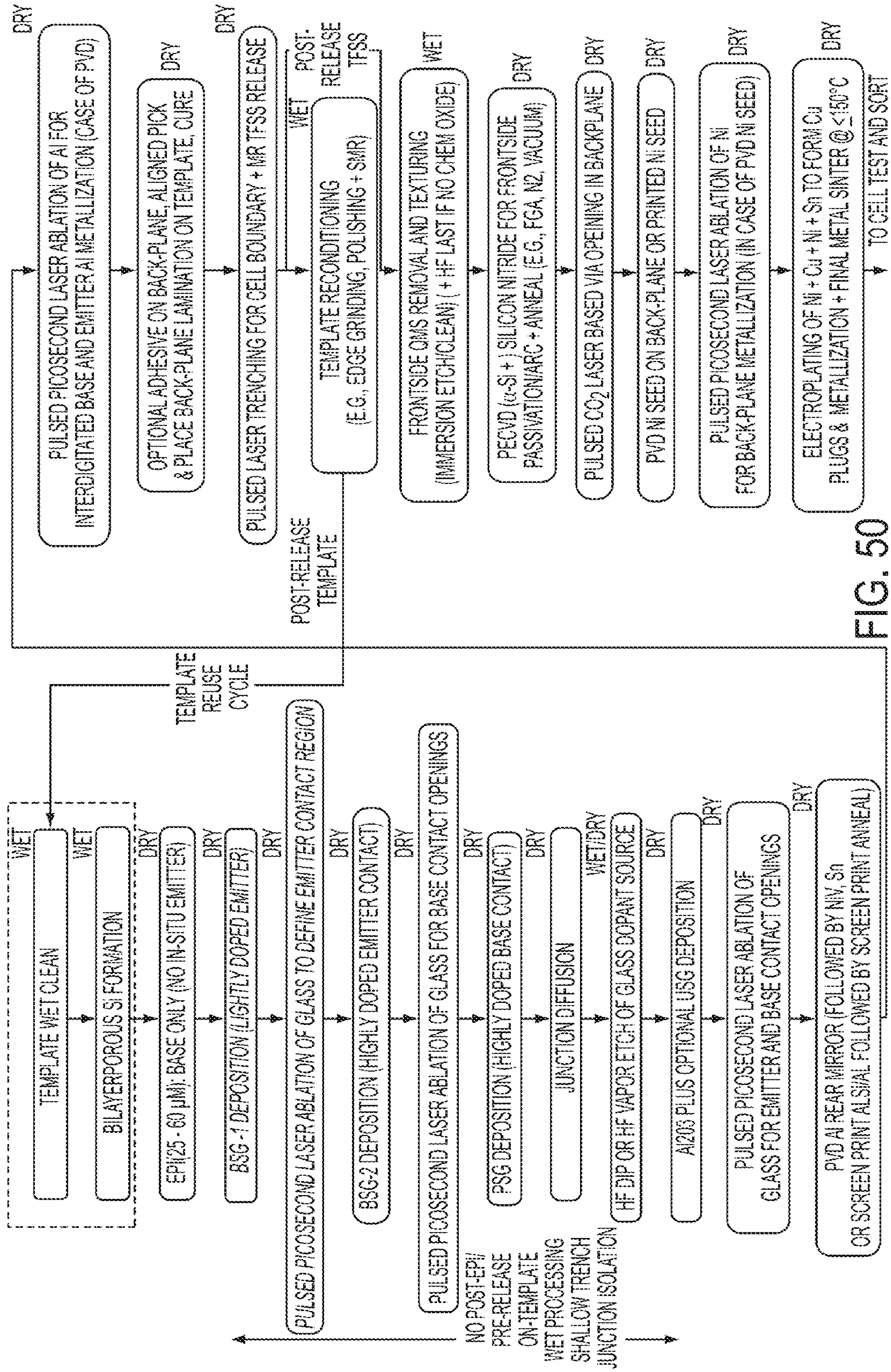
FIG. 50 is a back contact solar cell manufacturing process flow.

As an alternative to the above deposition sequences, it is also possible to apply the aluminum oxide at a later point in time—as shown by the flow in FIG. 50. FIG. 50 is an example of an alternative process flow which incorporates the deposition of aluminum oxide as the back surface passivation of the active absorber layer. For this flow, the aluminum oxide is deposited after removal of the doped glass layers which serve as precursors for the emitter and base contact diffusion doping.

For instance, after diffusion of the junctions using one of the above schemes which utilize BSG, PSG and USG, it is possible to strip these APCVD oxide layers, for instance using an HF dip or preferably an HF vapor etch, followed by suitable residue removal by gas stream. Then the aluminum oxide is deposited directly onto the silicon, which in turn already contains the suitable emitter and base contact diffusions. Optionally the aluminum oxide can be thick enough or capped with other deposited oxide, such as USG, in order to prevent pin hole shunting of the subsequent metal 1 deposition. Further processing proceeds as described above for all other embodiments.

Figure 51:
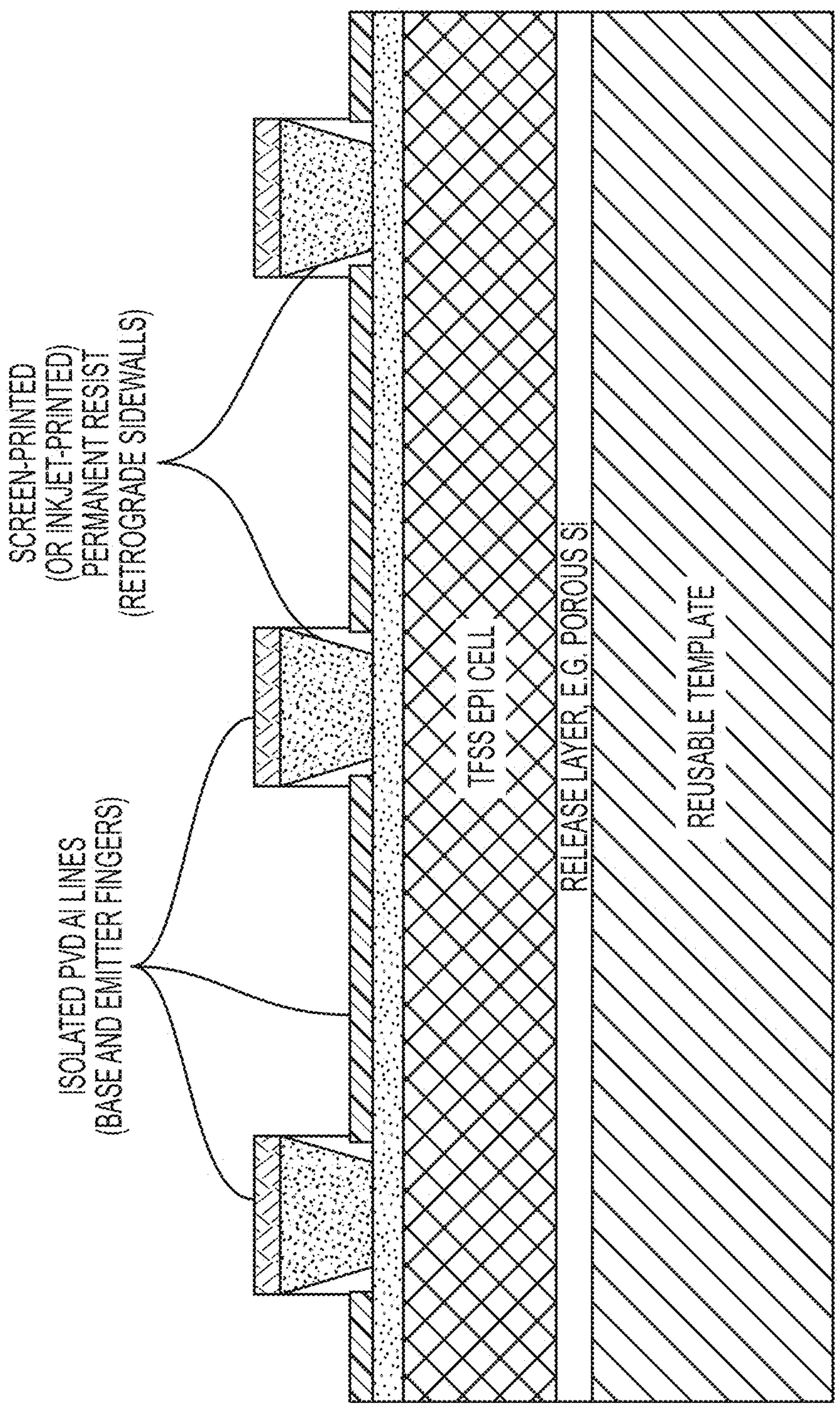
FIG. 51 is a cross-sectional diagram of a structure with retrograde resist sidewalls.

The metal 1 layer provides, in addition to electrical contact, a mirror for the photons that pass through the thin absorber layer. Therefore, a very effective mirror is advantageous for harvesting and converting a higher amount of photons by reflecting the infrared photons for improved photon trapping and energy harvesting. The area coverage of metal, as well as its specific reflectivity, play important roles for this function. In order to increase the area of coverage, deposit a thin, PVD based metal, the PVD layer on a previously patterned structure—as shown in FIG. 51. FIG. 51 is a cross-section a structure which enables the patterning and separation of a blanket deposited metal layer film, the structure providing an enhanced area of metal coverage on the back surface of a backside contacted cell. The structure of FIG. 51 consists of an overhanging structure of a material which is highly transparent to the photons to be reflected and which provides separation (electrical isolation) of the metal layer for a sufficiently line-of-sight based deposition process, such as PVD or evaporation. Such a layer also eliminates the need for laser ablation for the separation of the metal 1 layer. Cleanliness and process control are crucial for such a process in order to avoid direct shunting of adjacent emitter and base metal lines. The structure of FIG. 51 shows retrograde resist sidewalls, which may be formed by double screen printing of resist. Furthermore, optically transparent EVA or PV silicone may be used as the resist material. Alternatively, any other suitable material with long-term reliability may be used as the resist material may remain permanently in the cell and additively contribute to the rear mirror reflectance.

Additionally, the geometrical structure of the on-template processes may be optimized. In addition to the structures mentioned above which enable harvesting electrical current underneath the bus bar regions, there are other geometrical structures, especially for metal 1, that may be employed advantageously and which fan out underneath the bus bars which are located on metal layer 2. However, for simplicity most of the lines of emitter and base regions as well as contacts are parallel interdigitated lines—simplified structures depicted in FIGS. 52 and 53.

Figure 52:
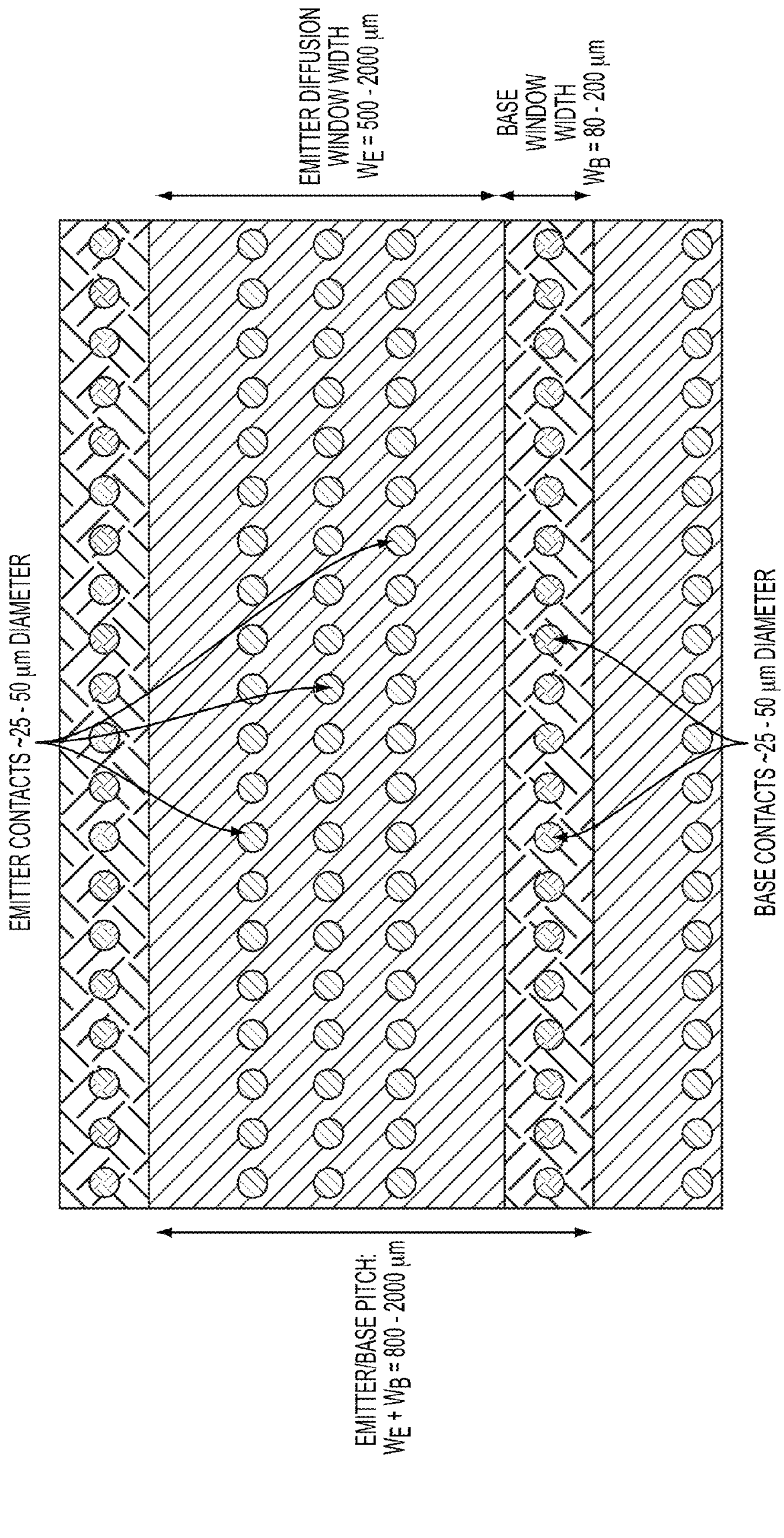
FIGS. 52 through 57 are top views of solar cell backplane embodiments after various processing steps.
Figure 53:
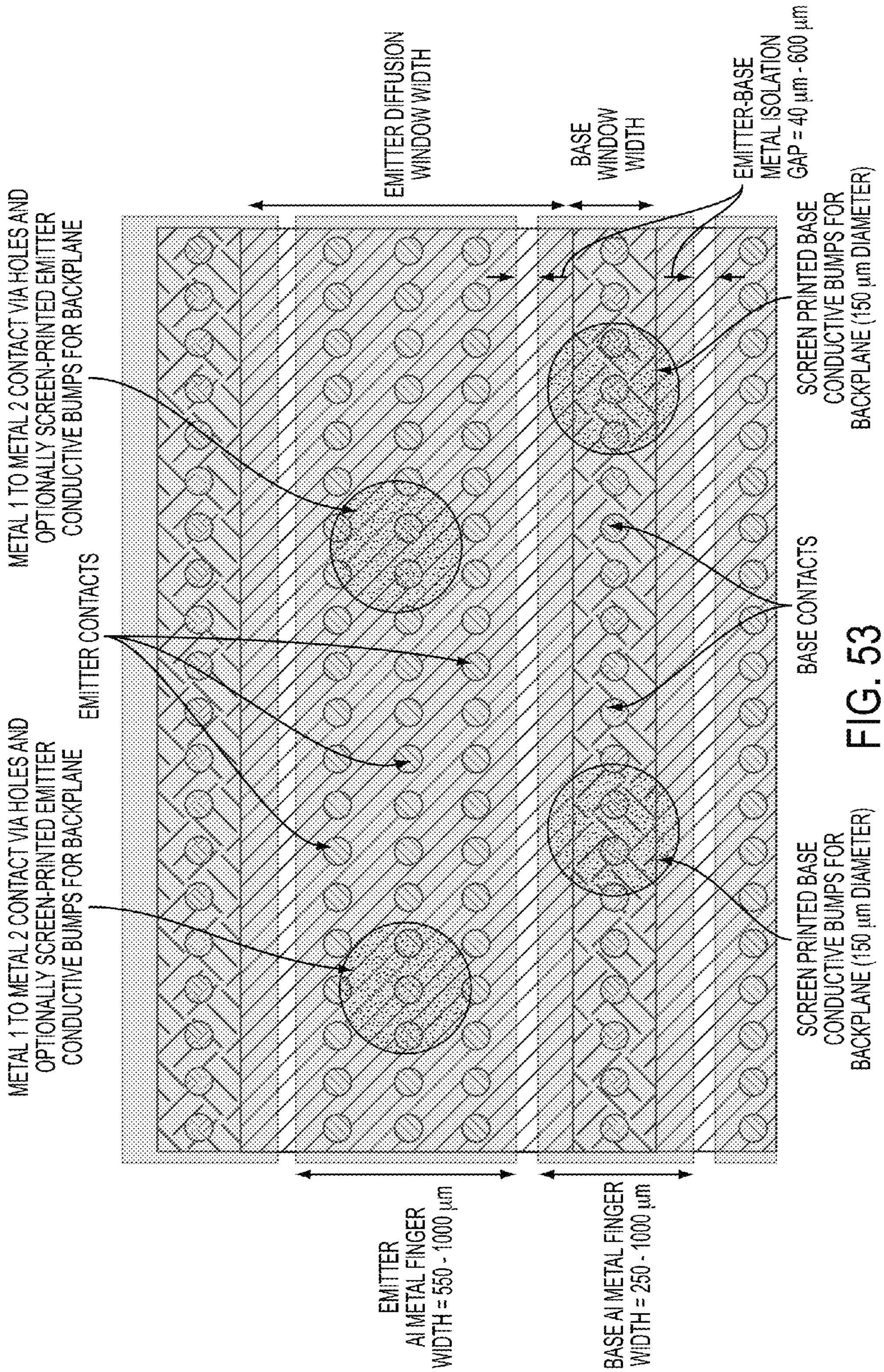

FIG. 52 is a top view of a cell backplane showing the layout for base contact window and emitter, including contact openings for the case of linear interdigitated emitter and base fingers. FIG. 53 is a top view of the cell backplane structure FIG. 52 including metal 1 deposition, with the addition of large round areas depicting locations for via holes in the backplane material to enable contact between metal 1 and metal 2 layers.

Figure 54:
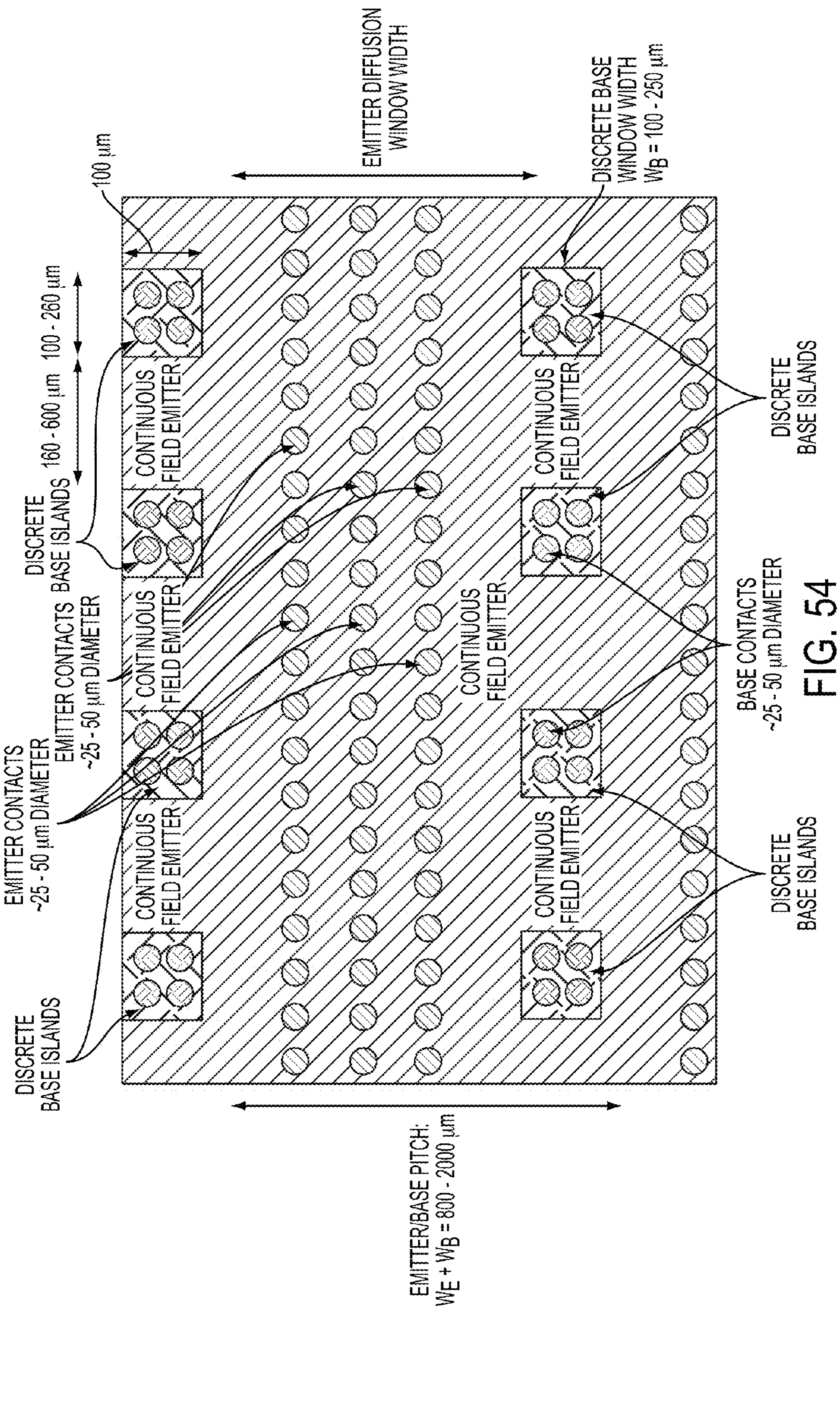
Figure 55:
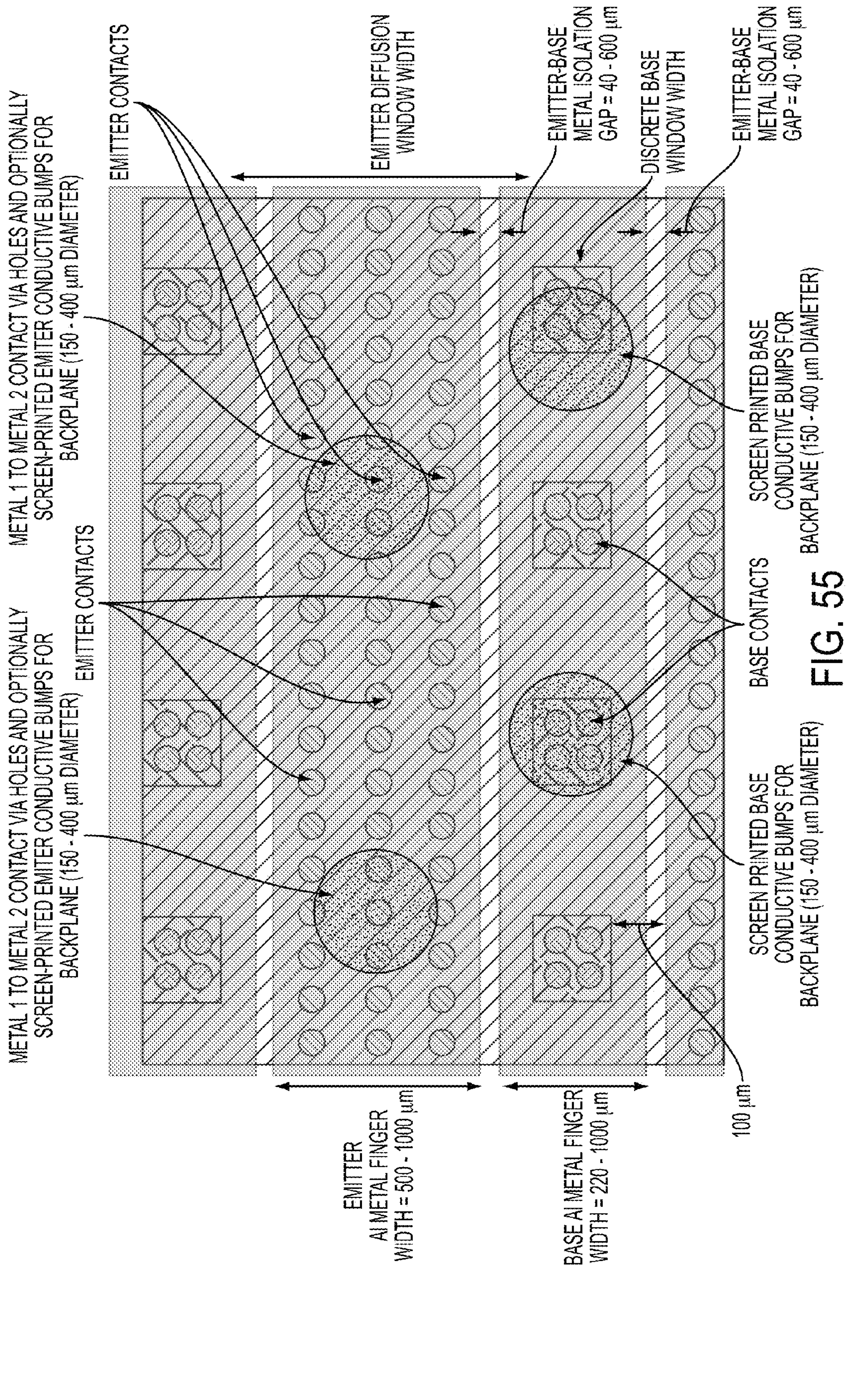

However, it is also possible to have both the base diffusion regions and the base contact opening regions laid out in the form of islands in a sea of emitter area—geometries shown in FIGS. 54 and 55. With such a layout, the electrical shading underneath the base region may be reduced. Electrical shading of the base mirrority carriers (holes in n-type material) occurs when the holes, rather than having to travel just vertically to the emitter region, also have to travel laterally to the emitter region. This is the case underneath the base diffusion regions. FIG. 54 is a top view of a cell backplane showing the layout for base contact window and emitter, including contact openings for the case of an array of base contact islands. FIG. 55 is a top view of a cell backplane showing the layout for base contact window and emitter, including contact openings for the case of an array of base contact islands with the presence of metal 1 lines and via hole locations. Note that no direct correlation is assumed between the location of via holes with respect to base contact islands.

When base islands are employed, the mean path of holes to travel to the emitter for current collection may be reduced, thereby increasing the hole collection efficiency. FIGS. 52 through 55 show base contact island structures in comparison to the linear structures. The base diffusion islands and the base contact hole openings have to be carefully aligned during the laser ablation processes. Such alignment and synchronization is critical for the success of these structures. The geometrical aspects of islands versus linear regions hold for all structures herein disclosed.

Figure 56:
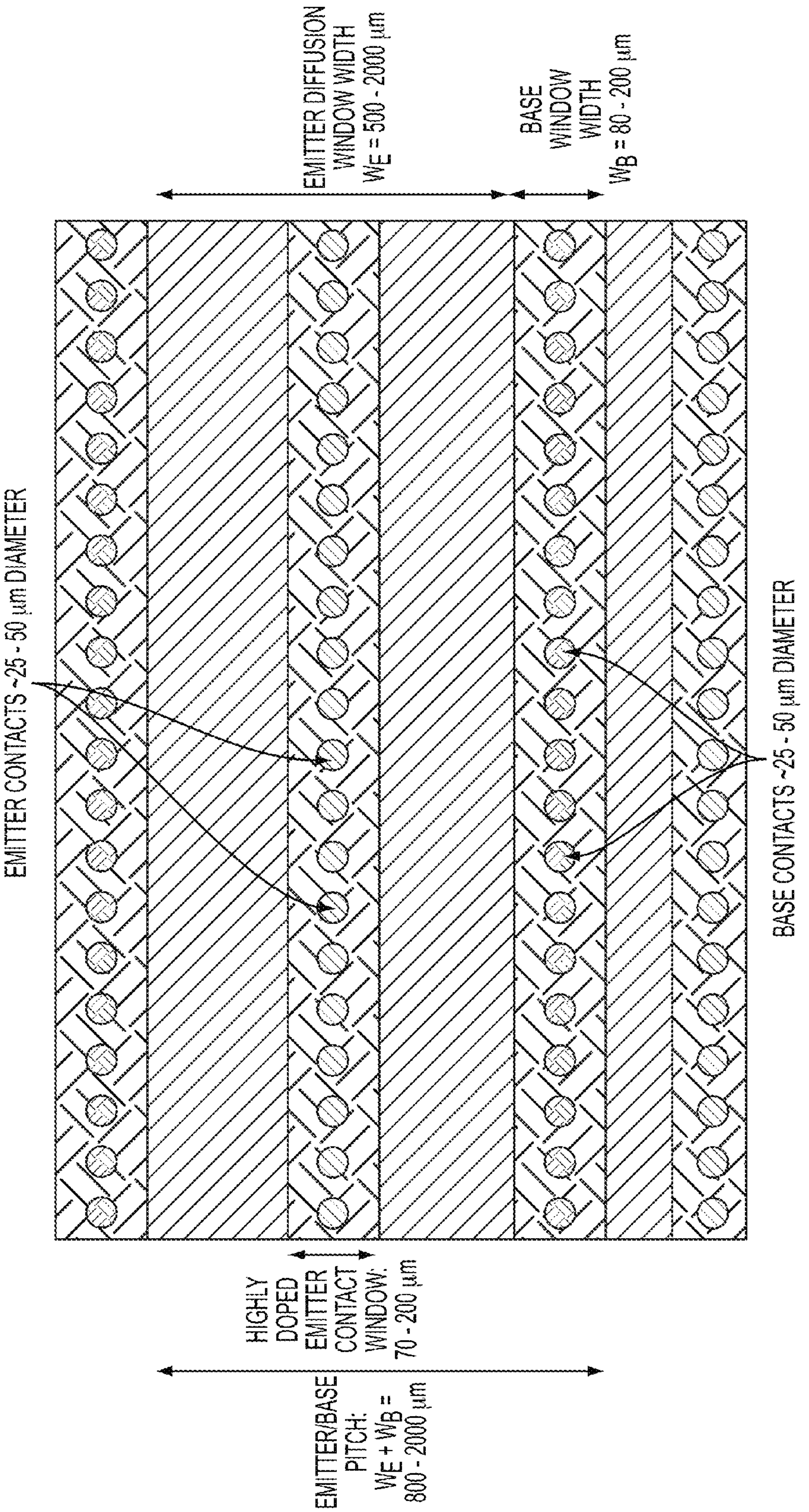
Figure 57:
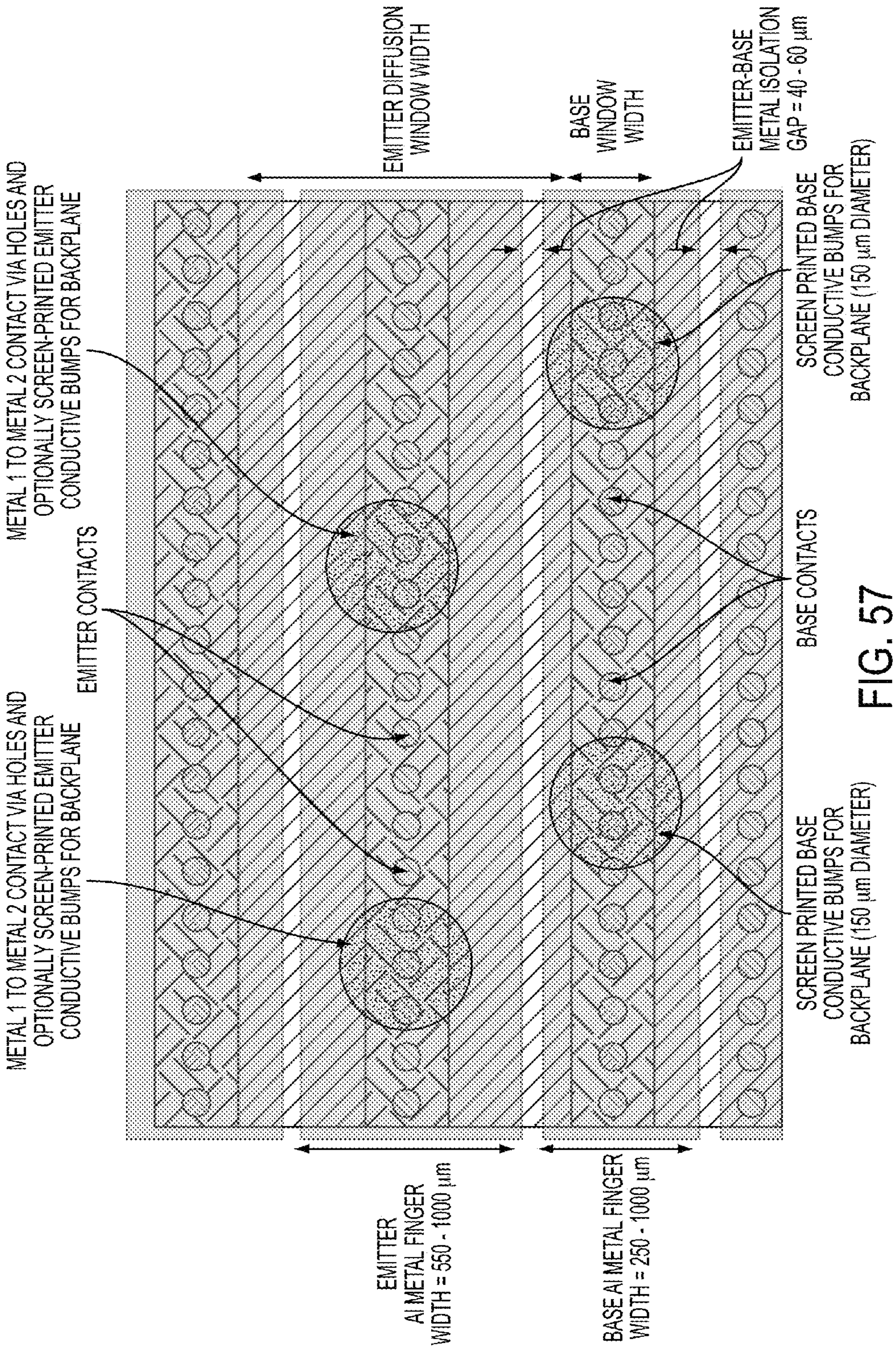

The same concepts hold true for the case of the above described selective emitter formation using two boron dopant sources, for example two different BSG layers, as described above—FIGS. 56 and 57 depict example geometries of the laser patterns for such generated selective emitters. FIG. 56 is a top view of a cell backplane showing the layout for base contact window and emitter, including contact openings for the case of linear interdigitated emitter and base fingers and selective emitter area where the emitter diffusion region of the contact to the emitter is doped higher than the emitter diffusion region away from said contact region. FIG. 57 is a top view of a cell backplane showing the layout schematics for the same selective emitter structure as FIG. 56 including metal 1 deposition. The large round areas are locations where via holes in the backplane material enable contact between metal 1 and metal 2 layers.

Similarly, in most of the presented disclosures metal 1 has been generated using PVD and subsequent laser ablation. However, all structures and methods are fully compatible and applicable as well to any direct write metal 1 application methods, such as screen printing, ink jet or aerosol jet printing and thermal or flame spraying.

Also, in most of disclosed embodiments, the annealing of the passivation has been employed in in-situ anneal methods. However, all processes and structures are also fully applicable to such conditions where the passivation anneal is carried out ex-situ at a suitable point after the passivation material deposition. Advantages to ex-situ annealing include the following: The ex-situ anneal reduces the stringency of matching the thermal expansion coefficients between all the materials involved, mainly the active TFSS absorber material, such as silicon, the backplane material, as well as the metal 1 paste material and the optional additional adhesive that is employed at least between the metal 1 lines and between the active absorber material such as silicon and the backplane laminate. When the passivation itself is done at a sufficiently low temperature, say at or below 220° C. in a sophisticated deposition tool, such as a PECVD machine, then having a subsequent anneal at a higher temperature, such as 300° C. d, can be done in a very simple tool, such as an oven, and in a simple, potentially coin stacked fashion with optional interleaves between TFSS. This sequence of processing alleviates handling concerns caused by residual CTE mismatching between the materials involved.

Heterojunctions.

Most silicon based solar cells on the market today are based on homojunctions. Heterojunctions, especially those with a wider bandgap emitter, benefit from the potential of a higher Voc and thus higher efficiency capability. Several cost effective ways for providing heterojunctions in conjunction with thin silicon cells are provided. The heterojunction is achieved mainly by the introduction of hydrogenated amorphous silicon (a-Si) in the emitter, which provides a wider bandgap when compared to crystalline silicon. One main task when processing such cells with amorphous silicon is to retain the effective process temperature after the amorphous silicon deposition below the crystallization temperature of silicon, typically below 400 deg C. In practice, deposition of amorphous Si (or silicon oxide) is done using PECVD at a temperature in the range of about 150° C. to 200° C.

Figure 58:
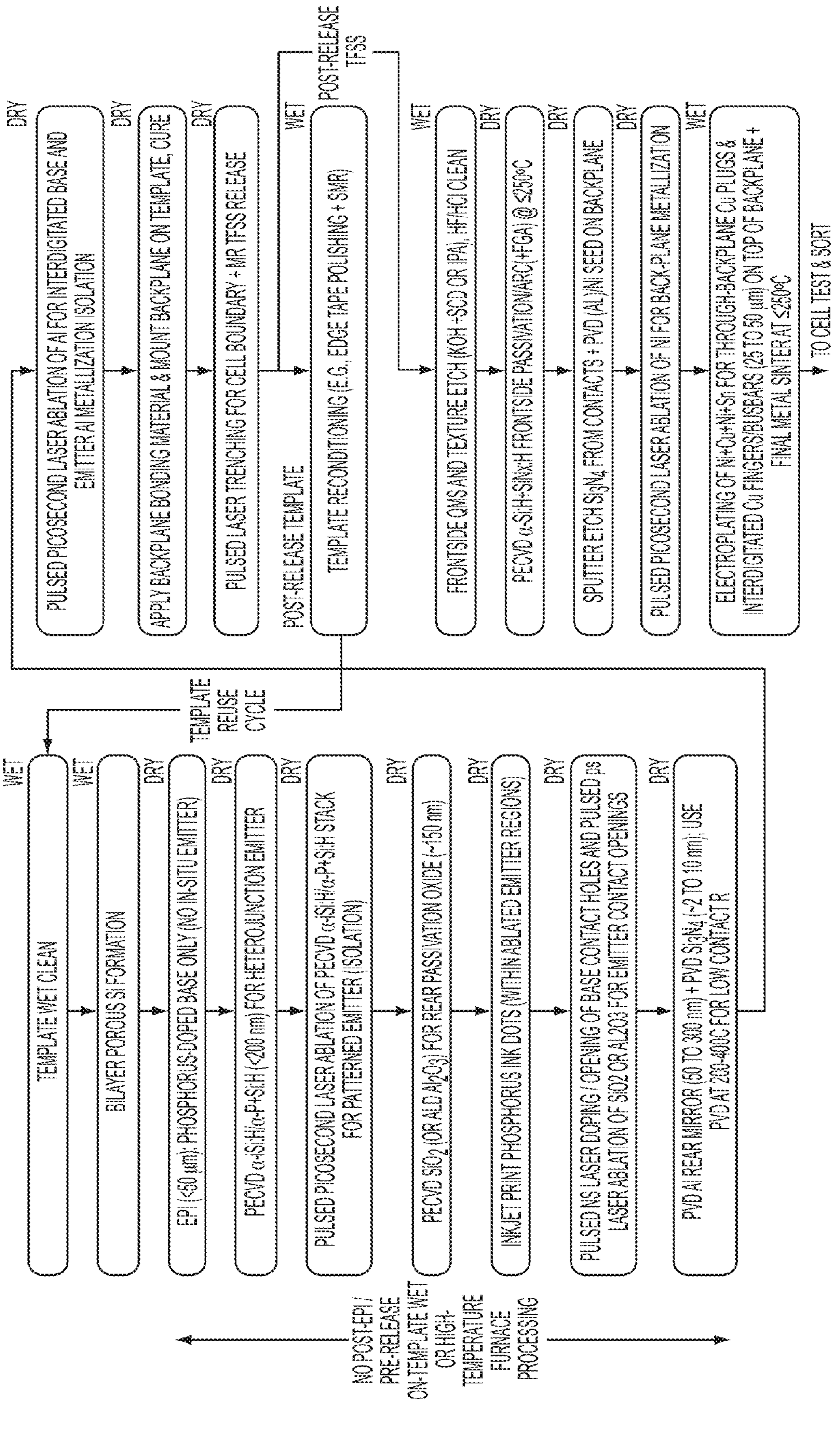
FIGS. 58 and 59 are back contact solar cell manufacturing process flows for heterojunction cells.
Figure 59:
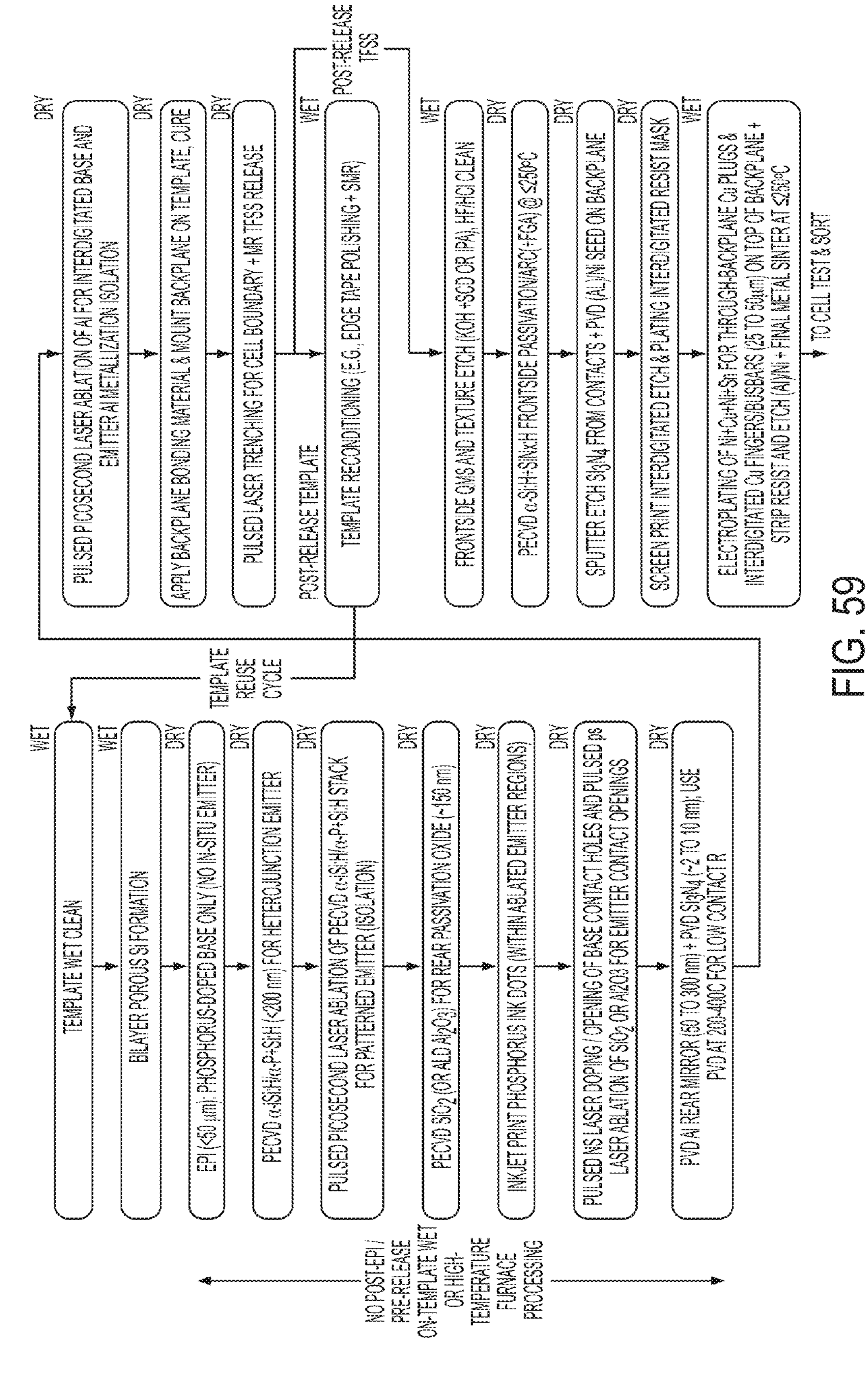
Figure 60:
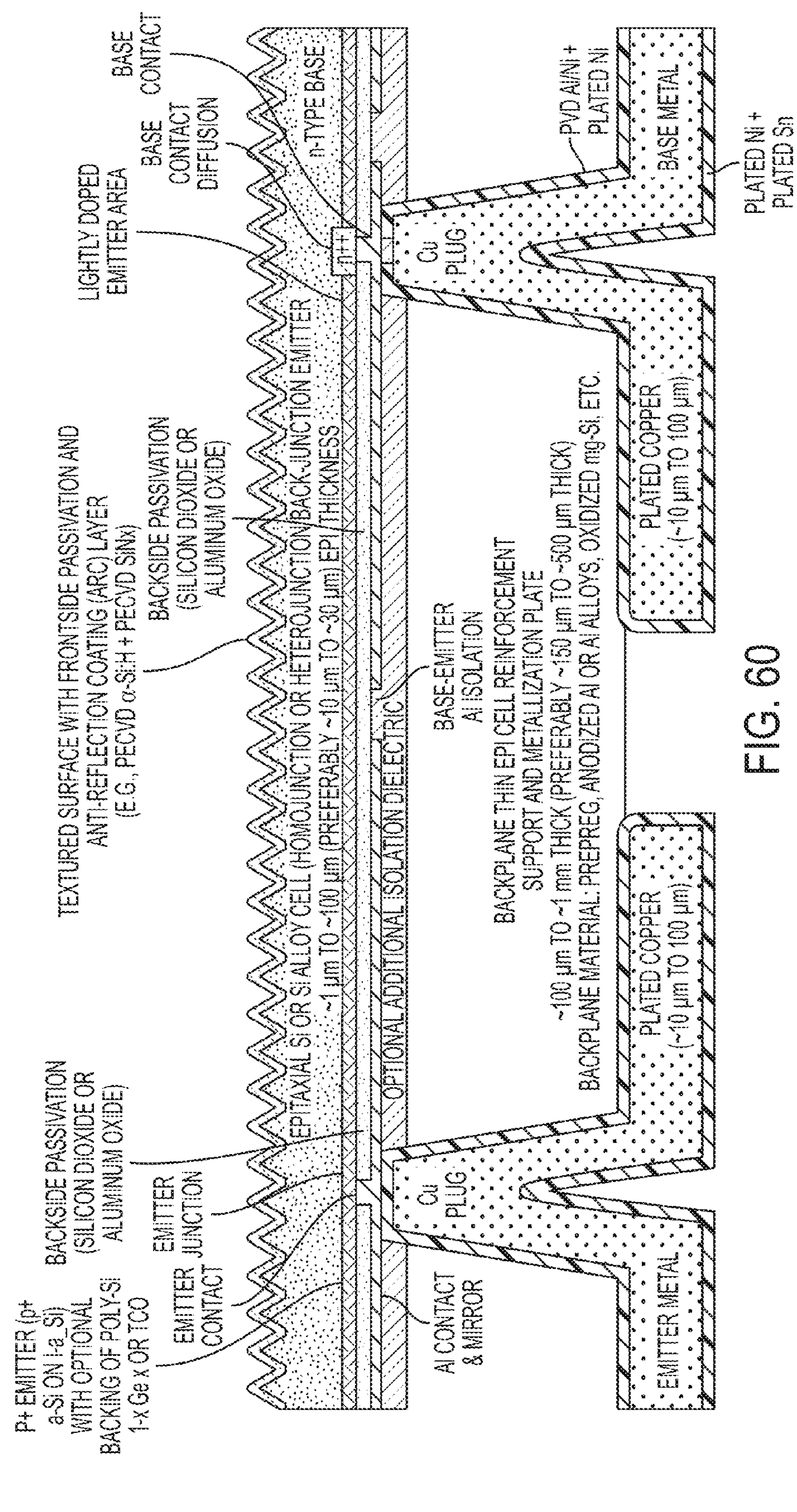
FIG. 60 is a cross-sectional diagram of a solar cell with a heterojunction architecture.

FIGS. 58 and 59 are process flow embodiments for generating a heterojunction cell (both using no furnace processing and inkjet phosphorous print), based on an a-Si emitter and based on using an epitaxially deposited thin silicon absorber structure. FIG. 60 is a diagram of a cross section of a resulting structure employing heterojunction thin silicon cell architecture using an epi based cell. The structural design of such a cell is the same for a CZ wafer based flow, with the exception that thicker silicon can also be employed. However, it is also possible to thin down the CZ silicon afterwards to a thickness with an optimized tradeoff between lifetime and absorption in the infrared, the latter being aided by a thicker absorber layer. Exemplary thickness dimensions for the cell of FIG. 60 include: epitaxial Si ~10 to 50 μm, backside passivation oxide 150 to 200 nm, backplane (prepreg, anodized Al alloy or oxidized mg-Si) ~150 to 500 μm, sputtered (PVD) Al or printed (AlSi, Al) contact/mirror ~50 to 250 nm, plated Ni (top and bottom) ~100 to 500 nm, plated top Sn ~0.5 to 5 μm, and plated copper metal ~25 to 50 μm.

The processes are applicable to thin silicon, such as silicon generated using epitaxial deposition on top of a porous silicon layer, as well as implant/cleave based thin silicon architectures, as well as CZ wafer- and thinned CZ wafer-based cells. FIG. 61 demonstrate process flow embodiments for such embodiments. Template clean, porous silicon formation and epitaxial Si deposition of the n-type base are as in other flows. Following epitaxy, a sequence of thin (typically <200 nm thick) depositions, comprising first an intrinsic, then a p+ doped amorphous silicon (a-Si) stack. As a-Si itself tends to have a rather low conductivity, it can be required to add a backing layer deposition after the amorphous Si to help carry the current with sufficiently low resistance. Such a backing layer should be deposited at a temperature low enough to prevent a-Si from crystallizing. Example layers of such kind are layers transparent conductive oxides such as ITO or ZnO or polycrystalline alloys of silicon and germanium (Si1−xGex), which, with sufficient Ge content, can be deposited in a polycrystalline form at low enough temperature. Subsequently, in the region where the base contact is to be placed, the a-Si emitter material and the optional backing material is ablated, preferably using a picosecond laser. Subsequently a rear passivation layer is deposited, which can be comprised of silicon dioxide or aluminum oxide. In the regions for the base contact, subsequently a phosphorus dopant source can be locally applied, such as by printing of phosphorus ink dots. In subsequent steps, the dopant for the base contact is driven in, for instance using a nanosecond laser that melts the top of the silicon and incorporates the deposited dopant into the silicon lattice. Also a picosecond laser is employed on the emitter contact side to remove the dielectric and make contact to the a-Si emitter. For metal 1 deposition, both PVD followed by ablation to define the metal layer, as well as screen printing can be employed, provided the thermal budget of both processes does not exceed the threshold for a-Si crystallization. The backplane lamination and further downstream processing with its various embodiments can then subsequently proceed in the same way that has been described for the homojunction process.

The following description provides processing methods and designs utilizing a permanent support structure ("backplane") providing a permanent reinforcement that will not be removed after it is applied to the thin Si wafers and may be used in solar module panels together with front or back contacted thin Si solar cells. Additionally, the disclosed backplanes provide for the extraction of electrical current and power from thin solar cells with suitably low loss. The disclosed permanent support structures enable the handling and support of thin solar cells through necessary process steps including, but not limited to, edge definition or trimming, texturization and clean, as well as passivation and anti reflective coating (ARC) deposition and optional follow-on anneals, by means of thermal, microwave, or radiation such as laser energy. Additionally, the permanent support structures further support contacting schemes, such as via openings and various metallization and dielectric material application schemes including, but not limited to, deposition, printing, plating, laminating metal or metal containing or in general conductive films as well as dielectrics, including intra-cell, cell to cell and cell to module contacting.

The disclosed subject matter details novel methods and structures for reinforcing very thin Silicon (Si) solar wafers and cells to reduce breakages and to furnish contacts to emitter and base during the manufacturing process. These methods and structures are motivated by the solar cell industry's movement from standard Si solar cell thicknesses of 180 to 250 μm towards thinner cells in order to reduce Si usage and thus material costs—Si wafer production technology has advanced rapidly in reducing the wafer thickness. The fabrication of Si wafers with thicknesses less than 30 μm has been demonstrated through various methods such as layer transfer and epitaxial Si deposition. However, the industry is generally unable to manufacture Si solar cells of thickness less than about 140 μm because of the significant increase in cell breakages and lower manufacturing yields. The disclosed subject matter provides for the handling of much thinner silicon through the solar cell line with high yield, with thicknesses down to tens of microns or even less, thus reducing costs associated with breakages. Currently, the industry standard substrate thickness is greater than 180 μm. And while solar cell manufacturers have begun using Si wafers as thin as 140 μm, Si wafers less than 140 μm thick are often too fragile for usage in high volume manufacturing processes. It is anticipated that aggressive cost savings may be achieved with solar cell material less than about 50 μm thick without significant detrimental impact to cell performance as less silicon allows for a cheaper solar cell (silicon material cost constitutes a substantial fraction of total solar cell cost). As previously noted solar cell substrates may be shaped in a variety forms including, but not limited to, standard pseudo squares, squares and hexagons. The size and the area of the substrate also varies, for example 125 mm×125 mm or ×156 mm or even much larger cells including but not limited to 210 mm×210 mm. Further, substrate material may be either mono-, poly- or multi-crystalline silicon. The disclosed subject matter is applicable to various types of substrates as distinguished by the source and the shape of the substrates. For instance, it is applicable to at least two categories:

A) Flat wafers from ingots obtained using either Czochralski (CZ) or float zone (FZ) techniques (textured or untextured) or multi-crystalline cast ingots which are obtained using techniques such as wire-sawing, polishing, lapping, etching, or ion implantation (Hydrogen or Helium) based slicing of bulk ingots.

B) Epitaxially or polycrystalline grown substrates which are produced directly using any of the precursors used for depositing silicon such as silicon tetrachloride (STC), trichlorosilane (TCS), dichlorosilane (DCS), or Silane. These substrates may or may not have the dopant diffusions as is customary in a finished solar cell such as back surface field (BSF), bulk doping, front surface field (FSF), and emitter, as part of the epitaxial growth process. The method is widely and equally applicable to any of the several combinations of doping which form a solar cell. For example: (1) n-type bulk doping using phosphorous with a boron-doped p-type emitter and (2) p-type bulk doping using boron with a phosphorous-based n-type emitter. A preference has been noted in the use of n-type doped base layers with p-type emitters as these n-type based solar cells tend to exhibit the light induced degradation effects often seen in silicon solar cell material with a boron doped p-type base.

Several embodiments of fabricating the epitaxial substrate are possible. In one embodiment the epitaxial substrate is grown on top of a sacrificial layer on a mother template and is subsequently dislodged. The mother template is then reused (for instance by residue removal, optional reconditioning by e.g. bevel or area lapping or grinding, cleaning and re-formation of the sacrificial layer) several times to grow more epitaxial substrates. The sacrificial layer has to transfer information about the crystalline structure in the mother template to the epitaxial layer and is removed selectively with respect to the substrate and the mother template. One specific embodiment of the sacrificial layer is porous silicon, whose porosity may be modulated to achieve both the aforementioned critical functions.

Within the epitaxial substrate embodiment, several possibilities distinguished by the underlying, starting, mother template are possible. Although, not limited to these, a few of these possibilities are described as examples below.

i) Substantially Planar Epitaxial Substrate:

This has at least two distinct cases. In the first case the epitaxial layer is grown on top of a flat, untextured template which does not have a pattern. The template may be grown using standard Czochralski (CZ) growth or may be manufactured as a seeded cast quasi-monocrystalline ingot to save costs of template fabrication. A multi-crystalline template material may also be used, which in turn will yield multi-crystalline thin cells. Herein, a substantially planar substrate is referred to as an epitaxial substrate. The released epitaxial substrate is also flat without a pattern. The second case is where there is an underlying pattern or texture on the template; however, the size scale of this texture is substantially smaller than the thickness of the epitaxial substrate. Thus, the released epitaxial layer is also textured but still substantially planar. This substrate is also referred to herein as an epitaxial substrate.

ii) Three Dimensional Epitaxial Substrate:

Here the underlying template has been pre-patterned or pre-structured and the pattern geometries or texture is of an order substantially equivalent or greater than the thickness of the epitaxial film. Thus, when the epitaxial film is released it will have a substantially non-planar 3D geometry. Within this paradigm, several examples of pre-pattern geometries are possible, for instance, a pyramid-based cell. This substrate is also referred to herein as an epitaxial substrate.

In the above description, the release layer is comprised of porous silicon and the epitaxial layer is silicon as well. However, the disclosed subject matter is also applicable to the use of other release layer methods such as those generated by the implantation of hydrogen to form a cleave release region or the use of a laser that is focused inside the silicon to form a release or cleave region. In addition, the disclosed subject matter is also applicable to active absorber material other than silicon, including hetero-epitaxial combinations such as silicon with germanium, carbon or mixtures thereof, as well as materials from the III-V family such as gallium arsenide (GaAs), which can, for instance, be grown on top of germanium or a graded silicon germanium region which in turn is grown onto a porous silicon layer and which is designated to allow for lattice matching between GaAs and underlying silicon in order to grow good quality GaAs on essentially a silicon substrate with a release layer.

For the aforementioned substrates (flat wafers from ingots and epitaxial substrates), if the thickness of the deposited silicon is substantially thin or if the processing conditions are not compatible with the materials used for permanent reinforcement, it may be necessary to introduce a carrier to temporarily support the solar cell during processing until it is suitable for permanent reinforcement. Possibilities for temporary reinforcement include (but are not limited to) mobile carriers utilizing electrostatic, vacuum, or combination of electrostatic and vacuum methods etc. These structures will substantially strengthen and reinforce the thin substrate thus ensuring a high manufacturing yield. However, the disclosed subject matter provides a permanent reinforcement for use in solar module panels together with the front or back contacted thin Si solar cells.

Further, in the case of an epitaxial substrate formed on a template with a release layer, the disclosed subject matter provides for continuous thin substrate support during the manufacturing process. For example, in the early, preferably dry and potentially high temperature process stages using the template as reinforcement and in the later, preferably low temperature and potentially wet process stages, using backplane reinforcement structures and methods. Thus, the disclosed subject matter entails materials, designs, structures and methods to fabricate permanent support structures that enable the manufacturing of solar cells with thin active absorber layers ("thin solar cells") and the structures of the resulting solar cells. Further, the disclosed subject matter provides for the integration of permanent support structures within various embodiments of cell manufacturing flows—the backplane structures, materials and methods disclosed may be employed for fabrication of photovoltaic solar cells that utilize high efficiency thin film solar cell substrates.

An advantageous design for the disclosed thin film solar cell structures are back junction, back contacted cells where the reinforcement is applied onto the side that contains the back junctions and back contacts. However, cell designs with at least one polarity of the contact on the front side may also be supported using the disclosed subject matter in combination with low temperature processing, typically below 250° to 350° C., is used to manufacture the front side contact if the front side contact is manufactured after the attachment of the reinforcement. An effectively low temperature process may utilize laser annealing that only heats the front surface while keeping the back surface cold enough for the backplane material to sustain the process. Methods for front side contacting include, for example, the formation of front side lines of Al or other metals with subsequent laser annealing for contacting and optional emitter junction formation, and contacts at the front side or patterned implantation followed by laser or other substantially low temperature annealing for forming the junctions, followed by a suitable metallization scheme such as Aluminum deposition, either patterned using deposition, printing or spraying, or unpatterned with subsequent patterning.

Figure 61A:
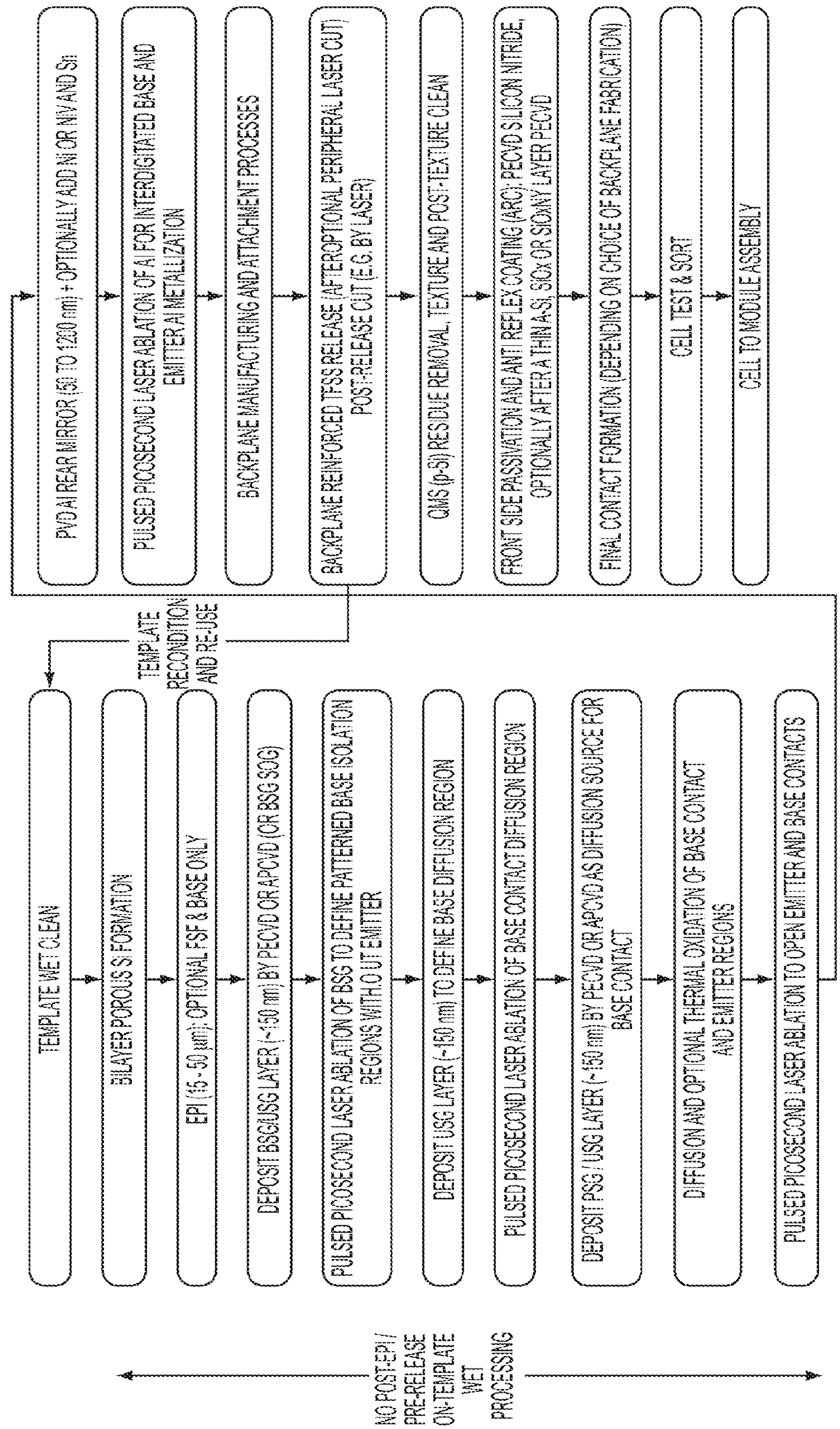
FIGS. 61A through C are back contact solar cell manufacturing process flows using an epitaxial substrate.
Figure 61B:
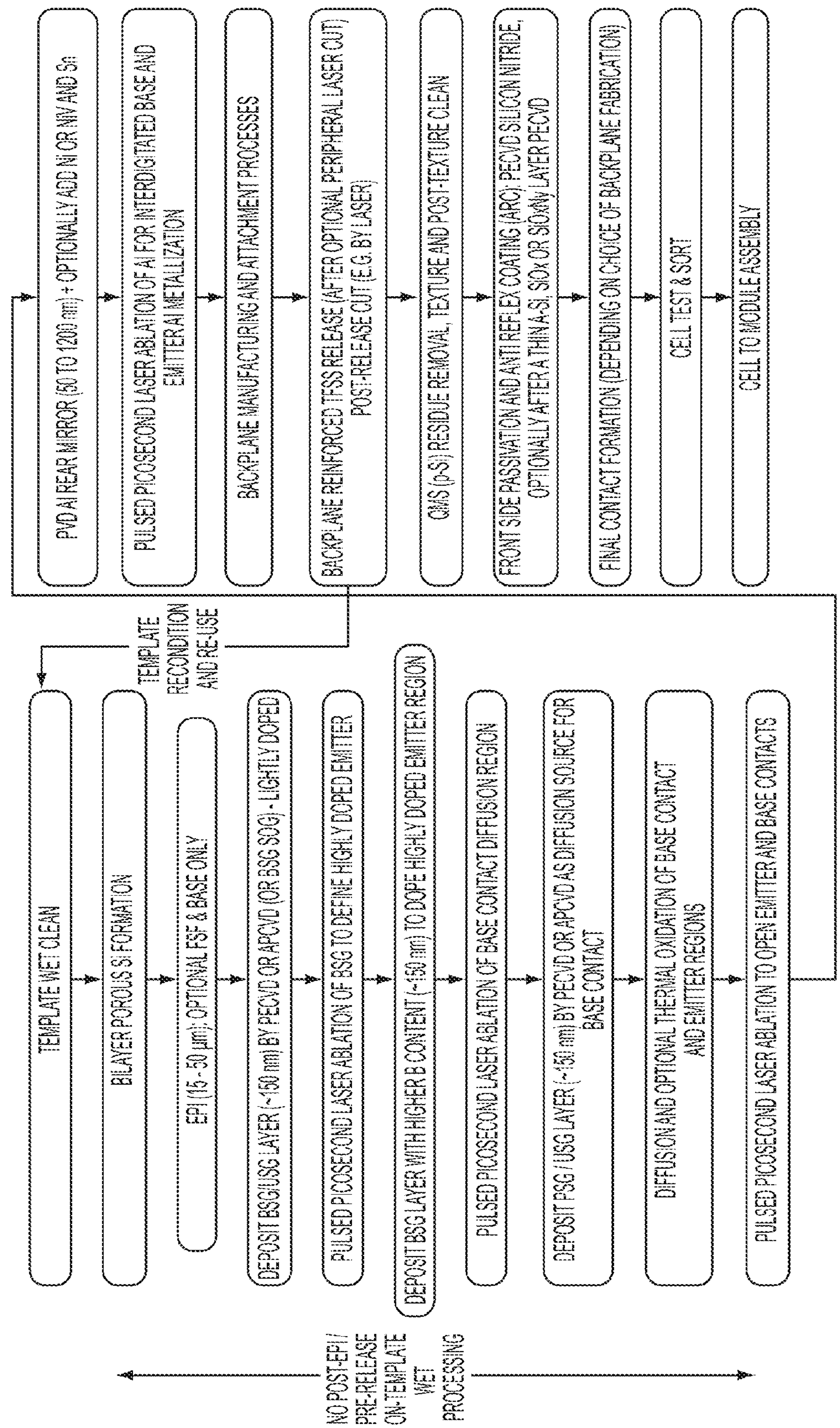
Figure 61C:
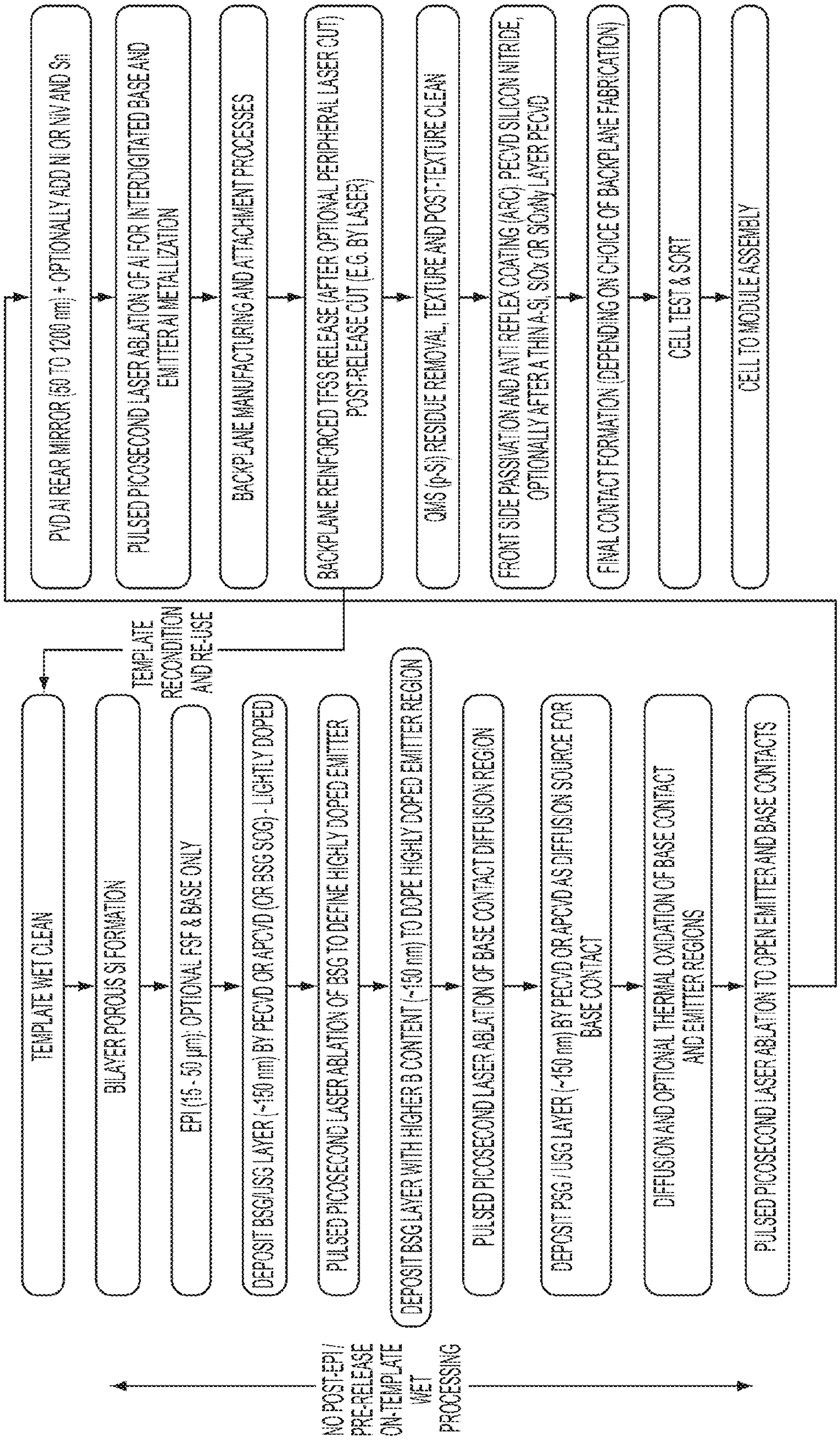

The intent of this disclosure is to enable the reinforcement and thus high yield manufacturing of many types of thin film structures while the focus of the disclosed embodiments is on presenting solutions for the often more challenging process of manufacturing back-contacted cells. Examples for viable structures and methods for manufacturing the thin film solar substrate (TFSS) up to the point of metallization are described generally in the process flows of FIGS. 61A-C. FIGS. 61A-C are process flows showing major processing steps for the formation of a back contact solar cell including general backplane reinforcement related steps further detailed throughout this disclosure.

The process flow starts with a cleaned re-usable semiconductor wafer, called a template. A release layer, such as porous semiconductor material, is then deposited on the surface of the template. In the case of silicon wafers, this may be porous silicon. The porous silicon layer may comprise at least two zones of different porosities, where the top layer is preferably of a lower porosity than the bottom layer. The bottom layer serves as a designated weak layer while the top layer is reflowed in a subsequent bake step in an epi reactor prior to the silicon layer deposition and the reflow reconstructs the surface to provide a seed surface to enable epitaxial deposition. In the ensuing epitaxial deposition, which may be carried out at high temperature using at least one silicon containing gas such as trichlorosilane (TCS) mixed in hydrogen (H2), a thin layer of semiconductor, for instance silicon, is deposited on top of the porous layer on top of the template. This layer may serve as the thin active absorber layer, or light capturing layer, for the solar cell.

Shown, the active absorber base layer is an n-type layer, formed by, for example, the addition of phosphine (PH3) during the deposition step. The PH3 may be optionally diluted in hydrogen. Graduation of PH3 flow during the deposition may be employed to achieve doping gradients in the film where desired.

After epitaxial deposition, further steps comprise the formation and structuring of the emitter layer, e.g. by atmospheric pressure chemical vapor deposition (APCVD) of borosilicate glass (BSG), and laser ablation of BSG where desired in order to make openings for base contacts. A subsequent optional step includes deposition of undoped silicate glass (USG), followed by laser ablation in order to later generate a separation zone between base contact and emitter. Then, phosphorus-silicate glass (PSG) may be deposited as a precursor to later form a highly n-doped base contact. Undoped layers may be used for separation of each layer where needed. A subsequent thermal drive-in step, optionally with oxidation in at least one step to form a good interface with the semiconductor (such as silicon), may be used to drive-in the doped diffusion profiles. A laser may then be used to ablate the dielectric in desired contact areas, which enables contacting with a subsequent metallization step. Suitable lasers for above ablation processes include picoseconds lasers and especially picoseconds UV lasers which may cause little or no subsurface damage to the underlying semiconductor.

Figure 62A:
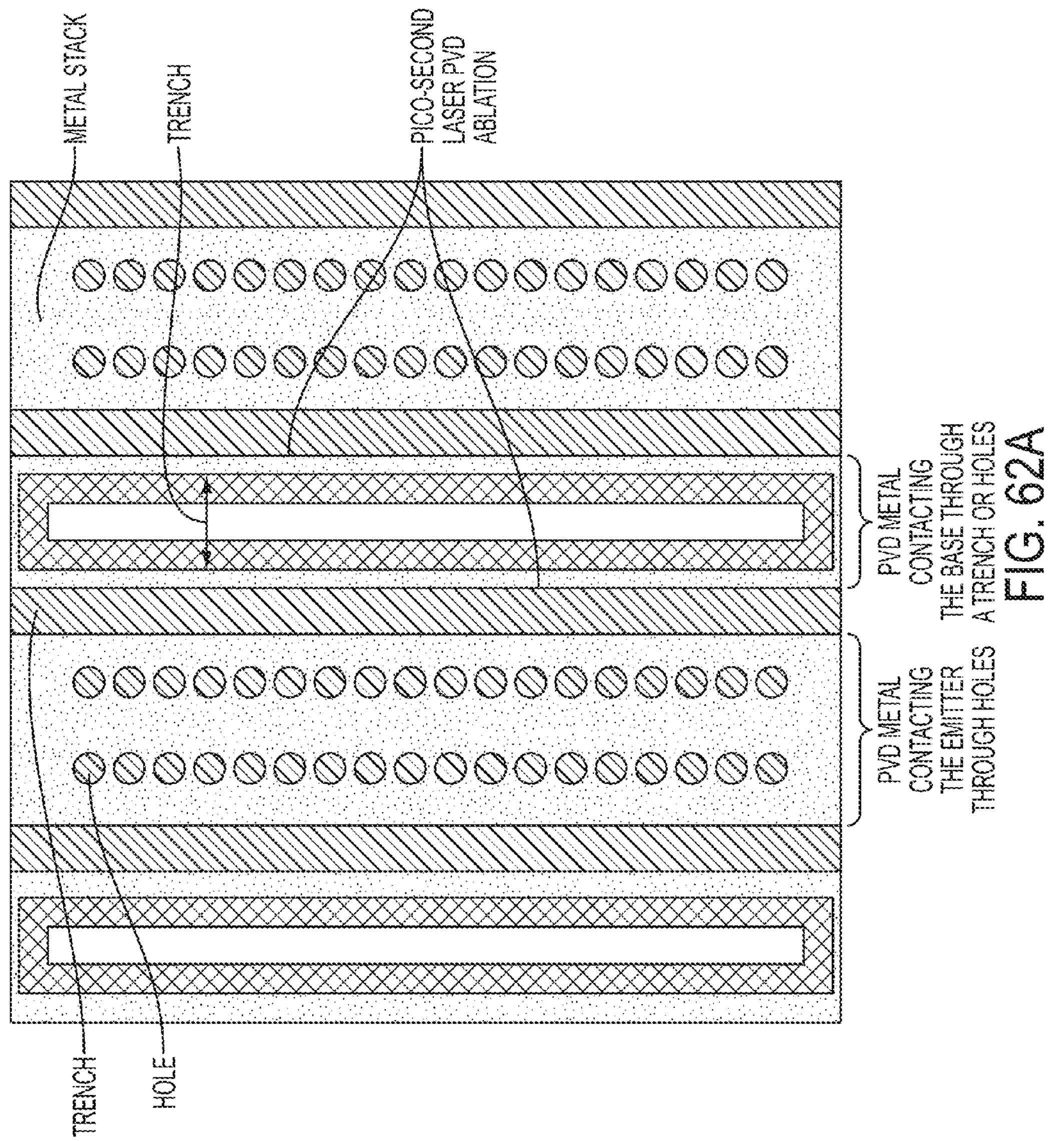
FIGS. 62A through G are top view and cross-sectional views of a back contact solar cells after backplane processing steps.
Figure 62B:
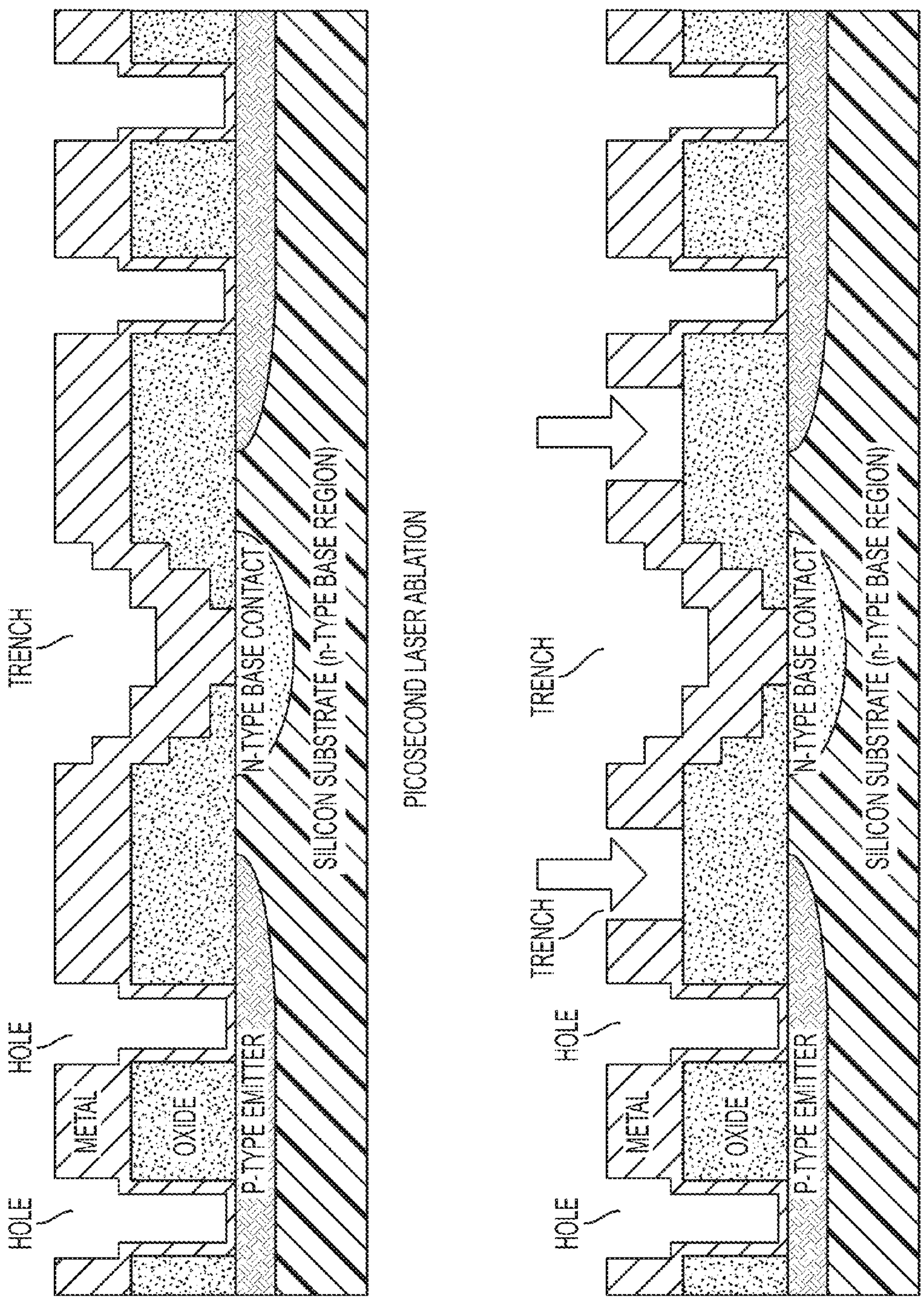
Figure 62C:
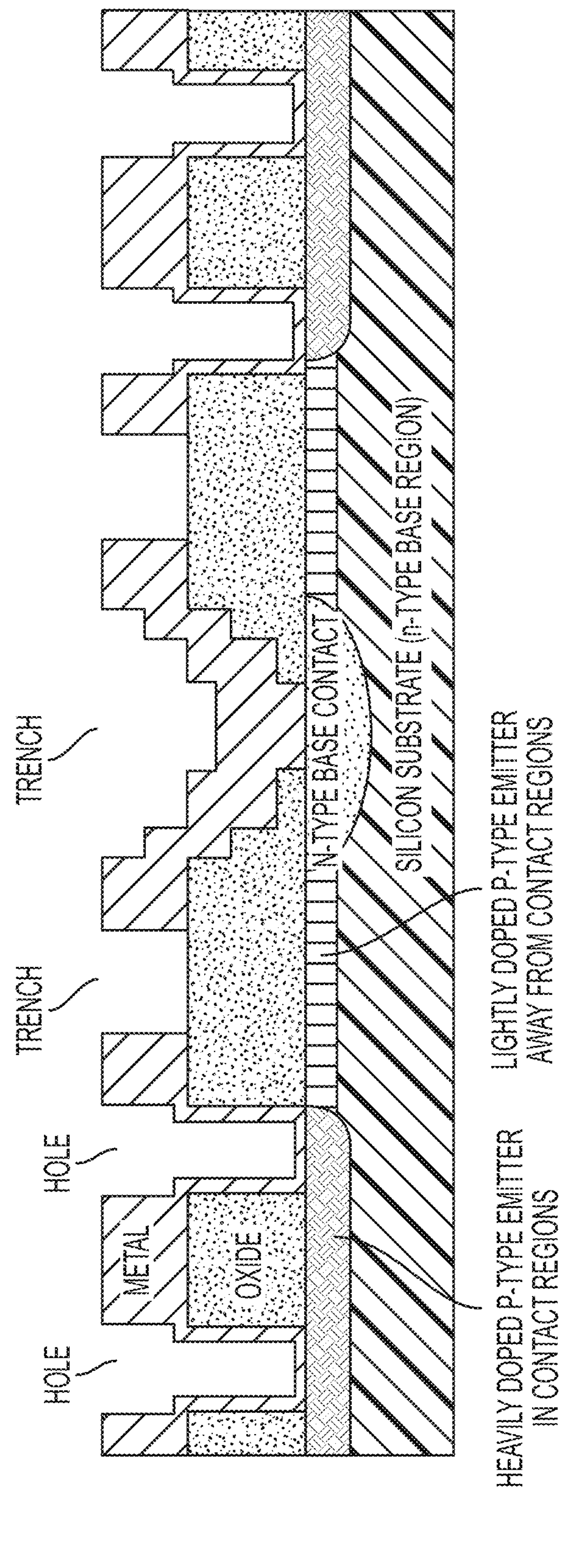

It is to be noted that after the backplane attachment and structuring processes disclosed herein, the template may be re-used after the release of the backplane reinforced structured thin film solar substrate (TFSS) from said template. This re-use requires clean-up steps to render the template ready again for the next round of porous layer formation and epitaxial deposition. FIGS. 62A-C are diagrams of structures prior to backplane reinforcement steps. FIGS. 62A and B are a top and cross-sectional views, respectively of on cell structures after PVD and metal contact openings. FIG. 62C is cross-sectional views of on cell structures after PVD and metal contact openings for a selective emitter structure. A method example on how to arrive at a selective emitter structure is detailed in FIGS. 73F through 73J.

Figure 62D:
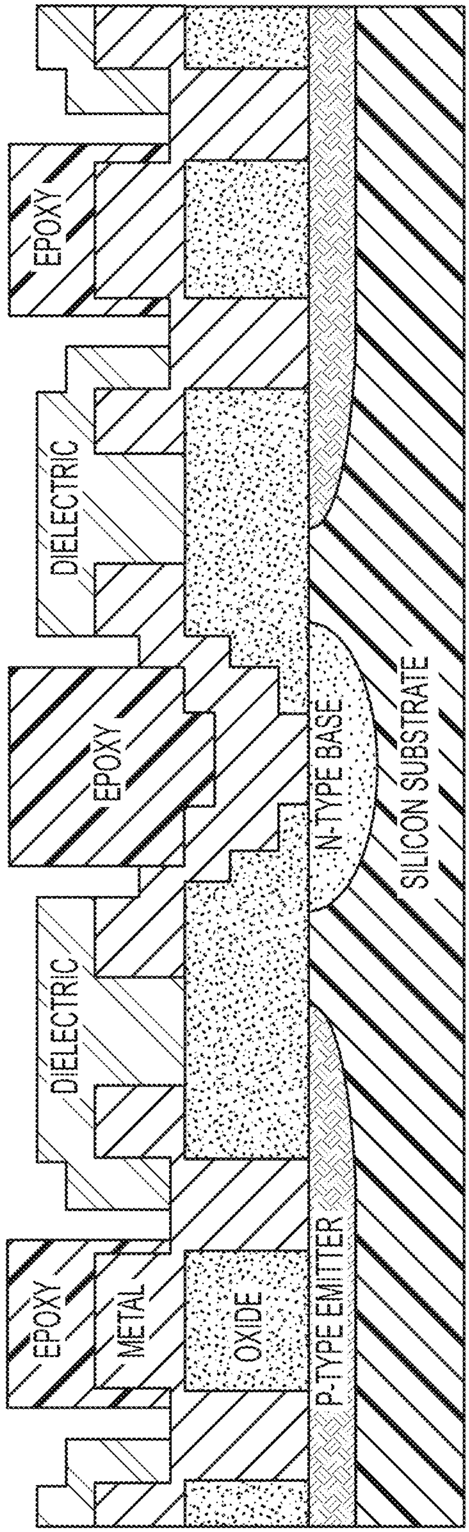
Figure 62E:
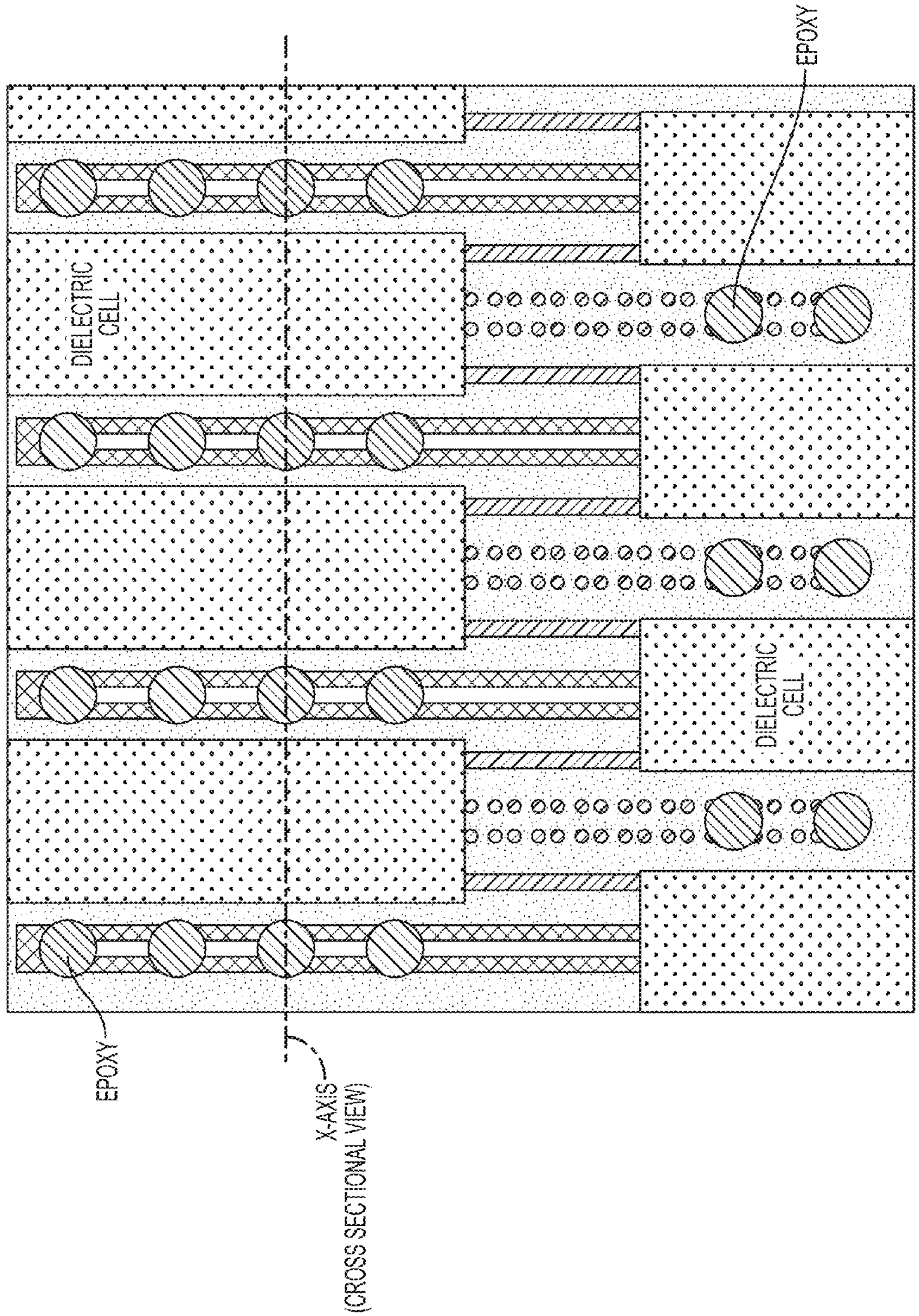
Figure 62F:
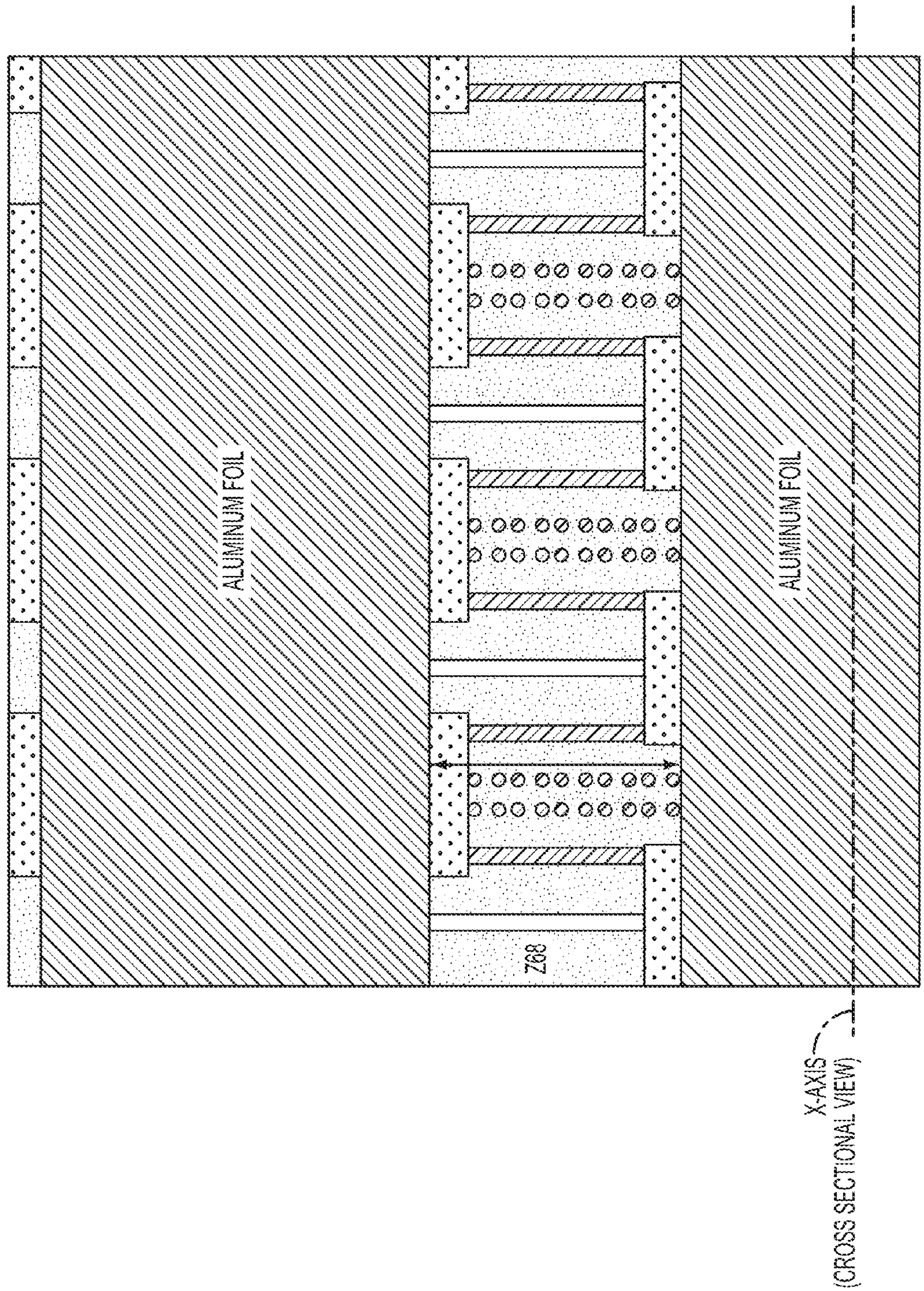
Figure 62G:
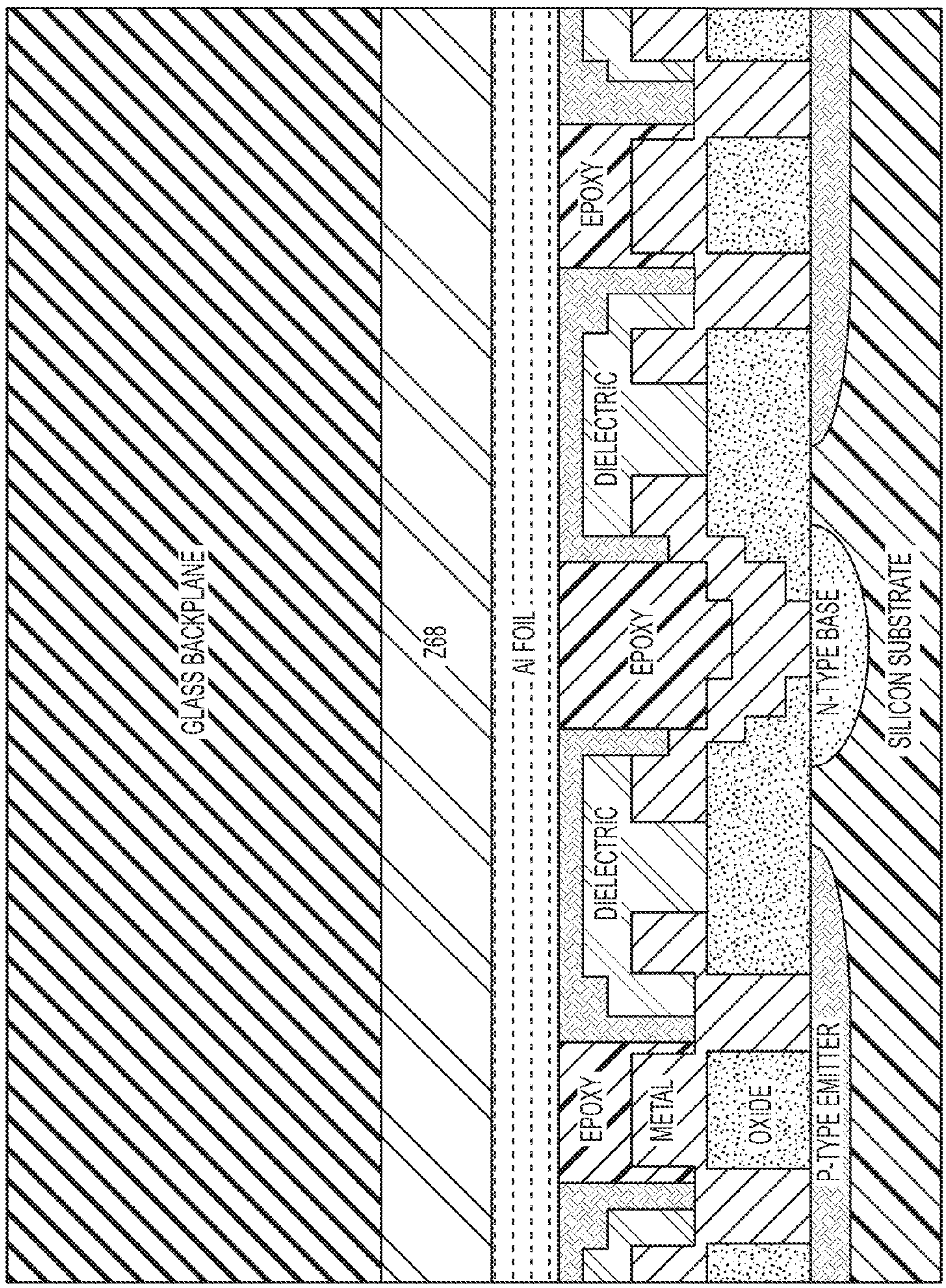

FIG. 62D is a cross sectional diagram of the structure of FIG. 62B after dielectric layers and epoxy pillars formation. FIG. 62E is a top view of the structure of FIG. 62D after dielectric layers and epoxy pillars formation. FIG. 62F is a top view of the structure of FIG. 62E after metal fingers (metal layer 2, shown as Aluminum foil) formation. FIG. 62G is a cross sectional diagram of the encapsulated structure of FIG. 62F.

Generally, the disclosed backplane structures utilize orthogonal current extraction. In back contacted solar cells, current typically needs to travel along long distances as both contacts are on the same side—thus a large area planar electrical contact may not be easily realized. To reduce electrical shading metal finger pitch typically needs to be kept small while finger height needs to be substantial, which often results in a costly and high stress process for metal finger formation on back contacted solar cells. Such high stresses can even prevent the move to larger substrate sizes for conventional back contact cells.

The disclosed subject matter provides a solution to high cost and high stress processes associated with back contact metal finger formation through the use of orthogonal current extraction. Metal fingers on the thin solar cell are kept thin, the current is then guided up through contacting dots, which can be comprised of conductive adhesives such as, but not limited to, silver epoxy or of solder, or of deposited or printed next level metal. The remainder of the area or most of the remainder around the contacting dots is covered by a printed dielectric adhesive or by a dielectric adhesive sheet, providing electrical isolation against the backplanes. Such dielectric sheets can for instance consist of prepreg that is laminated to the thin film solar substrate (TFSS) and later has vias drilled into it in areas where contact between metal layer 1 and metal layer 2 is to be established.

Current is then extracted orthogonally where large emitter and base fingers in the backplane structure contact the respective small emitter and base fingers on the thin film solar cell substrate (TFSS). By the use of this orthogonal transfer, the individual distance that the current has to travel within the thin metal layer on the cell is minimized or kept relatively small thereby strongly reducing the electrical series resistance experienced in the structure and in turn enabling thin metal fingers on the thin solar cell.

While the first and second layer metal lines are typically orthogonal to each other, some modifications may be utilized. In the case where a bus bar is to be implemented on the cell as part of the second layer metal, in a normal completely orthogonal arrangement the area under the bus bar would suffer from substantial electrical shading, as in the region of the respective bus bar via drilling to contact the opposing first metal layer line is precluded by the presence of the bus bar and opposing carriers would not get collected or would have to travel far within the active absorber area (e.g. silicon) to be collected by the closest finger of their respective second layer metal. Here, it may be advantageous to have, underneath the bus bar, a pattern of interwoven first metal lines that connect either directly to the bus bar (the metal line having the same polarity as the bus bar) or for the other polarity to the closest fingers of the second metal layer. Using this architecture, electrical shading is reduced greatly and only the series resistance of the first metal layer contributes to additional losses compared to the situation in the bulk of the cell where the first metal layer lines and second metal layer lines are arranged orthogonally and in alternating polarity, respectively.

An explanation in broad and general terms the variations of embodiments of the various backplane flows follows disclosing typical layers, structures, materials, functions and unit processes that are associated with the backplane reinforcement flow. Importantly, not every embodiment of the backplane or processing methods requires all described layers and functionalities.

Several cell layers and structures may be associated with the disclosed backplane flows and with layers that immediately influence the backplane structures and methods. In the following, such layers and structures are listed and described in general in an order starting with the layers and structures closest to the thin film solar cell (TFSS) and ending with the layers on the backside of the cell (closest to the layers that are in contact with the module).

On the TFSS are suitably patterned dielectric layer or layers on top of the thin film solar substrate that are deposited or grown on the thin film, for example while the thin film is on the template. Underneath the dielectric or dielectrics, are zones of emitters and bases (emitter and base regions) and base contacts of the thin film substrate. One of the functions of such layers is to provide dielectric isolation between terminals and of metal lines from active areas of the thin film solar substrate, and secondly to be used as dopant sources for forming emitter and/or base contacts. Methods and embodiments providing the dielectric layers include grown or deposited dielectric layers such as undoped or doped glasses with optional subsequent dopant drive-ins, thermal anneals, and/or thermal oxidations.

The contact opening of at least one of the zones of emitter and/or base (emitter and base regions) using suitable patterning methods, such as laser ablation, etch paste, lithography, and etch is employed to provide local access to the doped zones with suitable contact areas. Contact areas need to be optimized with the parameters of best contact and shunt resistance, as well as with providing a minimized area with high recombination rate for carriers. Depending on the process flow, such contact opening may be performed later in the cell process flow, but generally is performed prior to forming first layer metallization.

Metal contacts (herein also referred to as the first metallization layer or first electrically conductive interconnect layer) are deposited on the TFSS to at least one or both of the emitter and base areas. The first metallization layer (or layers) may be patterned as metal fingers, such as interdigitated metal electrodes, on the TFSS (while attached to the template if template processing is used to form the substrate) which may deposited using PVD or other methods such as printing of patterned metal layer or layers. The base and emitter metal contact layers forming the first metallization layer are suitably isolated from each other and can be patterned using laser ablation, printing, lithography and etching, etching pastes, or other methods. A function of the first metallization layer is to provide contact to at least one of emitter and base areas of the cell and to route current from the cell terminals (emitter and base) to the next backplane layer/level; and second to provide surfaces that can give low contact resistance, such as aluminum which gives low contact resistance to both p- and highly doped n-type material in silicon whereas optional materials on top of aluminum may provide good contact resistance to the next layer/level. Third, the first metallization layer may provide a surface that can later be plated, such as a Sn or Ni or NiV or Ta coated surface, if the next level of metal is applied using plating. Fourth, the first metallization layer may provide a good stopping layer in the case that a dielectric layer deposited, such as by lamination, on top of the first metallization layer is to be drilled, using a laser drilling for example. Example methods of depositing a first metallization layer are PVD, evaporation, screen printing, ink jet printing, and aerosol jet printing. Example materials and embodiments are PVD layers or stacks such as Al itself or AlSi1%, Al with Ni or NiV, and optionally Sn or SnAg, Al with Ta or Pd or Ag. Thick Al or AlSi1%, such as layer greater than 0.5 micron thick, may serve as particularly suitable reflectors in the far infrared and thus act as stopping layers for CO2 laser based drilling of subsequent via holes in further cell processing. Other examples are PVD stacks with additional locally printed pads for better contacting with the next layer, to provide better margins to stop laser drilling, and provide mechanical locks to prevent aligned pre-drilled dielectric from shifting during lamination. Such pads may consist of pastes containing Al or Ag such as conductive epoxy. Alternatively, printed metal or metals may be used, such as printed Al or printed Al with small amounts of Si (AlSi) or combinations thereof, optionally also with local caps of Ag for better contact and better reflectance for ensuing laser drilling process. For such printed layers, the metal may be printed in fingers, interrupted fingers, or dots that are aligned to subsequent metal vias. Refractory metals such as Ti, Co or Ni that may be printed, for instance using ink jet or screen printing and which can locally form silicides when suitably heated, may also be used as first metallization layer or part of a first metallization layer. Such silicides may be optionally used underneath other metals, for example underneath printed Al or AlSi.

The next level dielectric layer (herein referred to as the second dielectric layer) acts as an adhesion layer for the TFSS and additional components of the backplane. The second dielectric layer also serves as an isolating dielectric which enables the orthogonal arrangement between metal fingers on the TFSS (the first electrically conductive interconnect layer) and the large metal fingers on top of the dielectric or within the backplane (the second electrically conductive interconnect layer). The second dielectric may also provide protection from chemical attack to the backside of the TFSS along with the first electrically conductive interconnect layer and first dielectric layer in processing embodiments where the second dielectric acts as the outermost layer of the structure at the time of wet processing, such as texturing and post-texture cleaning. The second dielectric also serves to provide mechanical stability to the backplane reinforcement for the attached active absorber layer, comprised of the thin film silicon solar cell substrate. Deposition methods for the second dielectric layer include, a pre-drilled dielectric sheet which is attached using a lamination process, a post-drilled sheet which is attached using a lamination process and is undrilled at the time of lamination and of subsequent wet processing and drilled after said wet processing steps, and a patterned dielectric adhesive which may be, for example, printed either onto the TFSS surface or on the backplane side of the TFSS-backplane structure. Example materials for the second dielectrics layer include first dielectric sheets such as prepreg, EVA, Z68 PE sheet and others which are patterned via pre-lamination or post-lamination drilling (in the case of prepreg preferably using a laser such as for example a CO2 laser). Alternatively, punching or stamping processes may be used for perforation of such sheets. Printed dielectric adhesives, such as thermo-plastic or B-stageable materials, may also be used as a second dielectric. Other example second dielectric layers include a sandwich structure of sheets of dielectrics, such as prepreg, EVA, Z68, or others, covered with a protective material such a Tedlar, Mylar, Teonex such as Q83 or other PEN or PET materials, where at least one of the layers is continuous to secure protection and at least one or all of the other layers are either continuous (in the case of post lamination drilling) or perforated in the case of pre-lamination drilling. The latter allowing for easy low contact resistance access to the underlying metal fingers. Another example second dielectric layer includes a randomly or regularly but unaligned perforated sheet, such as in the case of the immersion contact bonding structure.

It is to be noted that in the case of performing subsequent wet processing steps in an embodiment where there is no wet chemistry contact to the back side of the backplane-reinforced TFSS, a protective sheet may not be necessary during the wet processing and, also, drilling of access via holes may then be performed even at any point prior to the wet processing.

The via hole (also referred to as contact openings) in the attached dielectric provides access between the underlying first level metal fingers on the TFSS (the first electrically conductive interconnect layer) and the next level metal on the backplane (the second electrically conductive interconnect layer. Drilling the via holes after lamination or keeping the via holes covered with a protective sheet provides, as in the case of the Pluto structure described below, protection of the underlying metal on the TFSS during the texture, clean, and front surface passivation steps and thus enables immersion of the reinforced structure into wet chemical baths. Via holes (contact openings) in the dielectric may be formed by drilling, preferably using a laser as described above, or in the case of a printed dielectric adhesive leaving areas unprinted where a via hole is desired.

The next level metal routes the current through the vias and either onto the next level of metal on the backplane or directly to cell-to-cell or to module connectors depending on the backplane structure and process embodiment. Typical materials and embodiments of via filling materials are conductive epoxy or more generally conductive adhesives which may be either stencil or screen printed into the vias or applied prior to applying a pre-drilled dielectric sheet. Typical materials also include solder or solder pastes, such as those containing Ag, Cu, Sn, Bi or mixes thereof, including SnBi mix which may be particularly advantageous due to its low solder apply temperature of approximately 140° C. which is in the same range as or even lower than attractive backplane dielectric processing temperatures.

Subsequently to at least partial via filling or even omitting via filling, the next level metal deposited serves to provide large width metal fingers on top of the dielectric (herein referred to as the second electrically conductive interconnect layer or second metallization layer). For the more desirable case where no additional via filling metal is used inbetween, said second level metal directly is used to make contact to the underlying first level metal in the drilled vias. Such large metal fingers may consist of plated metal, optionally with a prior blanket PVD seed which is then covered by a patterned and later removed dielectric print for emitter metal from base metal separation. The latter print is later removed and an etchback process may be carried out to remove the blanket seed metal. For plated fingers, optionally the seed may also be printed or deposited using a shadow mask, such that it is pre-patterned. Depending on the existence of a bus bar structure, a larger amount of contacting points during the plating of the finger structure may be employed. Rather than being deposited or built up by methods such as printing, spraying or plating, the large metal fingers (the second electrically conductive interconnect layer) may also consist of preformed fingers made of for instance solderable aluminum, i.e. Al with a thin coat of Ni, NiV and optionally Sn. For structural strength, such finger lines may be interlocked or may be tiles which may also be optionally interlocked. Another example for depositing the orthogonal fingers includes sprayed metal, such as the use of flame or thermal spraying. Yet another option is a flexible printed foil which can locally be attached to the underlying vias by the solder or conductive adhesive points—such printed foils are not unlike those used for flex circuitry or flex connectors.

The metal fingers embodiments may optionally include a bus bar design. If not, then subsequent contacting through soldering or printing of conductive adhesive may connect the backplane and with it the cell to the module. It is to be noted that for some embodiments, the printing of conductive material into the holes is not required and that rather, after the optional clean-up of the drilled via holes, optionally together with a removal of native oxide on metals, the seed layer for the next level metal (the second electrically conductive interconnect layer) can be applied directly into the opened via holes.

Optional additional layers, particularly as applied to the oasis and hybrid structures described herein, include:

a. In the case the second layer metal is already on the backplane when the backplane reinforced TFSS undergoes chemical treatment such as texturing and post texture cleaning, it may be advisable to have a protective dielectric layer on top of the second level metal. This layer's function is to provide protection from the chemical, optionally to help control CTE mismatch and structure bow as well as to protect and provide areas for contacting of the cell for later testing and module interconnection. Such contact areas may be opened through this protective layer for instance after undergoing the wet processing step or steps, for instance by cutting or drilling through the sheet or layer with a laser. Example material embodiments include the use of prepreg, EVA, Z68, Tedlar, Mylar PEN (e.g. Teonex Q83). Optionally, a sandwich of two or more layers can be used for this task, where at least one of the layers provides chemical protection of the backside and the edges from chemicals.

b. In addition to the above dielectric layer a backing layer may be added which serves to supply sufficient flatness and rigidity as required for most solar cell module embodiments or to provide a predetermined shape or curvature to the structure. The latter may be used advantageously in architectural designs where non flat cells are to be employed. This curvature, however, can also be tuned to potentially sufficient extent by the use of a suitably chosen initial backplane dielectric layer or layers, such as prepreg and others, as mentioned in herein. Such a backing layer or layers may also need to be perforated in order to allow contacting through them onto the metal layer underneath so that metallic contacts can be routed through it. Optionally, the backing layer may be assigned one of the polarities of the contacts. Typical embodiments for materials are aluminum, steel, glass or other suitably rigid plates that are thin, preferably thinner than 1 or 0.5 mm.

c. In the case that a metallic or otherwise not chemically resistant material is used for the backing layer, then an additional top protective cover layer may be employed which prevents chemical attack of the backing layer and which can be perforated after the chemical exposure, for instance using mechanical cutting or laser cutting, in order to provide electrical contact access to the metal underneath the backing layer and thus enable contacting of the backplane reinforced cell to the multi-cell module. Typical material embodiments for such protective layers are prepreg, Mylar, PEN, for instance Teonex's Q83. The attachment of these protective layers to the backplane reinforced cells may be performed either through an additional adhesive underneath or through adhesive which contacts through the perforations in the backing layer and around the edge of the backing layer. The adhesives may be comprised of for instance prepreg, EVA or Z68. The backing layer will tend to be slightly undersized to allow for edge wrap-around of the underlying adhesive to the top protective cover layer. During the lamination process, it may be advantageous to have a suitably shaped cover pressing onto the backplane side of the backplane reinforced TFSS, the cover providing a means to prevent closure of areas by adhesive that flows during the lamination process. This in turn can facilitate greater ease of electrical access to the backplane contacts at a suitable point after the lamination process. In the case that glass is used as such a backing layer, then the connection can be made either through drilled holes through the glass or by wrapping the wide metal fingers around the edge of the glass and either onto the top of the glass where they are subsequently covered by a chemically resistant material, or by having the metal fingers protrude outside of the cell used directly for contacting to neighboring cells in a module. The latter may also requires the application of a chemically resistant protection layer during the wet chemical exposure of the cell.

As the applications of this disclosure allow for a multitude of embodiments, this disclosure presents several possible embodiments using different types of support structures, materials and processes. Within some of these embodiments, we point out specific structures, materials and processes with their advantages and key points to be considered. Where not explicitly stated otherwise, it is perceived as included that such key points may also hold for other embodiments where conceptually similar structures, materials and processes are described.

Also, the structures, materials and methods covered in this disclosure allow for a multitude of potential implementation variations which cannot all be explicitly described. It is the intention of this disclosure to cover all such implementations, if at least one part of the presented embodiment is implemented and utilized in a comparable fashion. In addition to final structures, specific method or process flows along with some variations to achieve the final structure may be shown for each of the cases. The process flows and structures below assume a very thin silicon needing carrier support as this case is more general. Thicker silicon not requiring carrier support is a specific case of the more general case presented here.

For descriptive purposes, the present application provides several backplane and process flow embodiments, including: the Pluto structure, the Oasis structure, the Hybrid structure, and the immersion contact bond structure. However, the backplane structural and processing elements disclosed may be used in any number of combinations and variations by one skilled in the art.

Figure 63A:
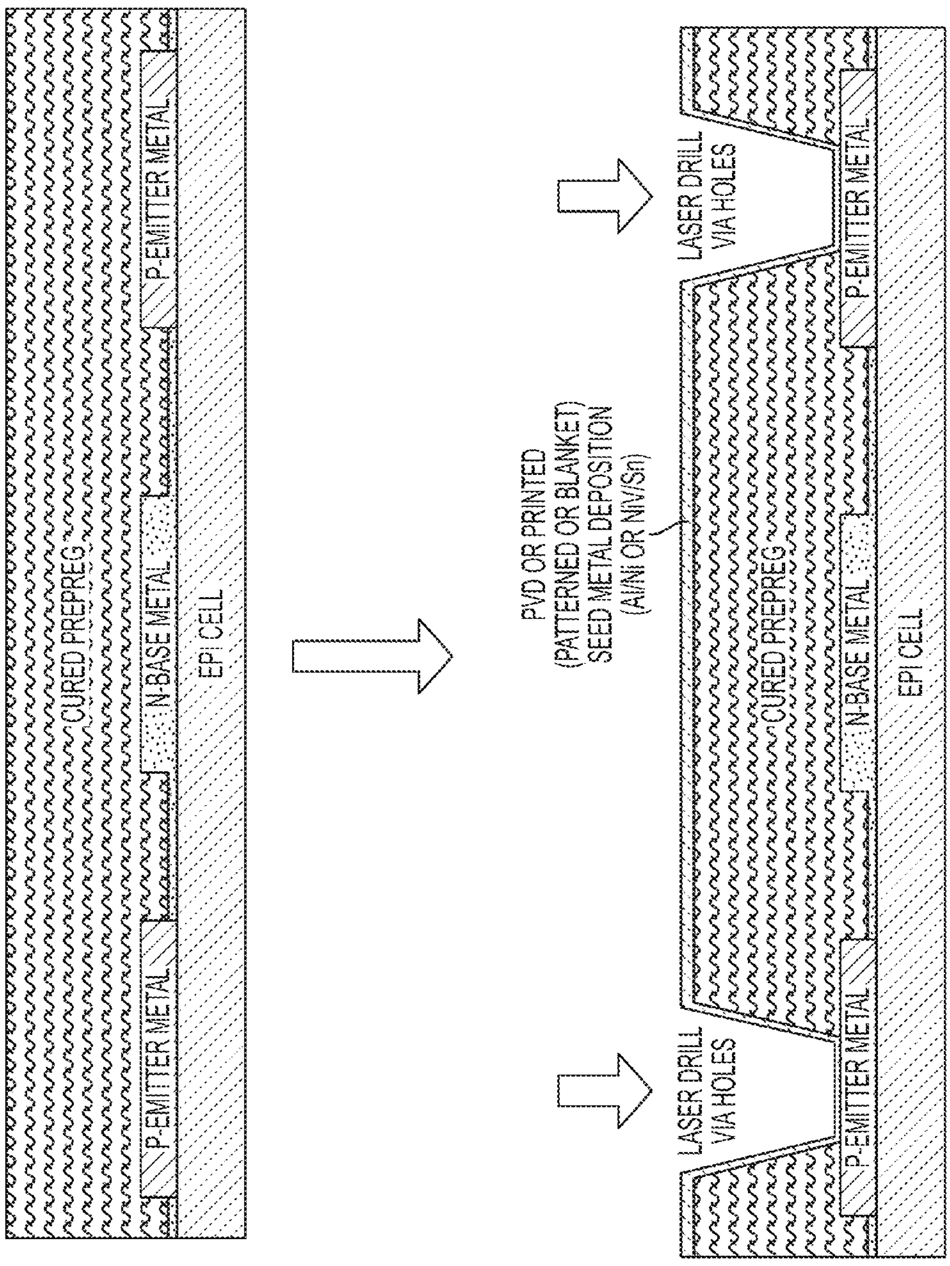
FIGS. 63A through D are cross sectional diagrams of a pluto structure after certain processing steps.

FIGS. 63A through 63D are cross-sectional diagrams of a first embodiment, hereinafter referred to as pluto, during certain processing stages. FIG. 63A shows a pluto structure after prepreg lamination, laser drilling, and PVD seed metal processing steps. As shown in FIG. 63A, a pluto structure consists of the following elements: First, the thin film solar substrate (TFSS) which consists of the active absorber layer, patterned emitter and base regions as well as patterned first layer metal, in this figure represented as deposited using PVD and subsequently patterned. Typically metal 1 fingers are lines that extend orthogonally to the metal 2 (plated Cu/Sn in the case of FIG. 3). The frontside of the TFSS (also called the sunny side) is textured and passivated. Second, Pluto comprises a prepreg or other suitable adhesive dielectric backplane forming material which is laminated to the TFSS structure and cured, optionally in the same step as lamination. The dielectric backplane material is selected to have good adhesion, good matching to the thermal coefficient of expansion of silicon which is chemically inert or optionally protected by a top cover sheet. Thermal matching allows for the drilling of vias, for instance drilled using a CO2 laser. Via drilling proceeds to the underlying metal 1 and needs to stop on top or just within the metal 1 layer. Further, the prepreg material may be comprised of one or more sheets of material with optionally different properties, such as incorporating woven or non-woven fibers (for instance glass, Kevlar, or other suitable materials as well as resin or different resins) all in optimized ratio to best match the coefficient of thermal expansion of the underlying silicon, or at the least, to reduce built-in bow and associated stress in the laminated and later released sandwich structure. It may be advantageous to balance thermal mismatch and adhesion to have an asymmetrically resin coated prepreg sheet or to laminate more than one prepreg sheet with different resin content or type.

Figure 63B:
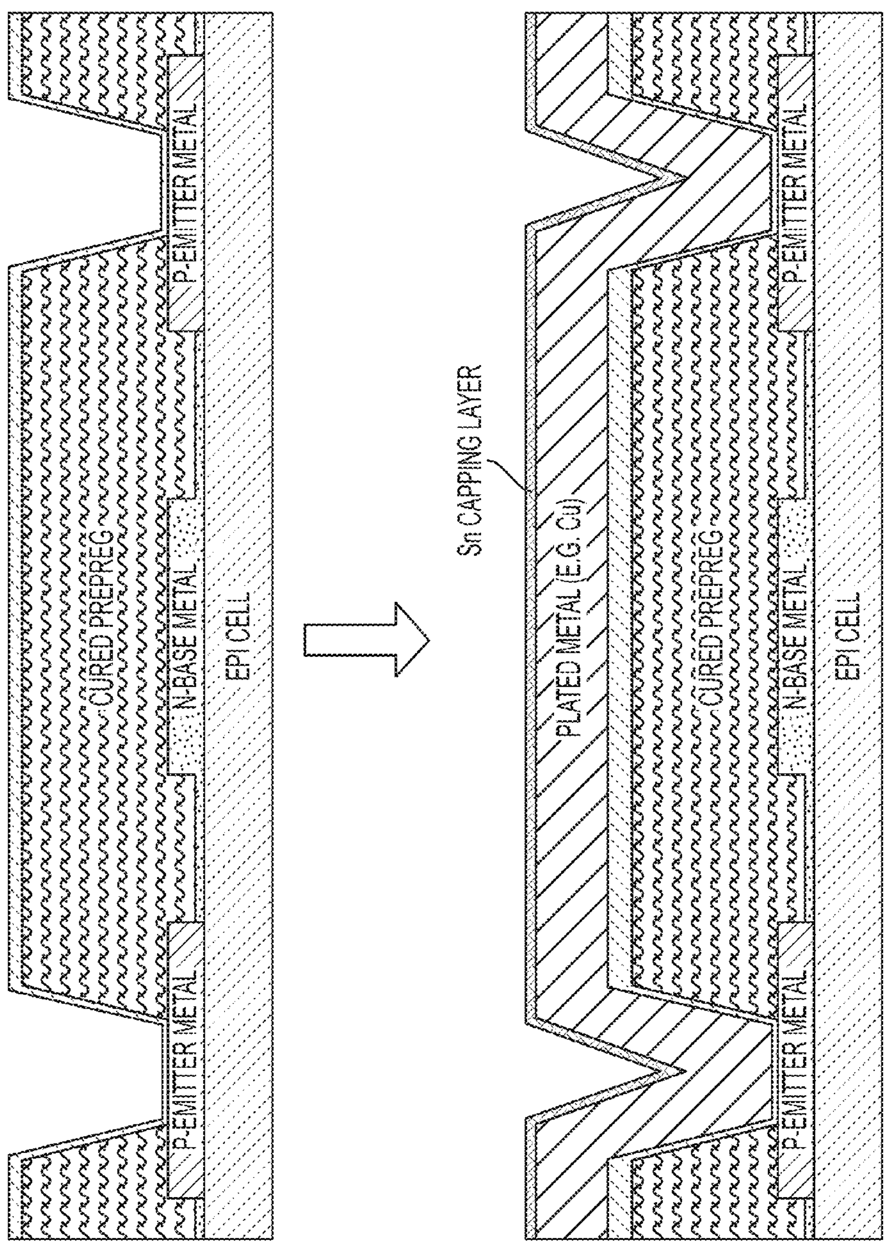
Figure 63C:
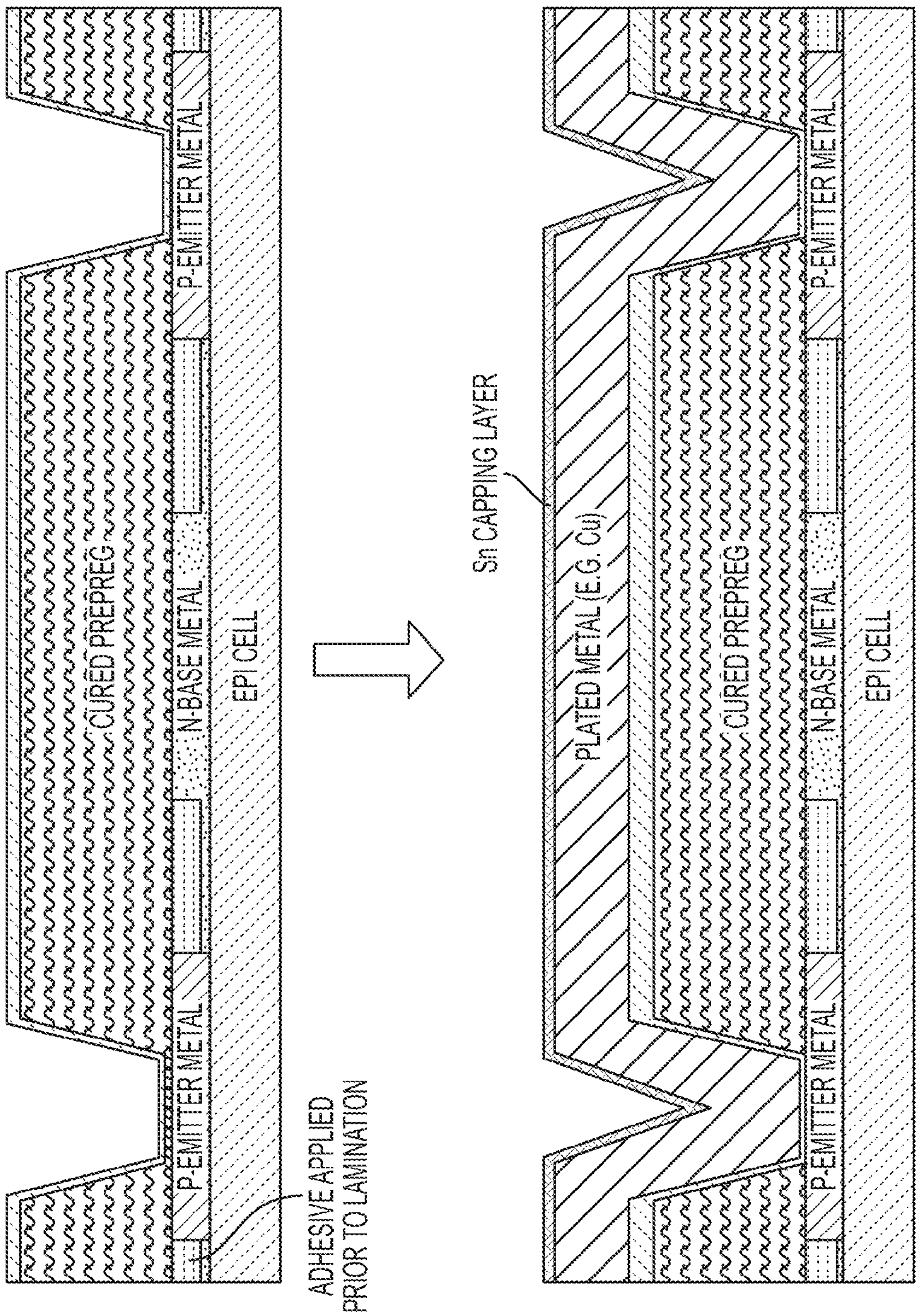
Figure 63D:
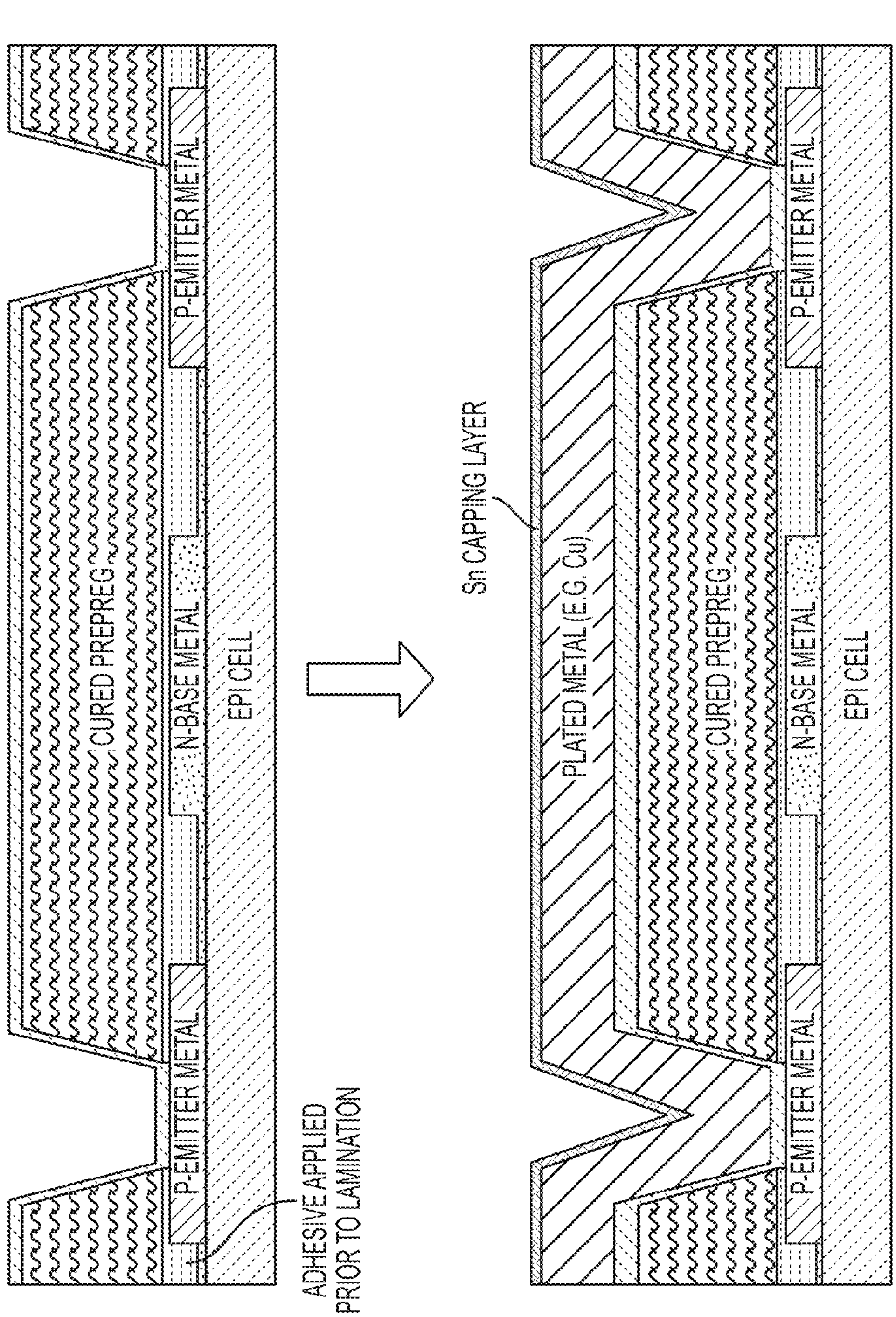

FIGS. 63B, 63C, and 63D show a pluto structure in plating and Sn capping layer processing steps. FIGS. 63C and 63D illustrate examples where prior to lamination of the prepreg an additional adhesive is place, e.g. by screen printing, between the metal 1 structures to. Note that the adhesive applied prior to lamination in FIG. 63D covers the space between metal 1 lines and metal 1. The adhesive applied prior to lamination may either be printed only in the space between the metal 1 lines (FIG. 63C) or at least partially above the metal 1 lines (FIG. 63D) which may provide several additional process options and benefits. The adhesive may help alleviate the planarization requirements during the subsequent lamination by providing a more planar starting lamination surface. It may also provide an improved adhesion as well as a stress buffer, especially if the adhesive, when cured, has a low modulus which can in turn help decouple thermal expansion coefficient mismatch between backplane (e.g. prepreg) and the active absorber material (e.g. epitaxially grown and released silicon). Third, the above mentioned vias are filled or contacted at least partially with a metallization such as a PVD or printed seed layer or conductive paste. FIGS. 63B-D show plated copper as the example metallization both to fill the via holes as well as to provide the fingers that route the current to and from the via holes. The metal fingers (metal 2) may be arranged in an essentially orthogonal way to the on-TFSS metal fingers (metal 1) of the first layer metal.

A multitude of similar structures may be envisioned with this scheme in mind, for instance structures that consist of more than one metal to form the contact to the on-TFSS metal fingers. Common to the structures shown is a two-layer metal design where the outer, second layer metal (metal 2) is arranged essentially orthogonal to the inner, first layer metal (metal 1). Further, the dimensions of the second layer metal are much larger and easily manufactured. A second group of structural embodiments, hereinafter referred to as oasis, is defined by the following two concepts. First, at least at some point in time the structure relies on orthogonal or quasi-orthogonal current transfer, a concept that is described in the following structure attributes: Orthogonal finger design for orthogonal current extraction including: 1) interlocked fingers to provide structural integrity and keep the cell-backplane arrangement from bowing or warping, and 2) stress relief cuts in fingers; and Tile design for orthogonal current extraction including: 1) segmented fingers (tiles) to reduce the CTE mismatch related stress between the thin solar cells and the backplane material in the direction of the fingers, and 2) interlocked tiles to provide structural integrity and keep the cell-backplane arrangement from bowing or warping. The second oasis characteristic is that at the time of the texture and passivation processes in the solar cell manufacturing process, at least one additional layer of metal next to the metal layer that makes the contact to the base and emitter in the semiconductor is already integrated into the backplane. Thus the oasis backplane is an integrated structure with two metal layers, metal 1 and metal 2.

Figure 64A:
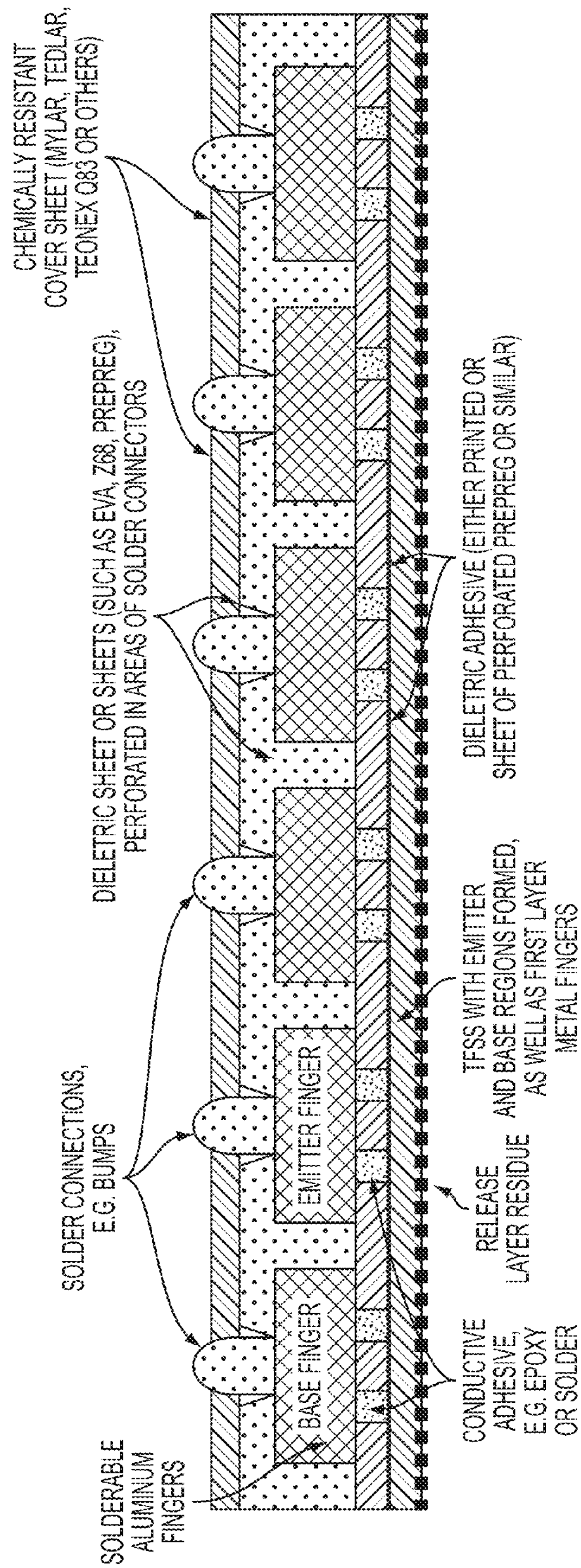
FIGS. 64A through F show various aspects, cross-sectional and top views and process flows, of a four-layer backplane oasis structure.

FIGS. 64A-F show various aspects of a four-layer backplane oasis structure (without a backbone) and manufacturing process flow embodiment. FIG. 64A is a cross-sectional diagram of an oasis structure after release from a template with six total metal fingers (three base/emitter pairs). The structure comprises the following elements: first, like a pluto structure, a TFSS which contains the patterned first layer metal fingers. Second, a dielectric adhesive, which is either applied in a patterned way using screen printing, or as a sheet such as a prepreg material which may be either pre-drilled or post-drilled prior to application to the TFSS. Third, an array of conductive contacts, which may be stencil or screen printed, made of materials such as conductive epoxy, such as silver epoxy. The conductive material being applied in areas where there are openings in the dielectric. Fourth, the structure contains a conductive second layer of metal fingers. The second layer of metal fingers material may be aluminum or solderable aluminum plate (SAP), for instance aluminum (Al) coated with a thin layer of Nickel (Ni), or Nickel Vanadium (NiV) and tin (Sn). The material being embedded into a further dielectric, for instance prepreg, EVA, Z68 or other compatible dielectric. This further dielectric is optionally pre-punctured to allow for contact access to the conductive second layer metal fingers. An optional chemically resistant cover sheet, for instance made of Mylar, Tedlar or other PEN or PET based materials such as Teonex, specifically Teonex Q83, may be applied to the top of the structure. Several process flow embodiments are possible to attain such a structure. The four layers of the backplane are 1) the dielectric/conductive adhesive, 2) the SAPlate fingers, 3) the next layer adhesive, and 4) the top cover sheet.

An important structural differentiation may be drawn between a single backplane lamination process where all components are laid up together and laminated at the same time, and a process where the second layer metal is laminated into a flat backplane and is embedded into the surrounding dielectric prior to a second lamination to the TFSS which, at that point, may be supported by the template by means of a release layer of suitable strength. In the latter case, the a backplane may be manufactured, stored and staged separately from the TFSS with potential benefits to cost and logistics. Also, in this case, there is an option: either one or both the dielectric adhesives that provide adhesion between the TFSS and the backplane and the conductive material that is used for the contact between the on-TFSS metal fingers and the large metal fingers that are part of the backplane may be applied either to the backplane side or to the TFSS side prior to lamination.

Figure 64B:
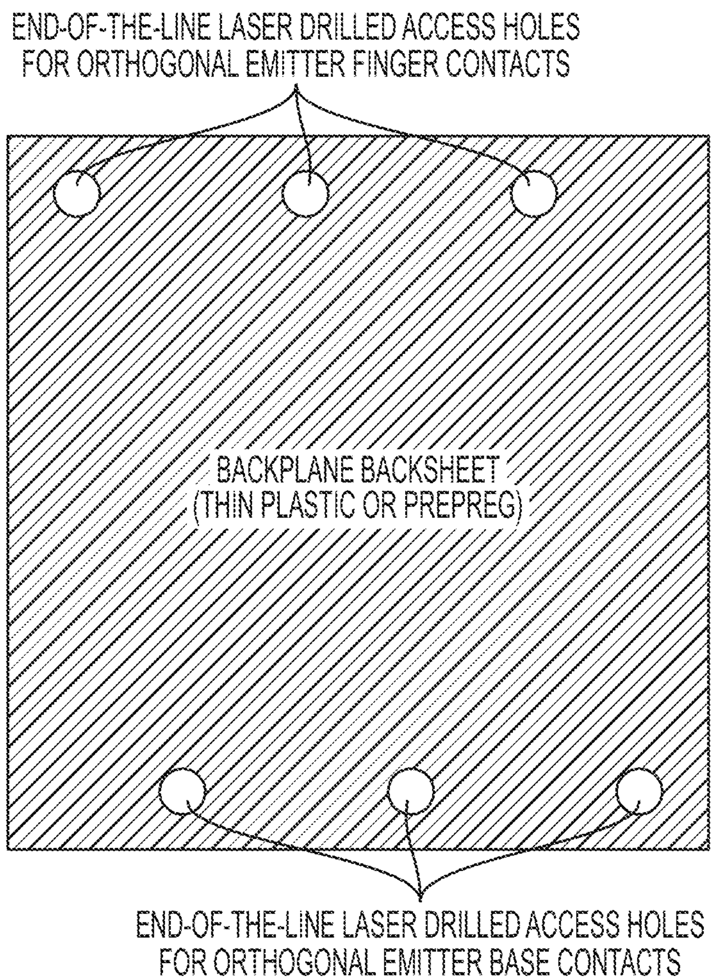
Figure 64C:
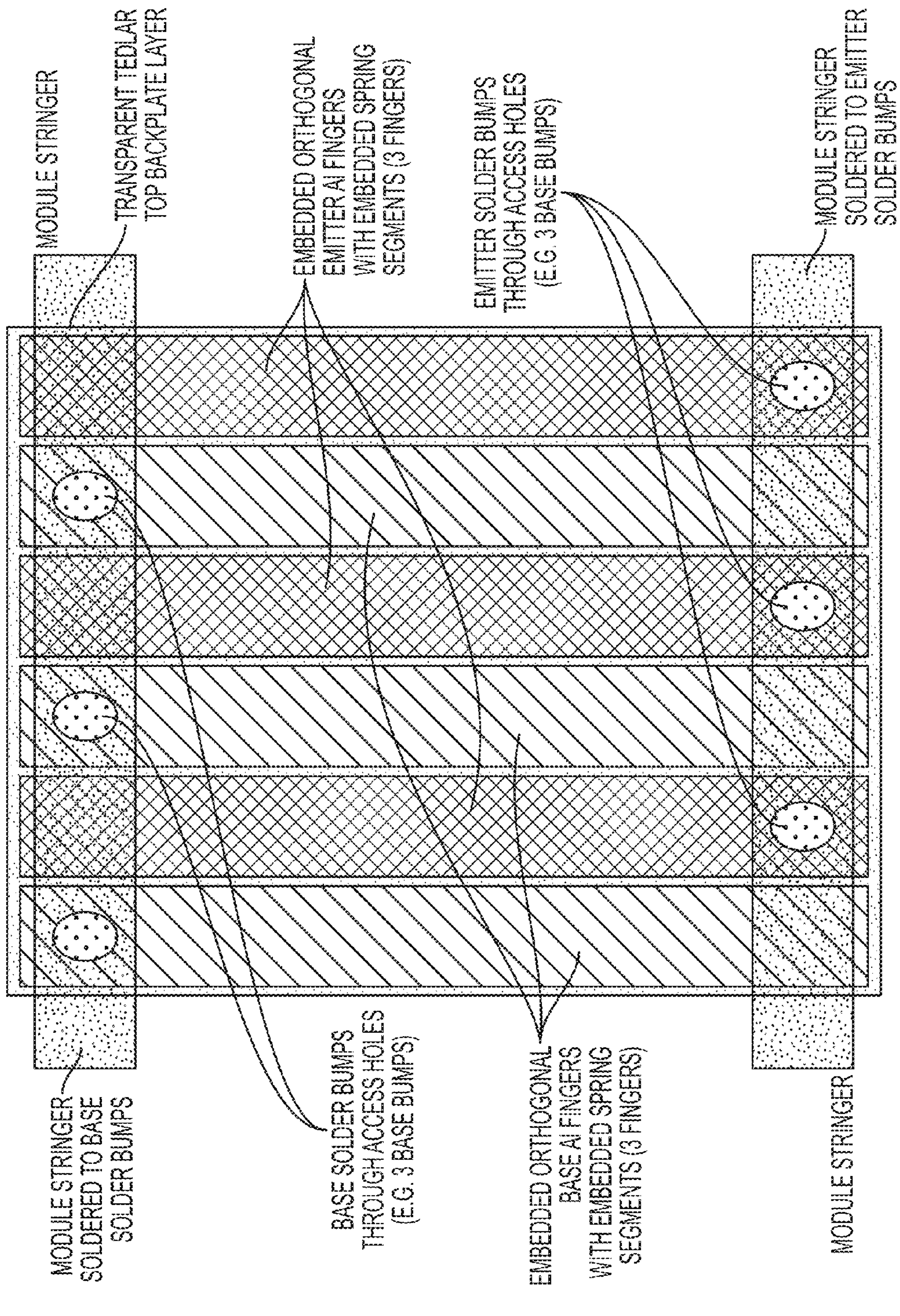
Figure 64D:
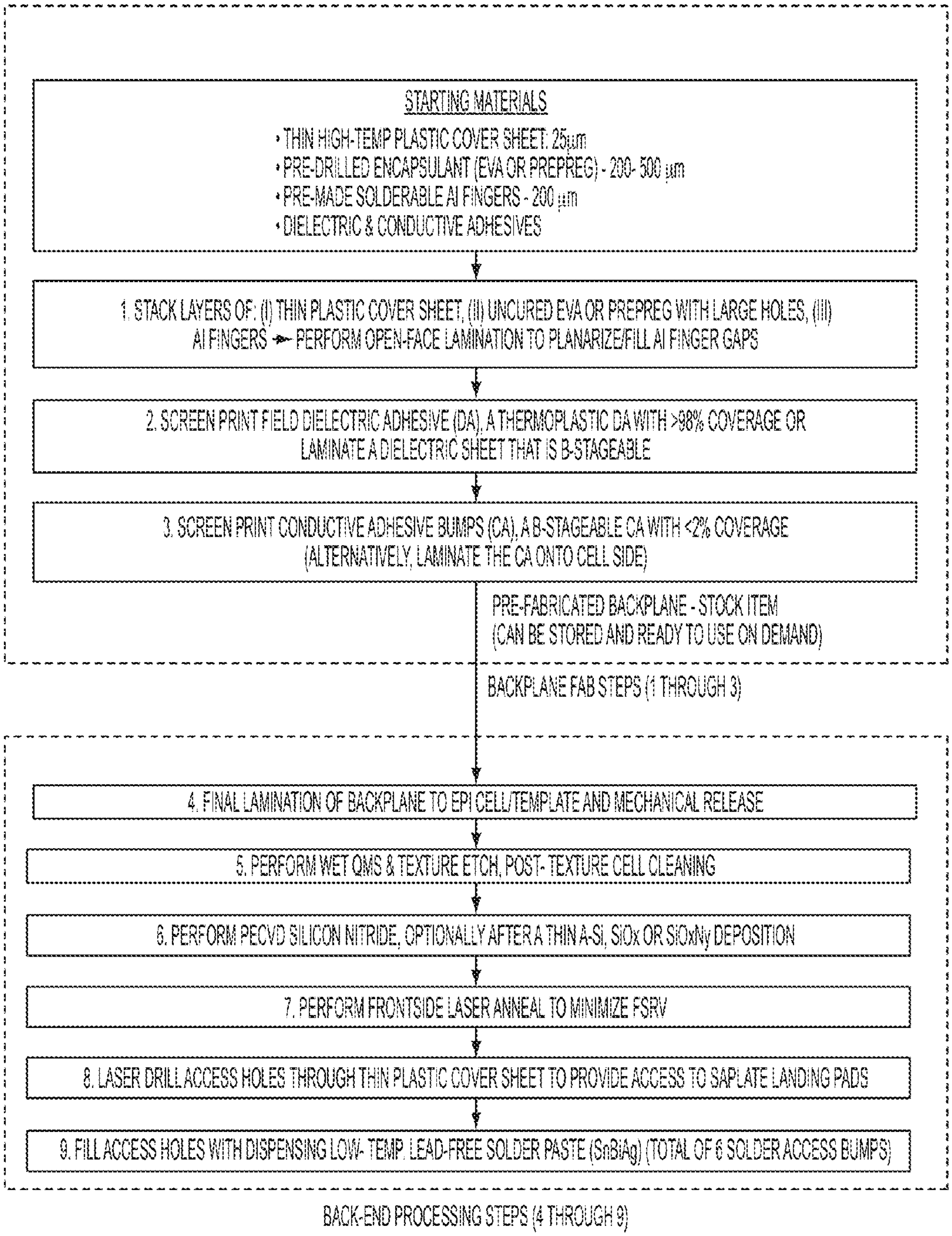
Figure 64E:
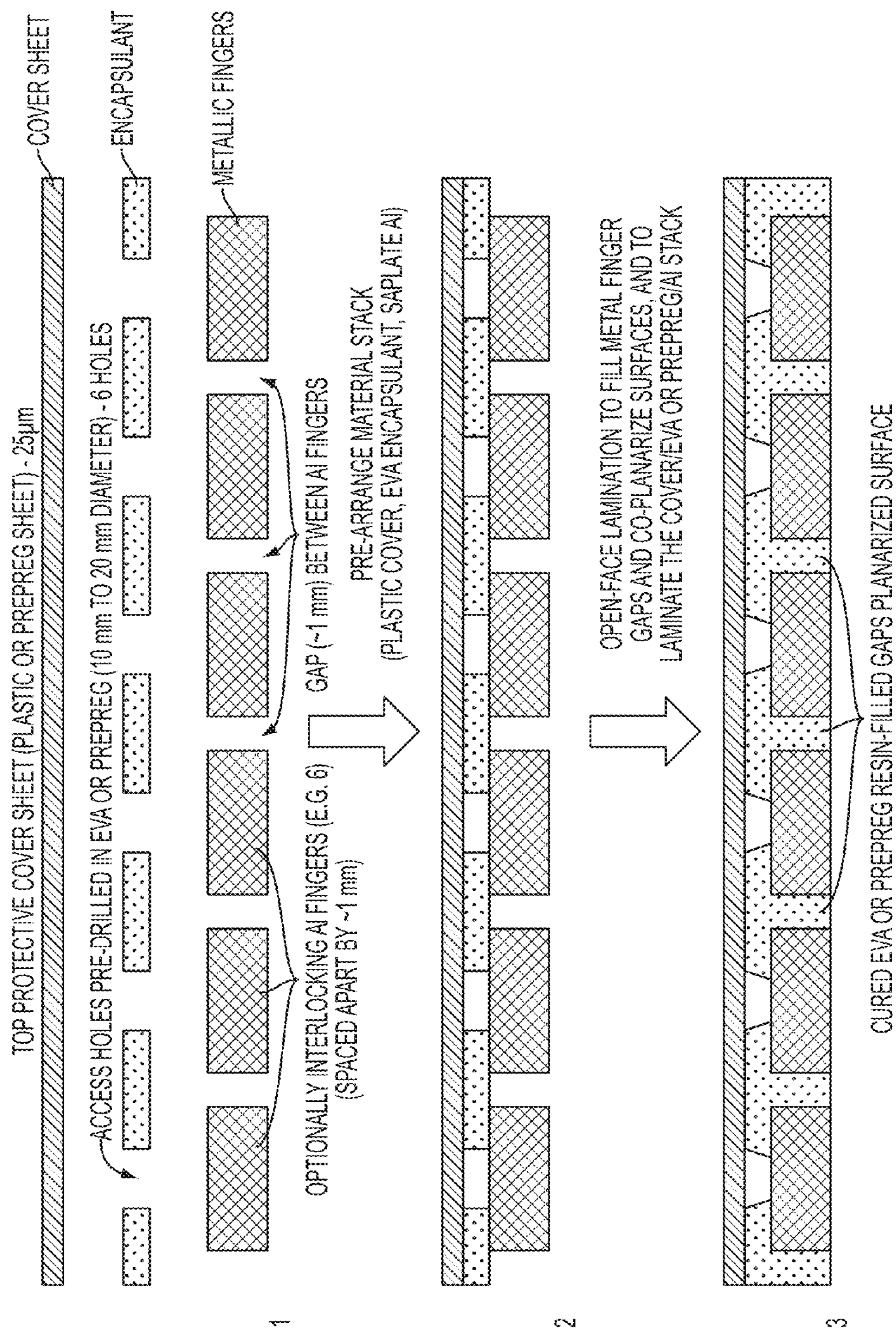
Figure 64F:
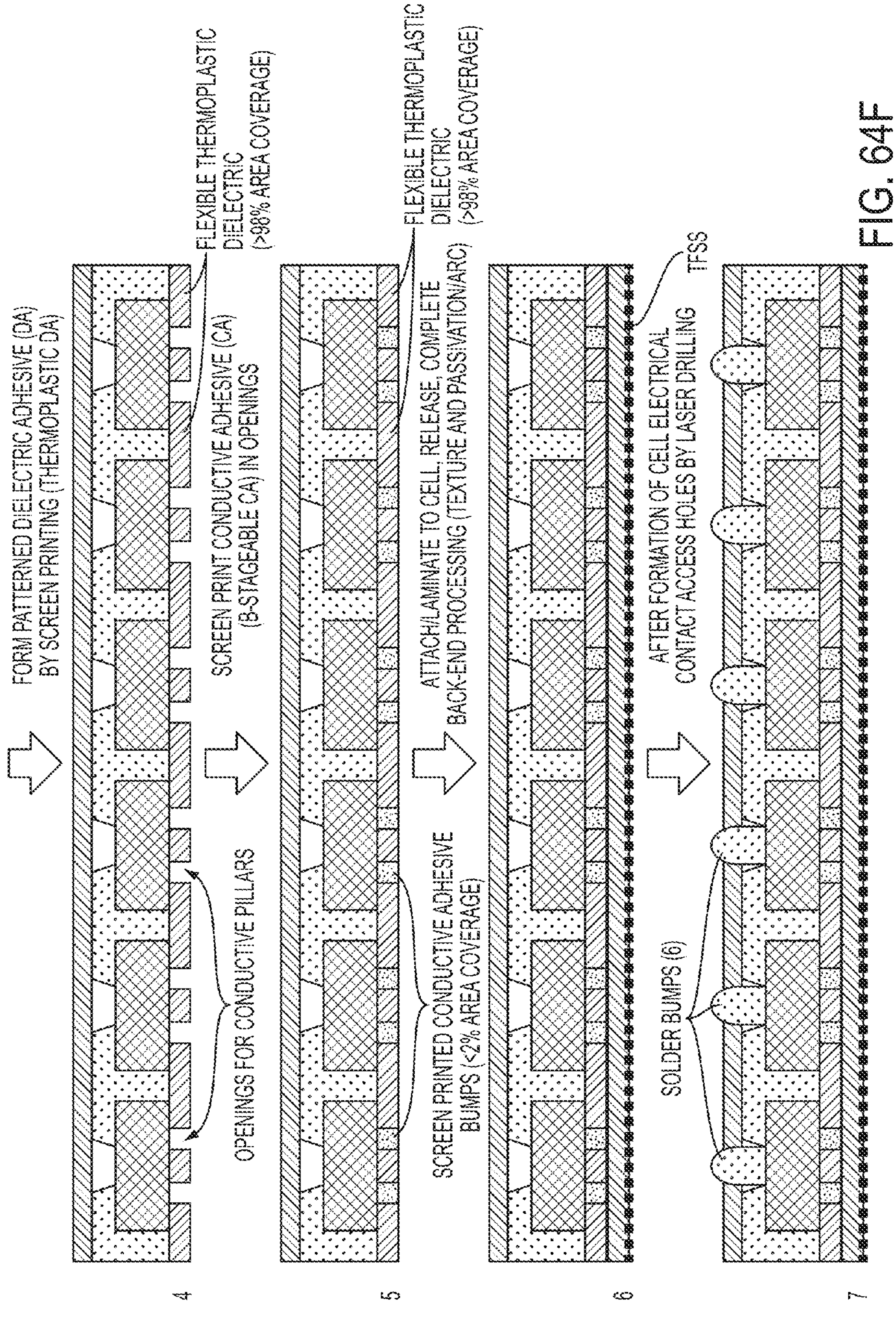

FIG. 64B is show a top view of the top cover sheet, e.g. 25 um plastic or prepreg material, of a backplane structure with end-of-the-line access holes formed near the backplane periphery. As shown with three emitter access holes and three base access holes. Access holes are laser (or mechanically) drilled into the thin backsheet to expose the solderable Al landing pads through the already pre-drilled EVA encapsulant sheet. The access holes may have a diameter of around 5 to 15 mm and are filled with Pb-free solder for stringer contacts, as well as module lamination and assembly. In one embodiment, one large-diameter access hole per orthogonal finger may be used (as shown six access holes for six underlying orthogonal fingers). FIG. 64C is show a top view of a backplane structure showing configuration of external access holes for external module stringer contact. Note no internal or external cell busbars are required. FIG. 64D is a process flow highlighting the major oasis backplane fabrication steps. FIGS. 64E and 64F show a structural process flow for an oasis backplane embodiment. Structure 1 of FIG. 64E shows a three layer stack, from top to bottom: 1) a thin (25 um) cover sheet, made from, for example, a transparent plastic or prepreg, 2) a thin (200 um) EVA or prepreg encapsulant pre-drilled with large access holes, made from, for example, an uncured EVA or prepreg), and 3) thin (200 um) solderable Al fingers prefabricated using laser scribe and KOH etching or stamping. In structure 2 of FIG. 64E the three layer stack is aligned to form a stack of: 1) the thin plastic cover sheet, 2) the pre-drilled EVA or prepreg, and 3) the orthogonal interlocking SAPlate Al fingers. Structure 3 of FIG. 64E shows the stack after open-faced lamination to cop-planarize and fill gaps between Al fingers and to prepare the planar backplane backbone structure. Structure 4 of FIG. 64F shows the structure after formation of field dielectric (such as a thermoplastic dielectric adhesive) by screen printing or a laser-predrilled dielectric sheet (e.g. prepreg or Z68). Structure 5 of FIG. 64F shows the structure after formation of conductive adhesive (CA) pillars, which may be b-stageable, by screen printing. Structure 6 of FIG. 64F shows the structure after attaching/laminating to cell, release, and back-end processing (also forming edge seal). Structure 7 of FIG. 64F shows the structure after final laser drilling of the top thin plastic cover sheet to form the electrical contact access holes, and after applying solder bumps to access holes for test and sort.

Figure 65A:
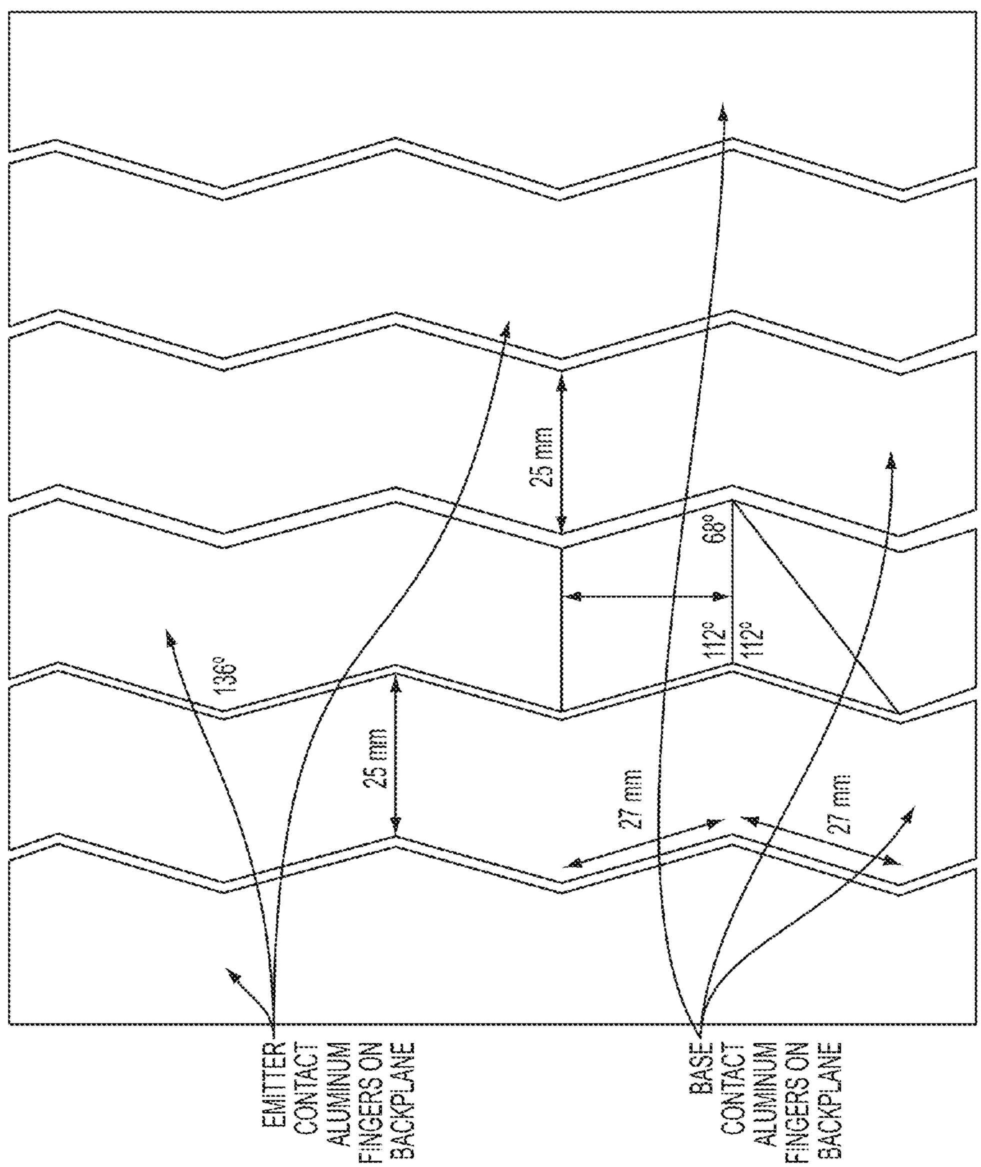
FIGS. 65A through D are top views of various cell backplane metal finger designs.
Figure 65B:
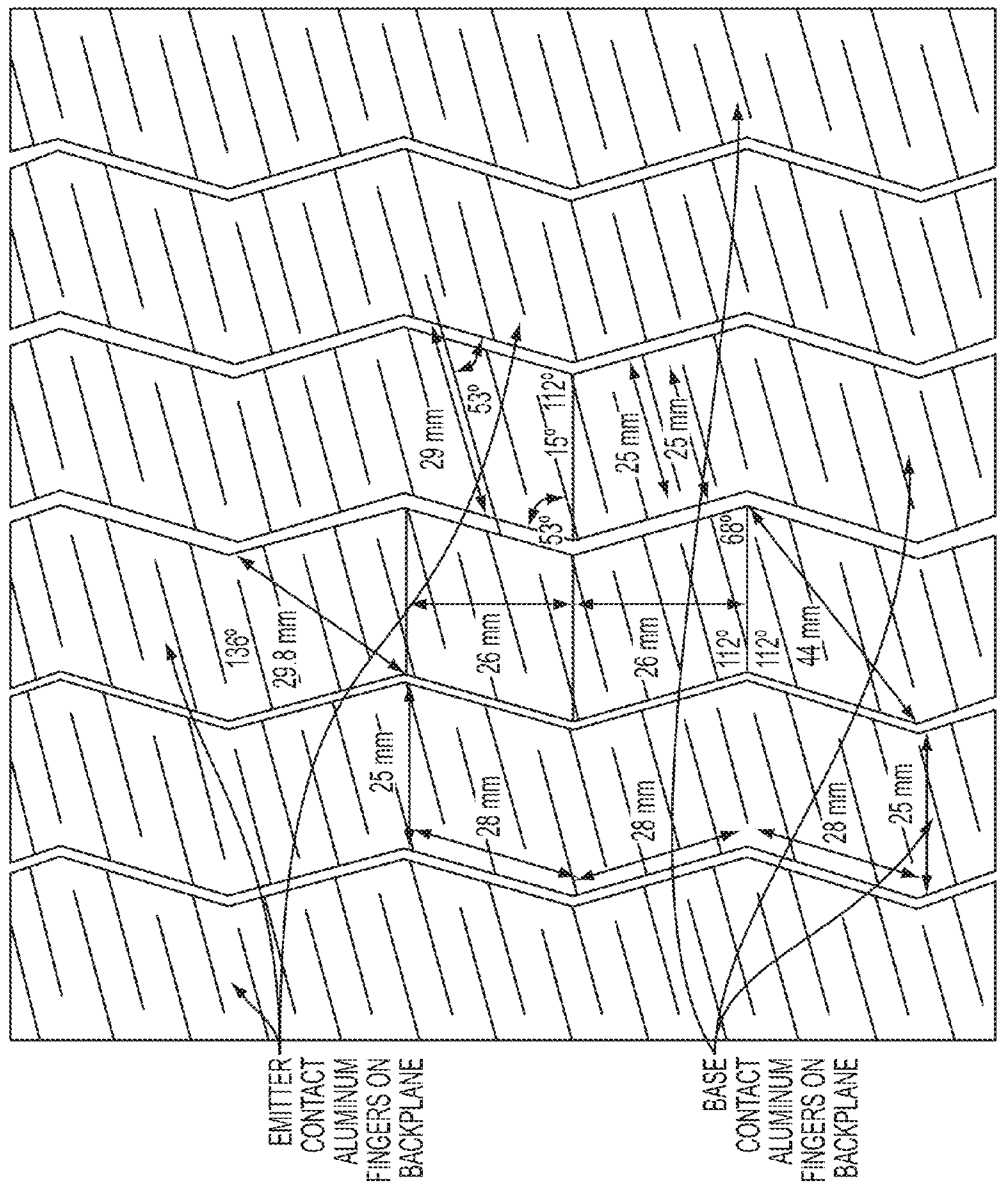
Figure 65C:
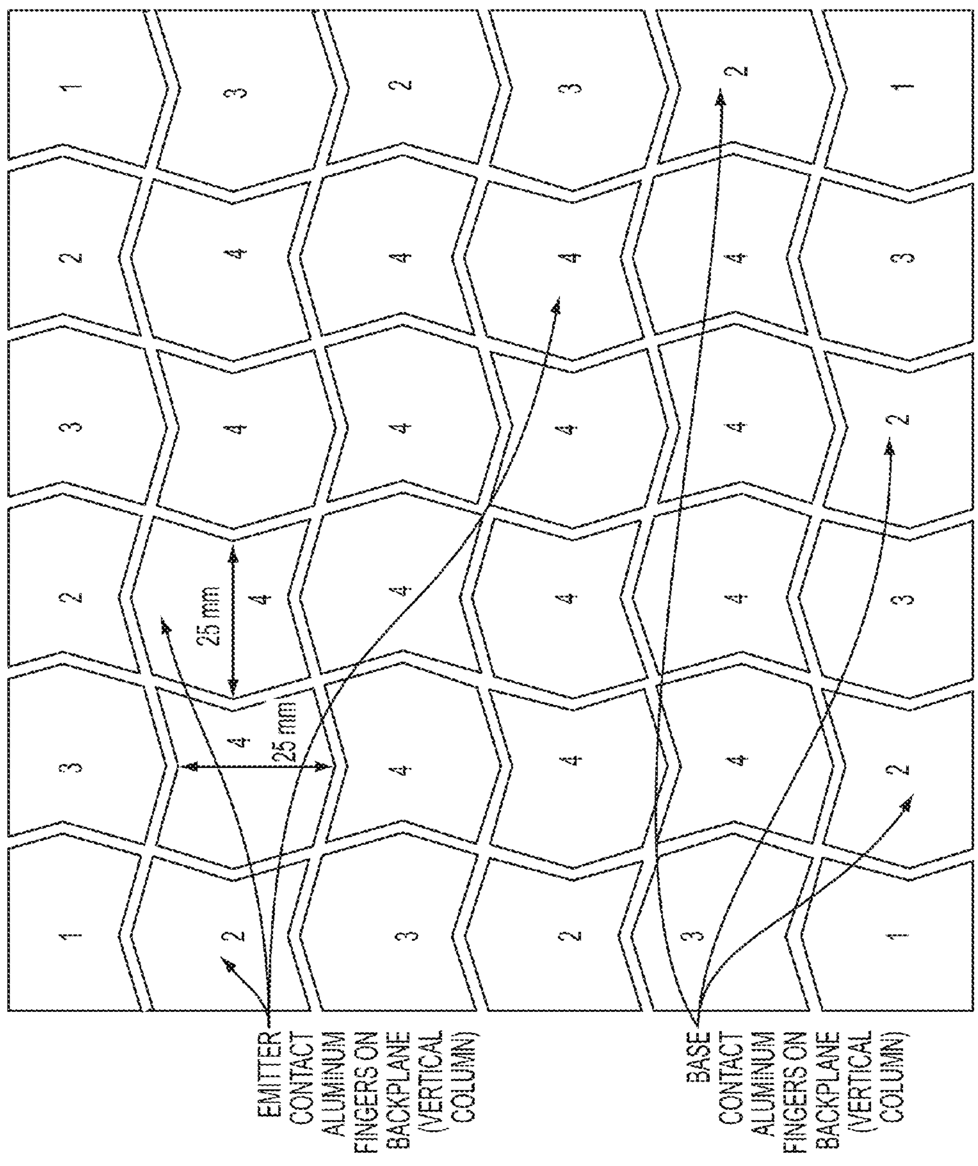
Figure 65D:
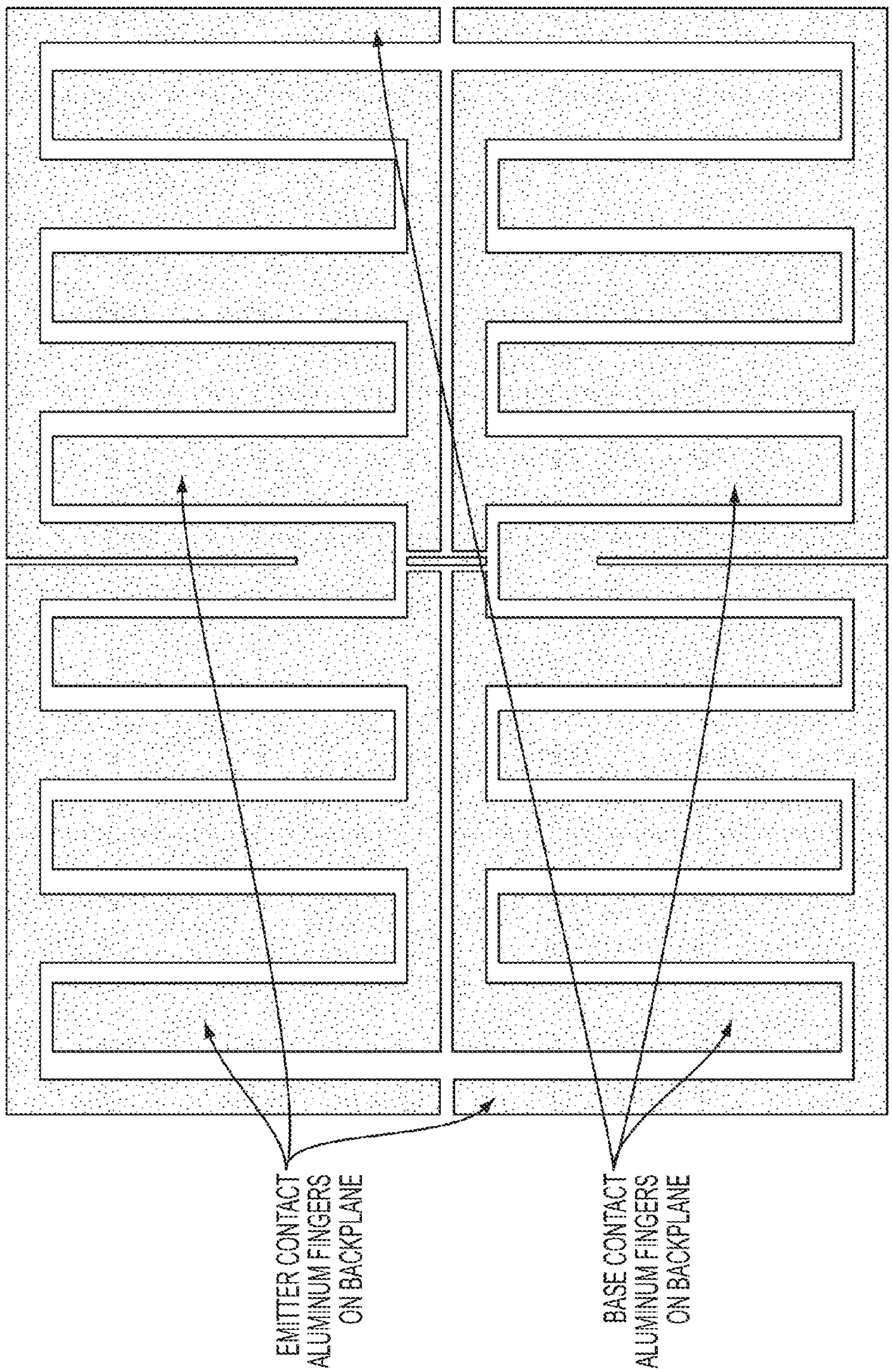

FIGS. 65A-D are top views of various embodiments illustrating potential shapes of the large metal fingers that are part of the backplane. FIG. 65A shows an interlocked pattern with six fingers, FIG. 65B shows a spring segmented balanced pattern (parallelogram) with six fingers, FIG. 65C shows a physically segmented balanced pattern with six fingers, and FIG. 65D shows an interlinked contact pattern. The fingers are in general arranged orthogonally to the on-cell first layer metal fingers. Because of the orthogonal transfer, the dimensions of second metal layer fingers may be relatively large without compromising ohmic losses due to series resistance through the metal routings. Typically, these metal fingers may be in the range from about 100 to several hundred microns thick. The main material that the backplane is to be laminated to is crystalline silicon, which has preferential mechanically weak directions along its crystal planes that act as preferential cleaving directions. Thus it may be advisable for securing the strength of the overall structure to have interleaved fingers or tiles in order to not provide preferred cleaving directions. If fingers are used (as shown FIGS. 65A and 65B), the addition of slits into the fingers can serve to provide a spring action which reduces CTE mismatch related stress along the direction of the large metal fingers. If tiles are used (as shown FIG. 65C with 36 tiles), then each column of tiles has the same polarity (emitter and base, respectively) and each tile needs to be connected later, which may require, for example, a pre-puncturing of the covering embedding dielectric sheet or alternatively opening contact holes after the cell is finished. These contact holes may be filled with a contact material such as conductive epoxy or solder and contacted to stringers as part of the module assembly fabrication. Numerous other large metal finger geometries are conceivable, for example the design depicted in FIG. 65D. The structure and geometry of FIGS. 64B and 64C show embodiments for the contacting of the cells to each other and to the module.

Figure 66:
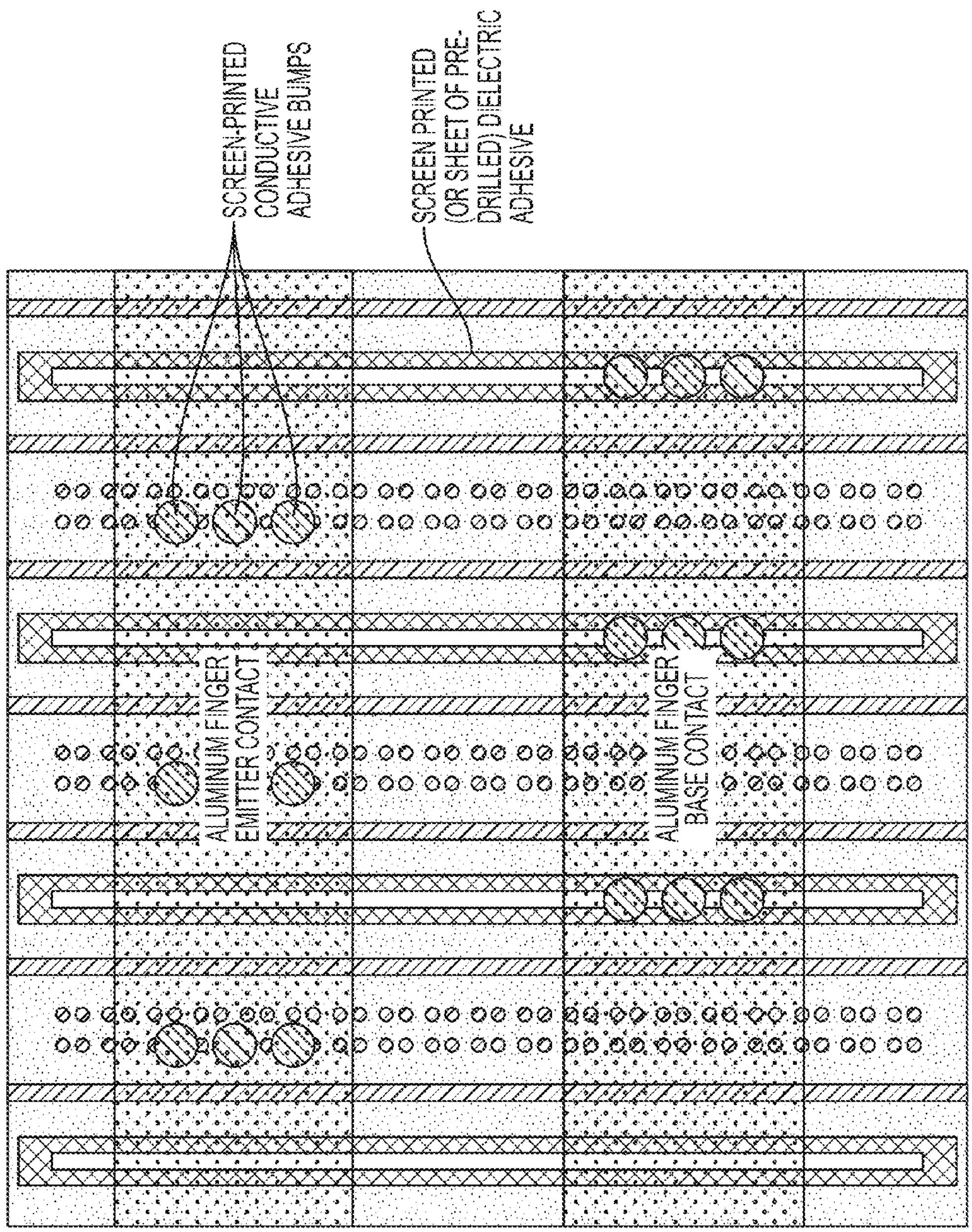
FIG. 66 is a top view of backplane embodiment.

FIG. 66 is a top view of the cell backside illustrating an orthogonal oasis design. The aluminum finger emitter and base contacts are arranged orthogonally and contacted to the underlying on-cell first layer metal fingers the on-cell first layer metal fingers.

Figure 67:
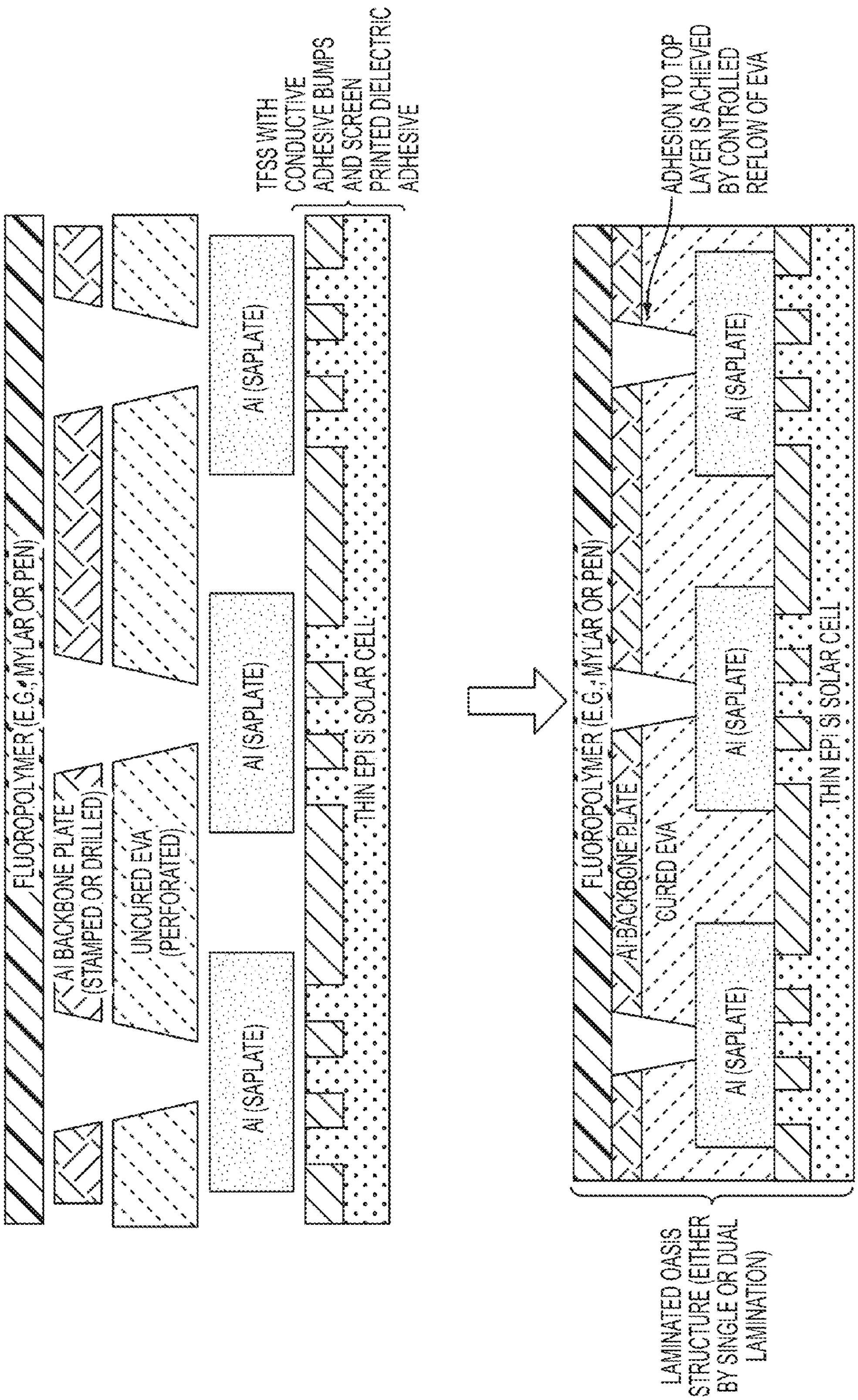
FIG. 67 show cross-sectional diagrams of an oasis structure.

FIG. 67 are cross-sectional diagrams of an oasis structure (with backbone) embodiment, herein referred to as a five or six layer oasis structure. In comparison to the four layer oasis structure shown in FIG. 64, the structure shown in FIG. 67 contains an additional plate or plates to give the structure more rigidity, flatness and mechanical support. The support plate is pre-punctured to provide electrical contact access holes and is attached either by a dielectric adhesive sheet of its own (adding a layer and making the Oasis structure a six layer structure) or by reflowing the underlying dielectric sheet sufficiently through the pre-punctured holes and around the edges of the device for suitable adhesion and edge sealing (a five layer Oasis structure). The support plate should be a low cost material such as, for example, aluminum, steel, a suitable polymer, glass or a ceramic. Additional adhesive sheets may be comprised of the same materials as above including, prepreg, EVA and Z68, and related materials. The controlled reflow of the adhesive material to secure adhesion to the top cover sheet may be enabled by a suitably preformed fixture that is applied during the lamination process and which prevents adhesive material from closing up desired contact holes while at the same time enabling reflow of adhesive material embedded underneath the backbone layer to flow out and contact the top cover sheet layer.

Figure 68A:
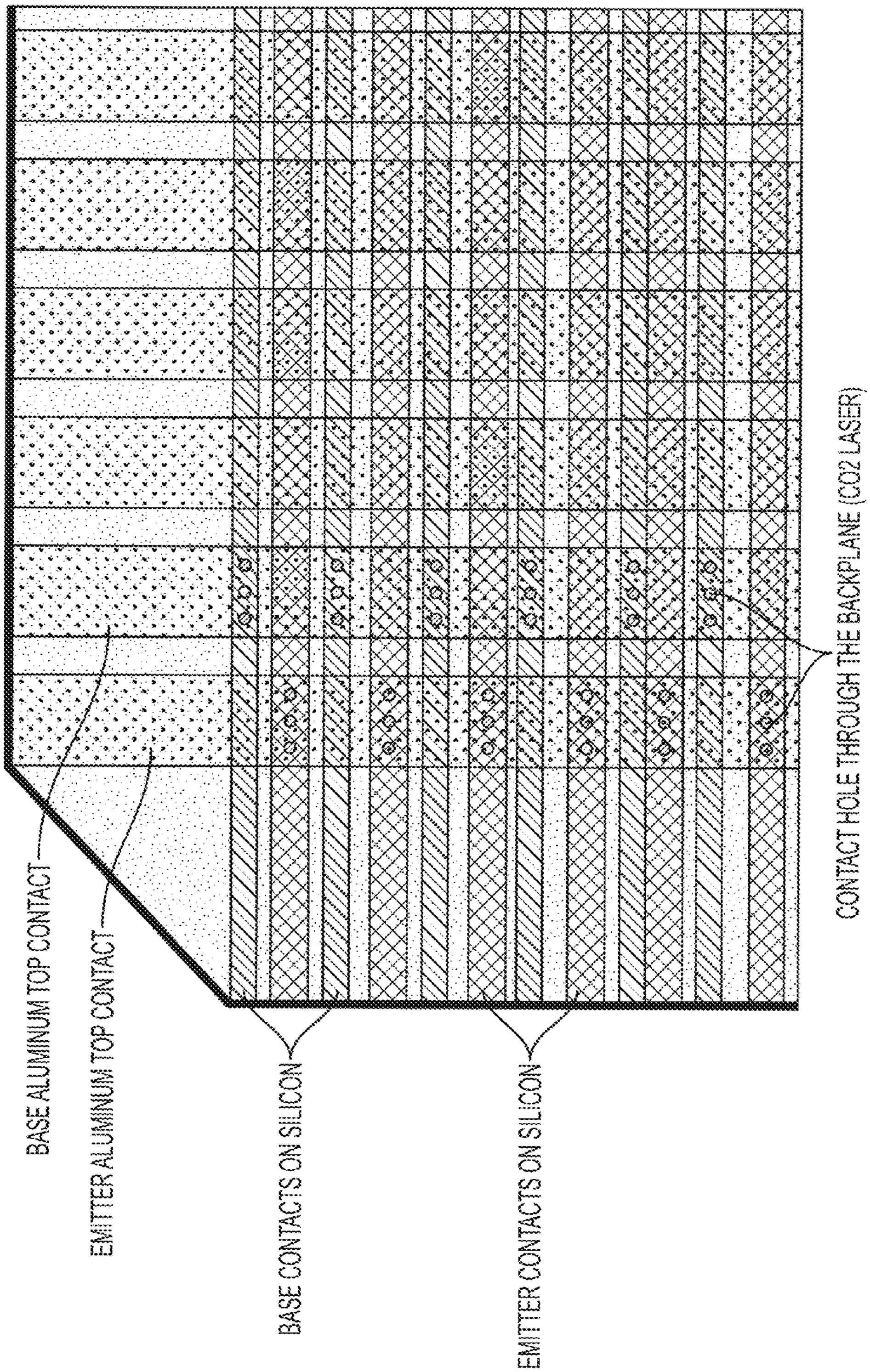
FIGS. 68A through C are cross-sectional diagrams of a hybrid structure.
Figure 68B:
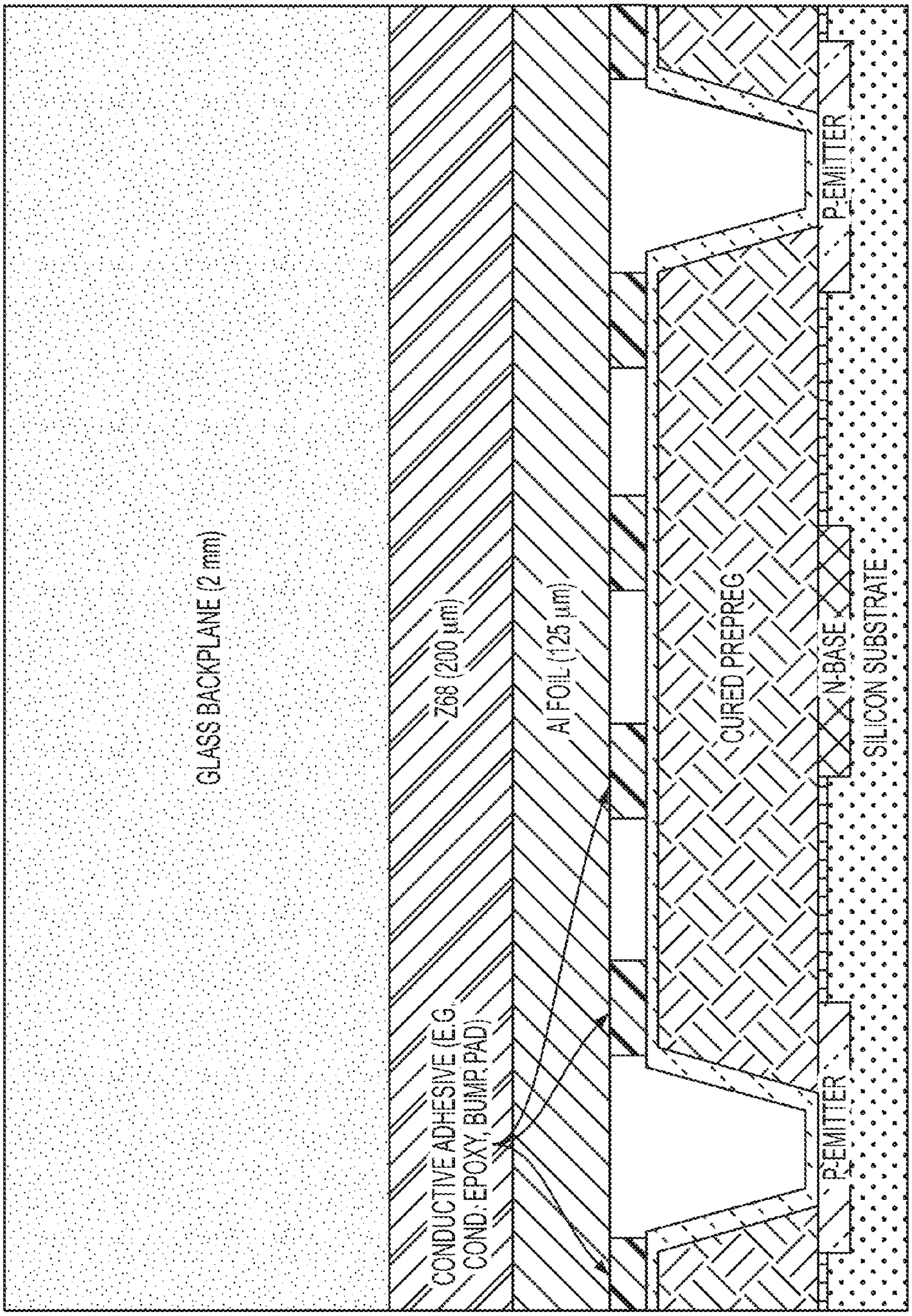
Figure 68C:
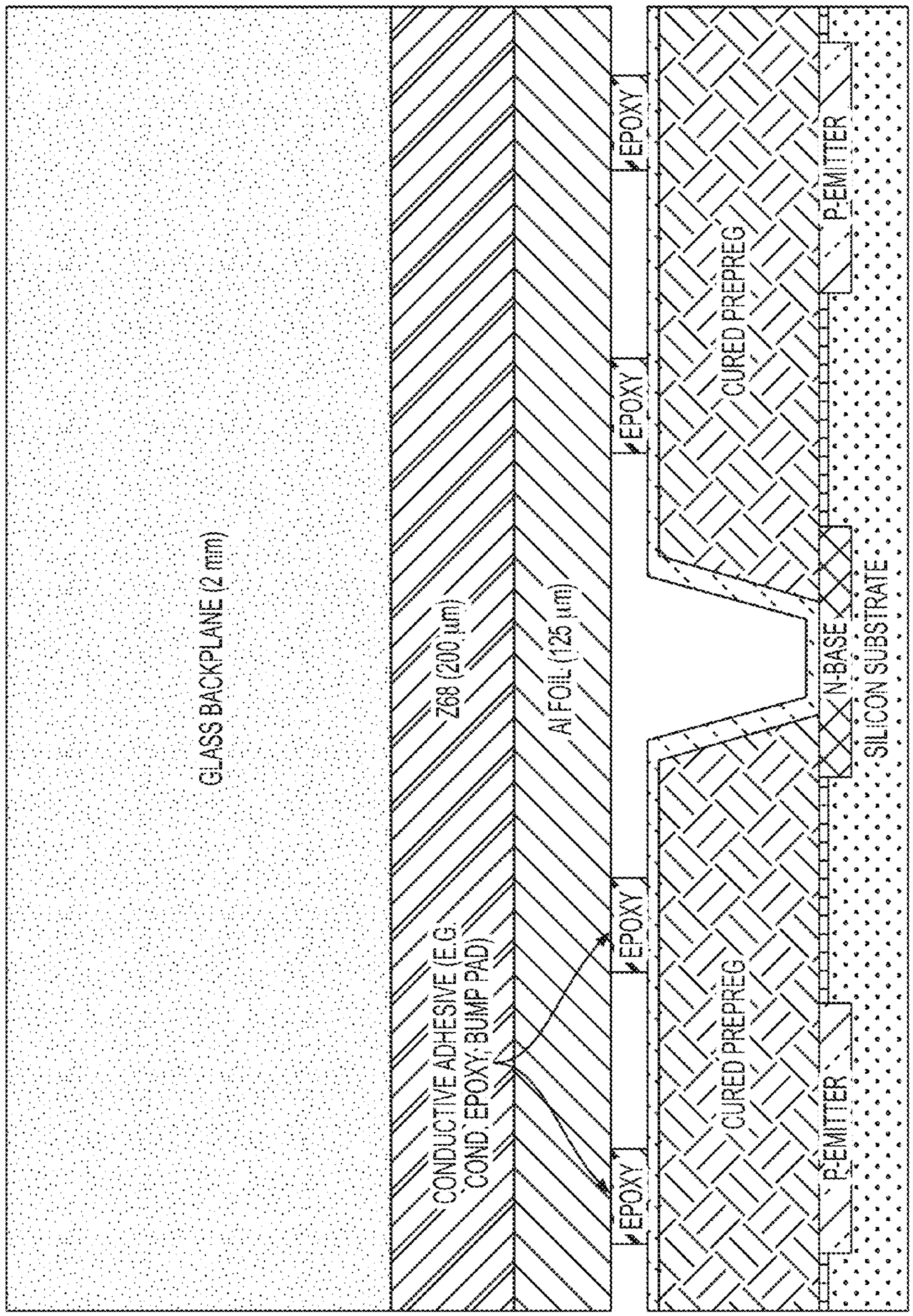

An embodiment of a third group of structural embodiments, hereinafter referred to as a hybrid structure, are depicted in the top and side views of FIGS. 68A and 68B-C, respectively. FIG. 68B is a cross-sectional view of a hybrid structure showing emitter contacts and FIG. 68C is a cross-sectional view of a hybrid structure showing base contacts. Pluto and oasis structures have substantial similarity and a multitude of intermediate/combination structures may be derived from the pluto and oasis concepts—FIGS. 68A-C illustrate one such example. The hybrid structure of FIGS. 68A-C has pluto characteristic elements such as that at the time of the wet processing and passivation the only metal components on the structure are those categorized in the process flow description below as first layer metal. The disclosed hybrid structure also has oasis characteristic elements in that it contains a large metal finger array; however, this large metal finger array is applied at a point after the texture and passivation process and thus is not integrated into the backplane structure prior to attachment to the TFSS as is characteristic of oasis structures.

The hybrid structure of FIGS. 68A-C comprises the following elements: a TFSS with the patterned first layer metal; a dielectric which may be either patterned during deposition using screen printing or using a post- or pre-lamination drilled prepreg material; a metal layer or layers that serve to route the metal from the on-cell first layer metal which is accessible through the via onto the top of the dielectric or directly to an array of large metal fingers; large metal fingers which are arranged orthogonally to the first layer metal on the TFSS and which are embedded in a dielectric, such as prepreg, EVA or Z68 with an optional backing plate (for example made of glass, polymer, ceramic or metal), and; a contact area for cell to cell and cell to module contacting which is located either on the side which may be formed by having the metal grid extend outwards and oversized compared to the cell or formed by contacting through the dielectric the large metal fingers are embedded in. Alternatively the contact may also be formed by wrapping the large metal fingers around the embedding and optional support plate material and having metal exposed directly at the very back of the cell.

Figure 69:
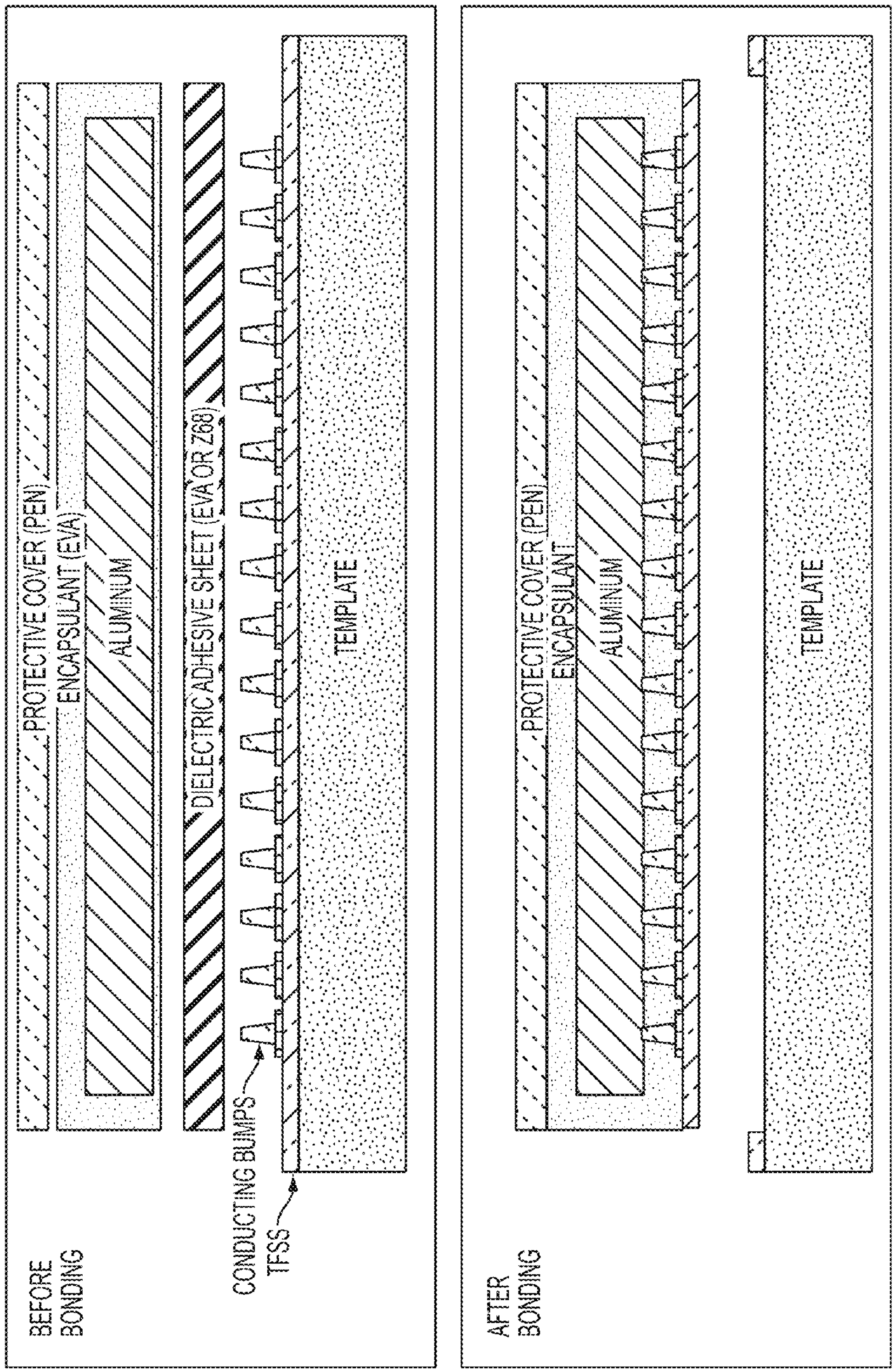
FIGS. 69 and 70 show cross-sectional diagrams of a immersion contact bonding structure embodiments.
Figure 70:
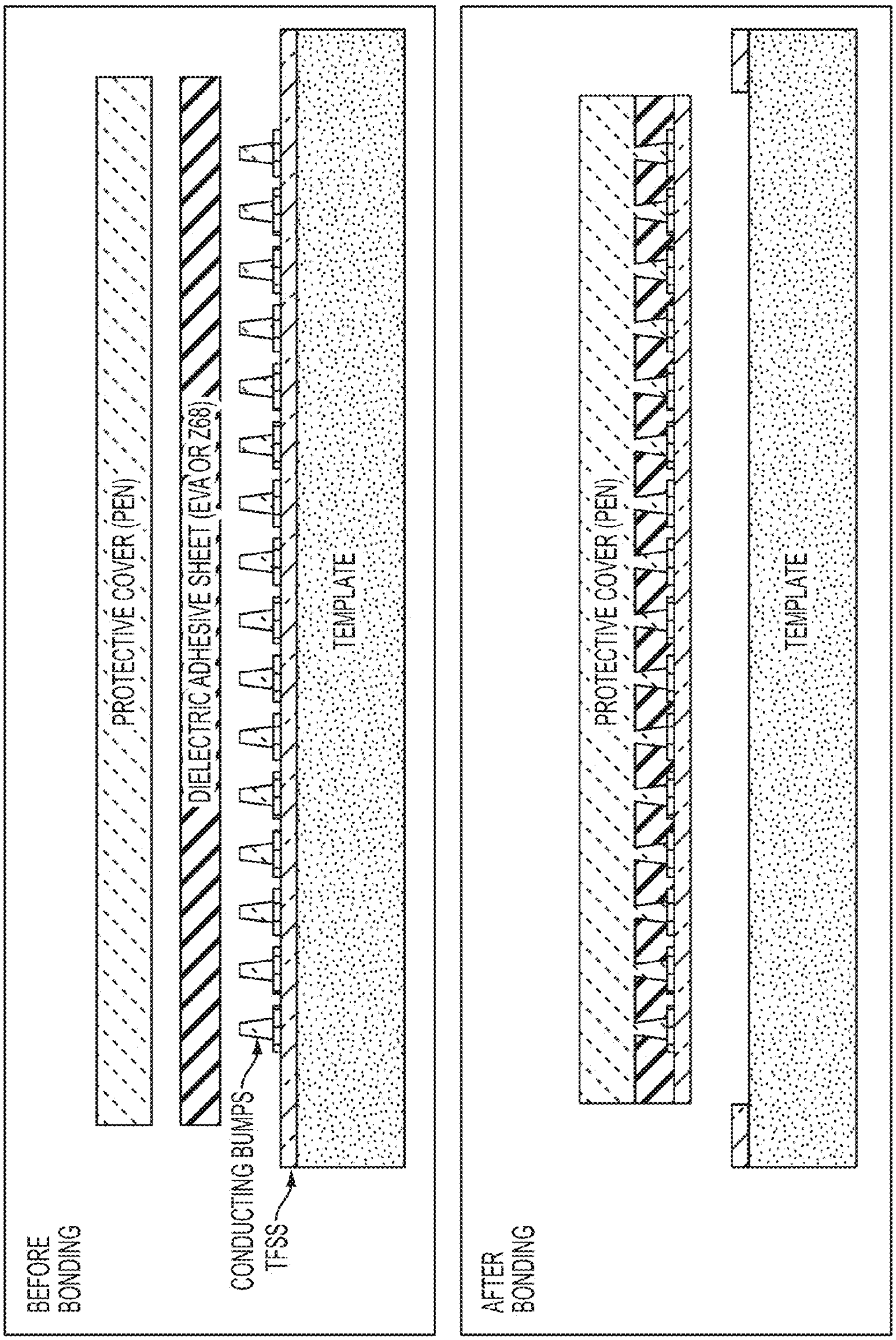

An embodiment of a fourth group structural embodiments, hereinafter referred to as an immersion contact bonding structure, are depicted in the cross-sectional diagrams of FIGS. 69 and 70. FIG. 69 is a cross sectional diagram of a immersion contact bonding structure and method using an Al oasis backplane showing the structure before and after bonding. FIG. 70 is a cross sectional diagram of an immersion contact bonding structure and method using a monolithic module array (MMA) type backplane showing the structure before and after bonding. Previously presented pluto, oasis and pluto-oasis hybrid structures have a dielectric adhesive—screen printed material or laminated prepreg sheet—that separates the first layer metal on the cell from the next layer metal and is patterned in an aligned way, such as to allow for open via holes that the contact to the next layer metal may be made through. In the immersion contact bonding structure, the dielectric adhesive is not patterned in an aligned way with respect to the contact points between first layer metal and the metal that is part of the backplane. The contact is made by an aligned, patterned array of printed conductive bumps, such as solder or conductive epoxy, which is placed in the desired contact spots and which in the process of lamination is pushed through the dielectric lamination sheet. The dielectric lamination sheet made of, for example, a material that sufficiently softens during lamination such as EVA or DNP's Z68. These materials are optionally produced as perforated sheets to provide a sufficient percentage of open area for the conductive bumps to make low resistance contact between the different metal layers. Thus, the immersion contact bonding structure comprises: a TFSS with the patterned first layer metal; an aligned array of conducting bumps; a dielectric sheet, for instance consisting of EVA or Z68, that is either perforated in a regular or random fashion or that may be perforated as part of the bonding process; in an oasis implementation, as depicted in FIG. 69, an oasis-styled prelaminated backplane with embedded large metal fingers, and; in an direct implementation into an MMA style backplane, as depicted in FIG. 70, a protective cover that is connected to the TFSS via the dielectric adhesive sheet (made of, for example, PEN or another suitably resistant material).

Figure 71:
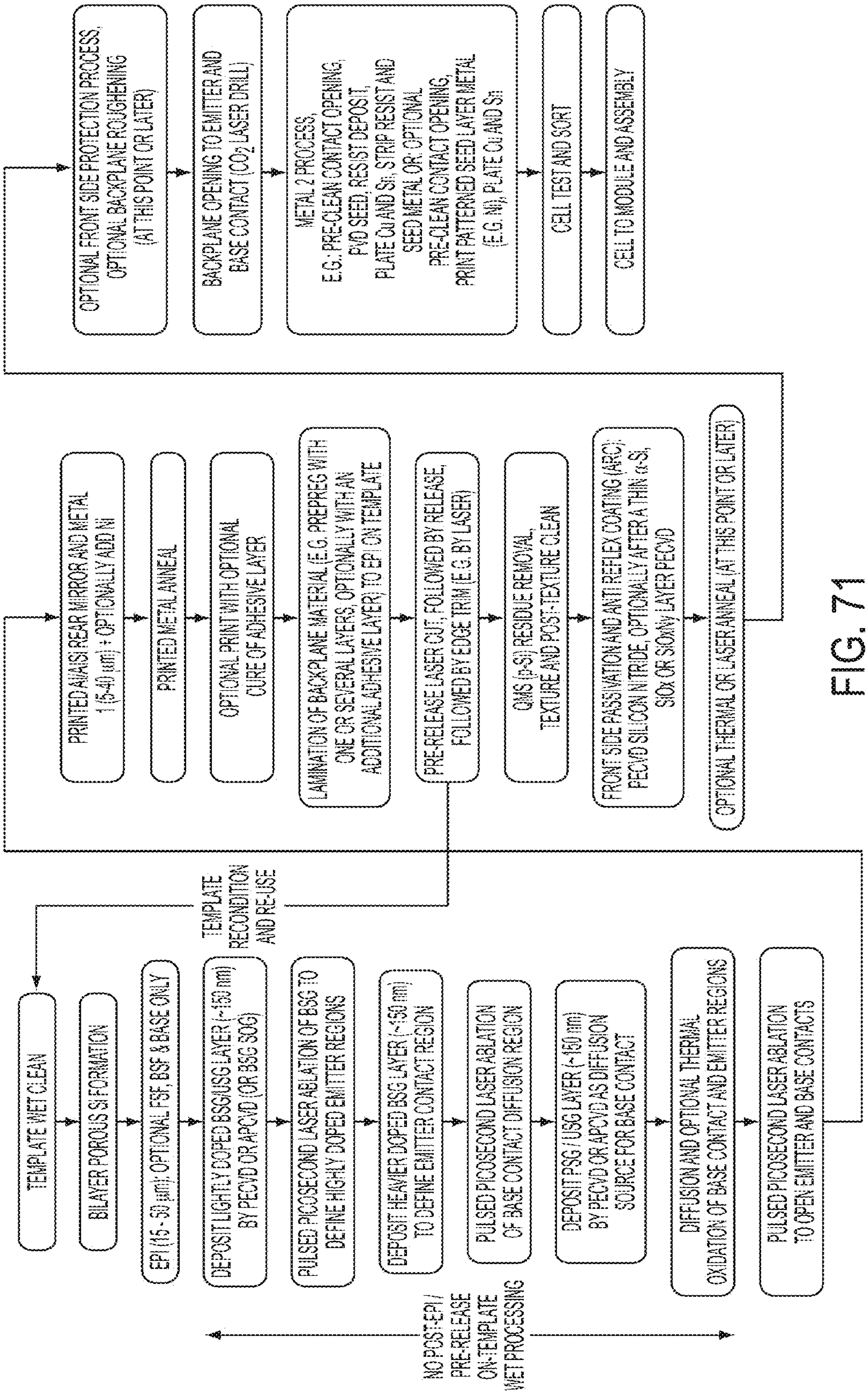
FIG. 71 is a back contact solar cell manufacturing process flow.

FIG. 71 is a process flow embodiment for a back contact solar cell with assembly and manufacturing of the backplane reinforcement. FIG. 73A-J illustrate front end processing such flows.

The front end of the process may begin with a wet clean of the re-used or fresh template, followed by the formation of the release layer, for example a bilayer of porous silicon with low porosity on top of high porosity. Subsequently, the active absorber cell area is deposited, for example using epitaxial deposition of silicon using trichlorosilane (TCS) gas and a dopant, for example phosphine ($PH_3$) to generate an n-type base, in hydrogen. Optionally such a deposition may be arranged to have more than one distinct doping concentration region as a function of depth. Subsequently layers of doped glass are deposited, for example using atmospheric pressure chemical vapor deposition (APCVD), followed by patterning processes using a picoseconds laser.

In one embodiment, the first glass layer contains a lighter amount of emitter dopant (boron in boroslicate glass—BSG), optionally capped with a layer of undoped silicate glass (USG), in order to form a less heavily doped emitter, followed by ablation of the borosilicate glass in areas where a more heavily doped emitter is to be generated which in turn serves to provide a low resistance contact to the emitter metal 1. After this, a more heavily doped BSG layer (BSG2) is deposited in the region of the metal 1 contact to the emitter, optionally with a USG cap layer. Then the area for the base contact is ablated, preferably using a picosecond laser. Subsequently, the phosphosilicate glass (PSG) layer is deposited which serves as the dopant source for phosphorus which in turn is to generate the heavily N+-type doped base contact region to form a low resistance contact to the base. In a subsequent step, the profile is thermally annealed, thereby driving in the junctions. Optionally the annealing ambient may be chosen between a neutral and an oxidizing ambient, the latter to serve to form a high quality interface at the backside to enable low back surface recombination velocity. As a next step, the contact areas to emitter and base doped junctions are opened to enable contacting of the subsequently applied metal 1 layer, where metal 1 may be for example a printed layer or sequence of printed layers, for example consisting of aluminum (Al) or AlSi to form a low resistance contact of metal 1 to the junctions while avoiding spiking through the junctions. The printed metal layer or layers may optionally be thermally annealed prior to the next steps. At this point, the front end of the device may be considered completed, and backplane related steps may begin.

The next steps may comprise either single step lamination or backplane preparation, followed by lamination to thin film solar substrate on template. Such lamination is preferably carried out in a vacuum and at elevated temperatures to cure the laminate. A pressure is applied to secure uniform and reliable adhesion. Pressure can be variable throughout the thermal and vacuum cycle that the structure undergoes. Various embodiments with respect to the lamination process and tool are possible, including stacking multiple templates with laminates, separated by release sheet and pressure distributing buffer layers or having multiple templates laminated side by side in a large tray arrangement. Such large tray arrangements may themselves be stacked into commercial laminators with multiple slots (daylights) which are all heated, typically from above and below or from one side only. Hydraulic press elements may be used to apply the pressure. Sufficiently chosen thick sheets of cellulose or rubber or other suitably compliant sheets may be used to overcome pressure differentials due to local stack height variations or due to different template heights, which respectively may be caused by templates of differing age or re-use count being laminated at the same time. It is to be noted that prior to lamination of the backplane material (e.g. prepreg) it may be advantageous to apply an additional adhesive, as described earlier in the same disclosure.

The next steps involve post-lamination release of thin film solar substrate (TFSS), laminated to backplane, from the template. Either prior to the lamination or prior to the release of the TFSS it may be advised to outline the shape of the TFSS with a laser cut either through the epitaxial film outside of the backplane or through backplane and the epitaxial film. Care is to be taken to minimize template damage from cutting past the epitaxial layer and into the template. Laser based technology called thermal laser separation may be used in this cutting process in which a heating laser beam is immediately followed and traced by a cooling spot, provided by a jet of cold liquid or mist such as water or a cold gas such as helium for example. By doing so, a cleave may be initiated through the silicon which in turn terminates at the interface between the TFSS and the template, in the region of the release layer.

Next are edge preparation steps including trimming (cutting) the edges, and optionally decoupling the fragile thin film from the edge of the reinforced thin substrate. The outer edges of the device may be cut to size by mechanical trimming, such as shearing or stamping, or by laser trimming. The corners of the device may be chosen to be cut using a chamfer or otherwise suitable shape to dull the corners and make them less prone to handling damage throughout subsequent process steps.

Next are wet (or optionally dry) texturing steps followed by a post texture clean and drying. Texturing may be preceded by one or more surface preparation steps, for instance by a mechanical roughening step, such as grit blasting, to aide in the later formation of proper pyramids, or by surface treatment such as organic residue removal or forming a thin chemical oxide to aide texturing.

Next are passivation steps at low temperatures with an optional dry bake with or without vacuum assistance prior to passivation layer deposition. Example viable passivation layers for low temperature being amorphous silicon (a-Si) or silicon oxide or sub-stoichiometric silicon oxide, silicon oxy-nitride or silicon nitride. Alternatively, the passivation layer such as a chemical oxide or oxynitride may be deposited in a wet process tank.

Next are anti-reflective coating steps using materials such as silicon nitride, Al2O3, or other suitable dielectric, preferably with very low absorption in the wavelength range capable of generating carriers in silicon and with suitable built-in charge to repel the respective mirrority carriers. Optionally, forming gas or other thermal anneal may be used to improve the front surface passivation. Optionally, a laser anneal from the front to improve the front surface passivation and also optionally bulk quality and back surface passivation depending on the laser processing parameters and penetration depth of the chosen laser wavelength or wavelengths. The next step consists of opening contacts to the next buried layer of the cell terminals. Depending on the chosen backplane structure, the next buried layer may be, for example: the patterned metal layer on the cell that was deposited onto the cell and prior to lamination; contact pads that were deposited on said patterned metal layer only in areas where contact access is needed, or; a buried next level routing of metal, optionally essentially orthogonally arranged with respect to the original metal connectors. This contacting process may be performed using laser or mechanical hole or slit drilling into the protective/dielectric layer. Optionally, prior to this step the surface is protected by a sheet or material that prevents plating or contamination of the front side during the later plating process Subsequently, the underlying metal is contacted through the contact opening by one of several optional means, for example: an optional surface preparation step to promote adhesion and/or platability of a seed metal; deposition of a seed metal by PVD, plating, printing including screen printing, ink jetting, aerosol jetting, stencil printing, or spraying such as flame or thermal spraying; in the case of a non-patterned deposition, a patterning step, such as printed resist, or; plating in non-resist covered areas, followed by resist removal and seed layer etchback (all of which are processes common in plating technology) Typical metallization materials include, for example, a starting layer of nickel, followed by copper and ending with tin or other solderable capping layer, and printed layers may contain suitable metals, including silver and alloys, nickel, copper, aluminum and tin. In the case of a PVD seed layer, choices include but are not limited to Sn, Ni, NiV, Al, Pd, Ta, Cu, Ag or alloys.

After optional testing and binning, contact to the solar module may be readily achieved using solderable stringer ribbons for example. The stringer ribbons may be for instance straight or dog-bone shaped and may optionally contain black or blackened areas, for instance in areas visible to the module customer, in order to retain an all-black appearance as well as to optionally serve as electrical isolation where needed. A final encapsulation is performed, for example, using common solar backside encapsulants.

The following disclosure relates to exemplary structures and process flows presented for descriptive purposes. A main difference between the pluto and the oasis structure is that at the time of wet processing or other form of texturization of the front surface of the epitaxial thin film, the pluto reinforcement structure does not contain any other metal structure except for on-cell metal emitter and base contact fingers, henceforth called first layer metal, whereas the oasis structure contains at least part of a second layer metallization.

The on-cell metal may be deposited using either a blanket deposition technique such as physical vapor deposition (PVD) or evaporation (e.g. via electron beam or thermal evaporation) with subsequent patterning using for instance laser ablation or direct patterned deposition of the metal or metal precursors using screen printing, typically with a subsequent thermal step for baking, sintering or drive-in. Importantly, the description below holds similarly for a PVD and for an evaporation based process. In the following, wherever not otherwise noted, PVD is used to represent all other large area blanket deposition type processes. Such blanket films may be deposited over the whole epitaxial cell structure on the template or a shadow mask can be implemented during the deposition to avoid deposition where not desired, for instance at the very edge of the template or outside of the active structure. Shadow masking may also be used to define the active or metal contacted area.

Figure 72A:
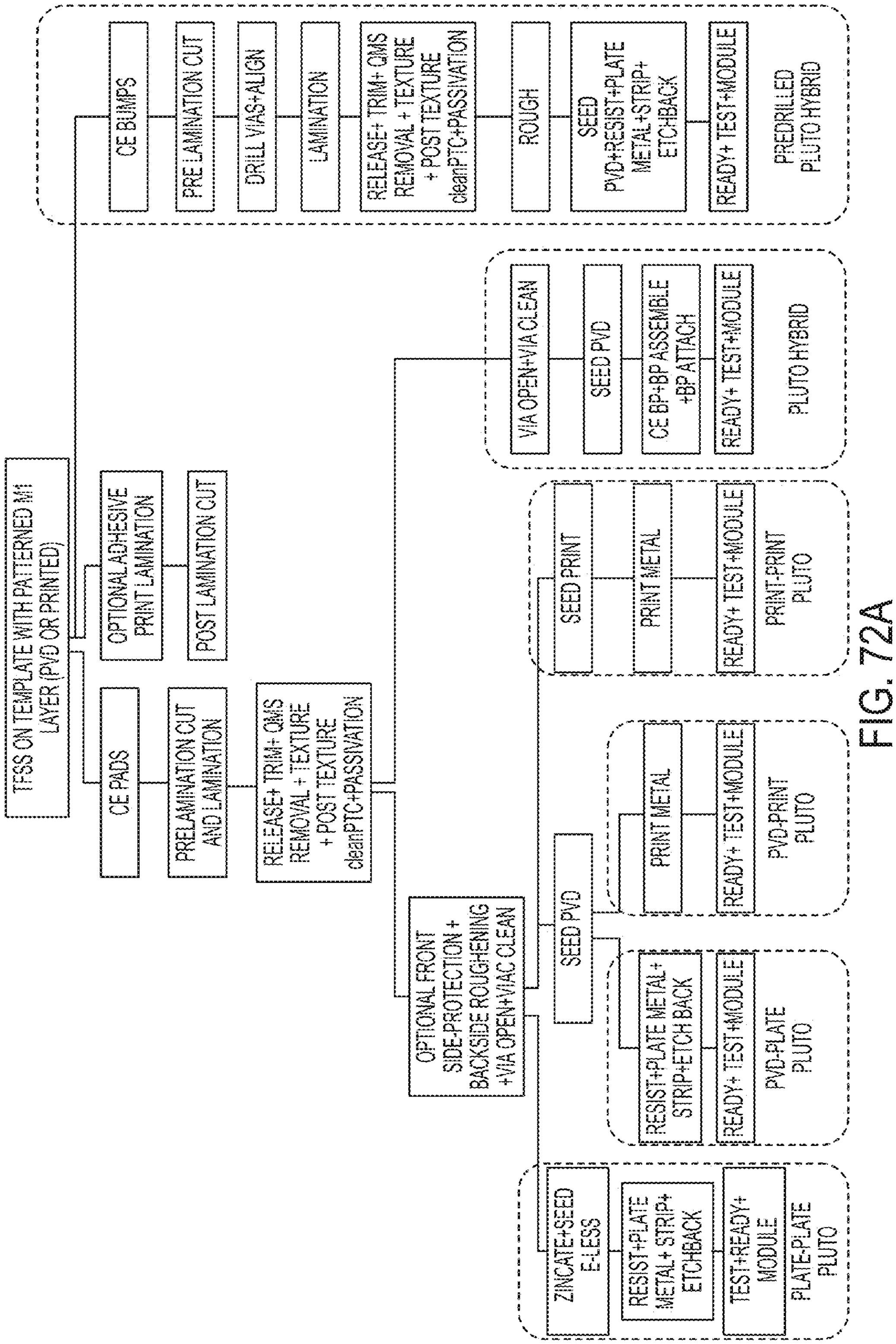
FIG. 72A shows process flows for manufacturing pluto backplane structures.
Figure 72B:
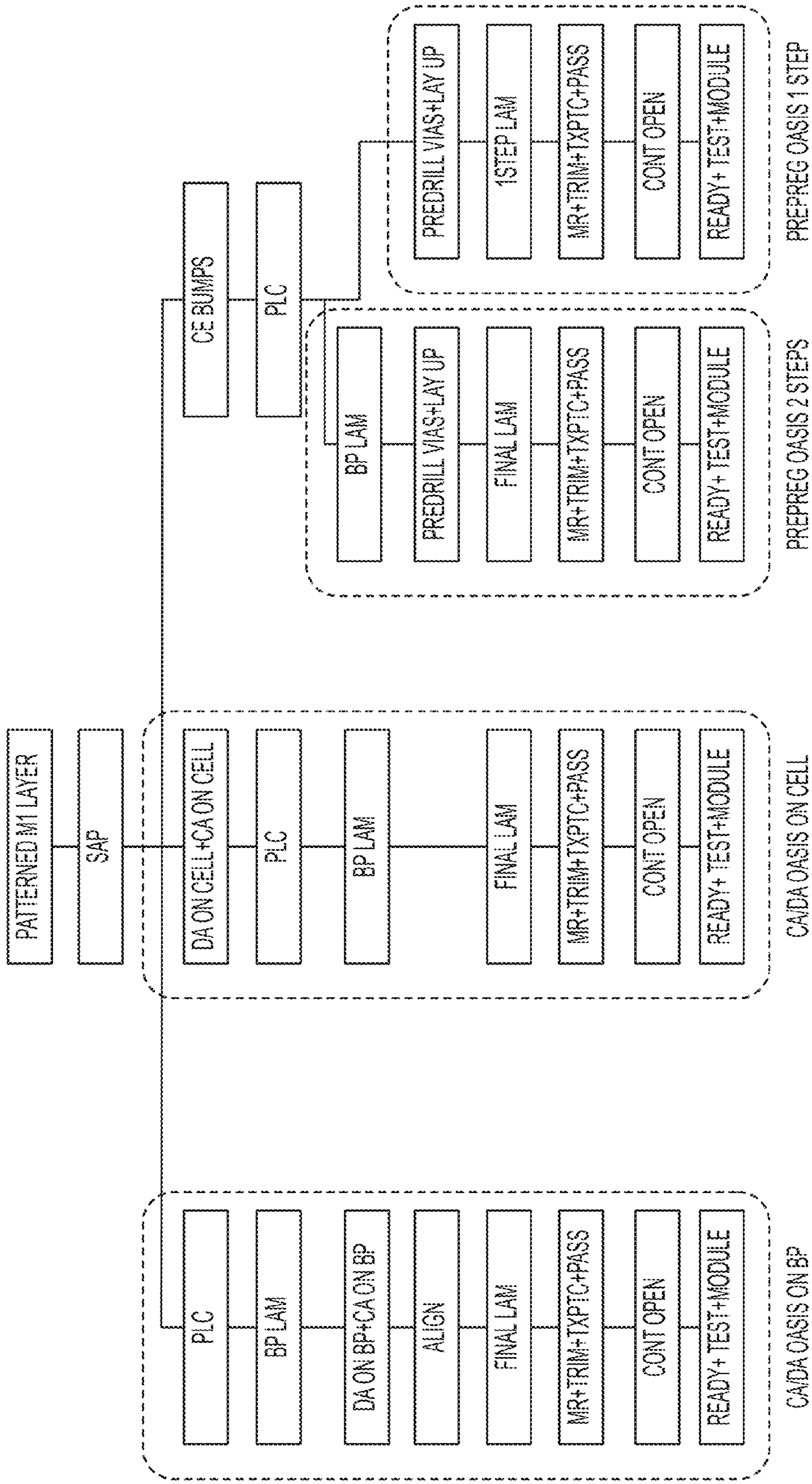
FIG. 72B shows process flows for manufacturing oasis backplane structures.

A schematic representation of examples for different embodiments of process flows of the pluto and oasis structures as well as pluto and oasis hybrid structures are depicted in FIGS. 72A and 72B. FIG. 72A are process flows relating to pluto structures and pluto hybrids. The table below defines the abbreviations used in the process flows depicted in FIG. 72A.

TABLE 1

Terms and Definitions for FIG. 72A

| TERM | DEFINITION |
|---|---|
| CE pad | Optional CE print (for enhanced process window of laser via drill) |
| CE bumps | |
| PLC | Optional pre-lamination epi laser cut (to generate suitable epi breakage lines) |
| Drill Vias | Drill vias in the prepreg sheet |
| Align | Align the components stacks prior to lamination (better than 100um) |
| Lam | Prepreg lamination (2-12 mil prepreg), 1-2 sheets (prepreg cut to suitable size, potentially oversized) |
| MR | Mechanical release (through vacuum chucking, vacuum pulsation, electrostatic chucking or optionally with the assistance of sonic or ultrasonic actuation) |
| Trim | Trimming, e.g. using laser |
| TX-PTC | Texture and post-texture clean |
| OS-TX-PTC | Texture and post texture clean in one-side tool |
| Pass | Passivation, e.g. a-Si, SiOx, SiOxNy followed by SixNy or Al2O3 in case of p-type base |
| FS-Pro | Optional front side protection |
| Rough | Optional grit blasting of exposed prepreg side or other micro-surface roughening |
| Via open | Laser via hole drilling, e.g. via CO2 laser |
| Via clean | Optional via clean-up and optional organic or native oxide removal, e.g. via peroxide clean, permanganate clean, ashing, radical plasma etching, pre-sputter etching |
| Zincate | Optional zincation if plasma clean-up is not possible and Al needs to be contacted directly |
| Seed e-less | Seed layer deposition, by plating such as electroless Ni plating |
| seed print | Seed layer deposition by printing (ink jet or screen printing), materials can be Al, Ni or NiV, Cu |
| seed PVD | Seed layer deposition by PVD |
| Resist | Resist deposition to define emitter and base region in case of plating |
| Print Metal | Plating or printing of main second layer metal, consisting of Ni, Cu, optionally with Sn at surface for solderability |
| Plate Metal | Plating or printing of main second layer metal, consisting of Ni, Cu, optionally with Sn at surface for solderability |
| Strip | Optional resist removal in case of plating |
| Etchback | Optional seed layer removal under resist, if plating is used |
| CE BP | CE print to backplane |
| BP assemble | Backplane (Al fingers, Z68, glass) |
| BP attach | Backplane attachment (laminate via CE dots to seed) |
| Ready | Cell ready for test |
| Test | Testing and sorting |
| Module | Module integration, including soldering |

FIG. 72B are process flows relating to oasis structures and oasis hybrids. The table below defines the abbreviations used in the process flows depicted in FIG. 72B.

TABLE 2

Terms and Definitions for FIG. 72B

| TERM | DEFINITION |
|---|---|
| SAP | Cut solderable Al fingers (Al with Ni/Sn surface) |
| DA on cell | print DA on cell |
| CA on cell | Print CA on cell |
| CE bumps | CE bumps print on cell |
| Pre-Drill Vias | Pre-drill vias into prepreg or other |
| PLC | Optional pre-lamination epi laser cut (to generate suitable epi breakage lines) |
| Align | Alignment of component stacks prior to lamination (~better than 100 um) |
| Lay up | Alignment of component stacks prior to lamination including predrilled prepreg sheet (~better than 100 um) |
| BP lam | Backplane lamination (SAP fingers plus adhesive (EVA or Z68 or prepreg) plus optional cover sheet (e.g. Mylar or Tedlar or Teonex - e.g. Q83) |
| DA on BP | print DA on backplane |
| CA on BP | Print CA on backplane |
| 1step lam | Laminate: cover sheet, adhesive, SAP fingers, pre-drilled prepreg, CE bumps on epi |
| Final lam | Prepreg lamination (2-12 mil prepreg), 1-2 sheets (prepreg cut to suitable size, potentially oversized) |

TABLE 2-continued

| Terms and Definitions for FIG. 72B | |
|---|---|
| TERM | DEFINITION |
| MR | Mechanical release (through vacuum chucking, vacuum pulsation, electrostatic chucking or optionally with the assistance of sonic or ultrasonic actuation) |
| Trim | Trimming, e.g. using laser |
| TX-PTC | Texture and post-texture clean |
| Pass | Passivation, e.g. a-Si, $SiOx$, $SiOxNy$ followed by $SixNy$ or Al2O3 in case of p-type base |
| Cont open | Open contact access holes in cover sheet (e.g. by laser) |
| Ready | Cell ready for test |
| Test | Testing and sorting |
| Module | Module integration, including soldering |

Figure 73A:
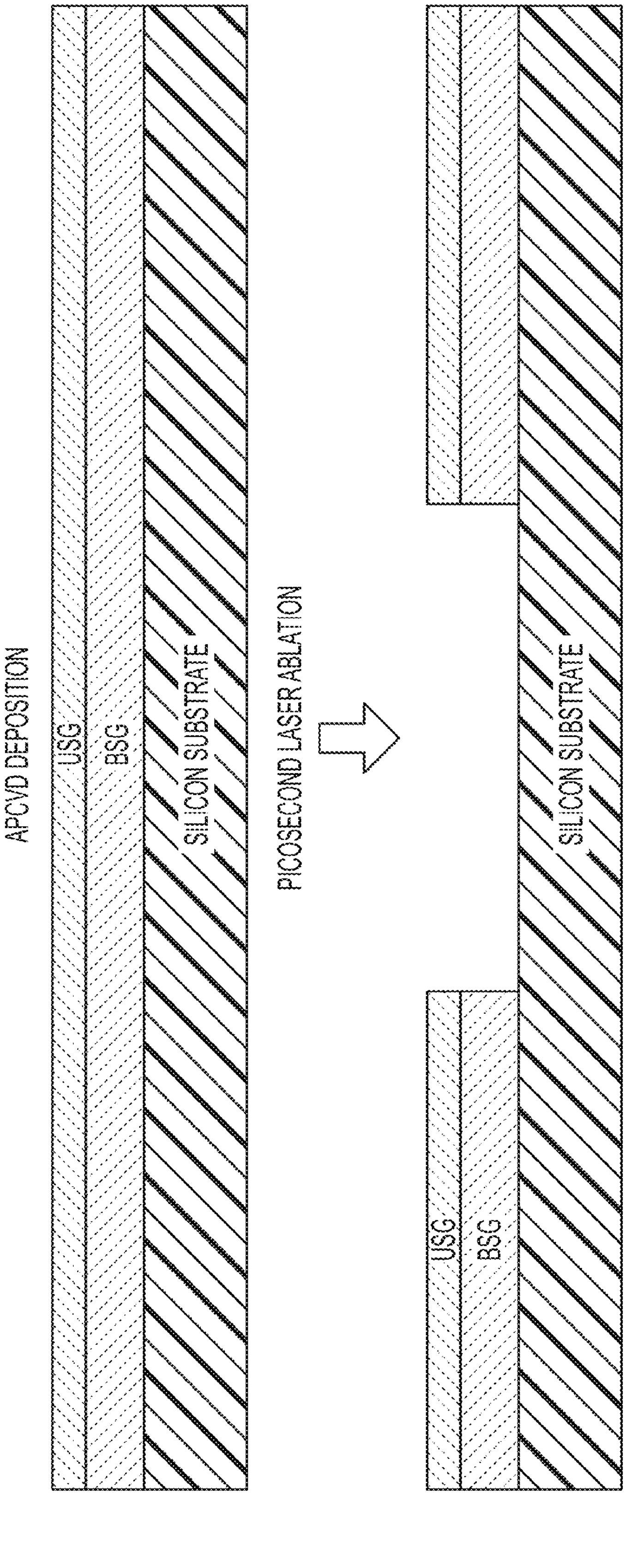
FIGS. 73A through J show cross-sectional diagrams of a cell during fabrication steps of a pluto embodiment of back contact solar cell process flow.
Figure 73B:
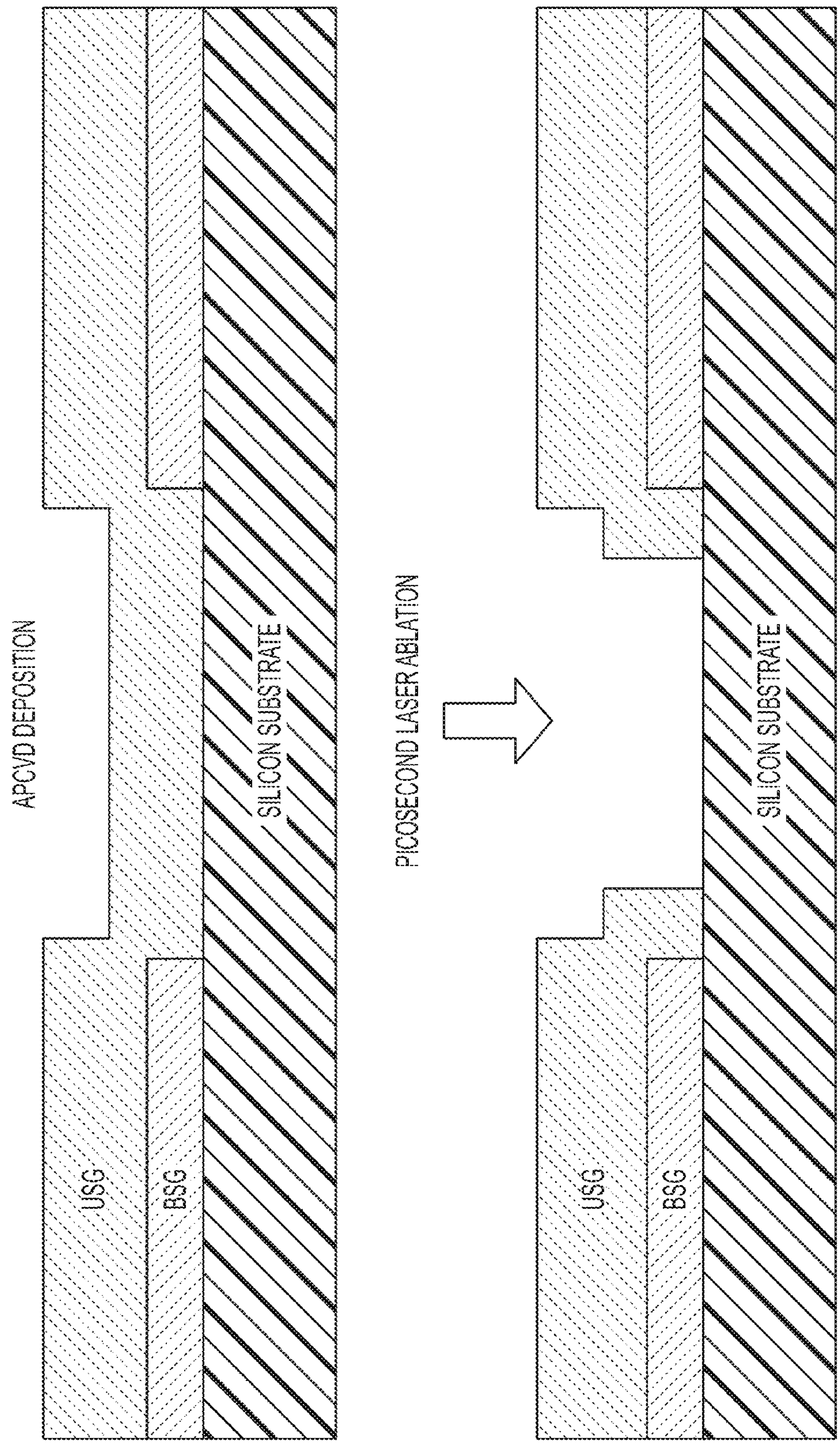
Figure 73C:
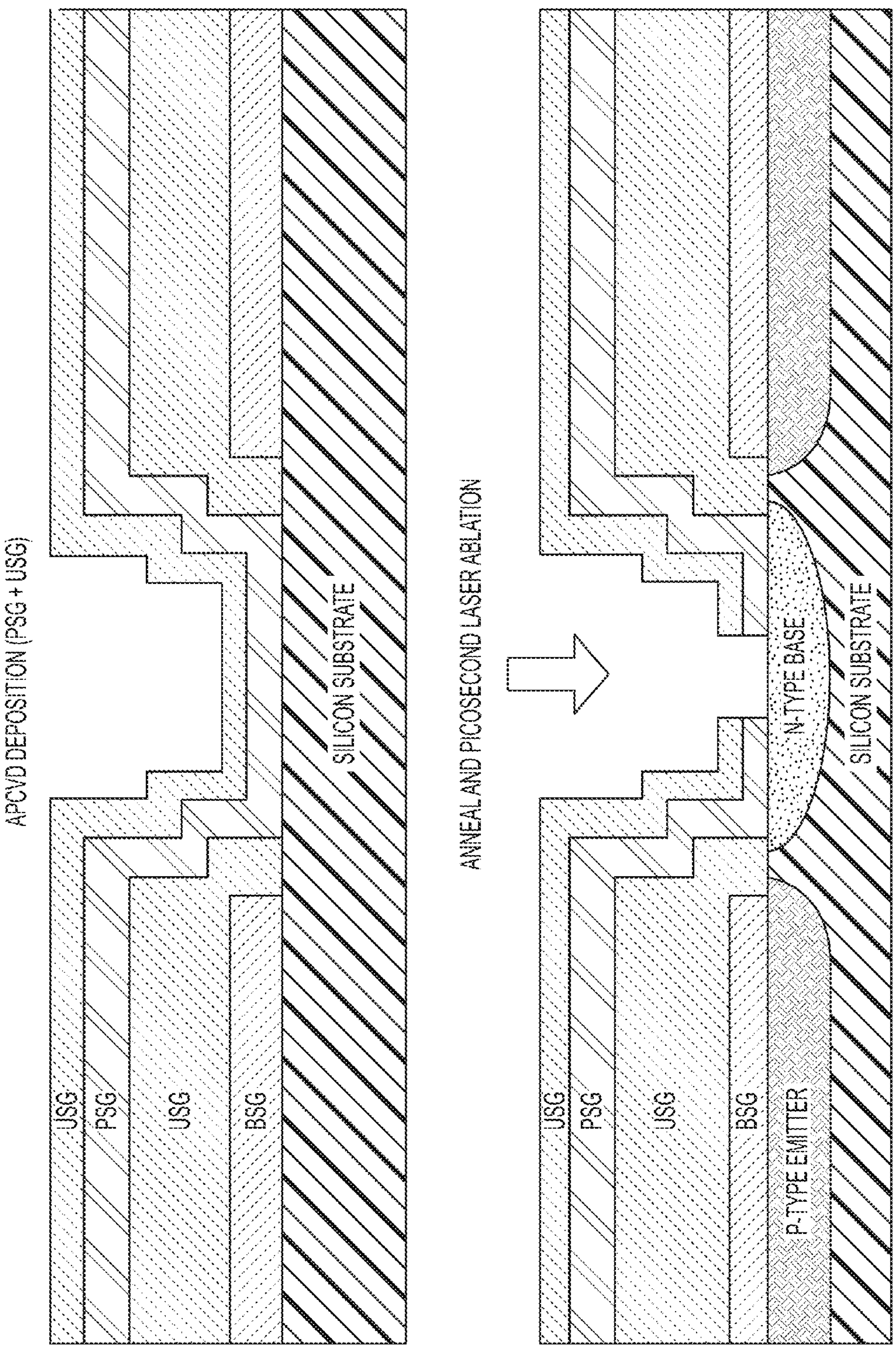
Figure 73D:
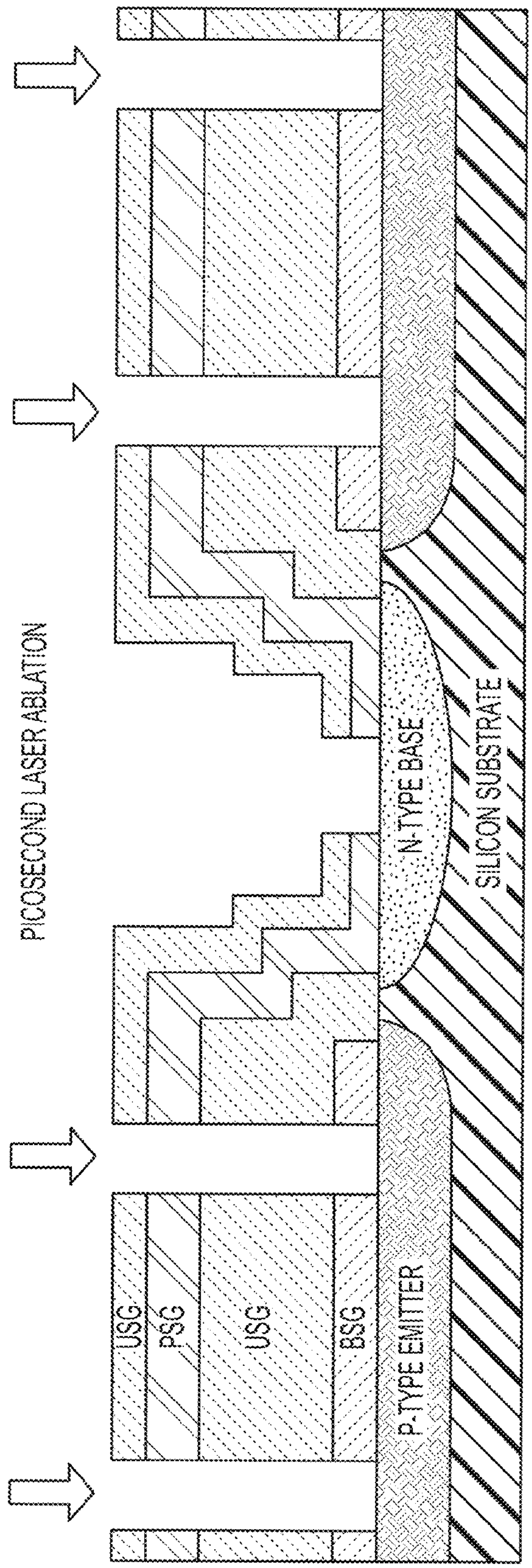
Figure 73E:
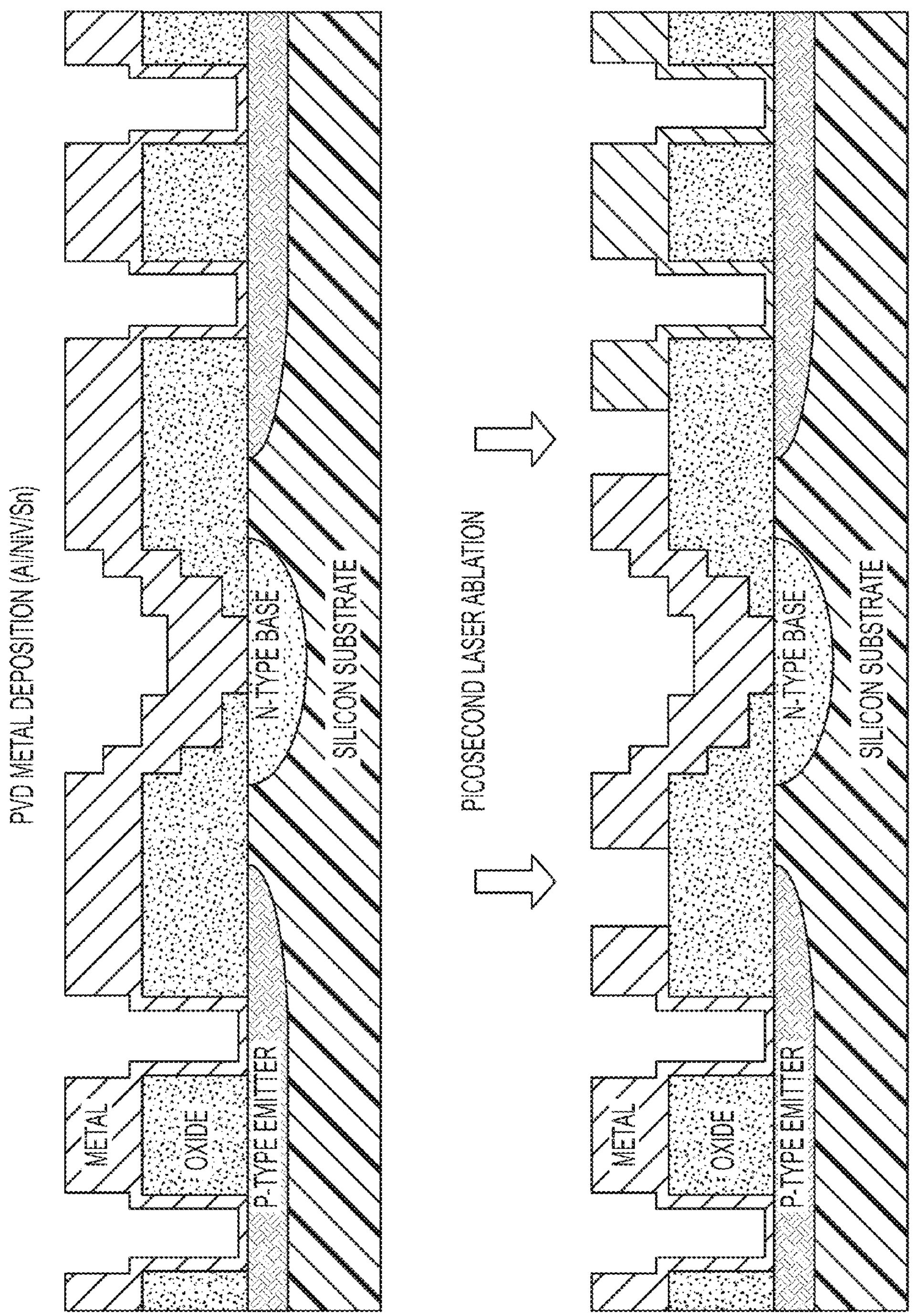

FIGS. 73A-J show a cross-section of a cell during major fabrication steps of a process flow of a pluto structure embodiment for manufacturing a back contact solar cell. FIGS. 73A-E show a flow based on having a physical separation between the base and emitter contact areas through the use of an undoped layer and subsequent patterning. FIG. 73A shows the cell after the BSG deposition and emitter opening steps. FIG. 73B shows the cell after the base window opening steps. FIG. 73C shows the cell after the PSG base deposition, annealing, and opening steps. FIG. 73D shows the cell after the laser contact opening steps. FIG. 73E shows the cell after the metal deposition and laser isolation steps.

Figure 73F:
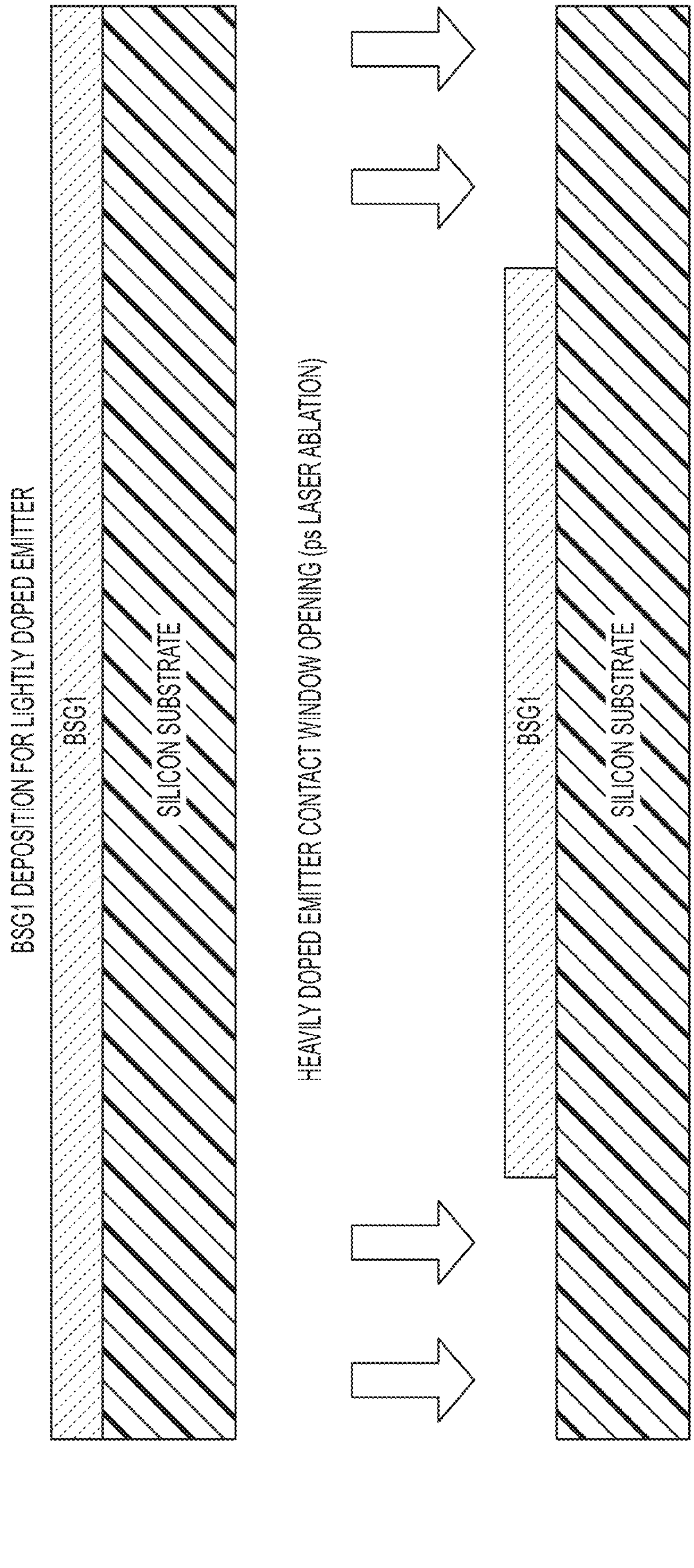
Figure 73G:
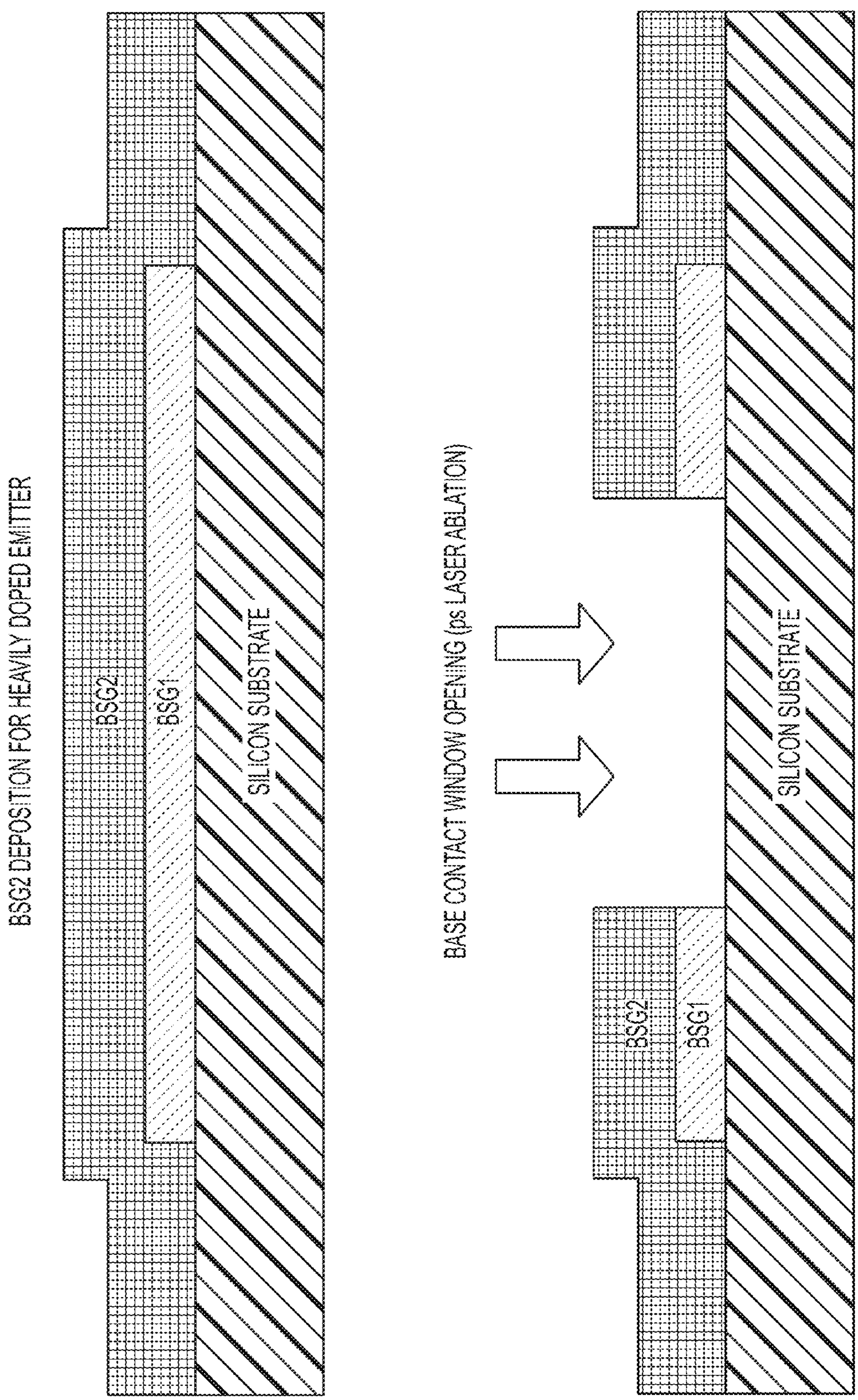
Figure 73H:
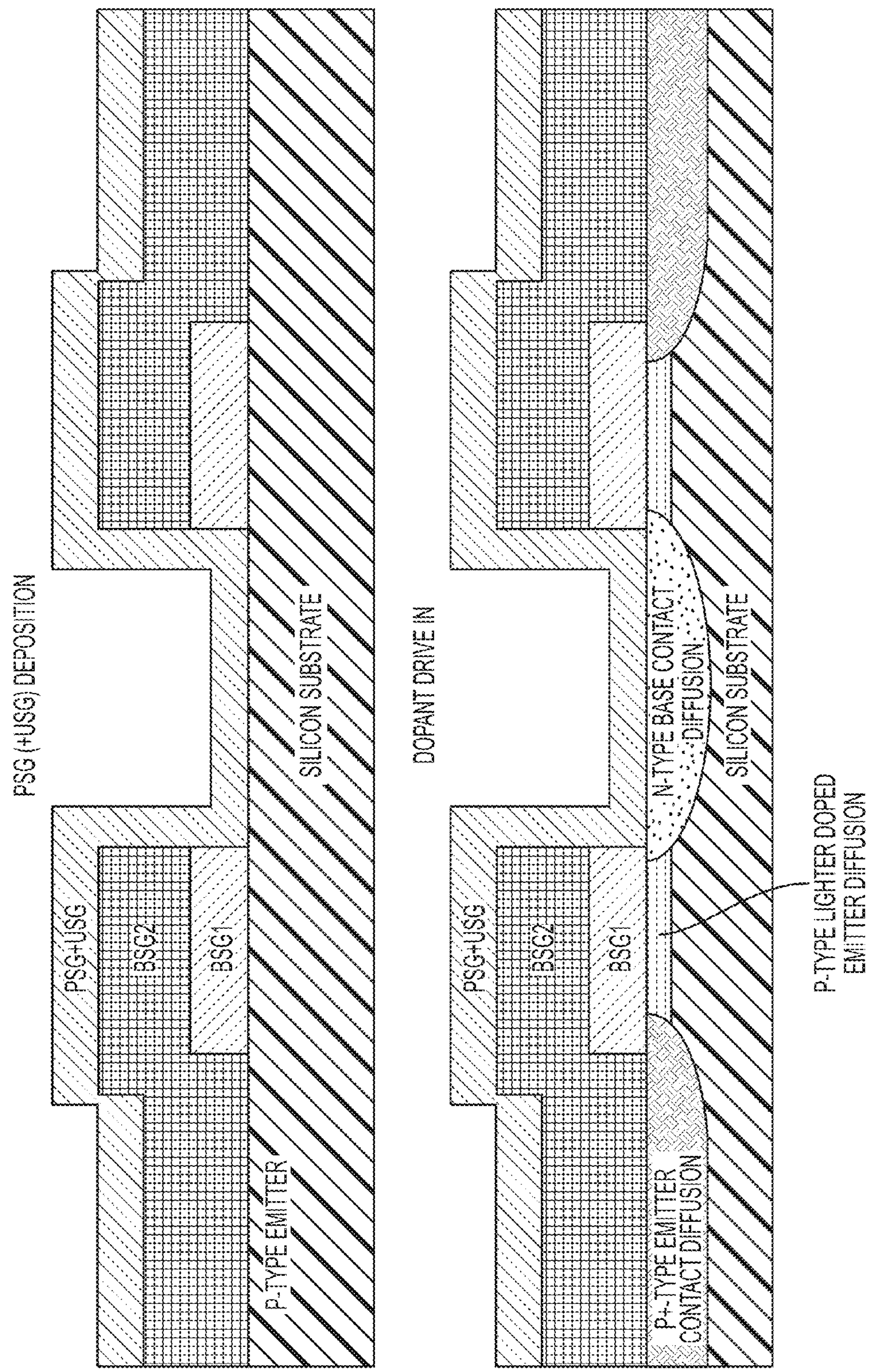
Figure 73I:
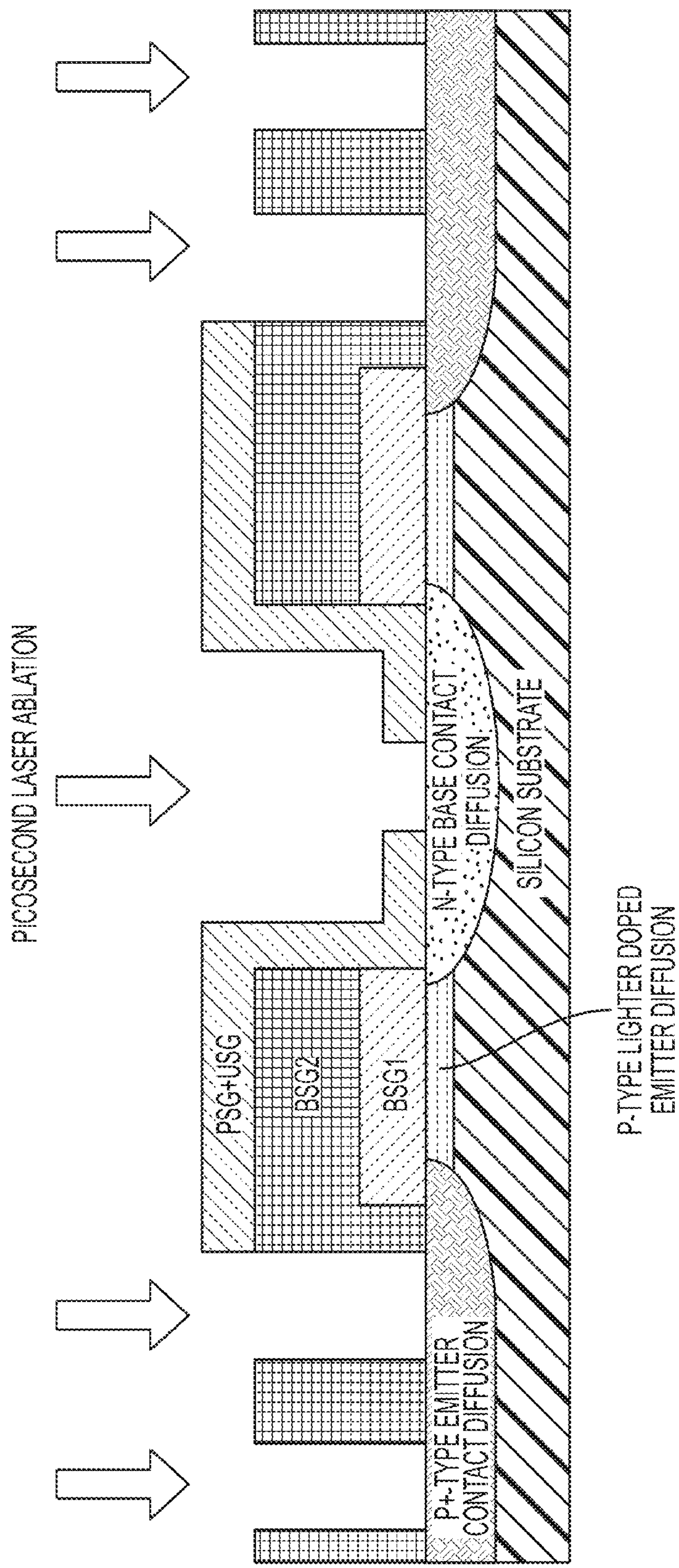
Figure 73J:
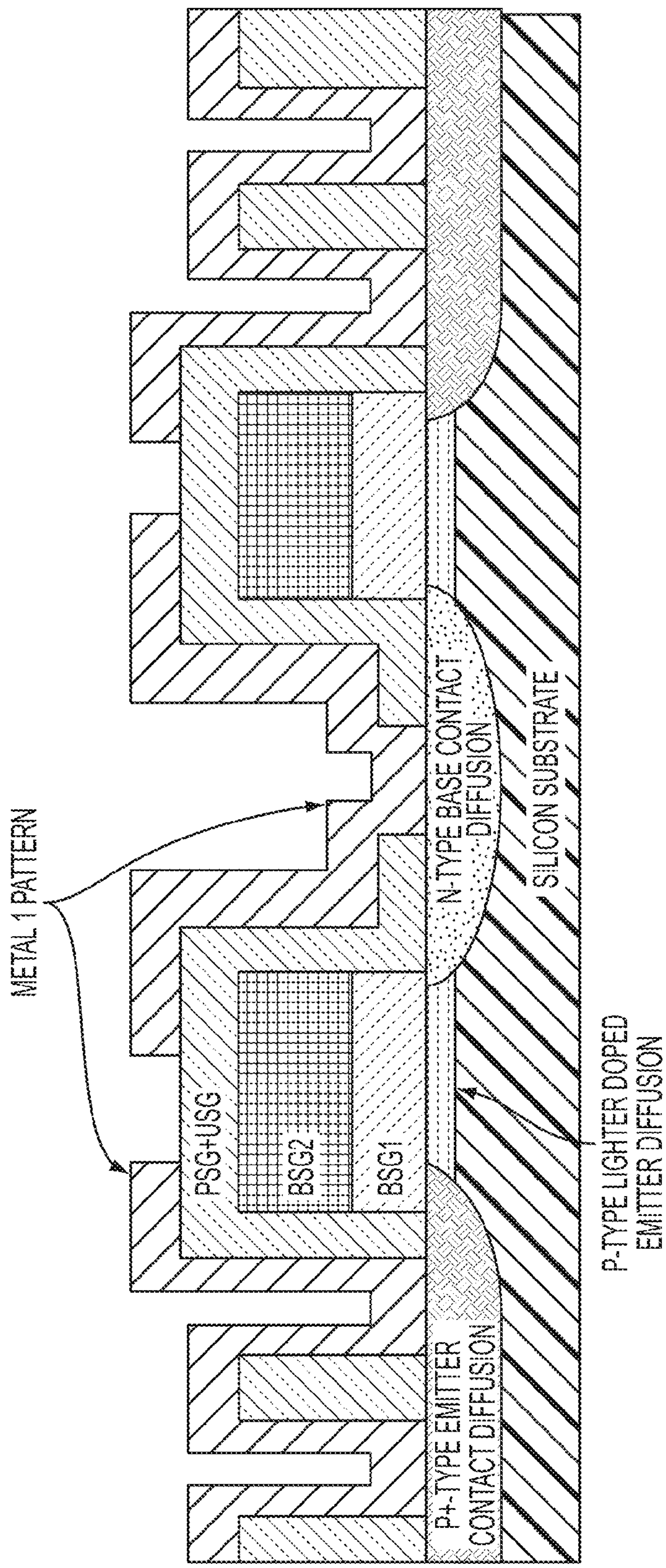

FIGS. 73F-J show a flow enabling selective emitter formation by having the emitter area more lightly doped everywhere except in the regions where an emitter to metal 1 contact is to be formed, the latter benefiting from higher doping for lower contact resistance. FIG. 73F shows the cell after the lighter doped emitter precursor deposition (BSG1) and heavily doped emitter region opening steps. FIG. 73G shows the cell after the heavily doped emitter precursor deposition (BSG2) and base contact opening steps. FIG. 73F shows the cell after the metal deposition and laser isolation steps. FIG. 73H shows the cell after the PSG (+USG) deposition and dopant drive-in to form junctions steps. FIG. 73I shows the cell after the laser contact opening steps. FIG. 73H shows the cell after the PSG (+USG) deposition and dopant drive-in to form junctions steps. FIG. 73J shows the cell after the metal 1 deposition, for example printed or PVD with ablation, steps.

Figure 74A:
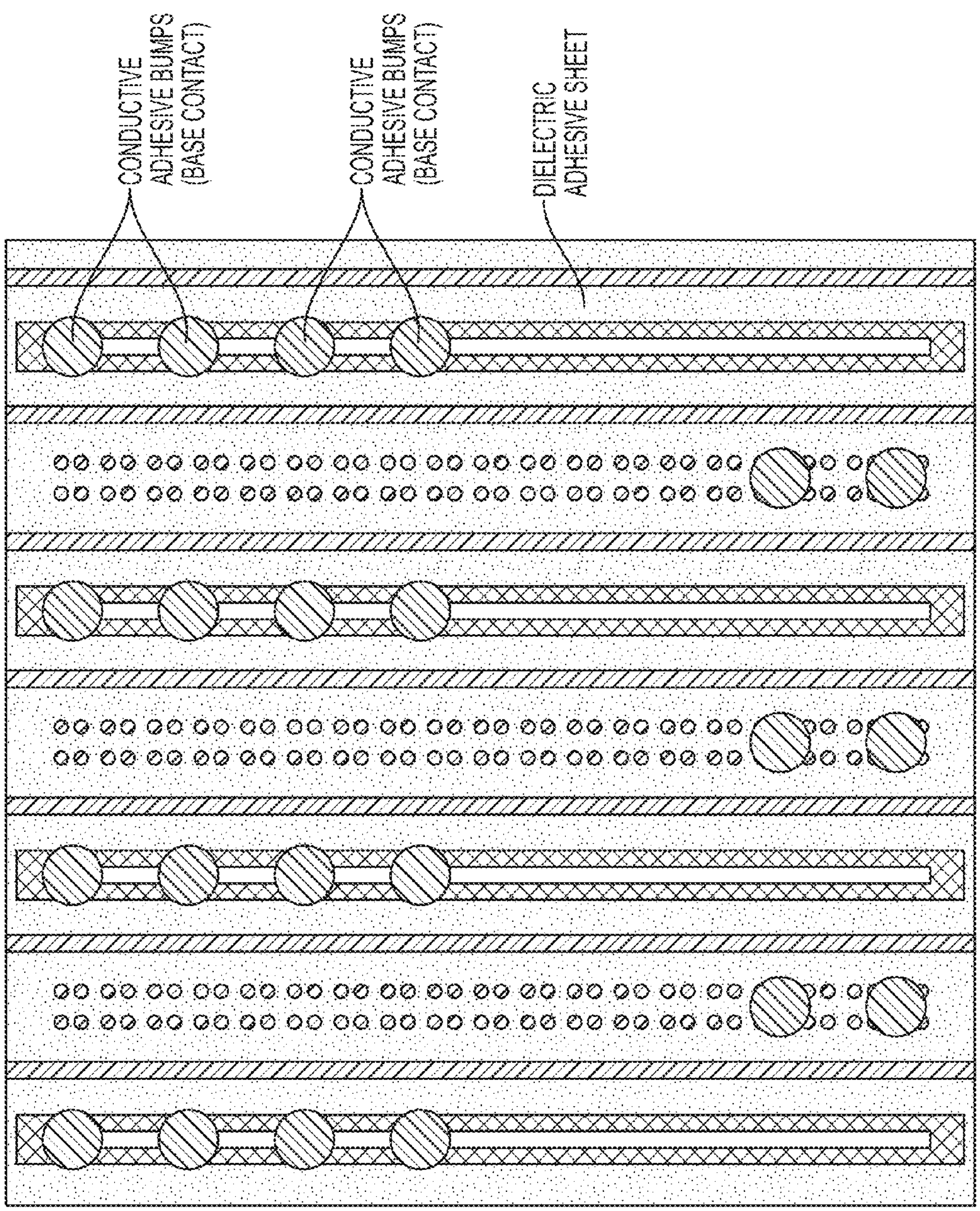
FIGS. 74A through D show a top view (FIG. 74A) and cross-sectional diagrams of a cell during fabrication steps of a oasis embodiment of back contact solar cell process flow.
Figure 74B:
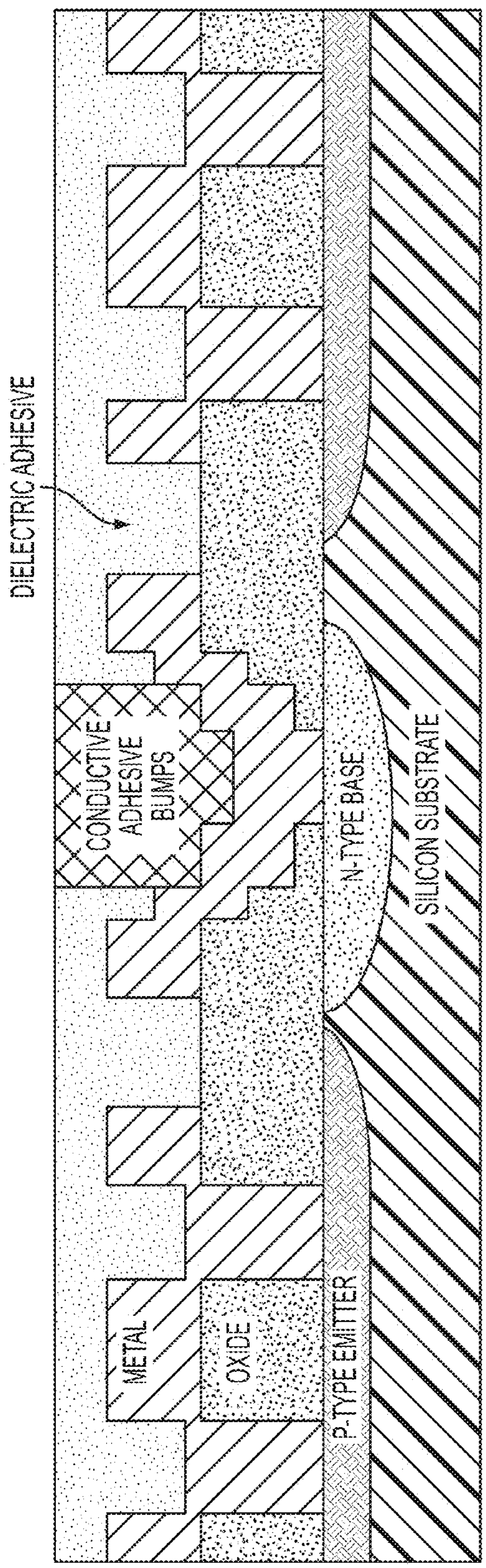
Figure 74C:
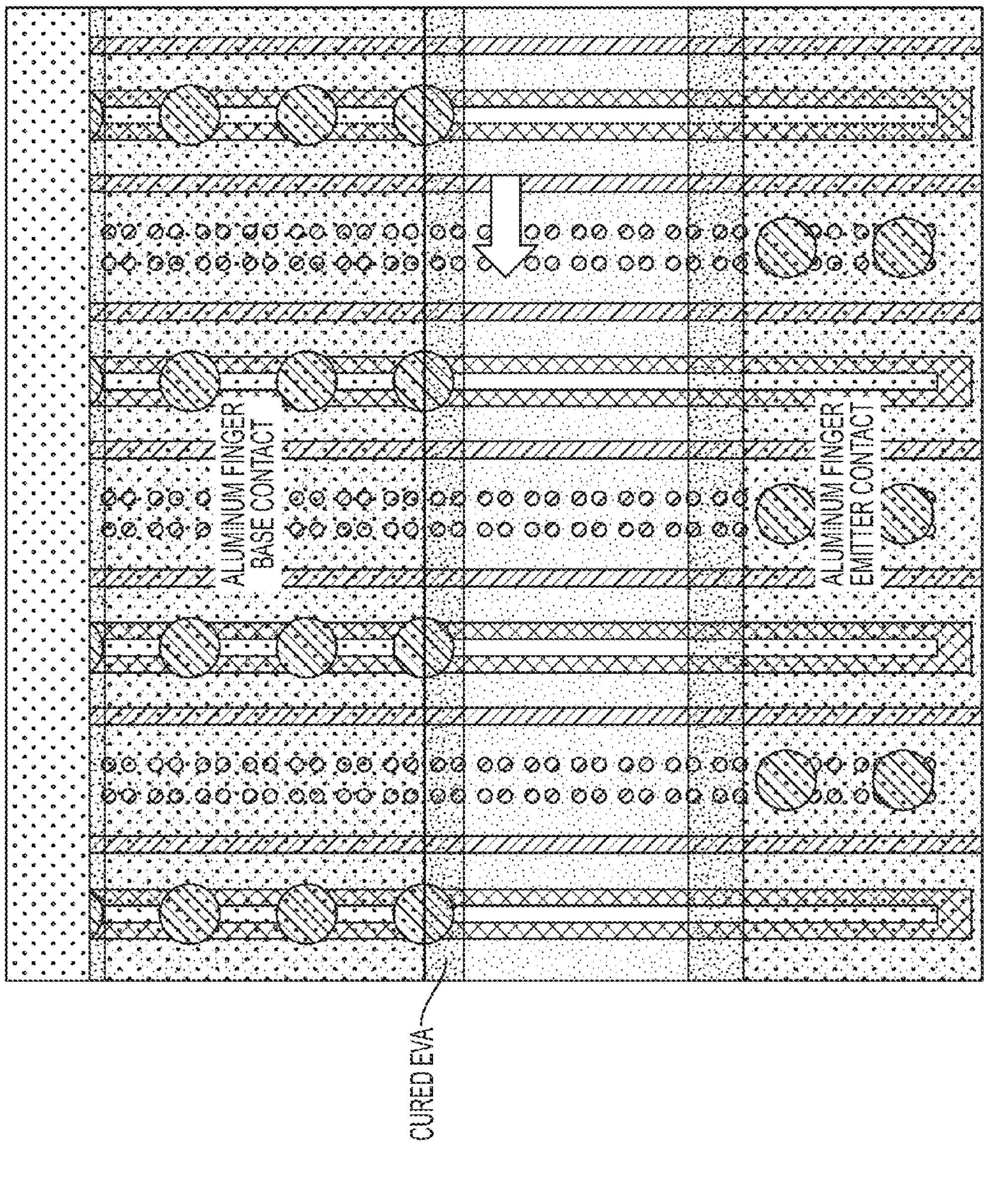
Figure 74D:
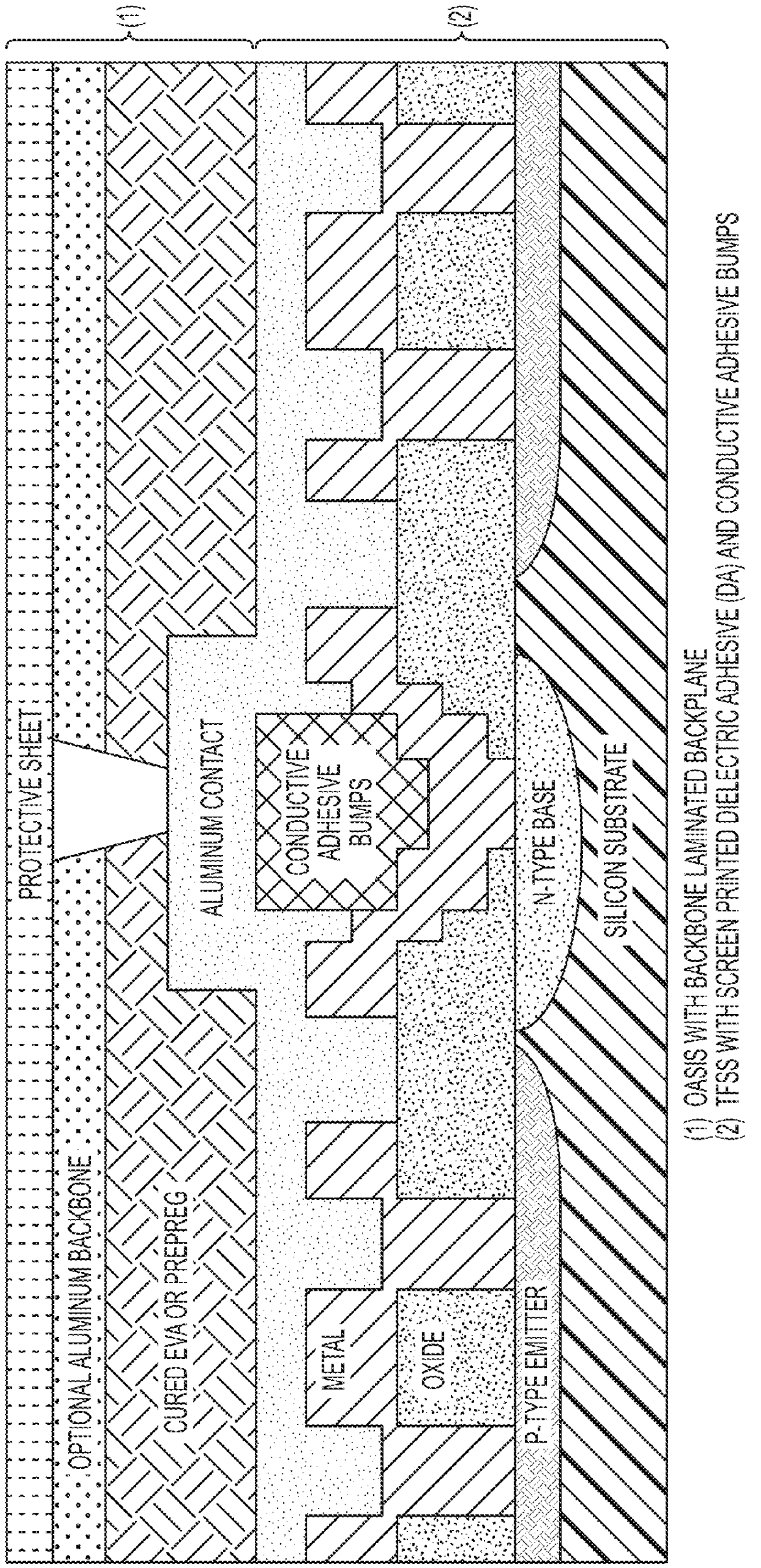

FIGS. 74A-D show a top view (FIG. 74A) and cross-sections of a cell during major fabrication steps of a process flow of an oasis structure embodiment for manufacturing a back contact solar cell. FIG. 74A is a top view of an oasis structure cell. FIG. 74B shows the cell after base contact formation steps. FIG. 74C is a top view of an oasis structure cell after backplane lamination steps. FIG. 74B shows the final oasis cell, with backbone.

For all the presented backplane embodiments, a viable processing flow and structure prior to the backplane part of the process has been disclosed herein. For example, in one starting substrate embodiment an epitaxial cell structure which is supported by the template has the contacts opened to the semiconductor areas of emitter and base. The contact to the base may have a highly doped contact area for low contact resistance, while the emitter is optionally a selective emitter with a highly doped area around the contact to the primary metal. These contacts may be opened using various techniques, as shown in the example embodiment of FIG. 73, the contacts are opened using laser ablation of the dielectric above. The contacts are best formed in an alternating line array of emitter and base contacts.

Subsequently the first layer metal is formed. This layer is referred to herein as the first layer metal even if it consists of several metals or several structures within. In one embodiment, the first metal structure is preferably aluminum or aluminum with a small amount of silicon to reduce spiking to ensure an ohmic contact to both p-type and n-type regions. If PVD is used to deposit the material, then the choice is typically that of a single material such as aluminum since the deposition is commonly performed for the whole cell area and structured later. The blanket deposited material is later patterned. Several options for patterning exist, in one example embodiment the metal is structured using laser ablation. Several options of laser ablations are possible, such as using picosecond laser ablation. The metal is preferably patterned such that alternating lines of emitter and base contact metal is formed, on top of the alternating lines of emitter and base contact openings.

If instead of PVD, a printing process is used for the first metal, such as screen printing or aerosol printing with—depending on the material—subsequent thermal processing, then aluminum or aluminum with a small amount of silicon to reduce spiking for both contacts may be used or aluminum for the p-type region contact and another metal, such as silver or others for the n-type region contact. The material of choice will also depend on its performance as a mirror. Good mirror performance (specular or Lambertian) can improve the overall light to electricity conversion, especially for the longer wavelengths which is important for cells using thin silicon. Alternatively, silicide forming refractory metals may be used as first metal layers as well for low resistance contacts; however, their mirror quality may not be adequate and the process is more complex.

Both PVD and printing processes for metal allow optionally for the deposition of stacked metal layers. In a PVD based process, aluminum deposition may be followed by an adhesion improving nickel vanadium (NiV) or nickel (Ni) layer, Ni often preferred because of the lower stress. This may be followed by a tin (Sn) layer, which allows for plating further on in the process flow. An alternative to this stack is Al, followed by tantalum (Ta). Other layer combinations are also possible. For simplicity of processing and for good performance as a mirror layer for the later introduced process of laser via opening, Al alone may be used as the first layer metal. When a plated layer is later used for the next metal layer and aluminum is the only base metal layer, then aluminum needs special surface treatment, such as zincation or double zincation.

The metal or metal stack needs to be chosen with several properties in mind, namely it needs to provide good adhesion, firstly to the underlying oxide or glass layer on the epi, secondly between the metals of a stack, and thirdly between the top metal on the stack and the backplane or, to be precise, to the adhesive component of the backplane.

For that, if aluminum is the first deposited metal and if the glass layer near the top also serves as a dopant source, for instance phosphorus silicate glass (PSG) as the n-type dopant source for the base contact, then it is typically helpful to retain the phosphorus content in the PSG at or below approximately 6% and/or cap the PSG layer with an undoped glass layer. Optional treatments of the metal during and after deposition can serve to improve subsequent adhesion. Such treatments include thermal annealing, laser annealing, surface roughening and others. For deposited materials, aluminum tends to provide good adhesion also to backplane materials presented here.

Printed metals normally require one or more thermal steps, for baking out solvents and optional sintering and/or drive-in steps. If more than one metal is printed, it is conceivable to do one thermal step for all or to have one or more thermal steps in between printing of metals. Printing of metals also allows for selective thickening of metal in areas where beneficial, such as in areas that serve as contact areas to the next layer metal at a later point in time. One method for selective thickening when using screen printed metal is to do more than one print while using different screen structures.

The surface of the deposited metal or metal stack is optimized to allow for a large process window for the metal ablation which is employed in conjunction with a PVD based process. For both PVD and printed metals, it may be beneficial for the top metal of the metal stack (or the surface of the metal)—if only one metal is used for the first metal layer—is chosen or engineered such that it provides sufficient thickness and high reflectance to a laser beam that is employed at a later point in time to drill vias through a backplane material, where these vias have the function to provide next level metal contact to the first metal layer. For such via drilling, CO2 lasers may, for example, be used and aluminum, copper, silver and several other metals tend to provide good reflectance in the long infrared wavelength range of the CO2 lasers.

In the case of printed metals, it may be beneficial to locally thicken the metal and/or to locally add another metal print in the area of the future vias. This may serve both to increase the process window for via hole drilling as well as to provide a good metal area for the second layer metal to make contact to.

Prior to lamination, which is the next main process step after the first layer metal and its patterning and treatment, it may be advisable to provide the epitaxial layer with an oversized cut while it is on the template, so as to provide a known breakage location during the release of the backplane reinforced epitaxial cell structure.

Process Flow for the Pluto Structure at Lamination.

The material chosen as the backplane material to be laminated to the thin film epitaxial solar cell structure (TFSS) which contains the patterned first layer metal is chosen with several important properties in mind, some of which are presented as follows: first the material has to be suitably matched with respect to its coefficient of thermal expansion with respect to silicon. Secondly the material has to either by itself, or with the help of a blanket or patterned adhesive layer, exhibit good adhesion to the TFSS and provide this adhesion throughout the temperature, pressure and humidity ranges that are required for the manufacturing of the backplane reinforced TFSS into a finished solar cell and that are required of solar cells in modules throughout their useful lifespan. Thirdly, the backplane reinforced TFSS needs to be able to withstand the chemistry, the gas environment and all handling steps throughout the manufacturing into a solar cell and into a module. Fourthly, the material needs to be cost-competitive, non-toxic and readily available.

The foregoing description focuses on the embodiments of a prepreg backplane in conjunction with silicon as the active absorber material. The same concepts apply for the use of Silicon with heterojunction materials such as Ge, SiGe, SiC, SiGeC, a-Si or a-SiGe, as well as for the use with III-V materials such as GaAs or the combination of GaAs with Si or Ge or its alloys. An attractive example material family to fulfill such requirements are prepregs that are used in similar formulations in the printed circuit board industry. Such prepregs are available with woven and non-woven fibers of different kinds, such as aramid, Kevlar or glass fibers in a matrix of resin.

Such sheets are laminated to the TFSS while it is on the template. The reinforcement can consist of a single sheet or more than one sheet, where different pretreatments or different fibers, fiber content percentage and resin type and content percentage are all employed to optimize adhesion as well as CTE mismatch.

As pointed out earlier, prior to lamination of the prepreg it may be advantageous to print an additional adhesive onto the cell. This adhesive may be thermally or UV curable and may cover either the whole area (as shown in FIG. 63D) and thus needs to be drilled through in the later via hole opening step or else is printed with openings where the via holes are to be drilled, or it can cover only the area between metal 1 lines (as shown in FIG. 63C).

Other backplane reinforcement materials options include materials similar to those used in solar module encapsulation, such as EVA or Z68. In examples below, whenever prepreg material treatment is mentioned explicitly, this should be understood to cover the use of other suitable backplane materials as well.

The materials chosen can include, depending on process flow and material formulation, the option of having very compliant or flexible cell structures, as well as enabling non-flat cell surfaces which enable further architectural solutions for applications such as non-flat solar modules.

Optionally, the prepreg area in contact with the TFSS may be covered at the time of lamination using a protective sheet which suppresses moisture or chemical uptake of the prepreg sheet during subsequent processing of the backplane reinforced TFSS such as texture and post-texture clean, as well as plating and plating surface preparation. Examples for such cover sheets are mylar or other PEN based materials which are chemically resistant.

Typical parameters to govern the lamination process itself are the use, extent and timing of pressure, temperature, temperature differential and ramping rates, resin and fiber type and content percentage, an optional pre-tacking or pre-treatment of the prepreg lamination sheet or sheets, the process time and time at temperature, the application and level of vacuum. Full curing of the prepreg through the lamination or at least prior to exposing it to water and wet chemistry may be advantageous.

After cooling down from the lamination step, the laminated TFSS on template is unloaded from the lamination tool and subsequently released from the template whether mechanically or other means such as etch. In general, the top side of the backside reinforced TFSS and the template are chucked and separated, either by the use of direct pulling, by peeling or by a pulsated pulling force, such as the force generated by the pulsated application of a vacuum on one or both sides of the structure.

The release may be optionally be assisted by the use of sonic or ultrasonic mechanical force, such as that administered by a piezo actuator that is coupled to the plates that are used to chuck the topside of the reinforced TFSS and/or the template. Also, immediately prior to the release a laser cutting step can be employed around the TFSS area to provide a preferred boundary within or along which the release takes place.

After releasing, the edges of the backplane reinforced TFSS are trimmed to a size suitable for further processing or even to the final size. In general, the trimming process may be carried out by the use of either a mechanical trim by cutting, shearing or sawing or by the use of one or more lasers, such as a CO2 laser or a pulsed YAG laser or similar, or by a combination of mechanical trimming and laser trimming.

Several options exist for aligning the trimming cut to the structure, depending on the geometry and setup of the cutting and whether the cut is initiated from the backplane side or from the TFSS side. Among the alignment options are the use of visible or infrared cameras (the latter in the case that buried alignment targets are to be used. Markings in the release layer residue may reflect the process of laser processing on the backside of the TFSS—such carried-through markings can serve as directly visible alignment targets.

Before or after the edge trimming, in any case before exposure to large capacity automated wet chemistry tools and processes and depending on the material and process chosen and the resulting flatness after releasing the backplane reinforced TFSS from the template, an optional thermal and pressure treatment of the released backplane reinforced TFSS may help provide optimized flatness of the layer which is advantageous for subsequent processes. The backplane reinforced TFSS contains remnants of the release layer including the reflowed top of the release layer. This layer is highly defective and also acts as a gettering site. It is either removed in the following texture step or with a separate step prior to the texturing. Post texture cleaning is employed to remove metallic and optionally organic residue prior to passivation. There are several options for passivation and anti reflection coating that are compatible with the temperature range of the backplane materials and typically these steps can be restricted to temperatures below 200-250° C.

The initial passivation layer in contact with the textured surface may be an oxide, such as a silicon dioxide or a silicon-sub-oxide, i.e. a silicon oxide with a stoichiometric ratio between oxygen and silicon of less than two, where any such oxide layers are deposited or grown via chemical vapor deposition (CVD) or wet chemistry. Alternatively, the initial passivation layer can also be an oxynitride, for instance deposited via CVD or an amorphous silicon (a-Si) layer, which is intrinsic or optionally doped. This layer is for instance deposited using CVD or PVD. The anti-reflection coating may be performed using silicon nitride, even though aluminum oxide is also an option, especially for p-type base cells. This layer is for instance deposited using CVD.

After deposition of the top surface layer or layers or alternatively in between the depositions, an anneal can be employed, in order to reduce front surface recombination velocity (FSRV) and also back surface recombination velocity (BSRV). Such annealing is to be controlled in such a way that it is compatible with the thermal budget range that the device, especially the backplane allows. Suitable processes for such anneals include forming gas anneals or anneals in air or in an inert ambient as well as laser anneals that are tuned suitably to deposit their energy close enough to the surface and/or for short enough times so as to not exceed the allowable thermal budget of the backplane materials. An example for laser annealing processes for this application is pulsed laser anneals in the visible or near infrared wavelength range.

To protect the front surface during subsequent processes and for improved handling, it can be advisable to attach an optically transparent protective layer to the front surface. Such layers can be either thermoset or thermoplastic materials such as EVA or PE based materials such as a Z68 or z68 like material. The latter can later be reflowed and used for attachment of the cell to glass in the module assembly part of the process.

In order to prepare the structure for later second level metallization, an optional step may be inserted to prepare the backside surface for good adhesion. Such a step may comprised mechanical roughening of the surface with processes such as grit blasting or sanding. Alternatively, a chemical treatment or a plasma treatment of the surface can be employed which promotes adhesion. It is to be noted that such treatments can also be carried out prior to texturing, if desired.

The next set of process steps serves to establish contact to the first metal layer which is so far protected underneath the backplane material. This contact opening can be accomplished by laser based via drilling. An example laser employed for this process is a CO2 laser, although other lasers such as pulsed UV, visible or IR YAG lasers may be employed as well to ablate the backplane material. Holes can be drilled by direct pulsing at the same spot, using single or repeated pulses or by trepanning the area with multiple pulses, depending among others on the via hole size desired and the laser pulse energy available. For best selectivity of the laser drilling process to the underlying first layer metal, the underlying metal should be very reflective to the laser beam, such as for example aluminum and silver are very reflective at CO2 laser wavelengths. Depending on its absorption characteristics for CO2 laser wavelengths, it may be advantageous to have a dye in the material to be drilled (e.g. the prepreg). This dye is to serve to increase the drilling speed in the backplane (e.g. prepreg) and thereby increase the selectivity to the underlying metal. The dye may also have a visual function of providing cells with darker sidewalls for an overall dark appearance of the cells in the module.

The laser drilling process may also be combined with other processes, such as plasma etching of residue in the opened via hole, or organic cleanups of the via holes using for instance hydrogen peroxide, or changing between different types of lasers or parameter settings of lasers between onset and finish of the via drilling process.

A potential plasma etching, if employed, may be implemented immediately prior to the next level metal deposition, especially if this deposition occurs in vacuum such as when using PVD. The use of molecule radicals is also envisioned for a cleanup process immediately prior to next level metal deposition.

In this implementation of the process flow, the via holes need to be aligned to the underlying structures on the TFSS, especially to the patterned metal fingers from the first layer metal. If an additional metallic contact is printed on top of the first layer metal underneath the via, in order to increase the laser process window or to promote good adhesion and electrical contact to the next layer, then the via holes also have to be aligned to this layer.

For alignment structures or targets on the TFSS it is conceived that either during one of the on-template patterning or patterned deposition processes the alignment targets may be laid down, or else the structure itself, especially where it breaks the symmetry, such as the edges of the active area, may be employed to provide alignment without using up active area for alignment targets. Since the reinforcement material in general may not be transparent, the alignment to the targets on the TFSS for the via hole drilling process may be accomplished in several ways: First by having window cutouts in the reinforcement backplane material prior to lamination. These windows need to contain some resin that reflows into the windows during lamination and that is transparent enough to allow for visual recognition of the alignment targets. Or second, the alignment targets can be viewed using a camera with suitable sensitivity wavelength, such as an infrared camera that locates the targets either through the backplane material or through the thin silicon.

Using an infrared camera which locates the targets in the laser drilling tool by transmission infrared (IR) illumination through the TFSS has the advantage that with suitable instrumentation no movement has to occur between locating the targets and drilling the vias. After drilling and optional cleanup of the vias, the backside reinforced TFSS is now ready for second layer metal formation to contact the first layer metal.

Before describing the second layer metal formation, another closely related embodiment is described. It is to be noted it is also possible to drill the via holes into the backplane material prior to the lamination. This process is subsequently called pre-drilling of vias. Pre-drilling may be advantageous for the overall drilling process window. If the contact holes are predrilled, then the requirements to selectivity to underlying first layer metal material is removed or greatly relaxed. For pre-drilling, if more than one sheet of backplane reinforcement material such as prepreg is used, it may be advisable to tack the sheets prior to pre-drilling using a tacking lamination at suitably low temperature. Furthermore, during the via pre-drilling the laser can cause local curing at the edges of the vias. This may serve to reduce outflow of resin that tends to close the opened holes. Since the predrilled holes after lamination would not necessarily protect the underlying first layer metal suitably during the wet chemistry process for texturization and post texture clean, it may be useful to add an undrilled protective sheet of the above mentioned mylar, teonex or other PEN or PET based materials. Similarly to the above described via drilling process where the vias are drilled after drilling the area, albeit this time with a much less stringent requirement on process selectivity. Such gains in process selectivity may potentially eliminate the need of other post via drilling hole cleanup steps. As an alternative to the application of an undrilled protective sheet it is also possible to locally cover the first layer metal that is to be contacted with a suitable dielectric such as a glass or polymer which is chemically resistant enough to withstand the texture and post texture clean processes, but which may be removed prior to second layer metal contact formation to the first layer metal. In the case where the wet processing is not carried out by immersion but by single side wet chemistry application, a protective sheet may not be required when using a pre-drilled sheet.

When the predrilled reinforcement backplane is laminated to the TFSS which is at that time supported by the template, the application of the backplane sheet or sheets with the TFSS on template for the lamination has to be done with an alignment. To secure that an aligned position is retained during the lamination, the sheet or sheets can be pretacked to the surface using a laser or other local heat source. Alternatively, as part of the first layer metal formation, the area of the vias may be built up with a taller, preferably printed, metal region. Such local pillars, when dimensioned properly, may serve to secure the predrilled sheet in place during the lamination. The above mentioned optional local protective material is in that case applied on top of such pillars. Such pillars can be employed in a very sparse pattern, so as to save on material usage for said pillars.

Second Layer Metal Formation.

The second layer of metal is preferably structured in an essentially orthogonal relation to the first layer metal fingers, with the potential exception of one or more bus bar strips for each terminal. Orthogonal relation may greatly relax the requirements for patterning the second layer metal. For instance, if the patterning requirements of the first layer metal are in the hundred or hundreds of micrometers, the patterning requirements of the second layer metal are in the millimeters to centimeters range. This in turn enables the use of very economic patterning techniques such as simple shadow masks or very cheap printing, roller coating or spraying applications. Also it allows for the use of stamped out large dimension metal fingers. This relaxation is enabled by the concept that for the orthogonal relation geometry, the distance that current has to travel in each first layer metal finger is suitably short prior to reaching a via for extraction.

Various process flow options for forming the second layer metal have been disclosed including the embodiments and alternatives following. If aluminum is the contact metal to the second layer, then a zincation process, preferably a double zincation is advantageous for reliable plating on top of aluminum. If a PVD process is to follow, zincation may be circumvented by doing a pre-sputter etch cleanup.

A suitable PVD process for contacting the first layer metal may then start with a pre-sputter etch, Al, follow by Ni or NiV deposition, followed by optional Sn deposition. This PVD process may be performed using a shadow mask, thereby enabling patterned metal deposition. Alternatively, the metal may be patterned after the deposition using laser ablation, similar to the patterning for the first layer metal. The deposited metal or metal stack may optionally be annealed after deposition to tune its properties.

Alternatively the vias may be filled or partially filled first by printing, for instance stencil printing a conductive paste such as aluminum, copper, nickel or silver paste. A seed metal or metal stack can then be deposited also using PVD or screen printing, on top of the metal that is used to at least partially fill the vias. Printed pastes can be baked and/or annealed after application.

On top of this seed, the remainder of the metal may be plated. And alternatively, the whole necessary thickness of the orthogonal metal fingers of the second layer metal can be printed using a suitable paste. In the case of plating, the deposition of the seed metal may be performed in a patterned way, as described above, or as a blanket layer which is subsequently patterned using a resist structure which separates emitter from base plated areas. After plating, the resist is stripped and the seed layer is etched back in the areas that were protected using the resist. A typical sequence of plating starts with Ni, followed by copper (Cu) and ending with Sn for solderability. Alternatively and depending on the seed material, Cu can be plated directly. Sn can also be applied locally after plating, using printing, in areas where it is required for soldering. In the case of a printed seed, it is also possible, if affordable, to print up the whole second level metallization using for instance screen or ink jet printing. The structure for the second layer metal may either have a single or multiple bus bars per terminal or it can contain only metal fingers. In case of a plating process for the second layer metal, the number of contact points required for module integration scales with the number of independent bus bars at the time of plating. Contacts in the module from cell to cell can be accomplished using dog bone shaped contact fingers. For a finger-only structure, the dog bone contact points per side need to equal the number of second layer metal fingers per terminal. Minimizing the area of the bus bar, up to the point where no bus bar is employed, serves to maximize the overall active area on the cell that current can be drawn from by in turn minimizing the area of electrical shading underneath the bus bars.

The contact metal strips between cells can consist of Cu with solder or solderable aluminum, such as Al with thin Ni and Sn or tin-bismuth (SnBi) coating. In the areas that are visible in the module, the strips can be painted in black locally to add to the all-black look of the panel. Such paint coating can act as a dielectric as well, allowing for tight arrangement of cells within a module.

Manufacturing the Oasis Structures.

FIGS. 64 and 67 show example embodiments of oasis structures. Oasis-type backplane structures may be realized either by single step lamination of more than one component onto the TFSS which is at that point supported by the template, or the oasis-type backplane may be formed separately using one or more lamination steps and then applied to the template supported TFSS. If the latter path is chosen, then there are additional options to apply some layers either to the TFSS side or to the backplane side. This holds for instance for the dielectric adhesive that provides adhesion between TFSS and the backplane and which is either applied by processes such as screen printing or by laminating a dielectric sheet such as prepreg which is pre-lamination drilled or post-lamination drilled. The same holds for conductive materials such as conductive adhesive or conductive epoxy that may be applied in the area where there is no dielectric, i.e. to provide a conductive contact through a via in a dielectric between the metal fingers on the TFSS and the next layer metal on the backplane. In these cases, it may be advantageous for at least the dielectric adhesive to be b-stageable or to be at least partially reflowable, since the dielectric has to undergo two laminations to the different sides. It is seen as advantageous to then have the thermal budget of the lamination step which connects the backplane to the TFSS to be chosen such that the dielectric is fully cured. Typical dielectric choices are sheets of prepreg material or screen printable dielectric adhesives, such as polyesters or other resins.

Oasis Formation Embodiments.

FIG. 72B illustrates options for forming an oasis structure. Embodiments include the manufacturing and attachment of the backplane in a single step or in separate step, such that the backplane can be stored and staged. Second, for the attachment between the TFSS with the patterned first layer metal fingers and the large metal fingers of the backplane embodiments include the use of a combination of printed dielectric adhesive and conductive adhesive or epoxy versus the use of a dielectric sheet such as prepreg which may then in turn vary from being drilled prior to lamination or after lamination. In the case of pre-lamination drilling, the CA posts may be printed onto either the TFSS side of the structure or to the backplane side of the structure, if the backplane is manufactured separately. For a single step lamination using pre-drilled prepreg, the CA posts are printed onto the metal fingers on the TFSS.

Oasis Lamination Using a Dielectric Adhesive.

In a process flow embodiment, such as that depicted in FIG. 64G-F, where an oasis backplane is manufactured prior to attaching to the TFSS on template and where a printed dielectric adhesive is used to bond the TFSS to the backplane, the following starting materials may be utilized. A chemically resistant top cover sheet, preferably made of Tedlar, Mylar, Teonex or other PEN or PET materials, followed by a dielectric sheet (EVA, Z68 or prepreg) which has access holes predrilled), are arranged onto the structure of the large area metal fingers. The metal fingers in turn may be structured from planar sheets of for instance solderable aluminum, i.e. Al with a thin layer of Ni and Sn, by electrical discharge manufacturing, laser marking followed by etching (in materials such as KOH, if aluminum is used), or they can be stamped out using one or more stamping dies. These structures are aligned and laid up on top of each other, optionally covered with release sheets or with non-sticky surfaces on both sides, and then laminated together. With the right choice of material and lamination conditions, such as suitable evacuation, temperature range, ramping and lamination pressure, the dielectric material flows and planarizes the structure. Areas where planarization is not desired, such as in the backside contact areas, may be kept open by providing suitably shaped lamination contact chucks or by pre-curing the edges of the contact holes (using for instance increased laser power during the cutting of these holes) to prevent outflow of material from the edge to close the holes.

A B-stageable or at least partially reflowable, i.e. thermoplastic, printed dielectric adhesive is used as the adhesive is then applied to the backplane or (not shown) to the TFSS. Further, a conductive adhesive may be printed on either side. Dielectric and conductive adhesive each receive suitable optional thermal treatment after printing. To keep costs low, the overall area of the conductive bumps is to be kept low, preferably below 2% of the overall cell area. Prior to lamination, the TFSS may be pre-cut in a region just outside the active area to provide a designated breakage point of the epi layer upon the release that is to occur after the lamination. After that, the backplane and the TFSS on template are laminated together. In this process, the electrical contact between the metal fingers on the TFSS and the large metal fingers on the backplane is also established. After the lamination, the structure is released by mechanical release, similar to the release described for the pluto structure. The edge of the released and backplane reinforced device may then be trimmed, also similar to the trimming described for the pluto structure. Preferably, the edges of the backplane structure where the trimming occurs are sealed by the suitably chemically resistant dielectrics. Afterwards, also similar to the pluto structure, on the sunny side of the TFSS the residue of the release layer is cleaned off, the surface is textured, post-texture cleaned and passivated. As a final process for the cell, the contact access points to the large metal fingers of the backplane are opened, for instance by laser drilling of the cover sheet material.

Conductive solder bumps may be placed, or the solder from a stringer that is used for module assembly manufacturing may be used, to establish the contact to the cell. The cell receiving its own solder bumps may have the advantage that the individual cell may be tested and passing cells may subsequently be assembled into a module; however, such testing may also be accomplished using suitable probe card arrangements.

Lamination Using a Dielectric Sheet.

Figure 75:
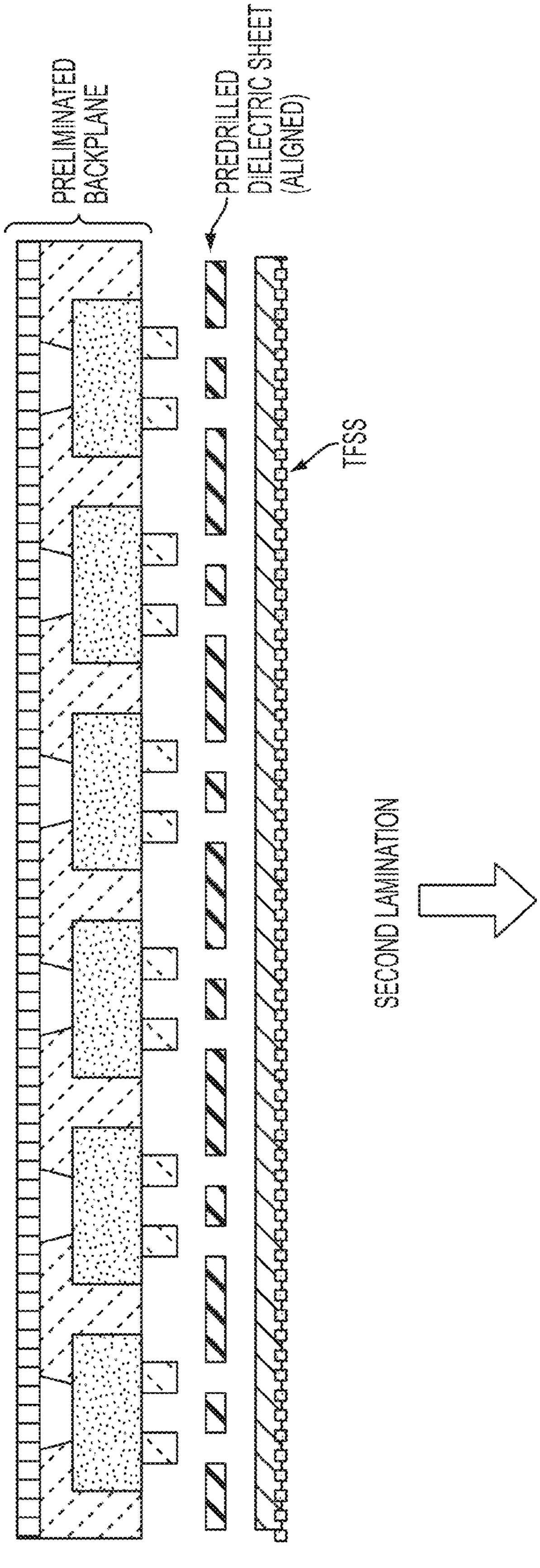
FIG. 75 shows cross-sectional diagrams of an oasis structure two step lamination using a predrilled dielectric sheet.
Figure 76:
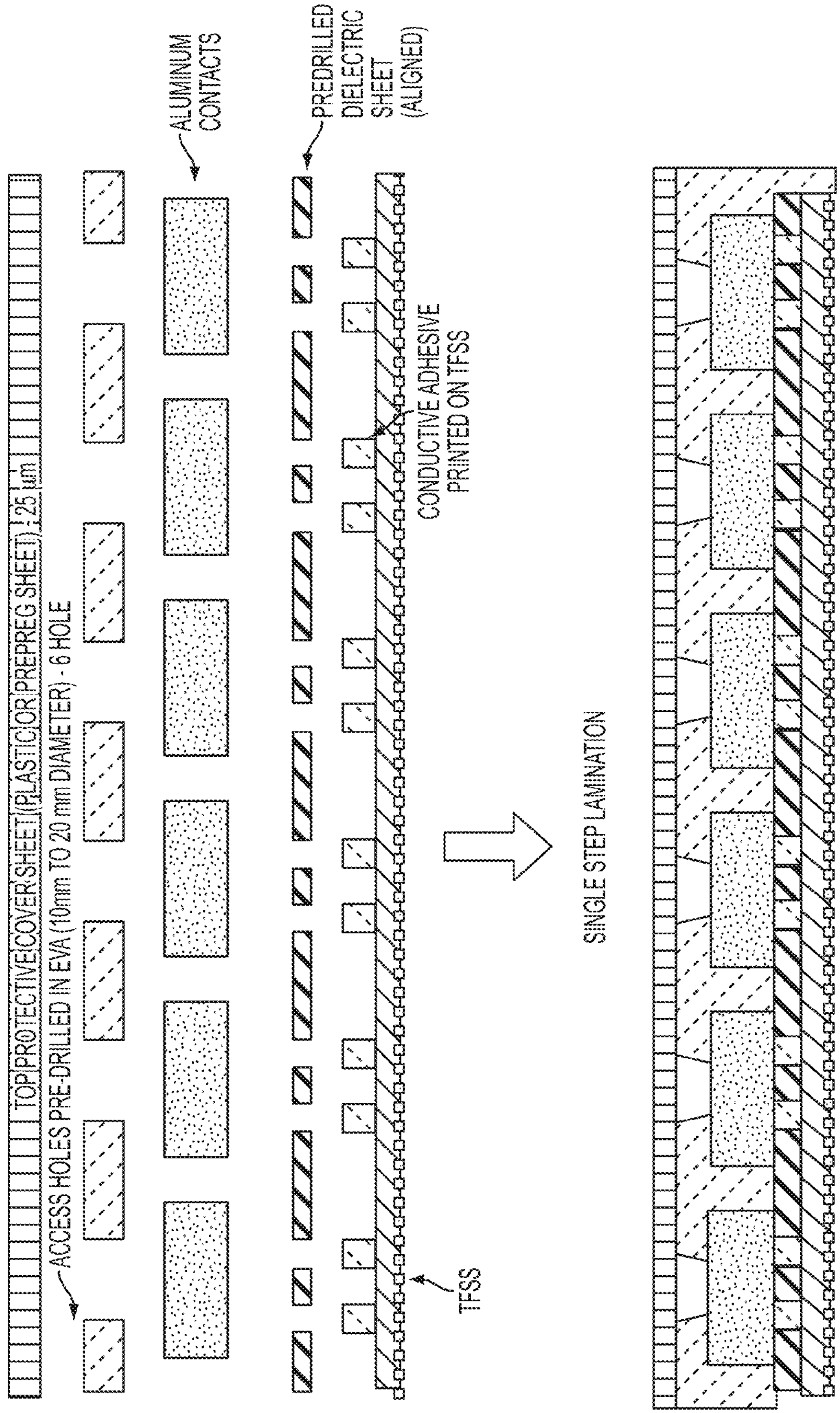
FIG. 76 shows cross-sectional diagrams of an oasis structure single step lamination using a predrilled dielectric sheet.

As an alternative to the lamination using a printed dielectric adhesive process described above, a dielectric sheet, for example a prepreg material, which is pre-drilled may also be used as the adhesive between large metal finger containing backplane and the TFSS. The cross-sectional diagrams of FIG. 75 illustrated an oasis flow using a predrilled dielectric sheet (with two step lamination) showing this process. Here, the conductive adhesive is printed in the desirable area and the pre-drilled dielectric sheet is laid up in an aligned way to the grid of the printed conductive adhesive. For that process, it may be desirable that the conductive adhesive be B-stageable such that it may be dried and not smear during the lay-up process but still reflow during the lamination to provide a good contact between the metal on the TFSS and the backplane metal. The remainder of the process, after lamination, is similar to the previously described case of using a printed dielectric adhesive.

Single Step Lamination Process for Oasis Structure.

With proper thermal budget and thermal sequencing during lamination it is possible to attach all components of the Oasis structure in a single step, rather than having a separate step for backplane lamination and lamination of the backplane to the TFSS on template.

The cross-sectional diagrams of FIG. 75 illustrated an oasis flow using a predrilled dielectric sheet (with single step lamination). Here, the conductive adhesive needs to be printed on the TFSS side. In a case that a dielectric adhesive is used, this adhesive is also printed onto the TFSS side, preferably prior to printing the conductive adhesive. In a case that a dielectric sheet such as prepreg sheet is used, this sheet needs to be pre-drilled for the single step lamination. In both cases above the conductive bumps are printed prior to laying up the pre-drilled dielectric sheet and the pre-drilled sheet is aligned to the pre-formed bumps. The large metal fingers of the backplane are laid up, the top perforated dielectric sheet (e.g. EVA, Z68 or prepreg) is laid up and finally the cover sheet is added. Then the lamination process is carried out, using a process profile that is adapted to the required process parameters of the materials involved—typical lamination temperatures are below 300 or even below 250 deg C. After this lamination, further processing proceeds in a like fashion to the process flows described above for the oasis structure.

Process Flow for the Pluto-Oasis Hybrid Structure.

Figure 77A:
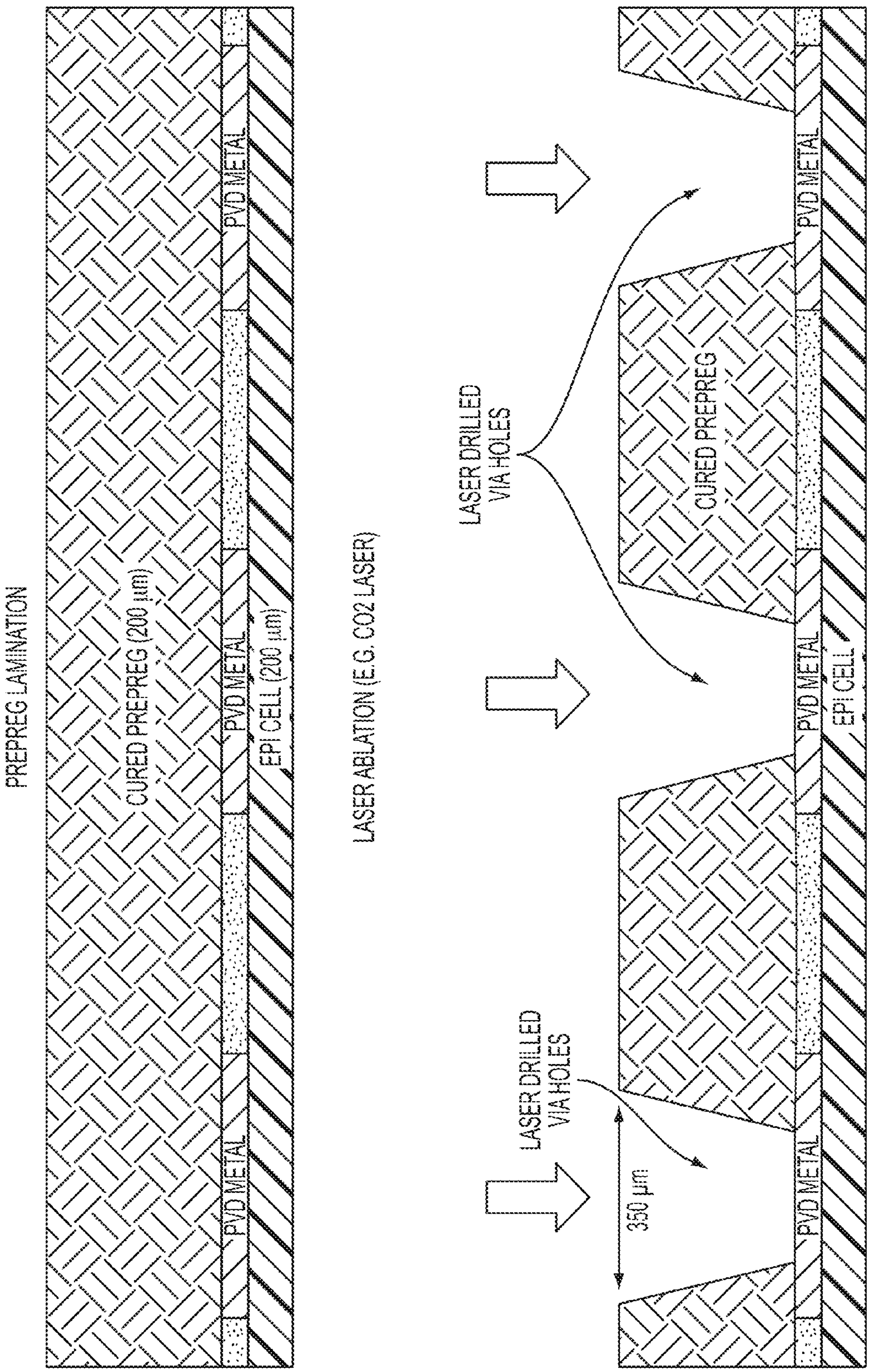
FIGS. 77A through D are cross-sectional diagrams of a pluto-hybrid structure during back contact solar cell formation.
Figure 77B:
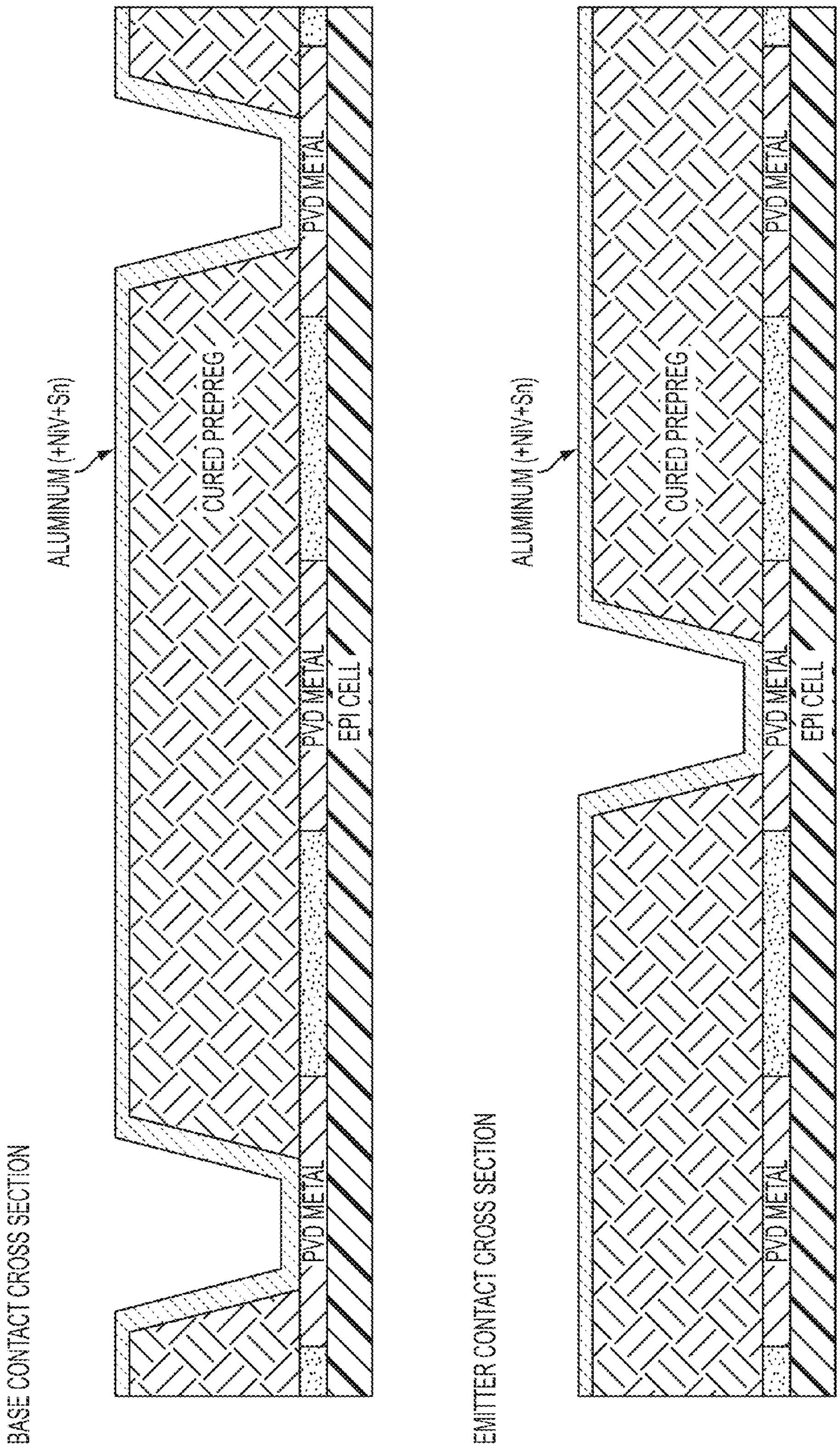
Figure 77C:
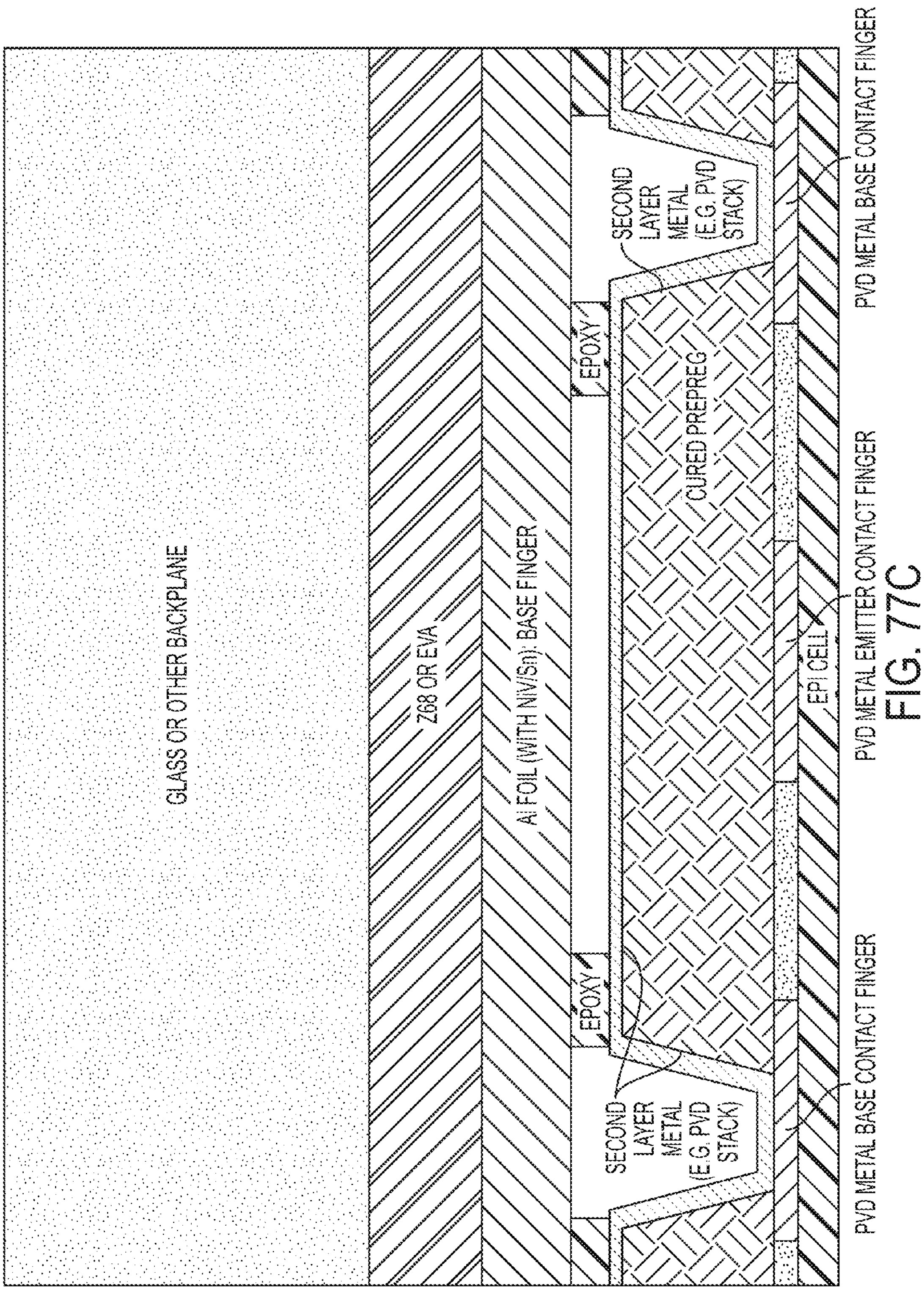
Figure 77D:
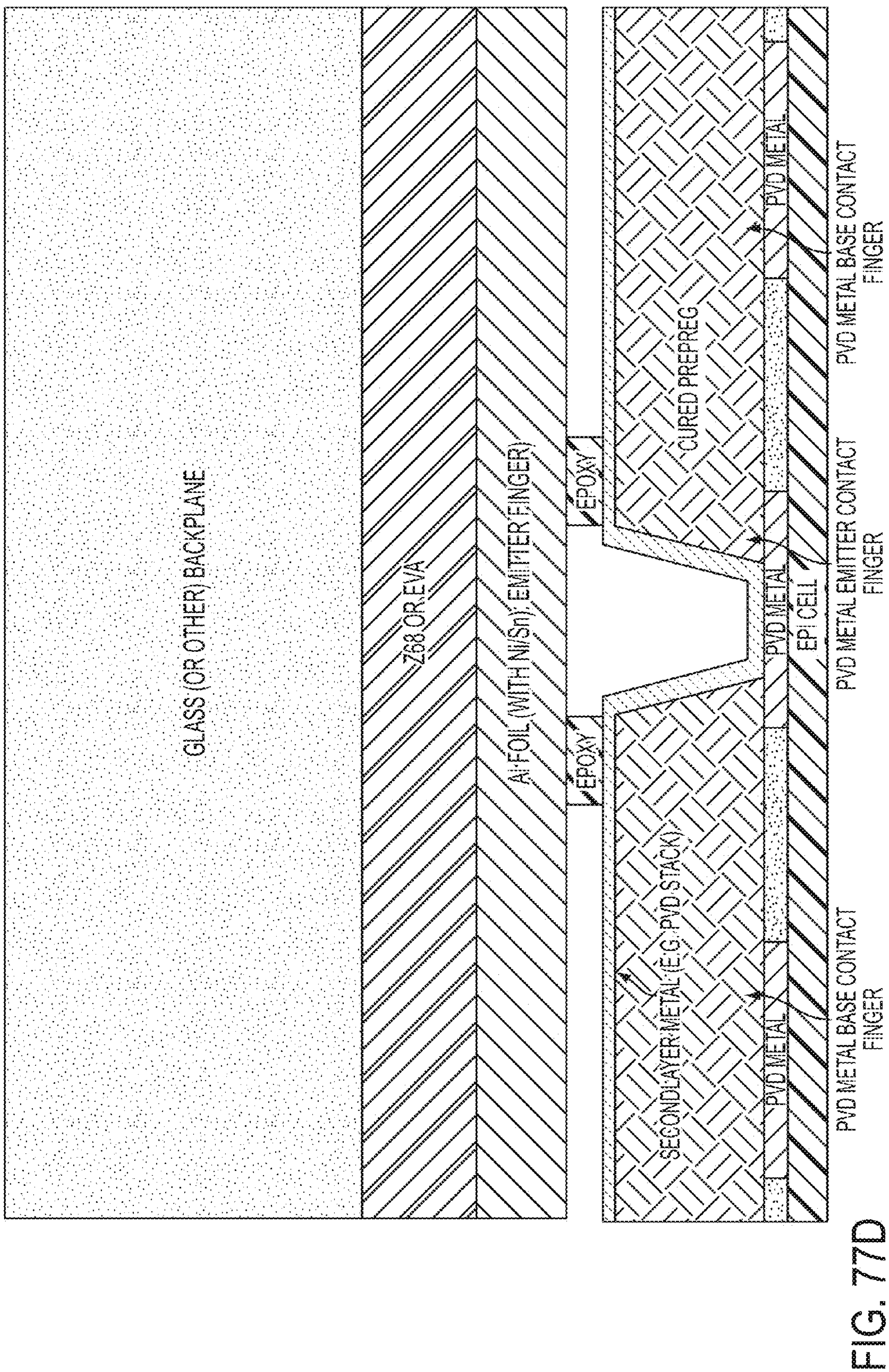

FIG. 77A-D illustrating process steps on a pluto-hybrid structure. FIG. 77A is a cross section of a pluto-hybrid structure during the prepreg via drilling processes. FIG. 77B is a cross section of a pluto-hybrid structure during the metal deposition and isolation processes—the metal isolation is parallel to the diagram and therefor not illustrated. In one embodiment, an Al (+NiV+Sn) PVD and isolation. FIG. 77C is a cross section through base contacts of a pluto-hybrid structure after conductive epoxy screen printing and backplane lamination. FIG. 77C is a cross section through emitter contacts of a pluto-hybrid structure after conductive epoxy screen printing and backplane lamination. The process flow for the hybrid structure may be substantially equivalent to the pluto based flow up to and including the process of opening the via holes by laser drilling after the passivation and preparation of the surface, as illustrated in FIGS. 73A-E. A difference to the pluto structure and flow and with it the similarity to the oasis structure and flow is that the hybrid structure of FIG. 77 includes a structure of large metal fingers which attached to the backplane reinforced TFSS, rather than a metallization structure that is built up using a plating process. To do so, after the via cleanup as described in the pluto flow, first the metal contact is routed from the bottom of the via onto the top of the dielectric, for instance the prepreg. This may be performed in one or several steps. If several steps are used, the via is first at least partially filled using a stencil or screen printed paste. Then metal fingers are deposited for instance by PVD through a slitted shadow mask. Alternatively, if the process of routing the metal is performed in one step or sequence, then the surface of the bottom of the via can be cleaned for instance immediately prior to PVD deposition by doing a pre-sputter etching and/or ashing, in order to remove potential organic residue and native oxides, both of which can contribute to high contact resistance or poor contact reliability.

Alternatively to depositing the metal fingers through a shadow mask, which may be possible due to the rather coarse dimensional requirements for the fingers (millimeters to centimeters). The metal may also be deposited as a blanket metal and afterwards patterned, for example using laser ablation.

On top of the large width metal fingers which run orthogonally to the metal fingers on the TFSS and which contain optionally one or several bus bars per polarity, as explained for the pluto structure, an array of conductive bumps or epoxy are printed. Similar to the oasis structure, there is an additional backplane with large metal fingers, for instance made of solderable Al, for instance with a Ni and/or Sn coating, which may be either pre-manufactured and then laminated to the already reinforced TFSS, or which may be laminated in a single step. The backplane itself consists for example of large width metal fingers which are held in place by a dielectric adhesive which in turn may have a backing plate, for example of glass, polymer, ceramic or metal. For contacting the cell to other cells or in general within the module, it may be advantageous to either have holes in the layer above the large width metal fingers or to have the large width metal fingers extend beyond the edge of the cell. Such metal fingers may be generated in a similar way as for the oasis structure, for example by EDM, stamping, slit cutting or suitable etching after a definition of the etch areas using a mechanical or laser marking. From a structural point of view, it may be advantageous to retain the structure throughout the process in such a way that the area that becomes the bus bars is connected to both polarities, and only prior to cell assembly each side of the contact polarities is cut off. This is an especially straightforward process if the large width metal finger grid is chosen to be oversized compared to the cell.

As another alternative, such metal connections may also be integrated into the module assembly where then a large area of metal fingers may be processed and laminated in parallel. This is possible since the initial metal of the reinforced cell already enables testing and sorting of the cell.

It is to be noted that for the hybrid structures the orthogonal transfer of the metal lines between the on-cell thin fingers and the on-backplane wide fingers may be implemented either from the on-cell metal fingers to the second layer deposited or printed metal or from the printed metal to the backplane aluminum foil fingers. With the latter, it may be advantageous to implement another dielectric between the second layer deposited or printed metal and the aluminum foil fingers.

Process Flow for the Immersion Contact Bonding Structure.

The immersion contact bonding structure is processed similar to an oasis type structure. Main process step differences are depicted in FIGS. 69 and 70 and may be described as the following: After the patterning of the on-TFSS thin metal fingers, as described for the above structures, these fingers are covered with an array of conductive bumps. Then, similar to the oasis structure, there are essentially two alternatives. One is the bonding of the TFSS with the array of conductive bumps to a prefabricated backplane, second is the layup and common lamination of all components of the backplane. Both alternatives have structural and flow options as described in the oasis flow. In both cases, for the immersion contact bonding structure, the adhesive dielectric does not contain the array of via holes which is patterned complimentary to the array of conductive bumps. Rather, the dielectric is applied as a randomly or regularly perforated array to offer sufficient open area for conductive bumps to puncture through upon the softening of the dielectric during the reflow that occurs at lamination. Alternatively, the dielectric is not pre-punctured yet the conductive bumps are shaped such that with the choice of a suitably compliant dielectric, the bumps may still puncture the dielectric and form a low contact resistance contact through the dielectric and serve to establish contact between the TFSS metal fingers and the large width metal fingers on the backplane.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A back contact back junction thin solar cell, comprising:

- a semiconductor layer, comprising:
  - a light capturing frontside surface with a passivation layer;
  - a doped base region, and a doped backside emitter region with a polarity opposite said doped base region; and
  - a backside passivation dielectric layer and patterned reflective layer on said backside emitter region;
- backside emitter contacts and backside base contacts connected to metal interconnects forming a first level interdigitated metallization pattern on the backside of said back contact back junction thin solar cell;
- at least one permanent support reinforcement containing prepreg material positioned on the backside of said back contact back junction thin solar cell; and
- a second metal layer which is separated from the first level by said permanent backside support reinforcement structure, said second layer contacting to said first level metallization pattern locally through an interdigitated pattern of holes in said permanent backside support reinforcement structure.

2. The back contact back junction thin solar cell of claim 1, wherein said second metal layer is aligned orthogonally to said first level interdigitated metallization pattern.

3. The structure in claim 1, where said backside passivation layer consists of a glass.

4. The structure in claim 1, where said backside passivation layer contains at least a thin layer of aluminum oxide.

5. The structure in claim 1, wherein said second metal layer comprises at least one bus bar per polarity.

6. The structure in claim 5, wherein said first level interdigitated metallization pattern is positioned under said bus bars thereby reducing electrical shading.

7. The structure in claim 1, wherein said first level metallization pattern is deposited using printing.

8. The structure in claim 1, wherein said first level metallization pattern comprises aluminum paste or aluminum paste with silicon content.

9. The structure in claim 1, wherein said first level metallization pattern comprises more than one aluminum paste.

10. The structure in claim 1, wherein said emitter region is comprised of at least two regions of different dopant concentration and regions in the vicinity of said emitter contact have higher dopant concentration than regions away from said emitter contact regions.

11. The structure in claim 1, wherein said emitter region is comprised of a very thin layer of p+ doped amorphous silicon on top of intrinsic amorphous silicon, said emitter region backed by polycrystalline silicon germanium alloy or a conductive oxide.

12. A back contact crystalline semiconductor solar cell, comprising:

- a crystalline semiconductor substrate, said substrate comprising a light capturing frontside surface and a backside surface for forming emitter and base contacts;
- a first electrically conductive metallization layer having an interdigitated pattern of emitter electrodes and base electrodes on said backside surface of said crystalline substrate, said first electrically conductive metallization layer having a thickness less than approximately 40 microns;
- a backplane attached to said backside surface of said crystalline substrate, said backplane laminated to said backside surface of said crystalline substrate and comprising a prepreg layer; and
- a second electrically conductive metallization layer providing high-conductivity cell interconnects connected to said first electrically conductive interconnect layer via holes in said backplane, said second electrically conductive interconnect layer having an interdigitated pattern of emitter electrodes and base electrodes.

13. The back contact crystalline semiconductor solar cell in claim 12, wherein said prepreg is attached to said crystalline substrate using reflowed resin from the prepreg.

14. The back contact crystalline semiconductor solar cell in claim 12, wherein the prepreg is attached to said crystalline substrate using an additional resin in at least part of the region of attachment between said crystalline substrate and said backplane.

15. The back contact crystalline semiconductor solar cell in claim 14, wherein said additional resin is planarized at least partially in said interdigitated pattern of emitter electrodes and base electrodes.

16. The back contact crystalline semiconductor solar cell in claim 12, wherein said second electrically conductive metallization layer is comprised of a printed, sprayed, or built-up layer.

17. The back contact crystalline semiconductor solar cell in claim 12, wherein said second electrically conductive metallization layer contacts said first electrically conductive metallization layer according to a contacting metal.

18. The back contact crystalline semiconductor solar cell in claim 12, wherein said second electrically conductive metallization layer is comprised of preformed metal.

19. The back contact crystalline semiconductor solar cell in claim 12, wherein said second electrically conductive metallization layer is arranged essentially orthogonal to said first electrically conductive metallization layer.

20. The back contact crystalline semiconductor solar cell in claim 12, wherein said second electrically conductive metallization layer contains at least one bus bar per polarity.

21. The back contact crystalline semiconductor solar cell in claim 20, wherein said interdigitated pattern of emitter electrodes and base electrodes of said first electrically conductive metallization layer are positioned in regions below said bus bars in said second electrically conductive metallization layer thereby reducing electrical shading.

22. The back contact crystalline semiconductor solar cell in claim 12, wherein said second electrically conductive metallization layer comprises interlocked structures not aligned throughout with the main crystalline axes of said crystalline semiconductor substrate.

23. The solar cell in claim 12, wherein said crystalline semiconductor substrate is an epitaxial silicon substrate.

24. The solar cell in claim 12, wherein said crystalline semiconductor substrate is a thinned or unthinned CZ silicon wafer.

25. The solar cell in claim 12, wherein said crystalline semiconductor substrate is a material containing gallium arsenide.

* * * * *